United States Patent
Takahashi et al.

(10) Patent No.: US 9,568,824 B2
(45) Date of Patent: Feb. 14, 2017

(54) ACTINIC-RAY- OR RADIATION-SENSITIVE RESIN COMPOSITION, RESIST FILM THEREFROM AND METHOD OF FORMING PATTERN THEREWITH

(75) Inventors: Toshiya Takahashi, Shizuoka (JP); Hideaki Tsubaki, Shizuoka (JP); Hiroshi Tamaoki, Shizuoka (JP); Hidenori Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/193,235

(22) Filed: Jul. 28, 2011

(65) Prior Publication Data

US 2012/0034559 A1 Feb. 9, 2012

(30) Foreign Application Priority Data

Jul. 29, 2010 (JP) ................................ 2010-171085

(51) Int. Cl.
| | |
|---|---|
| *G03F 7/039* | (2006.01) |
| *G03F 7/004* | (2006.01) |
| *G03F 7/075* | (2006.01) |
| *G03F 7/20* | (2006.01) |
| *G03F 7/30* | (2006.01) |
| *G03F 7/32* | (2006.01) |

(52) U.S. Cl.
CPC ........... *G03F 7/0397* (2013.01); *G03F 7/0045* (2013.01); *G03F 7/0046* (2013.01); *G03F 7/0392* (2013.01); *G03F 7/0758* (2013.01); *G03F 7/20* (2013.01); *G03F 7/2037* (2013.01); *G03F 7/2039* (2013.01); *G03F 7/30* (2013.01); *G03F 7/322* (2013.01)

(58) Field of Classification Search
None
See application file for complete search history.

(56) References Cited

U.S. PATENT DOCUMENTS

| | | | |
|---|---|---|---|
| 2001/0003772 A1* | 6/2001 | Hatakeyama et al. | 526/279 |
| 2008/0187860 A1* | 8/2008 | Tsubaki et al. | 430/270.1 |
| 2009/0202943 A1 | 8/2009 | Ohsawa et al. | |
| 2009/0233223 A1 | 9/2009 | Tachibana et al. | |
| 2009/0269696 A1* | 10/2009 | Ohsawa et al. | 430/270.1 |
| 2010/0055608 A1 | 3/2010 | Ohashi et al. | |
| 2010/0075256 A1* | 3/2010 | Joo et al. | 430/286.1 |
| 2010/0183975 A1 | 7/2010 | Takahashi et al. | |
| 2010/0233617 A1 | 9/2010 | Wada | |
| 2010/0248143 A1* | 9/2010 | Ito et al. | 430/282.1 |
| 2011/0177453 A1 | 7/2011 | Masubuchi et al. | |
| 2012/0315449 A1 | 12/2012 | Tsubaki et al. | |

FOREIGN PATENT DOCUMENTS

| | | |
|---|---|---|
| EP | 1 754 999 A2 | 2/2007 |
| EP | 1 975 705 A2 | 10/2008 |
| EP | 2 196 462 A1 * | 6/2010 |
| JP | 2007-297590 A | 11/2007 |
| JP | 2008-203452 A | 9/2008 |
| JP | 2009-093137 A | 4/2009 |
| JP | 2009-192618 A | 8/2009 |
| JP | 2009-217253 A | 9/2009 |
| JP | 2009-242789 A | 10/2009 |
| JP | 2009-263487 A | 11/2009 |
| JP | 2010-095643 A | 4/2010 |
| JP | 2010-266857 A | 11/2010 |
| JP | 2013-157116 A | 8/2013 |
| JP | 2013-257582 A | 12/2013 |
| TW | 200839467 A | 10/2008 |
| TW | 201004985 A | 2/2010 |
| WO | WO2009/038148 A1 * | 3/2009 |
| WO | WO 2010/067898 A2 * | 6/2010 |
| WO | WO 2011/025070 A1 * | 3/2011 |

OTHER PUBLICATIONS

Derwent English abstract for JP 2008-203452 (Hatakeyama et al) (2008).*
Machine-assisted English translation for JP2008-203452, provided by JPO (2008).*
Tarutani et al., "Study on acid diffusion length effect with PAG-blended system and anion-bounded polymer system", Advances in Resist Materials and Processing Technology XXVII, Feb. 22-24, 2010, San Jose, CA, USA, vol. 7639, 763910, Mar. 30, 2010, pp. 1-7, XP002664987.
Japanese Office Action dated Dec. 3, 2013 issued in corresponding patent application No. 2010-171085.
Japanese Office Action issued in application No. 2010-171085 dated Sep. 9, 2014.
Taiwanese Office Action dated Nov. 5, 2014, issued in application No. 100127040.
Japanese Office Action dated Mar. 31, 2015 issued in application No. 2010-171085.
European Communication dated Sep. 4, 2015 issued in corresponding application No. 11 175 933.8-1560.

* cited by examiner

*Primary Examiner* — Sin Lee
(74) *Attorney, Agent, or Firm* — Sughrue Mion, PLLC

(57) ABSTRACT

Provided is an actinic-ray- or radiation-sensitive resin composition, includes a resin (P) containing a repeating unit (A) that when exposed to actinic rays or radiation, is decomposed to thereby generate an acid and a repeating unit (B) with a structure that when acted on by an acid, is decomposed to thereby increase its solubility in an alkali developer, and a compound (U) structured so that when the composition is formed into a film, the compound is unevenly distributed in a surface of the film.

23 Claims, No Drawings

ACTINIC-RAY- OR RADIATION-SENSITIVE RESIN COMPOSITION, RESIST FILM THEREFROM AND METHOD OF FORMING PATTERN THEREWITH

CROSS-REFERENCE TO RELATED APPLICATIONS

This application is based upon and claims the benefit of priority from prior Japanese Patent Application No. 2010-171085, filed Jul. 29, 2010, the entire contents of which are incorporated herein by reference.

BACKGROUND OF THE INVENTION

1. Field of the Invention

The present invention relates to an actinic-ray- or radiation-sensitive resin composition, a resist film therefrom and a method of forming a pattern therewith. The composition, resist film and method of forming a pattern according to the present invention can be used in, for example, a semiconductor production process for an IC, a photomask or the like, a circuit board production process for a liquid crystal, a thermal head or the like, a nanoimprint mold fabrication process and other photofabrication processes.

2. Description of the Related Art

Heretofore, the microfabrication by lithography using a photoresist composition is performed in the process for manufacturing semiconductor devices, such as an IC and an LSI. In recent years, the formation of an ultrafine pattern in the submicron region or quarter-micron region is increasingly demanded in accordance with the realization of high integration for integrated circuits. Accordingly, the trend of exposure wavelength toward a short wavelength, for example, from g-rays to i-rays and further to a KrF excimer laser light is seen. Further, the development of lithography using electron beams, X-rays, or soft X-rays such as EUV light, other than the excimer laser light, is now being promoted.

In particular, the lithography using electron beams is positioned as the next-generation or next-next-generation pattern forming technology. Resists of high sensitivity and high resolution are demanded for the lithography. Specifically, increasing the sensitivity is a very important task to be attained for the shortening of wafer processing time. However, the pursuit of increasing the sensitivity with respect to the resists for electron beams is likely to invite not only the lowering of resolving power but also the deterioration of line edge roughness. Thus, there is a strong demand for the development of resists that simultaneously satisfy these properties. Herein, the line edge roughness refers to the phenomenon that the edge at an interface of resist pattern and substrate is irregularly varied in the direction perpendicular to the line direction due to the characteristics of the resist, so that when the pattern is viewed from above, the pattern edge is observed uneven. This unevenness is transferred in the etching operation using the resist as a mask to thereby cause poor electrical properties resulting in poor yield. Especially in the nanoregion of 0.25 μm or less, the line edge roughness is now an extremely important theme in which improvement is to be attained. High sensitivity is in a relationship of trade-off with high resolution and good line edge roughness. How to simultaneously satisfy all of them is a critical issue.

With respect to development defects as well, suppression thereof is demanded. How to simultaneously satisfy all of high sensitivity, high resolution, good line edge roughness and development defects is a very important task.

The electron beam lithography utilized as a nanofabrication technology is now indispensable as a method of fabricating a photomask blank used in the production of a photomask for semiconductor manufacturing.

CITATION LIST

[Patent reference 1] Jpn. Pat. Appln. KOKAI Publication No. (hereinafter referred to as JP-A-) 2008-203452.

BRIEF SUMMARY OF THE INVENTION

It is an object of the present invention to provide an actinic-ray- or radiation-sensitive resin composition that can simultaneously satisfy high sensitivity, high resolution, good roughness performance and reduction of development defects. It is another object of the present invention to provide a resist film prepared from the composition. It is a further object of the present invention to provide a method of forming a pattern with the use of the composition.

According to an aspect of embodiments, the present invention is as described below.

[1] An actinic-ray- or radiation-sensitive resin composition comprising:

a resin (P) containing a repeating unit (A) that when exposed to actinic rays or radiation, is decomposed to thereby generate an acid and a repeating unit (B) with a structure that when acted on by an acid, is decomposed to thereby increase its solubility in an alkali developer, and a compound (U) structured so that when the composition is formed into a film, the compound is unevenly distributed in a surface of the film.

[2] The composition according to claim 1, wherein the compound (U) contains either an acid group or a group that when acted on by an alkali developer, is decomposed to thereby produce an acid group.

[3] The composition according to item [1] or [2], wherein the repeating unit (A) has a structure that when exposed to actinic rays or radiation, produces an acid group in a side chain of the resin (P).

[4] The composition according to any of items [1] to [3], wherein the compound (U) contains at least either a fluorine atom or a silicon atom.

[5] The composition according to any of items [1] to [4], wherein the compound (U) is a resin.

[6] The composition according to any of items [1] to [5], wherein the compound (U) contains a polarity conversion group.

[7] The composition according to item [6], wherein the compound (U) has at least either the partial structure of general formula (KA-1) below or the partial structure of general formula (KB-1) below:

(KA-1)

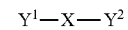
(KB-1)

in which

X represents the polarity conversion group, and each of $Y^1$ and $Y^2$ independently represents an electron withdrawing group.

[8] The composition according to item [7], wherein the above X represents a carboxylic ester, an acid anhydride, an acid imide, a carboxylic thioester, a carbonic ester, a sulfuric ester or a sulfonic ester.

[9] The composition according to any of items [1] to [8], wherein the compound (U) has at least one partial structure selected from the group consisting of those of general formulae (KA-1-1) to (KA-1-17) below.

KA-1-1

KA-1-2

KA-1-3

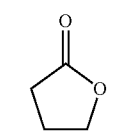

KA-1-4

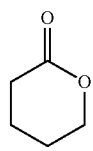

KA-1-5

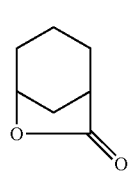

KA-1-6

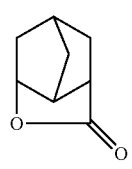

KA-1-7

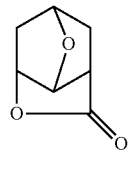

KA-1-8

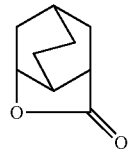

KA-1-9

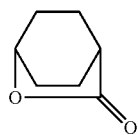

KA-1-10

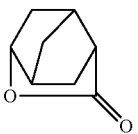

KA-1-11

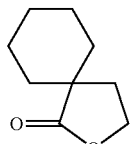

KA-1-12

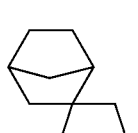

KA-1-13

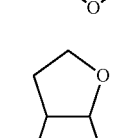

KA-1-14

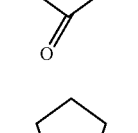

KA-1-15

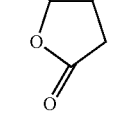

KA-1-16

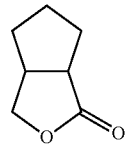

KA-1-17

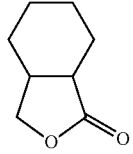

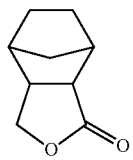

[10] The composition according to any of items [1] to [9], wherein the compound (U) has at least one partial structure selected from the group consisting of those of general formulae (F2), (F3), (F4), (CS-1), (CS-2) and (CS-3) below:

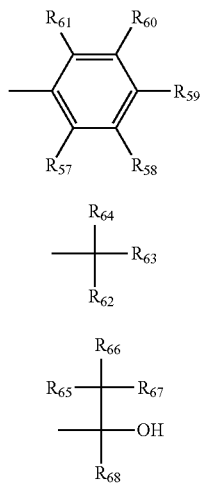 (F2)

(F3)

(F4)

in general formulae (F2) to (F4),
each of $R_{57}$ to $R_{68}$ independently represents a hydrogen atom, a fluorine atom or an alkyl group, provided that in each of $R_{57}$-$R_{61}$, $R_{62}$-$R_{64}$ and $R_{65}$-$R_{68}$, at least one thereof is a fluorine atom or an alkyl group substituted with at least one fluorine atom, and

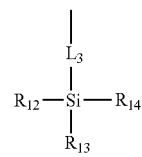 (CS-1)

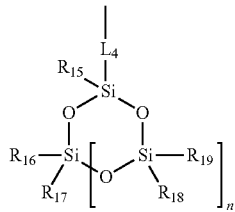 (CS-2)

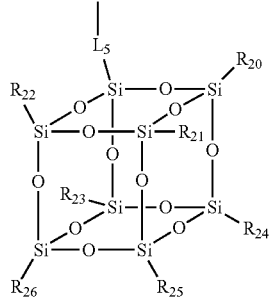 (CS-3)

in general formulae (CS-1) to (CS-3),
each of $R_{12}$ to $R_{26}$ independently represents an alkyl group or a cycloalkyl group,
each of $L_3$ to $L_5$ independently represents a single bond or a bivalent connecting group, and
n is an integer of 1 to 5.

[11] The composition according to any of items [1] to [10], wherein the repeating unit (B) is any of the repeating units of general formula (ES) below:

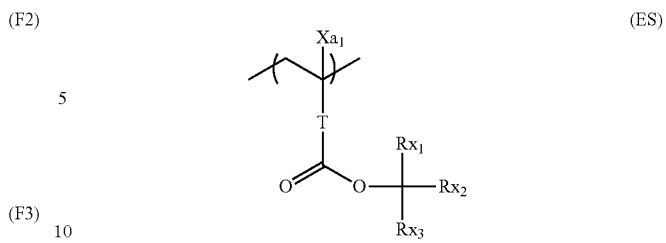 (ES)

in which
$Xa_1$ represents a hydrogen atom, a methyl group, a trifluoromethyl group or a hydroxymethyl group,
T represents a single bond or a bivalent connecting group, and
each of $Rx_1$ to $Rx_3$ independently represents an alkyl group or a cycloalkyl group, provided that at least two of $Rx_1$ to $Rx_3$ may be bonded to each other to thereby form a ring.

[12] The composition according to any of items [1] to [11], which further comprises a basic compound whose conjugate acid exhibits a pKa value of 9 or below.

[13] A resist film formed from the composition according to any of items [1] to [12].

[14] A method of forming a pattern, comprising:
forming the composition according to any of items [1] to [12] into a film,
exposing the film to light, and
developing the exposed film.

[15] The method according to item [14], wherein the exposure is performed using electron beams, X-rays or soft X-rays.

The present invention has made it feasible to provide an actinic-ray- or radiation-sensitive resin composition that can simultaneously satisfy high sensitivity, high resolution, good roughness performance and reduction of development defects. The present invention has further made it feasible to provide a resist film prepared from the composition and also a method of forming a pattern with the use of the composition.

DETAILED DESCRIPTION OF THE INVENTION

Embodiments of the present invention will be described in detail below.

Herein, the groups and atomic groups for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

Further, herein, the terms "actinic rays" and "radiation" mean, for example, brightline spectra from a mercury lamp, far ultraviolet represented by an excimer laser, X-rays, soft X-rays such as extreme ultraviolet (EUV) and electron beams (EB). The term "light" means actinic rays or radiation. The term "exposure" unless otherwise specified means not only irradiation with light, such as light from a mercury lamp, far ultraviolet, X-rays or EUV light, but also lithography using particle beams, such as electron beams and ion beams.

The actinic-ray- or radiation-sensitive resin composition of the present invention comprises a resin (P) and a compound (U) as to be described in detail below. The inventors have found that high sensitivity, high resolution, good roughness performance and reduction of development defects can be simultaneously satisfied by employing this composition. The individual components of this composition will be described below.

[1] Resin (P)

The resin (P) contains a repeating unit (A) that when exposed to actinic rays or radiation, is decomposed to thereby generate an acid and a repeating unit (B) with a structure that when acted on by an acid, is decomposed to thereby increase its solubility in an alkali developer.

[Repeating Unit (A)]

The repeating unit (A) has a structure that when exposed to actinic rays or radiation, is decomposed to thereby generate an acid.

In particular, it is preferred for the repeating unit (A) to be any of the repeating units of general formula (I) and general formula (II) below.

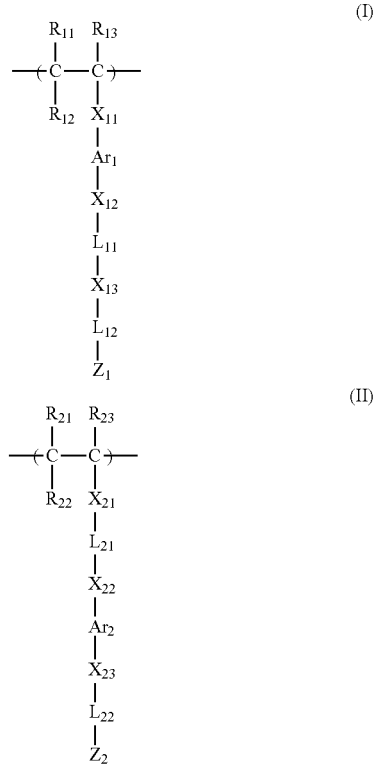

In general formula (I), each of $R_{11}$, $R_{12}$ and $R_{13}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{11}$, $R_{12}$ and $R_{13}$.

As the monovalent aliphatic hydrocarbon ring group, there can be mentioned an optionally substituted monocyclic or polycyclic aliphatic hydrocarbon ring group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is especially preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{11}$ to $R_{13}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (I), each of $R_{11}$, $R_{12}$ and $R_{13}$ is preferably a hydrogen atom, an alkyl group or a halogen atom. A hydrogen atom, a methyl group, an ethyl group, a trifluoromethyl group (—$CF_3$), a hydroxymethyl group (—$CH_2$—OH), a chloromethyl group (—$CH_2$—Cl) and a fluorine atom (—F) are especially preferred.

Each of $X_{11}$, $X_{12}$ and $X_{13}$ independently represents a single bond, —O—, —S—, —CO—, —$SO_2$—, —NR— (R represents a hydrogen atom or an alkyl group), a bivalent nitrogenous nonaromatic heterocyclic group or a group composed of a combination of these.

With respect to —NR—, the alkyl group represented by R is an optionally substituted linear or branched alkyl group. Particular examples thereof are the same as those of the alkyl groups represented by $R_{11}$, $R_{12}$ and $R_{13}$. R is most preferably a hydrogen atom, a methyl group or an ethyl group.

The bivalent nitrogenous nonaromatic heterocyclic group refers to a preferably 3- to 8-membered nonaromatic heterocyclic group having at least one nitrogen atom. In particular, there can be mentioned, for example, bivalent connecting groups with the following structures.

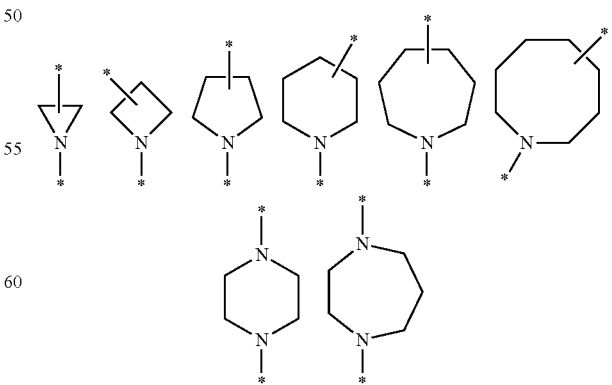

When $X_{11}$ is a single bond, $R_{12}$ may form a ring in cooperation with $Ar_1$. In that instance, $R_{12}$ represents an alkylene group. $X_{11}$ is preferably a single bond, —COO— or —CONR— (R represents a hydrogen atom or an alkyl group). A single bond and —COO— are most preferred.

$X_{12}$ is preferably a single bond, —O—, —CO—, —SO$_2$—, —NR— (R represents a hydrogen atom or an alkyl group) or a group composed of a combination of these. A single bond, —OCO— and —OSO$_2$— are most preferred.

$X_{13}$ is preferably a single bond, —O—, —CO—, —SO$_2$—, —NR— (R represents a hydrogen atom or an alkyl group) or a group composed of a combination of these. A single bond, —OCO— and —OSO$_2$— are most preferred.

$L_{11}$ represents a single bond, an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other and may be linked to each other through, as a connecting group, —O—, —S—, —CO—, —SO$_2$—, —NR— (R represents a hydrogen atom or an alkyl group), a bivalent nitrogenous nonaromatic heterocyclic group or a group composed of a combination of these.

The alkylene group represented by $L_{11}$ may be linear or branched. As preferred examples thereof, there can be mentioned alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group described above in connection with $L_{11}$.

The bivalent aliphatic hydrocarbon ring group may be monocyclic or polycyclic. As preferred examples thereof, there can be mentioned bivalent aliphatic hydrocarbon ring groups each having 3 to 17 carbon atoms, such as a cyclobutylene group, a cyclopentylene group, a cyclohexylene group, a norbornanylene group, an adamantylene group and a diamantanylene group. A bivalent aliphatic hydrocarbon ring group having 5 to 12 carbon atoms is more preferred. A bivalent aliphatic hydrocarbon ring group having 6 to 10 carbon atoms is more preferred.

As the bivalent aromatic ring group, there can be mentioned, for example, an optionally substituted arylene group having 6 to 14 carbon atoms, such as a phenylene group, a tolylene group or a naphthylene group, or a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Particular examples of the —NR— and bivalent nitrogenous nonaromatic heterocyclic groups are the same as mentioned above in connection with $X_{11}$. Preferred examples are also the same.

$L_{11}$ is preferably a single bond, an alkylene group or a bivalent aliphatic hydrocarbon ring group. A single bond and an alkylene group are most preferred.

$L_{12}$ represents a single bond, an alkylene group, an alkenylene group, a bivalent aliphatic hydrocarbon ring group, a bivalent aromatic ring group or a group composed of a combination of two or more of these. The hydrogen atoms of each of these groups are partially or entirely substituted with a substituent selected from among a fluorine atom, a fluoroalkyl group, a nitro group and a cyano group. In the group composed of a combination, two or more groups combined together may be identical to or different from each other and may be linked to each other through, as a connecting group, —O—, —S—, —CO—, —SO$_2$—, —NR— (R represents a hydrogen atom or an alkyl group), a bivalent nitrogenous nonaromatic heterocyclic group or a group composed of a combination of these.

Preferably, $L_{12}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group at least partially or entirely substituted with a fluorine atom is especially preferred. $L_{12}$ is most preferably an alkylene group, 30 to 100% of the hydrogen atoms of which are substituted with a fluorine atom.

The alkylene group represented by $L_{12}$ may be linear or branched. As preferred examples thereof, there can be mentioned alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group.

Particular examples of the bivalent aromatic ring groups are the same as set forth above with respect to the bivalent aromatic ring group used as a connecting group in $L_{11}$.

Particular examples of the —NR— and bivalent nitrogenous nonaromatic heterocyclic groups used as connecting groups in $L_{12}$ are the same as mentioned above in connection with $X_{11}$. Preferred examples are also the same.

Preferred particular examples of the groups represented by $L_{12}$ are shown below, which are to be construed as in no way limiting the scope of the groups.

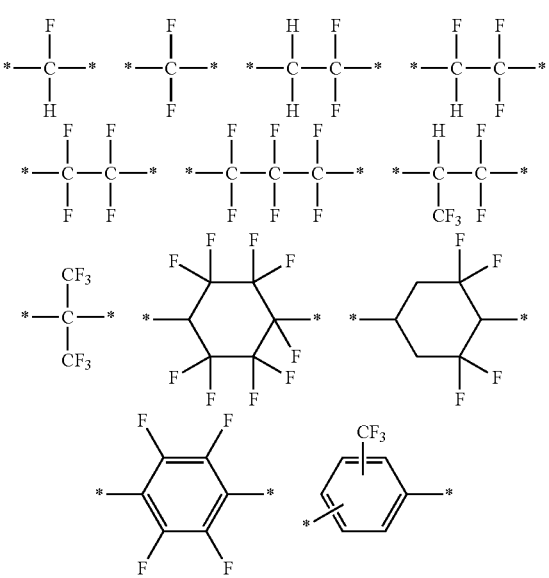

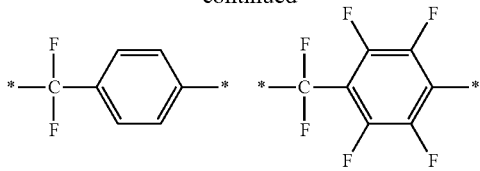

Ar₁ represents a bivalent aromatic ring group or a group composed of a combination of a bivalent aromatic ring group and an alkylene group.

A substituent may be introduced in the bivalent aromatic ring group. As preferred examples thereof, there can be mentioned an arylene group having 6 to 18 carbon atoms, such as a phenylene group, a tolylene group or a naphthylene group; and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Preferred substituents that can be introduced in these groups are, for example, the alkyl group mentioned above in connection with $R_{11}$ to $R_{13}$, an alkoxy group such as a methoxy group, an ethoxy group, a hydroxyethoxy group, a propoxy group, a hydroxypropoxy group or a butoxy group, and an aryl group such as a phenyl group.

As a preferred example of the group composed of a combination of a bivalent aromatic ring group and an alkylene group, there can be mentioned an aralkylene group composed of a combination of the above-mentioned bivalent aromatic ring group and an alkylene group (linear or branched) having 1 to 8 carbon atoms, such as a methylene group, an ethylene group, a propylene group, a butylene group, a hexylene group or an octylene group.

Preferably, Ar₁ is an optionally substituted arylene group having 6 to 18 carbon atoms. A phenylene group, a naphthylene group, a biphenylene group and a phenylene group substituted with a phenyl group are especially preferred.

$Z_1$ represents a structural moiety that when exposed to actinic rays or radiation, is decomposed to thereby generate an acid. It is preferred for this structural moiety to have a structure that when exposed to actinic rays or radiation, produces an acid group in a side chain of the resin. More preferably, $Z_1$ is a moiety that when exposed to actinic rays or radiation, becomes a sulfonic acid group, an imidic acid group or a methide acid group. It is especially preferred for the moiety represented by $Z_1$ to be any of the moieties of general formulae (ZI) to (ZIII) below.

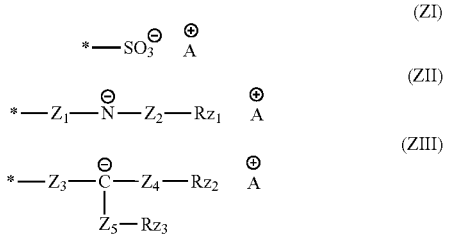

In general formulae (ZII) and (ZIII), each of $Z_1$, $Z_2$, $Z_3$, $Z_4$ and $Z_5$ independently represents —CO— or —SO₂—, preferably —SO₂—.

Each of $Rz_1$, $Rz_2$ and $Rz_3$ independently represents an alkyl group, a monovalent aliphatic hydrocarbon ring group, an aryl group or an aralkyl group. Forms of these groups having the hydrogen atoms thereof partially or entirely substituted with a fluorine atom or a fluoroalkyl group (especially a perfluoroalkyl group) are preferred. Forms of these groups having 30 to 100% of the hydrogen atoms thereof substituted with a fluorine atom are most preferred.

The above alkyl group may be linear or branched. As a preferred form thereof, there can be mentioned, for example, an alkyl group having 1 to 8 carbon atoms, such as a methyl group, an ethyl group, a propyl group, a butyl group, a hexyl group or an octyl group. An alkyl group having 1 to 6 carbon atoms is more preferred. An alkyl group having 1 to 4 carbon atoms is most preferred.

The monovalent aliphatic hydrocarbon ring group is preferably a monovalent aliphatic hydrocarbon ring group having 3 to 10 carbon atoms, such as a cyclobutyl group, a cyclopentyl group or a cyclohexyl group. A monovalent aliphatic hydrocarbon ring group having 3 to 6 carbon atoms is more preferred.

The aryl group is preferably one having 6 to 18 carbon atoms. An aryl group having 6 to 10 carbon atoms is more preferred. A phenyl group is most preferred.

As a preferred form of the aralkyl group, there can be mentioned one resulting from the bonding of the above aryl group to an alkylene group having 1 to 8 carbon atoms. An aralkyl group resulting from the bonding of the above aryl group to an alkylene group having 1 to 6 carbon atoms is more preferred. An aralkyl group resulting from the bonding of the above aryl group to an alkylene group having 1 to 4 carbon atoms is most preferred.

Each of $Rz_1$, $Rz_2$ and $Rz_3$ is preferably an alkyl group having the hydrogen atoms thereof partially or entirely substituted with a fluorine atom or a fluoroalkyl group (especially a perfluoroalkyl group), most preferably an alkyl group having 30 to 100% of the hydrogen atoms thereof substituted with a fluorine atom.

In general formulae (ZI) to (ZIII) above, A⁺ represents a cation. It is preferred for the cation represented by A⁺ to be any of those of general formulae (CT1) and (CT2) below, provided that the cation represented by A⁺ is not limited to a sulfonium cation and an iodonium cation and may be any of other cations.

In general formula (CT1), each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20. Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by the bonding of two of $R_{201}$ to $R_{203}$, there can be mentioned an alkylene group (for example, a butylene group or a pentylene group).

As the organic groups represented by $R_{201}$, $R_{202}$ and $R_{203}$ in general formula (CT1) above, there can be mentioned, for example, corresponding groups of the cations (CT1-1), (CT1-2), (CT1-3) and (CT1-4) to be described hereinafter.

The cation (CT1-1) is any of the cations of general formula (CT1) above in which at least one of $R_{201}$ to $R_{203}$ is an aryl group. Namely, the cation (CT1-1) is an arylsulfonium cation.

In this cation, all of $R_{201}$ to $R_{203}$ may be aryl groups. Alternatively, $R_{201}$ to $R_{203}$ may be an aryl group in part and may be an alkyl group or a cycloalkyl group in the remainder. As the cation (CT1-1), there can be mentioned, for example, cations corresponding to a triarylsulfonium, a diarylalkylsulfonium, an aryldialkylsulfonium, a diarylcycloalkylsulfonium and an aryldicycloalkylsulfonium.

The aryl group of the arylsulfonium is preferably a phenyl group or a naphthyl group, more preferably a phenyl group. The aryl group may be one with a heterocyclic structure containing an oxygen atom, a nitrogen atom, a sulfur atom or the like. As the heterocyclic structure, there can be mentioned the structure of pyrrole, furan, thiophene, indole, benzofuran, benzothiophene or the like. When the arylsulfonium contains two or more aryl groups, the two or more aryl groups may be identical to or different from each other.

The alkyl group or cycloalkyl group contained in the arylsulfonium according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may contain as a substituent thereof an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. An alkyl group having 1 to 4 carbon atoms and an alkoxy group having 1 to 4 carbon atoms are more preferred. The substituent may be introduced in any one of the three $R_{201}$ to $R_{203}$, or alternatively may be introduced in all of the three $R_{201}$ to $R_{203}$. When $R_{201}$ to $R_{203}$ represent aryl groups, the substituent is preferably introduced in the p-position of the aryl group.

Now, the cation (CT1-2) will be described.

The cation (CT1-2) is any of those of general formula (CT1) wherein each of $R_{201}$ to $R_{203}$ independently represents an organic group containing none of aromatic rings. The aromatic rings include an aromatic ring containing a heteroatom.

Each of the organic groups containing no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. A linear or branched 2-oxoalkyl group, a 2-oxocycloalkyl group and an alkoxycarbonylmethyl group are more preferred. A linear or branched 2-oxoalkyl group is most preferred.

The alkyl group or cycloalkyl group represented by $R_{201}$ to $R_{203}$ is preferably a linear or branched alkyl group having 1 to 10 carbon atoms (for example, a methyl group, an ethyl group, a propyl group, a butyl group or a pentyl group) or a cycloalkyl group having 3 to 10 carbon atoms (a cyclopentyl group, a cyclohexyl group or a norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be linear or branched, preferably being a group resulting from the introduction of >C=O in the 2-position of any of the above alkyl groups.

The 2-oxocycloalkyl group is preferably a group resulting from the introduction of >C=O in the 2-position of any of the above cycloalkyl groups.

As preferred alkoxy groups of the alkoxycarbonylmethyl groups, there can be mentioned alkoxy groups each having 1 to 5 carbon atoms (a methoxy group, an ethoxy group, a propoxy group, a butoxy group and a pentoxy group).

These $R_{201}$ to $R_{203}$ may be further substituted with a halogen atom, an alkoxy group (for example, 1 to 5 carbon atoms), a hydroxyl group, a cyano group or a nitro group.

The cation (CT1-3) is any of the cations of general formula (CT1-3) below. This cation has a phenacylsulfonium salt structure.

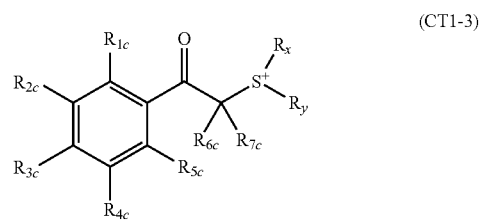

(CT1-3)

In the formula, each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded to each other to thereby form a ring structure. This ring structure may contain an oxygen atom, a sulfur atom, an ester bond or an amido bond.

Specific examples of the cations (CT1-3) are shown below.

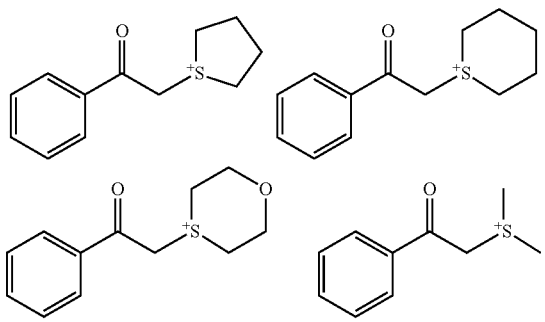

-continued
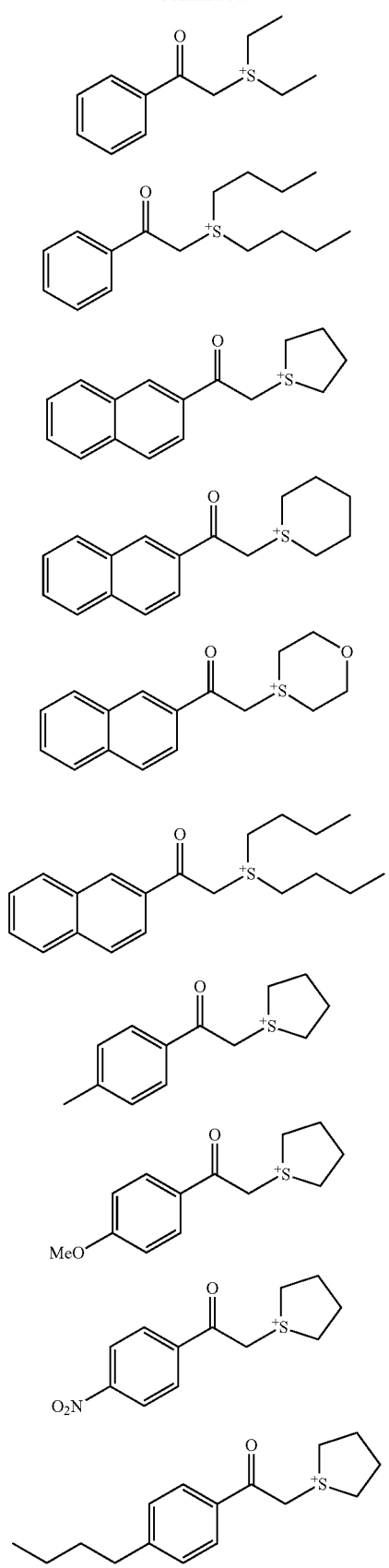
-continued
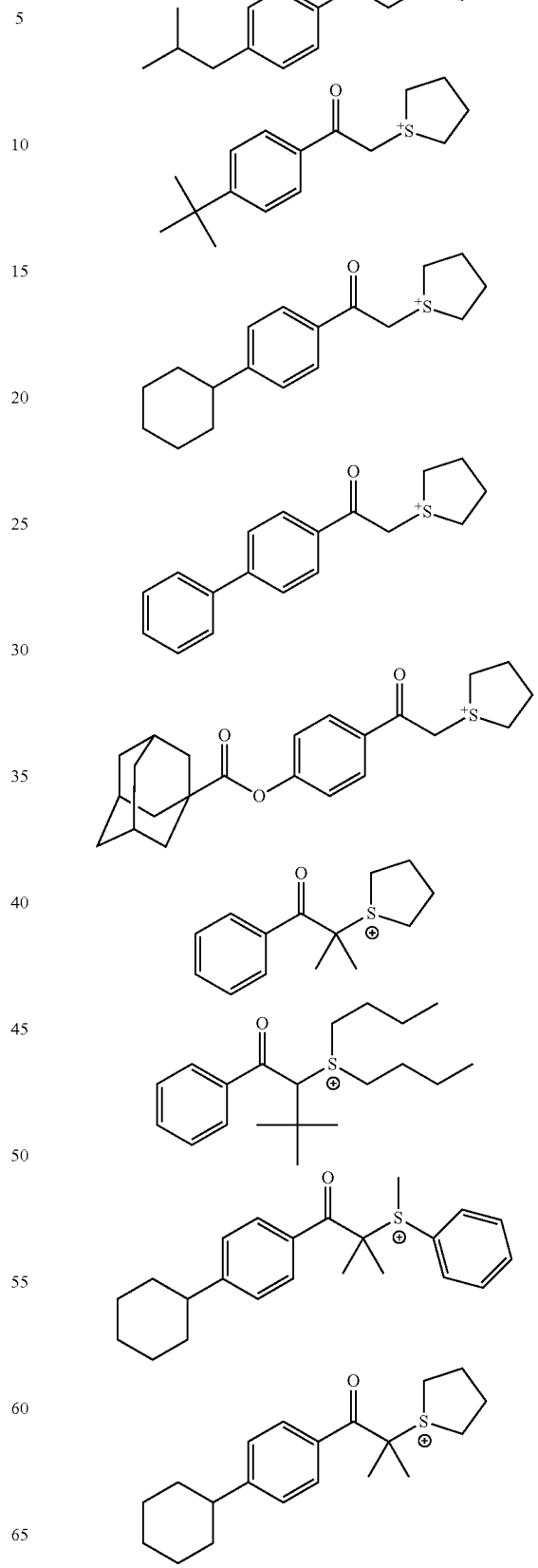

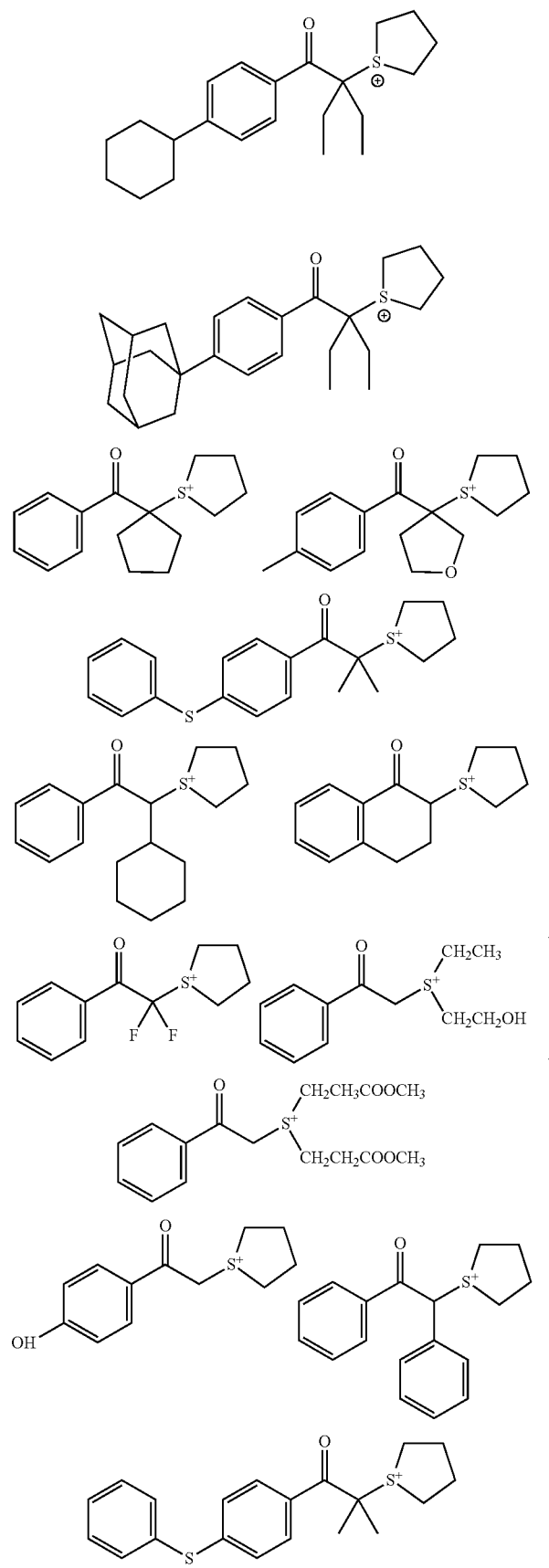
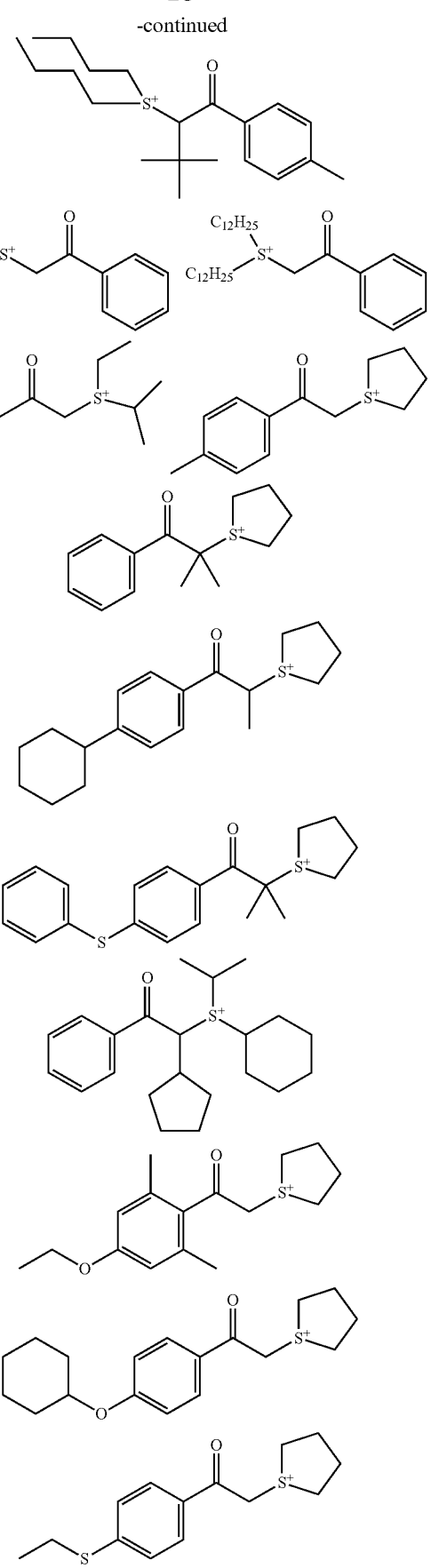

-continued

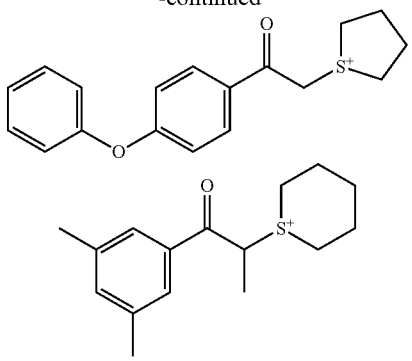
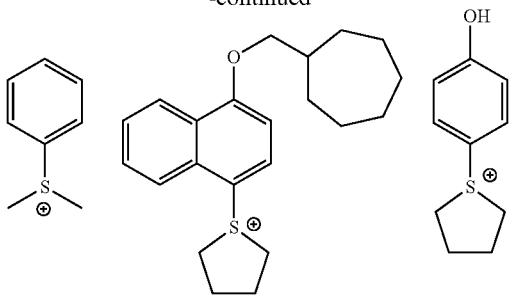

The cation (CT1-4) is any of the cations of general formula (CT1-4) below.

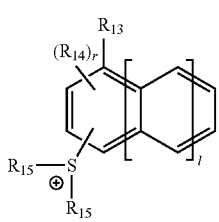

(CT1-4)

In the formula,

R$_{13}$ represents a hydrogen atom, a fluorine atom, a hydroxyl group, an alkyl group, a cycloalkyl group, an alkoxy group, an alkoxycarbonyl group or a group with a mono- or polycycloalkyl skeleton. Substituents may be introduced in these groups.

R$_{14}$, or each of R$_{14}$s independently, represents an alkyl group, a cycloalkyl group, an alkoxy group, an alkoxycarbonyl group, an alkylcarbonyl group, an alkylsulfonyl group, a cycloalkylsulfonyl group or a group with a mono- or polycycloalkyl skeleton. Substituents may be introduced in these groups.

Each of R$_{15}$s independently represents an alkyl group, a cycloalkyl group or a naphthyl group, provided that two R$_{15}$s may be bonded to each other to thereby form a ring. Substituents may be introduced in these groups.

In the formula, l is an integer of 0 to 2, and r is an integer of 0 to 8.

Specific examples of the cations (CT1-4) are shown below.

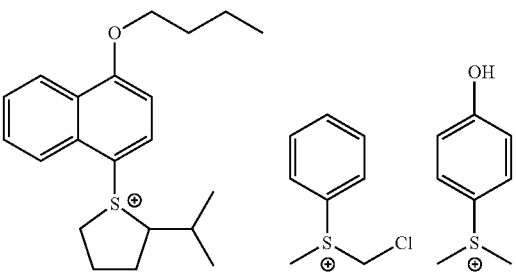

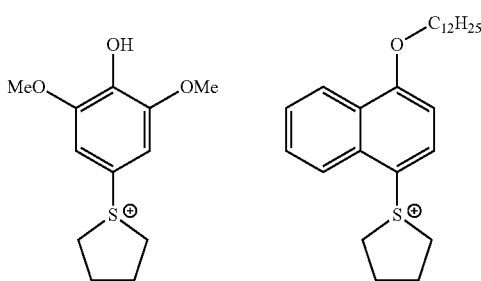

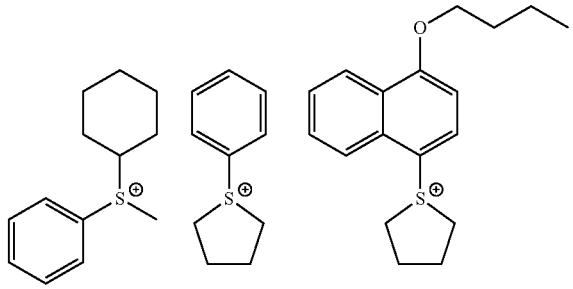

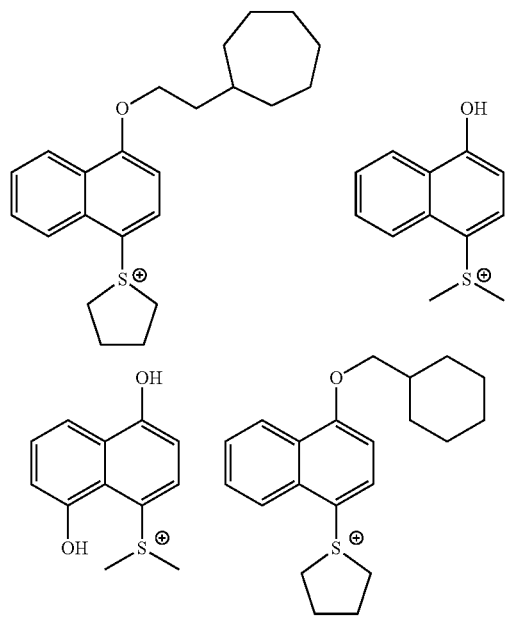

-continued
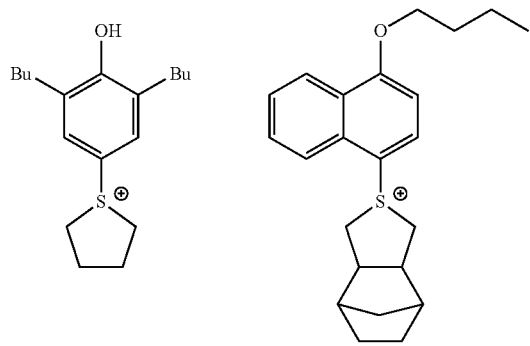
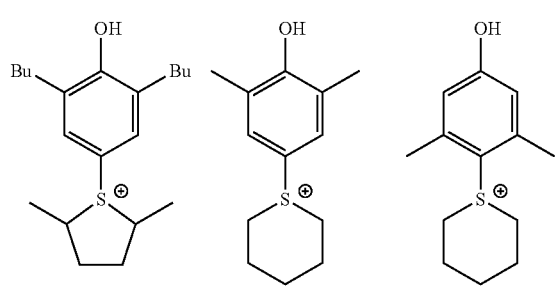
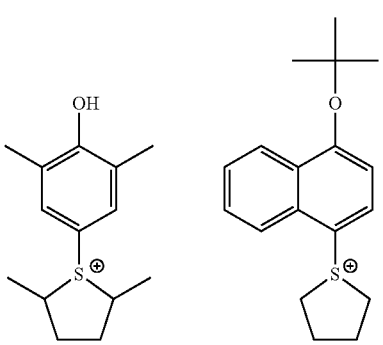
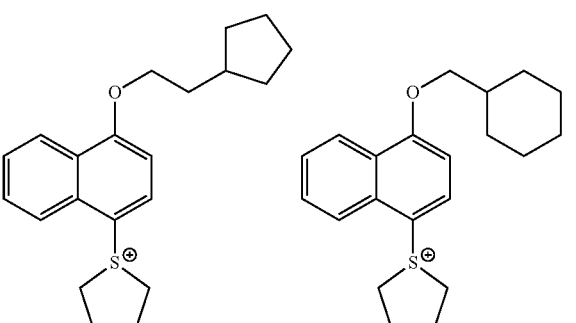
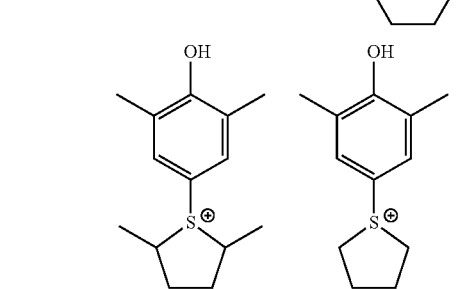
-continued
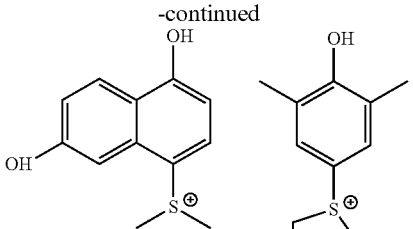
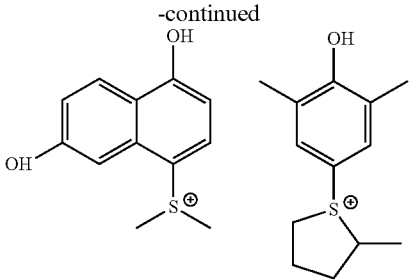
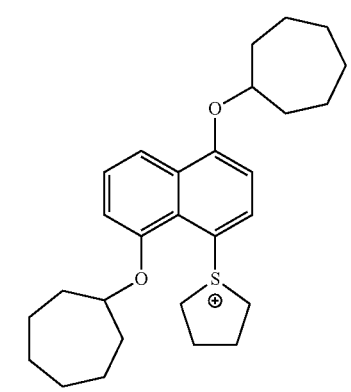
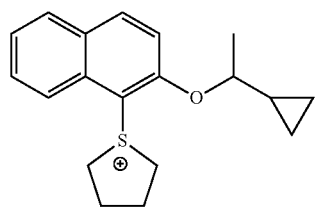
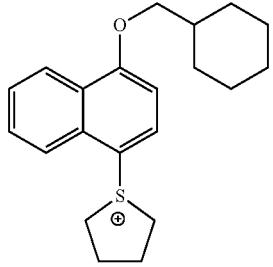
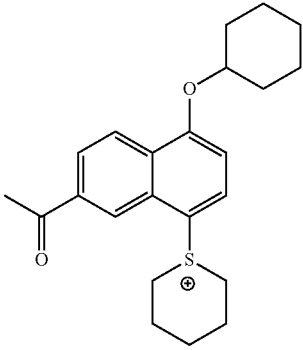

23
-continued
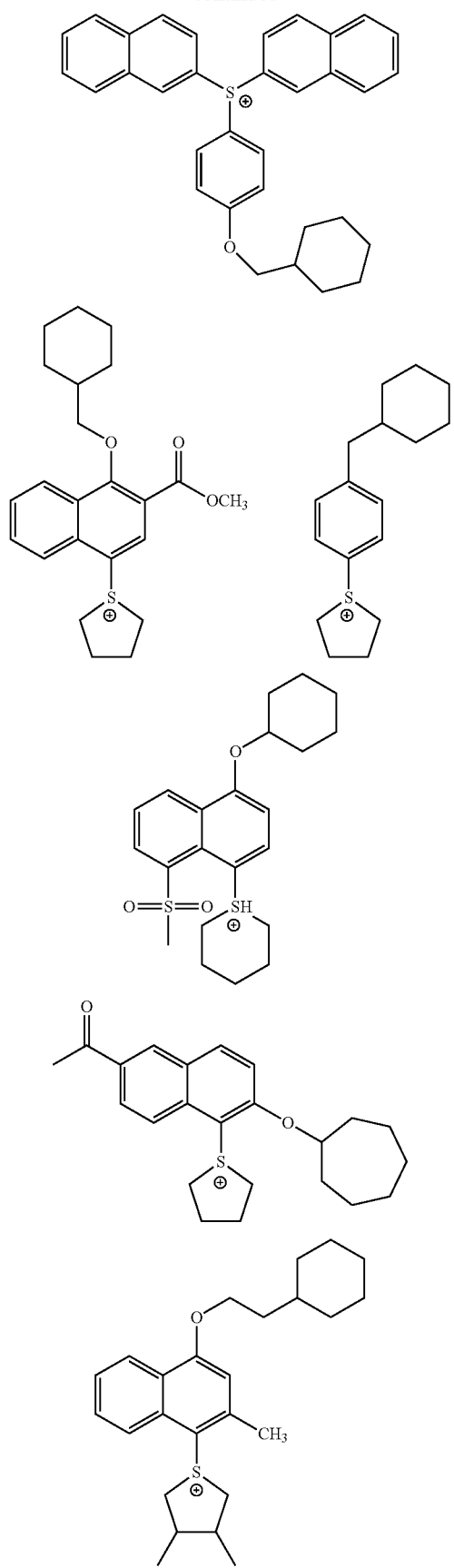
24
-continued
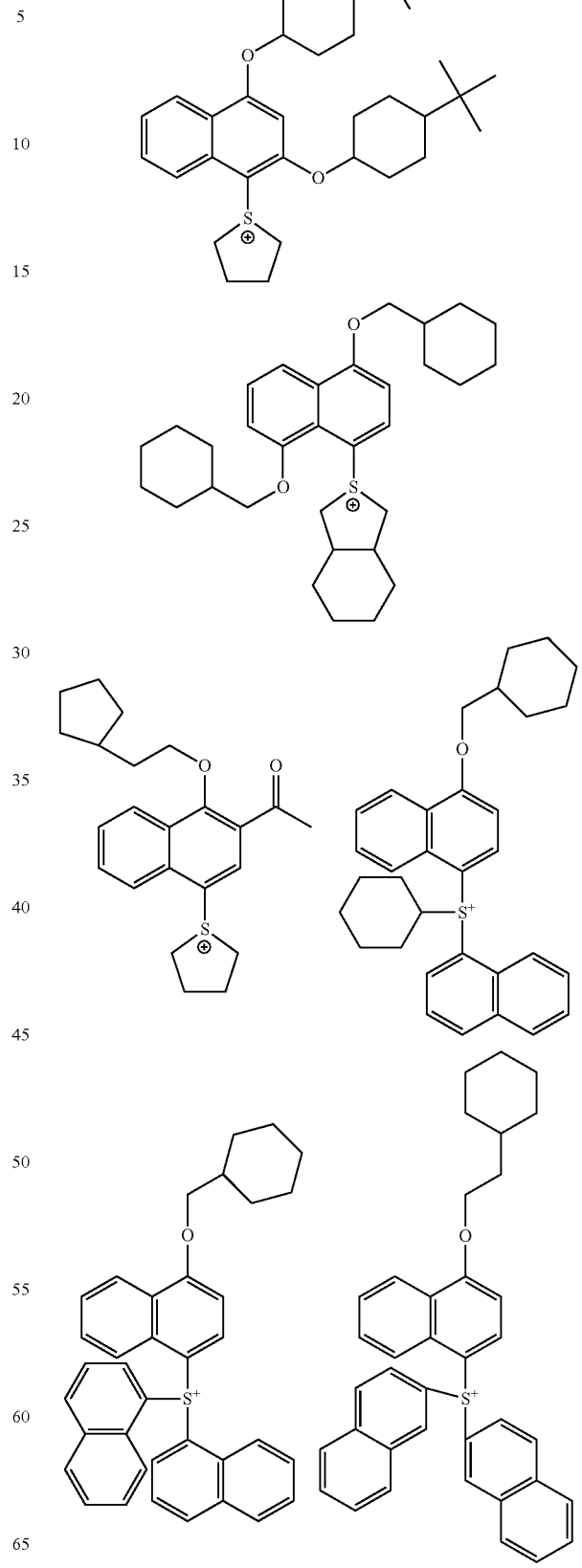

-continued

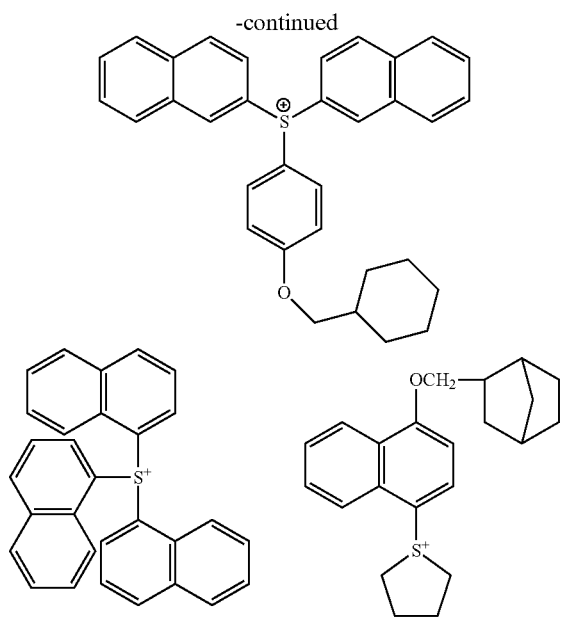

Now, the cations of general formula (CT2) will be described.

In general formula (CT2), each of $R_{204}$ and $R_{205}$ independently represents an aryl group, an alkyl group or a cycloalkyl group.

Particular examples and preferred forms of the aryl group, alkyl group and cycloalkyl group represented by each of $R_{204}$ and $R_{205}$ are the same as mentioned above with respect to the aryl group, alkyl group and cycloalkyl group represented by $R_{201}$ to $R_{203}$ in connection with the cation (CT1).

Substituents may be introduced in the aryl group, alkyl group and cycloalkyl group represented by each of $R_{204}$ and $R_{205}$. As the substituents, there can be mentioned those set forth above as being optionally introduced in the aryl group, alkyl group and cycloalkyl group represented by $R_{201}$ to $R_{203}$ in connection with the cation (CT1).

The cation represented by $A^+$ is also preferably any of those of general formula (AZ) below. High sensitivity, high resolution, good pattern shape and good line edge roughness can be simultaneously satisfied at a high level by employing this cation. The cations of general formula (AZ) below may be, or may not be azinium cations.

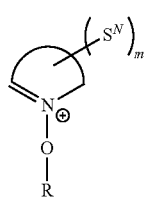

(AZ)

In the formula, R represents a monovalent substituent.

This moiety is a mono- or polycyclic nitrogenous heterocycle.

$S^N$ represents a substituent, and m is an integer of 0 or greater.

The substituent represented by R may be an organic group or an inorganic group. As the substituent, there can be mentioned, for example, an alkyl group, a cycloalkyl group, an aryl group, an alkenyl group, an alkynyl group, a substituted carbonyl group or a substituted sulfonyl group. Further substituents may be introduced in these groups.

The alkyl group represented by R may be in the form of a linear or branched chain. This alkyl group preferably has 1 to 50 carbon atoms, more preferably 1 to 30 carbon atoms and further more preferably 1 to 20 carbon atoms. As such an alkyl group, there can be mentioned, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group or a 2-ethylhexyl group.

The cycloalkyl group represented by R may be monocyclic or polycyclic. This cycloalkyl group preferably has 3 to 50 carbon atoms, more preferably 4 to 30 carbon atoms and further more preferably 5 to 20 carbon atoms. As the cycloalkyl group, there can be mentioned, for example, a cyclopentyl group, a cyclohexyl group, an adamantyl group or a norbornyl group.

The aryl group represented by R may be monocyclic or polycyclic. This aryl group may be a heteroaryl group. The aryl group represented by R preferably has 6 to 50 carbon atoms, more preferably 6 to 30 carbon atoms and further more preferably 6 to 20 carbon atoms. As the aryl group, there can be mentioned, for example, a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group or an ovalenyl group.

The alkenyl group represented by R may be in the form of a linear or branched chain. This alkenyl group preferably has 2 to 50 carbon atoms, more preferably 2 to 30 carbon atoms and further more preferably 3 to 20 carbon atoms. A further substituent may be introduced in the alkenyl group.

As such an alkenyl group, there can be mentioned, for example, a vinyl group, an allyl group or a styryl group.

The alkynyl group represented by R may be in the form of a linear or branched chain. This alkynyl group preferably has 2 to 50 carbon atoms, more preferably 2 to 30 carbon atoms and further more preferably 3 to 20 carbon atoms. A further substituent may be introduced in the alkynyl group.

As such an alkynyl group, there can be mentioned, for example, an ethynyl group, a propynyl group or a propargyl group.

The substituted carbonyl group represented by R is any of the groups of general formula: —CO—$R^{o13}$. $R^{o13}$ represents a group comprising a monovalent nonmetallic atomic group.

As the substituted carbonyl group, there can be mentioned, for example, a formyl group, an acyl group, a carboxyl group, an alkoxycarbonyl group, an aryloxycarbonyl group or a carbamoyl group. As the alkyl group and aryl group contained in these groups, there can be mentioned, for example, those set forth above as the groups represented by R.

The substituted sulfonyl group represented by R is any of the groups of general formula: —$SO_2$—$R^{o11}$. $R^{o11}$ represents a group comprising a monovalent nonmetallic atomic group.

As the substituted sulfonyl group, there can be mentioned, for example, an alkylsulfonyl group, an arylsulfonyl group or a sulfamoyl group. The sulfamoyl group may be substituted or unsubstituted. As the alkyl group and aryl group contained in these groups, there can be mentioned, for example, those set forth above as the groups represented by R.

The heterocycle containing a nitrogen atom appearing in general formula (AZ) may be an aromatic ring or a nonaromatic ring. This heterocycle may further contain a heteroatom, such as a nitrogen atom, an oxygen atom or a sulfur atom, other than the nitrogen atom of the formula. Moreover, this heterocycle may be monocyclic or polycyclic as mentioned above.

As such a heterocycle, there can be mentioned, for example, an imidazole ring, a pyridine ring, a pyrazine ring, a pyrimidine ring, a pyridazine ring, a 2H-pyrrole ring, a 3H-indole ring, a 1H-indazole ring, a purine ring, an isoquinoline ring, a 4H-quinolizine ring, a quinoline ring, a phthalazine ring, a naphthyridine ring, a quinoxaline ring, a quinazoline ring, a cinnoline ring, a pteridine ring, a phenanthridine ring, an acridine ring, a phenanthroline ring, a phenazine ring, a perimidine ring, a triazine ring, a benzisoquinoline ring, a thiazole ring, a thiadiazine ring, an azepine ring, an azocine ring, an isothiazole ring, an isooxazole ring or a benzothiazole ring. Among these rings, a pyridine ring and a quinoline ring are especially preferred.

As mentioned above, $S^N$ represents a substituent. As the substituent, there can be mentioned, for example, any of those set forth above in connection with R. A further substituent may be introduced in this substituent.

As mentioned above, m is an integer of 0 or greater. The upper limit of m is equal to the number of atoms that can be substituted with a substituent among the atoms constituting the heterocycle.

$X^-$ represents an anion. The anion represented by $X^-$ will be described in detail hereinafter.

The cations of general formula (AZ) above are preferably expressed by general formula (AZ-1) or (AZ-2) below. Namely, the heterocycle containing a nitrogen atom appearing in general formula (AZ) preferably contains a 6-membered ring or a 5-membered ring.

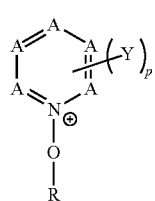

(AZ-1)

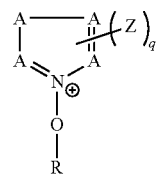

(AZ-2)

In the formulae,
each of A's independently represents a carbon atom, a nitrogen atom, an oxygen atom or a sulfur atom.

Y, or each of Y's independently, represents a substituent. At least two of Y's may be bonded to each other to thereby form a ring, and p is an integer of 0 to 5.

Z, or each of Z's independently, represents a substituent. At least two of Z's may be bonded to each other to thereby form a ring, and q is an integer of 0 to 4.

R is as defined above in connection with general formula (AZ).

In both of general formulae (AZ-1) and (AZ-2), the number of A's each representing a nitrogen atom, an oxygen atom or a sulfur atom among all the A's is preferably in the range of 0 to 2, more preferably 0 or 1.

As particular examples of Y's and Z's, there can be mentioned those set forth above in connection with $S^N$ of general formula (AZ). At least two of Y's, or Z's, may be bonded to each other to thereby form a ring. Namely, each of the cations of general formula (AZ-1) or (AZ-2) may have a condensed-ring structure.

The ring formed by the mutual bonding of Y's, or Z's may be an aromatic ring or a nonaromatic ring. This ring may be a heterocycle containing a heteroatom. The ring formed by the mutual bonding of Y's, or Z's is preferably a 5- to 7-membered ring, more preferably a 5- or 6-membered ring and most preferably a 6-membered ring.

Further, a substituent may be introduced in the ring formed by the mutual bonding of Y's, or Z's. As the substituent, there can be mentioned, for example, any of those set forth above in connection with $S^N$ of general formula (AZ).

When at least one of A's is a nitrogen atom, an oxygen atom or a sulfur atom, more preferably, the cations of general formula (AZ-1) are expressed by general formula (AZ-1A) or (AZ-1B) below.

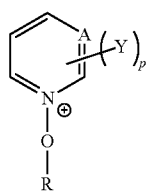

(AZ-1A)

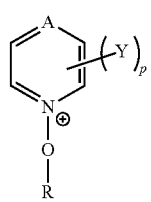

(AZ-1B)

In general formulae (AZ-1A) and (AZ-1B), A represents a nitrogen atom, an oxygen atom or a sulfur atom. Y, p and R are as defined above in connection with general formula (AZ-1).

When at least one of A's is a nitrogen atom, an oxygen atom or a sulfur atom, more preferably, the cations of general formula (AZ-2) are expressed by general formula (AZ-2A) below.

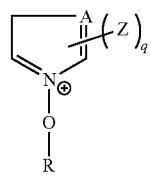

(AZ-2A)

In general formula (AZ-2A), A represents a nitrogen atom, an oxygen atom or a sulfur atom. Z, q and R are as defined above in connection with general formula (AZ-2).

Specific examples of the cation structures each containing a mono- or polycyclic nitrogenous heterocycle are shown below.

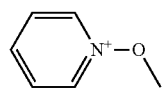

AZ-1

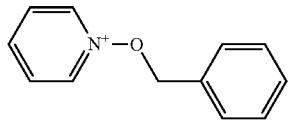

AZ-2

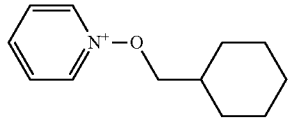

AZ-3

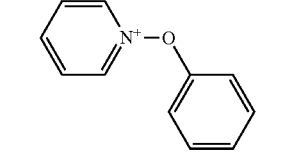

AZ-4

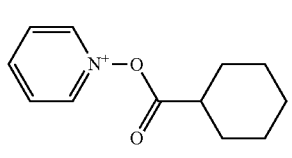

AZ-5

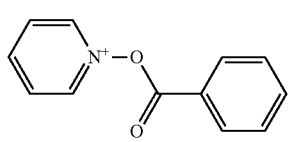

AZ-6

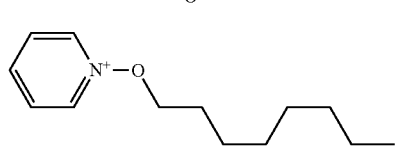

AZ-7

-continued

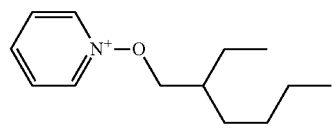

AZ-8

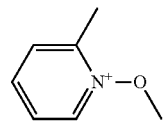

AZ-9

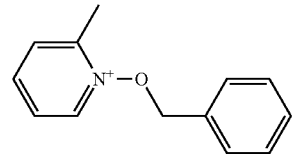

AZ-10

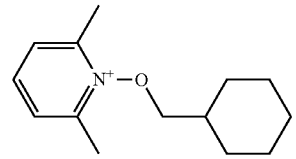

AZ-11

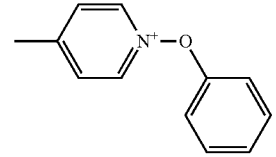

AZ-12

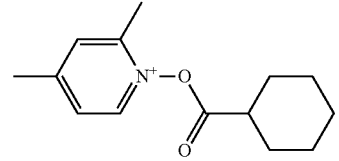

AZ-13

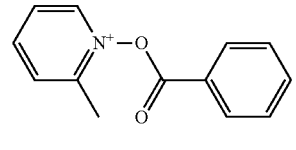

AZ-14

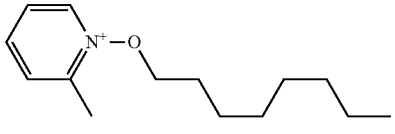

AZ-15

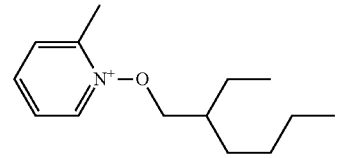

AZ-16

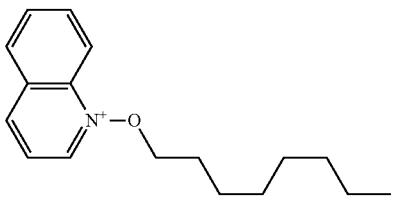

AZ-17

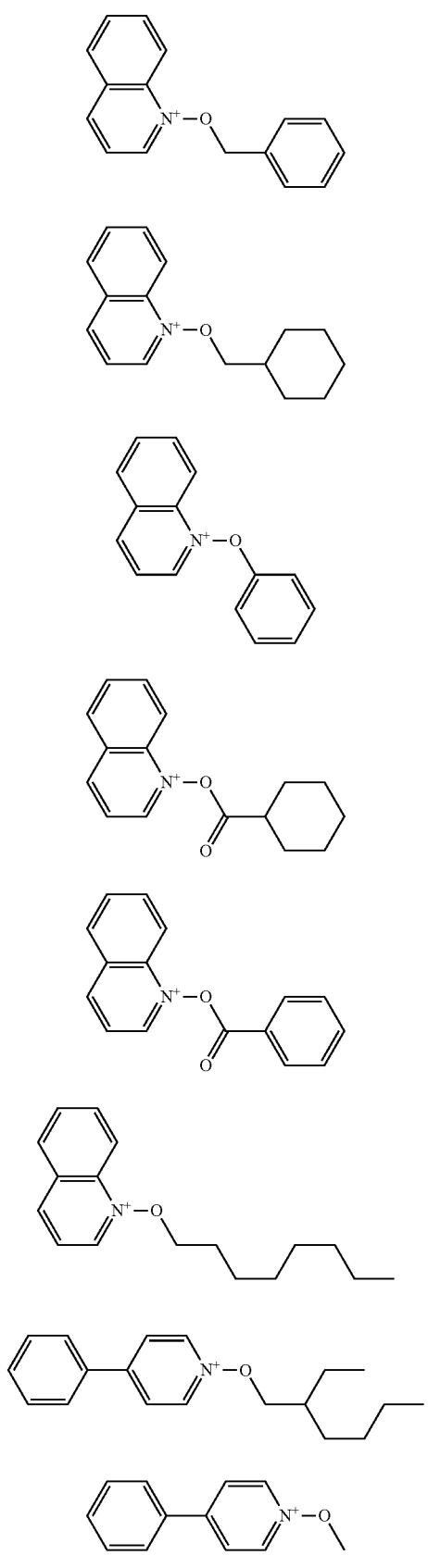
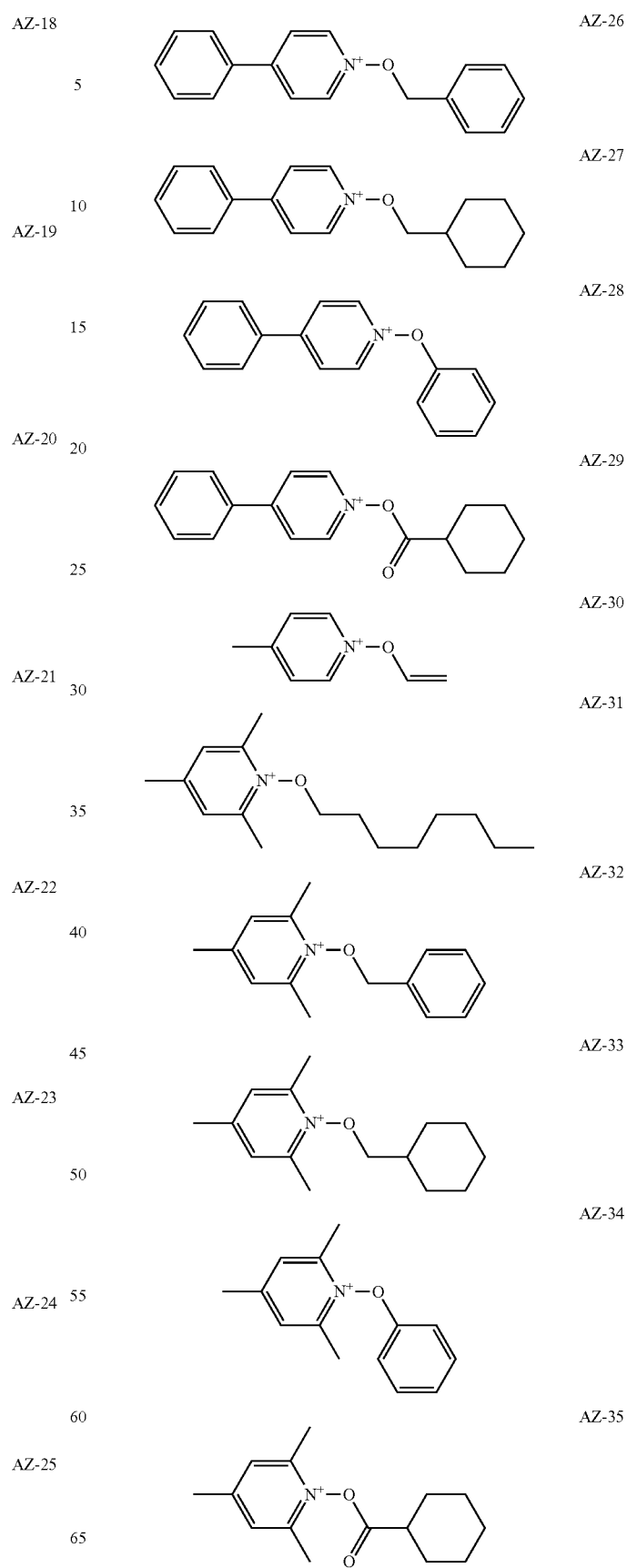

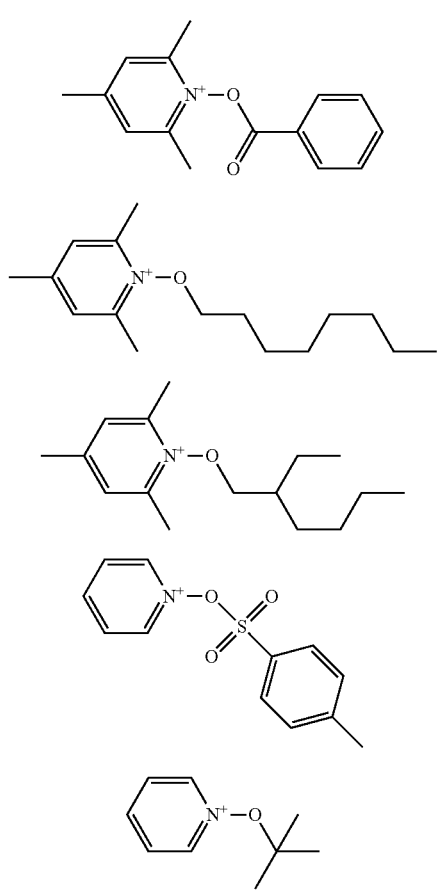

AZ-36
AZ-37
AZ-38
AZ-39
AZ-40

The cations of general formula (AZ) can be synthesized by, for example, the methods described in J. AM. CHEM. SOC. 2004, 126, 14071-14078 and J. AM. CHEM. SOC. 2002, 124, 15225-15238.

Specific examples of the structural moieties represented by $Z_1$ are shown below. The structures as obtained by substituting the cations of the following specific examples with the structures of general formula (AZ) above can be mentioned as preferred forms.

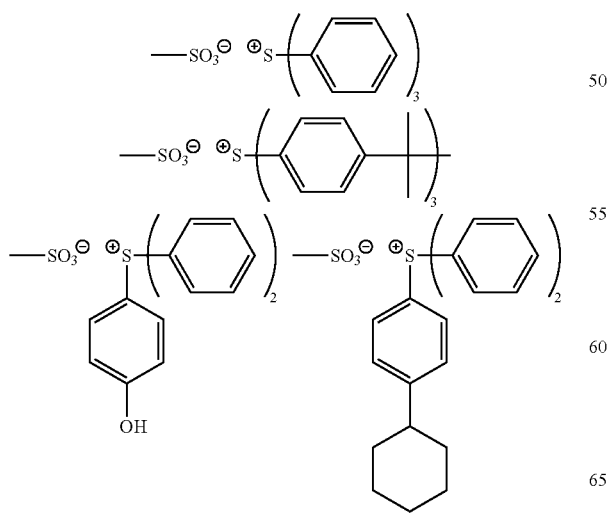

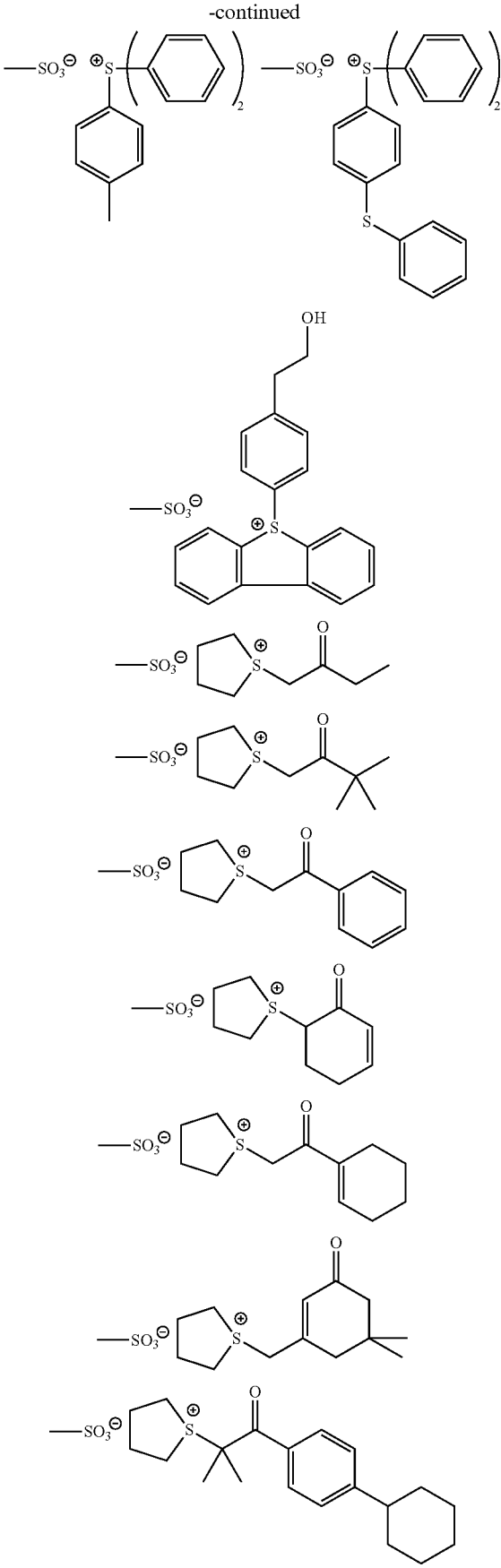

-continued
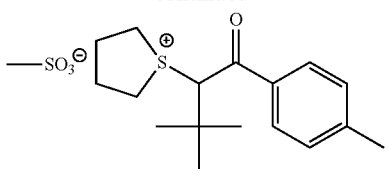
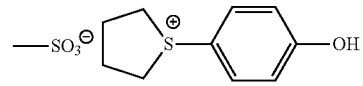
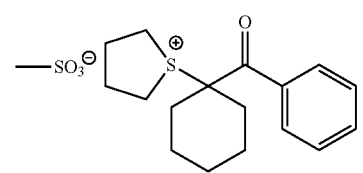
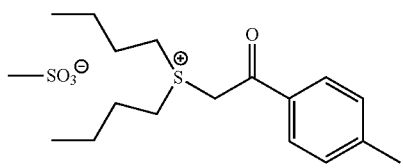
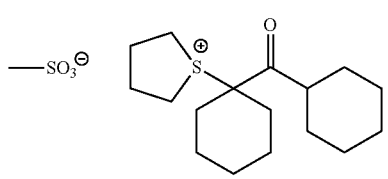
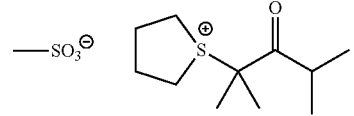
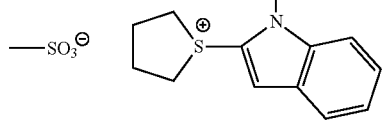
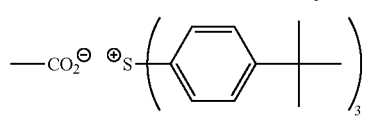
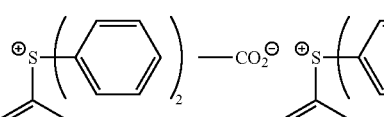
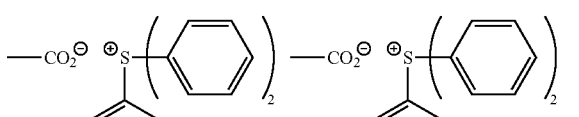
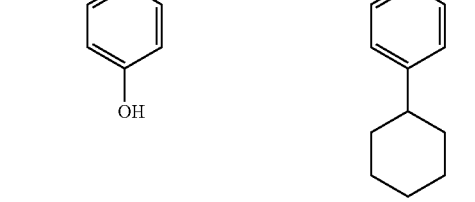
-continued
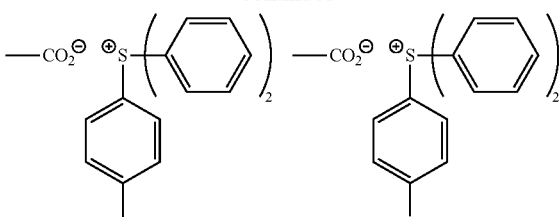
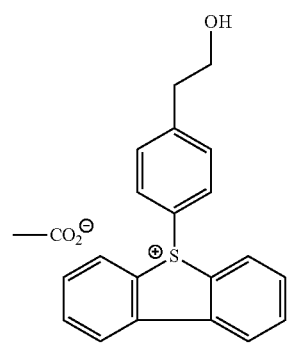
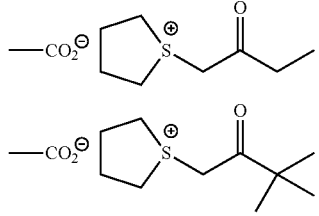
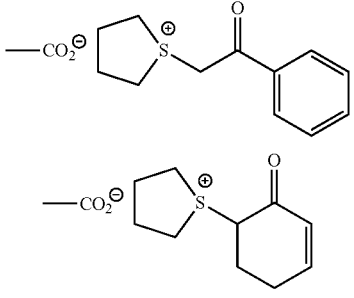
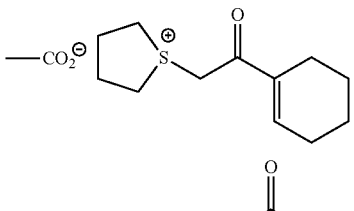
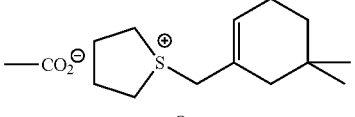
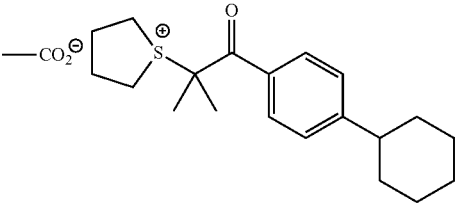

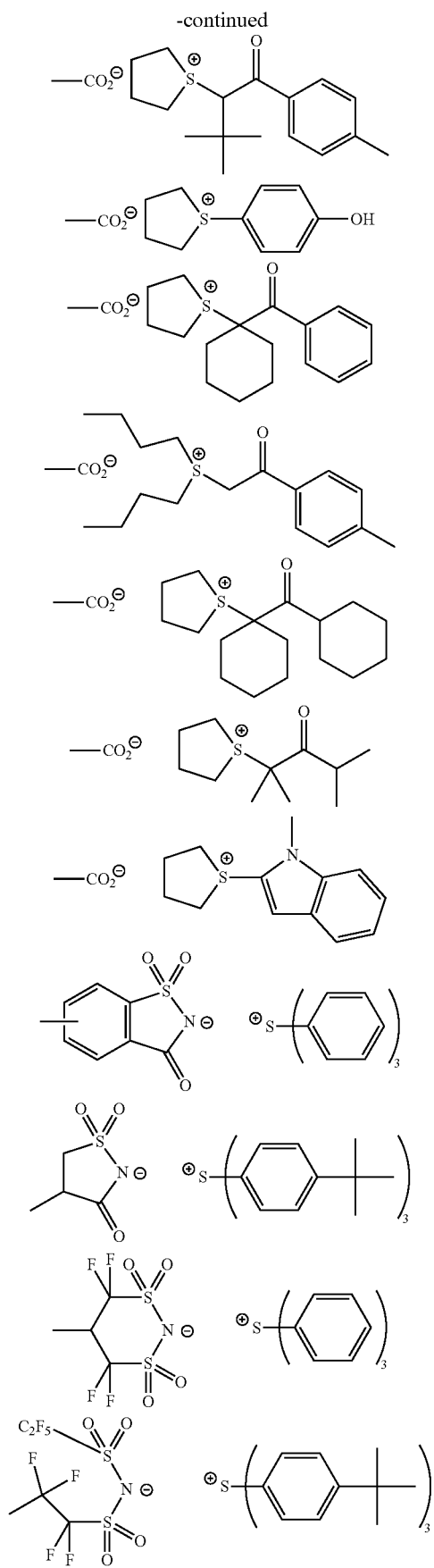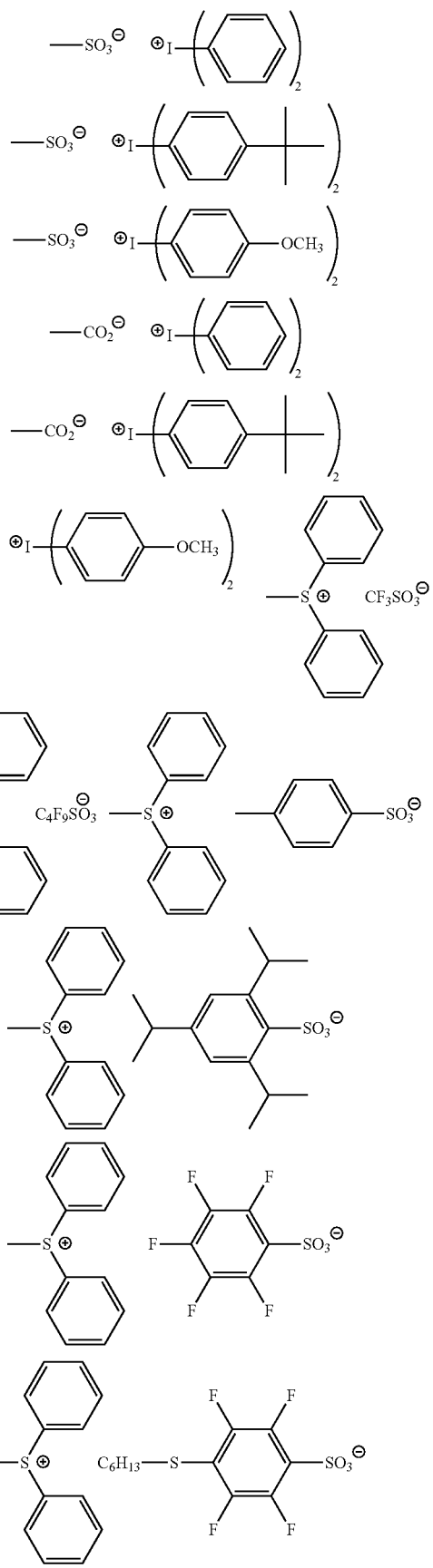

39
-continued
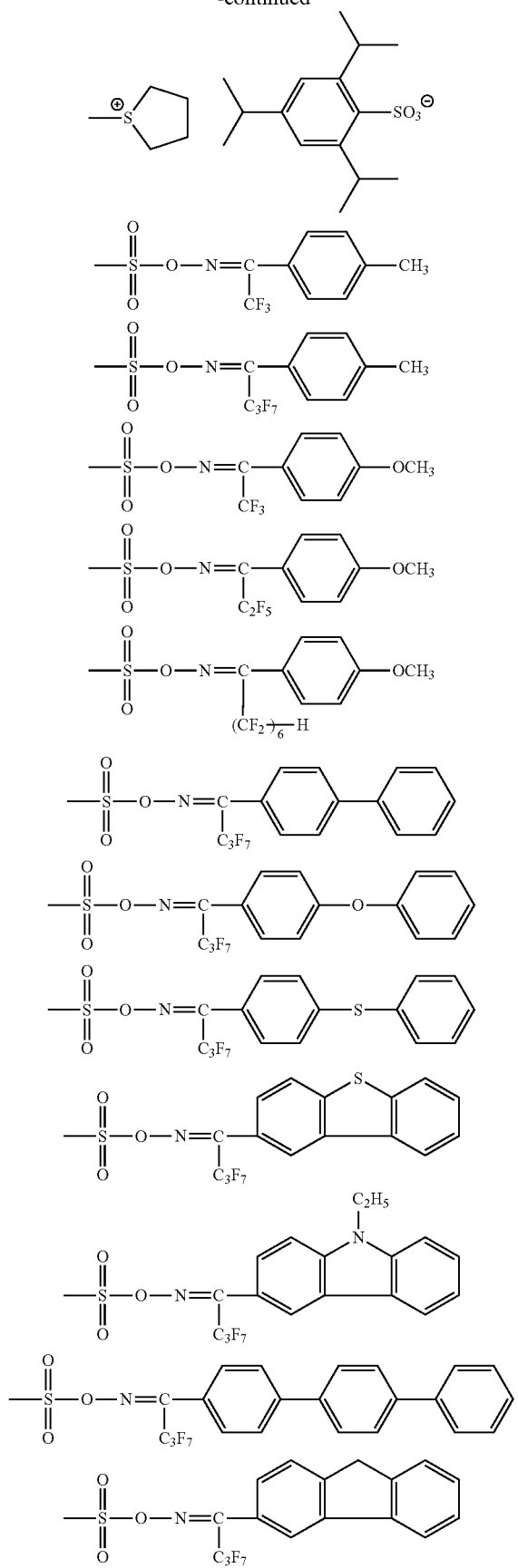
40
-continued
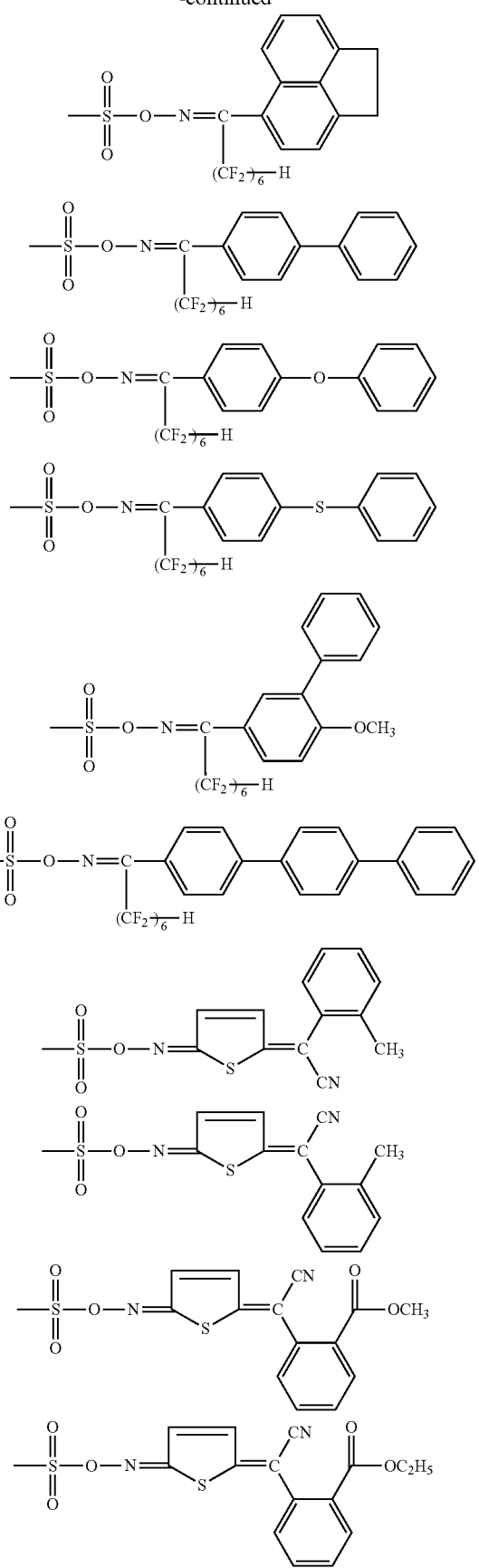

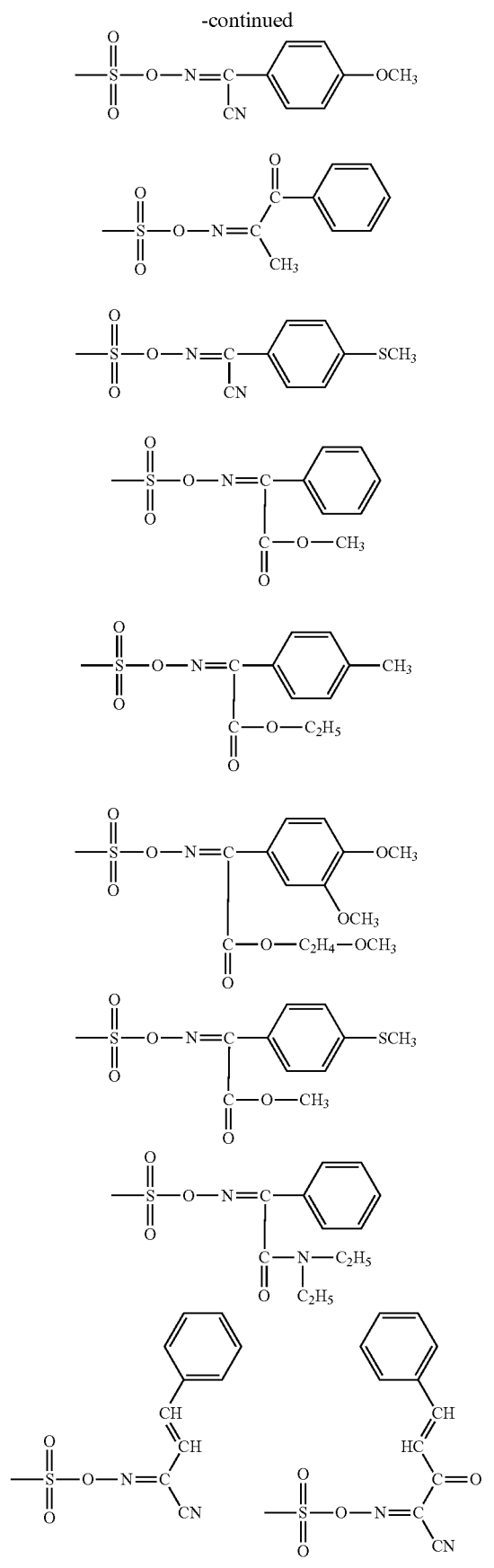
Specific examples of the polymerizable monomers corresponding to the repeating units of general formula (I) are shown below in the form of structures after the decomposition upon exposure to actinic rays or radiation.
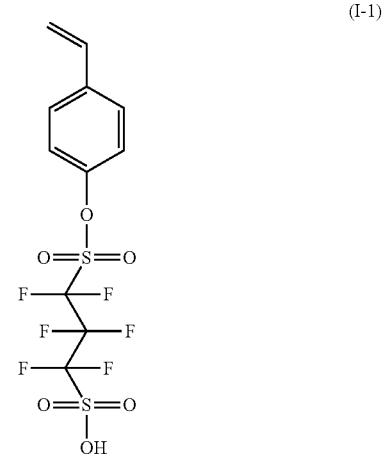
(I-1)
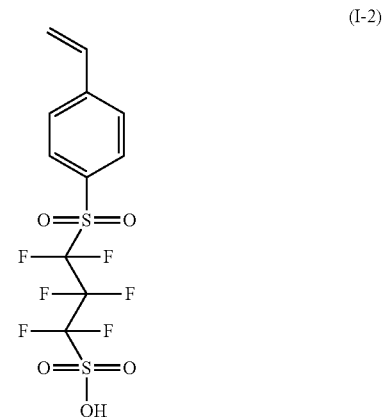
(I-2)
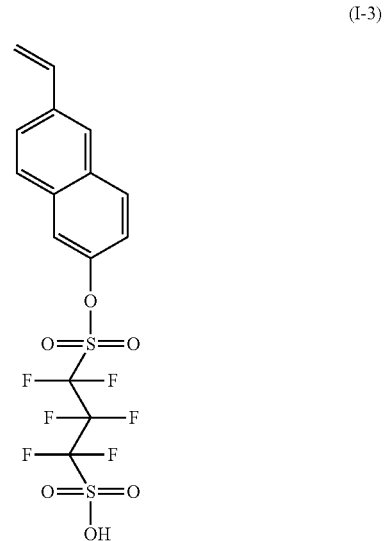
(I-3)

-continued
(I-4)
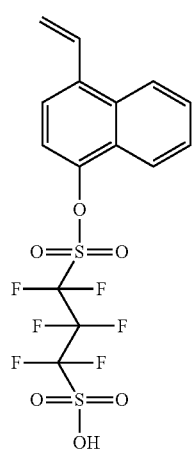
(I-5)
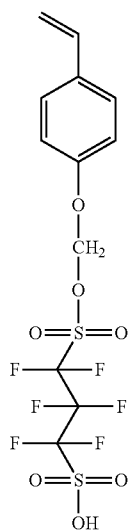
(I-6)
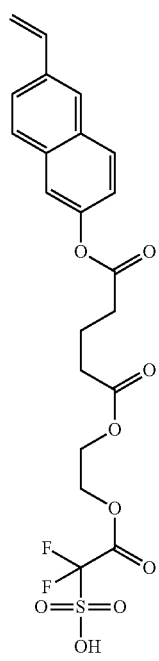
-continued
(I-7)
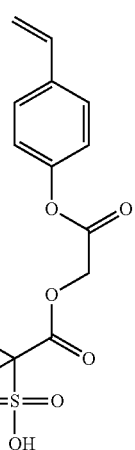
(I-8)
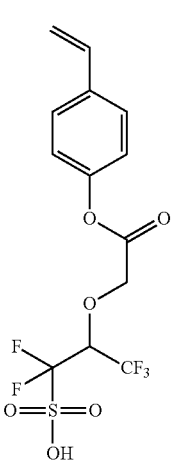
(I-9)
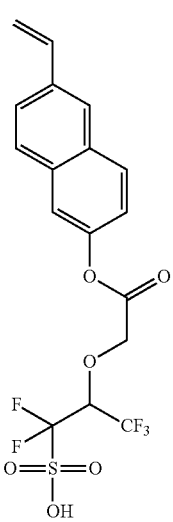

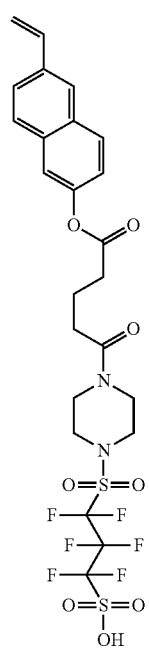
(I-10)
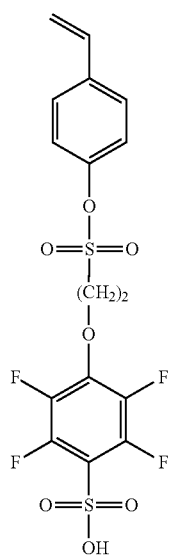
(I-11)
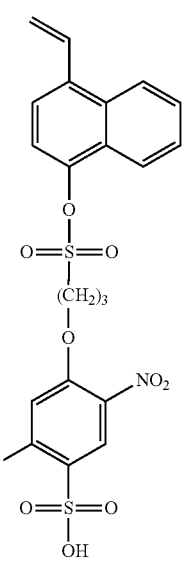
(I-12)
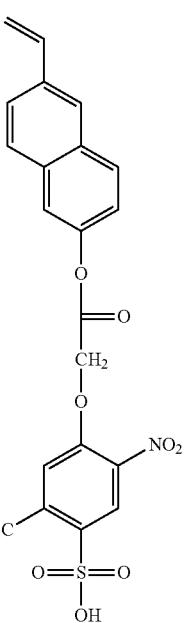
(I-13)

(I-14)
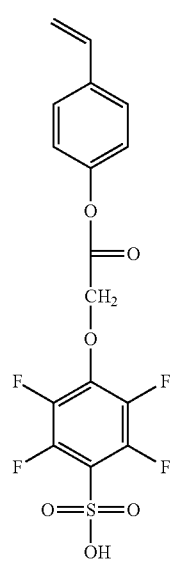
(I-15)
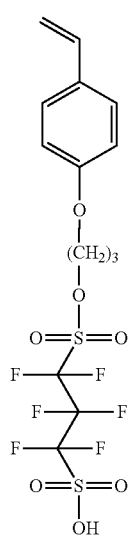
(I-16)
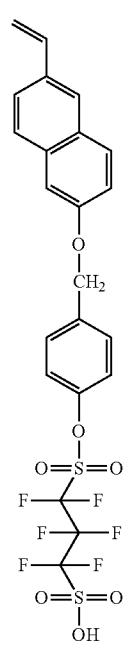
(I-17)
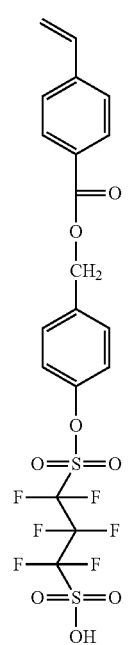

(I-18)
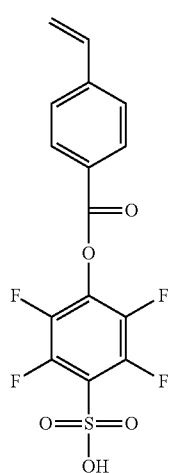
(I-19)
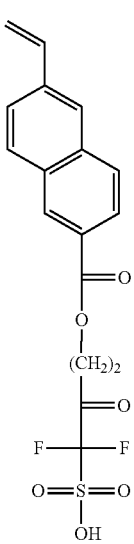
(I-20)
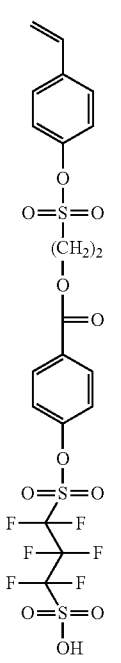
(I-21)
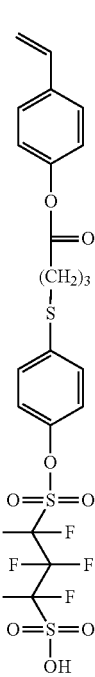
(I-22)
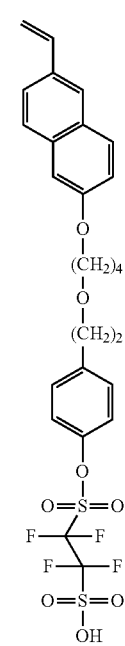

51
-continued
(I-22)
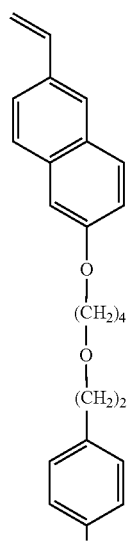
(I-23)
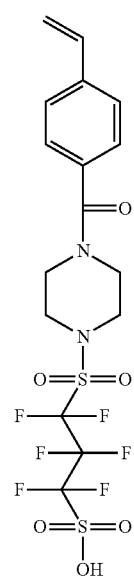
52
-continued
(I-24)
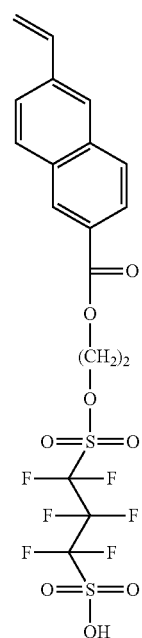
(I-25)
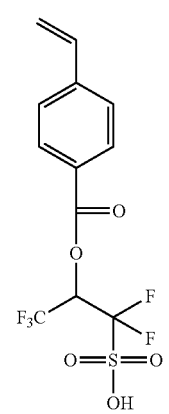
(I-26)
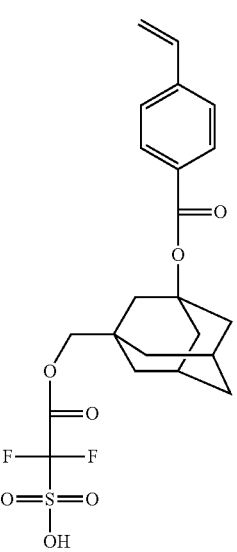

(I-27)
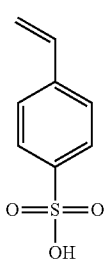
(I-28)
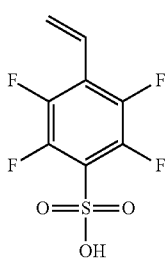
(I-29)
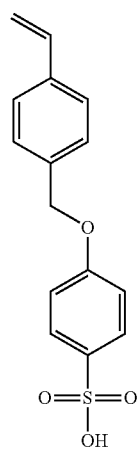
(I-30)
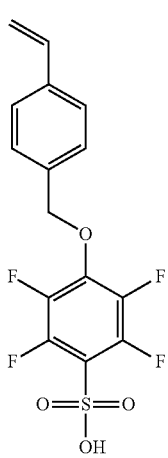
(I-31)
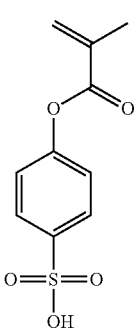
(I-32)
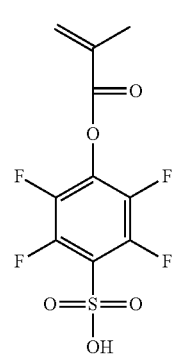
(I-33)
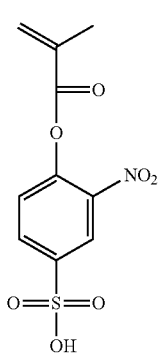
(I-34)
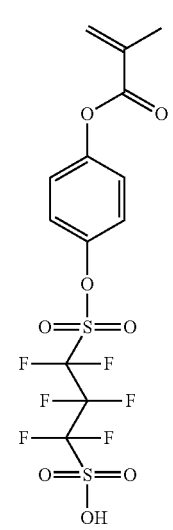

(I-35)
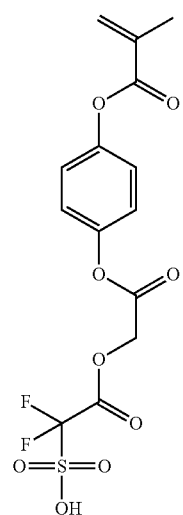
(I-36)
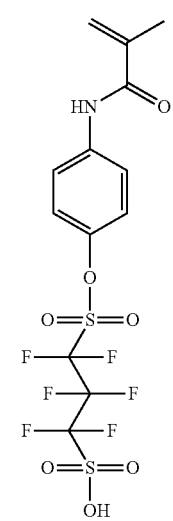
(I-37)
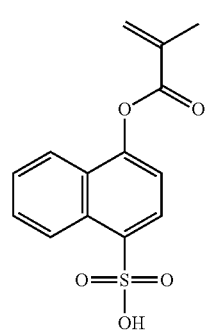
(I-38)
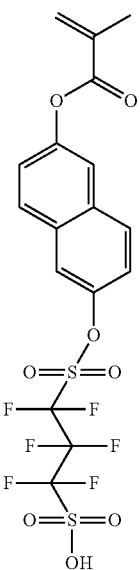
(I-39)
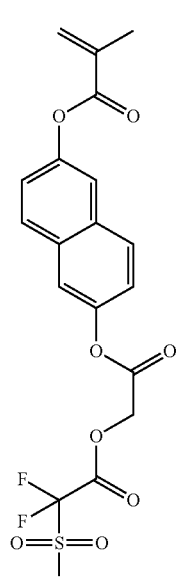
(I-40)
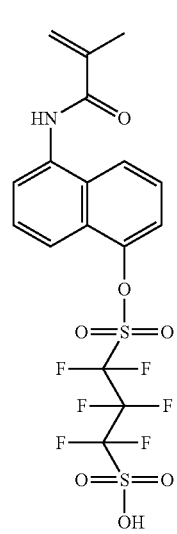

(I-41)
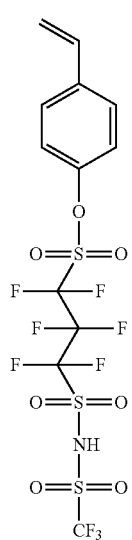
(I-42)
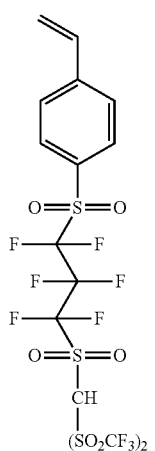
(I-43)
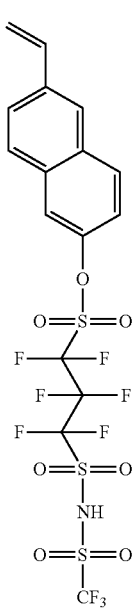
(I-44)
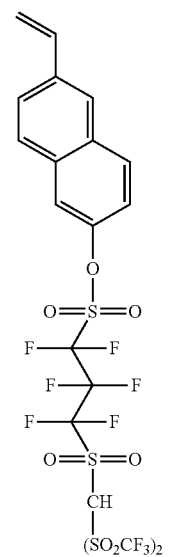
(I-45)
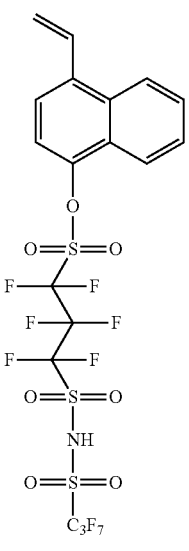

(I-46)
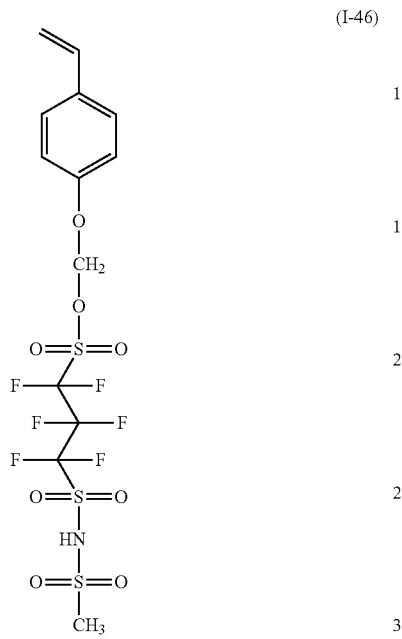
(I-47)
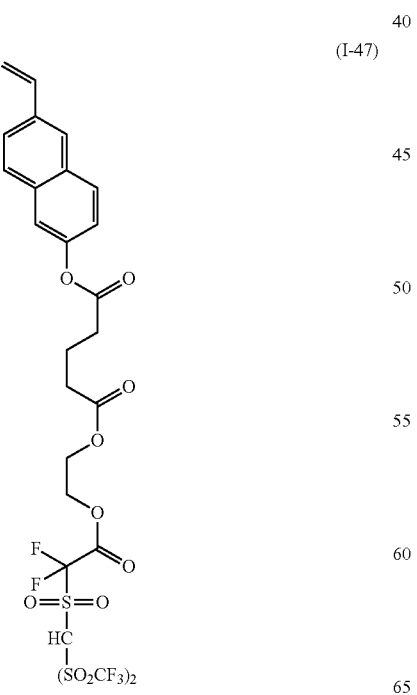
(I-48)
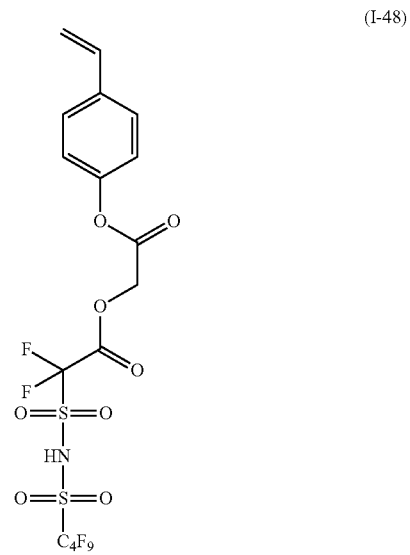
(I-49)
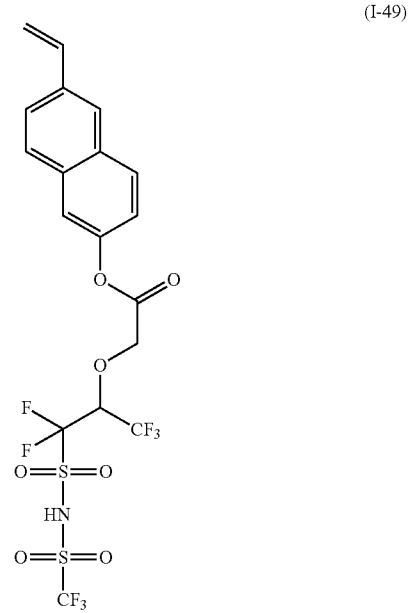

(I-50)
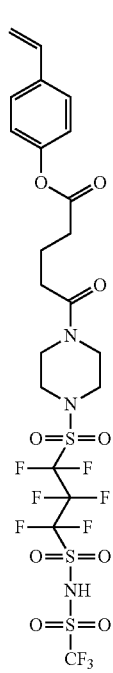
(I-51)
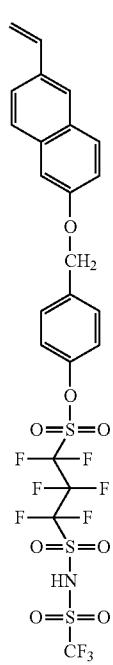
(I-52)
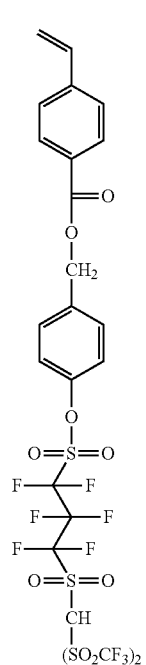
(I-53)
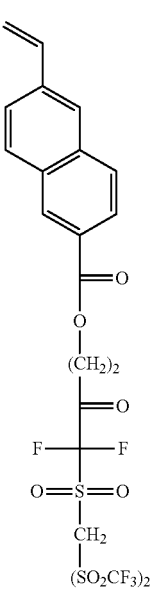

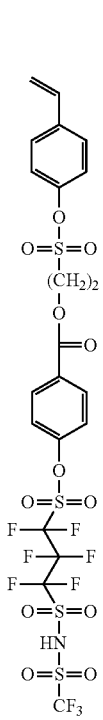 (I-54)
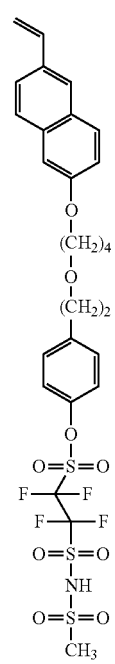 (I-56)
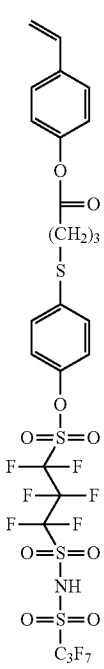 (I-55)
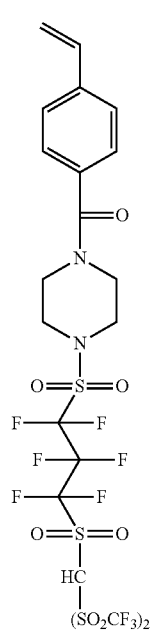 (I-57)

(I-58)
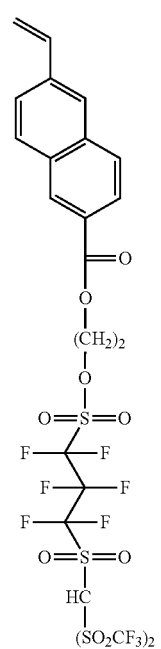
(I-59)
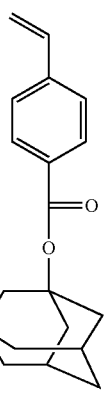
(I-60)
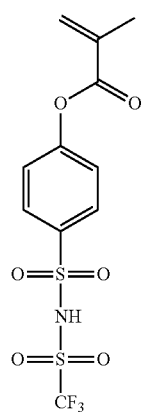
(I-61)
(I-62)
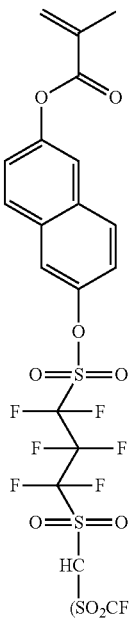

(I-63)

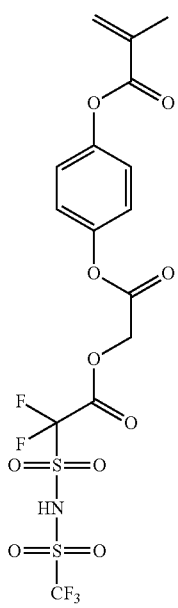

(I-64)

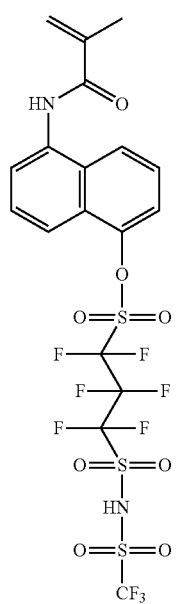

(I-65)

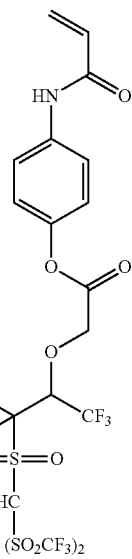

Below, general formula (II) will be described.

In general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{21}$, $R_{22}$ and $R_{23}$.

As the monovalent aliphatic hydrocarbon ring group, there can be mentioned an optionally substituted mono- or polycyclic aliphatic hydrocarbon ring group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is most preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{21}$ to $R_{23}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (II), each of $R_{21}$, $R_{22}$ and $R_{23}$ is preferably a hydrogen atom, an alkyl group or a halogen atom. A hydrogen atom, a methyl group, an ethyl group, a trifluoromethyl group ($-CF_3$), a hydroxymethyl group ($-CH_2-OH$), a chloromethyl group ($-CH_2-Cl$) and a fluorine atom ($-F$) are especially preferred.

$X_{21}$ represents $-O-$, $-S-$, $-CO-$, $-SO_2-$, $-NR-$ (R represents a hydrogen atom or an alkyl group), a bivalent nitrogenous nonaromatic heterocyclic group or a group composed of a combination of these.

With respect to $-NR-$, the alkyl group represented by R is an optionally substituted linear or branched alkyl group. Particular examples of the alkyl groups are the same as those of the above alkyl groups represented by $R_{21}$, $R_{22}$ and $R_{23}$. R is most preferably a hydrogen atom, a methyl group or an ethyl group.

The bivalent nitrogenous nonaromatic heterocyclic group refers to a nonaromatic heterocyclic group that contains at least one nitrogen atom and that are preferably 3 to 8-membered. In particular, there can be mentioned the structures shown above by way of example in connection with $X_{11}$ to $X_{13}$ of general formula (I).

Preferably, $X_{21}$ is $-O-$, $-CO-$, $-NR-$ (R represents a hydrogen atom or an alkyl group) or a group composed of a combination of these. $-COO-$ and $-CONR-$ (R represents a hydrogen atom or an alkyl group) are especially preferred.

$L_{21}$ represents an alkylene group, an alkenylene group, a bivalent aliphatic hydrocarbon ring group or a group composed of a combination of two or more of these. In the group composed of a combination, two or more groups combined together may be identical to or different from each other and may be linked to each other through, as a connecting group, $-O-$, $-S-$, $-CO-$, $-SO_2-$, $-NR-$ (R represents a hydrogen atom or an alkyl group), a bivalent nitrogenous nonaromatic heterocyclic group, a bivalent aromatic ring group or a group composed of a combination of these.

The alkylene group represented by $L_{21}$ may be linear or branched. As preferred examples thereof, there can be mentioned alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group mentioned above in connection with $L_{21}$.

The bivalent aliphatic hydrocarbon ring group may be monocyclic or polycyclic. As preferred examples thereof, there can be mentioned bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group. A bivalent aliphatic hydrocarbon ring group having 5 to 12 carbon atoms is more preferred. A bivalent aliphatic hydrocarbon ring group having 6 to 10 carbon atoms is most preferred.

As the bivalent aromatic ring group being a connecting group, there can be mentioned, for example, an optionally substituted arylene group having 6 to 14 carbon atoms, such as a phenylene group, a tolylene group or a naphthylene group, or a bivalent aromatic ring group containing a heteroring, such as thiophene, furan, pyrrole, benzothiophene, benzofuran, benzopyrrole, triazine, imidazole, benzimidazole, triazole, thiadiazole or triazole.

Particular examples of the $-NR-$ and bivalent nitrogenous nonaromatic heterocyclic groups are the same as set forth above in connection with $X_{21}$. Preferred examples are also the same.

Most preferably, $L_{21}$ is an alkylene group, a bivalent aliphatic hydrocarbon ring group or a group comprising alkylene groups and/or bivalent aliphatic hydrocarbon ring groups combined together through $-COO-$, $-O-$ or $-CONH-$ (for example, -alkylene-O-alkylene-, -alkylene-OCO-alkylene-, -bivalent aliphatic hydrocarbon ring group-O-alkylene-, -alkylene-CONH-alkylene- or the like).

Each of $X_{22}$ and $X_{23}$ independently represents a single bond, $-O-$, $-S-$, $-CO-$, $-SO_2-$, $-NR-$ (R represents a hydrogen atom or an alkyl group), a bivalent nitrogenous nonaromatic heterocyclic group or a group composed of a combination of these.

Particular examples of the $-NR-$ and bivalent nitrogenous nonaromatic heterocyclic groups represented by $X_{22}$ and $X_{23}$ are the same as set forth above in connection with $X_{21}$. Preferred examples are also the same.

$X_{22}$ is preferably a single bond, $-S-$, $-O-$, $-CO-$, $-SO_2-$ or a group composed of a combination of these, most preferably a single bond, $-S-$, $-OCO-$ or $-OSO_2-$.

$X_{23}$ is preferably $-O-$, $-CO-$, $-SO_2-$ or a group composed of a combination of these, most preferably $-OSO_2-$.

$Ar_2$ represents a bivalent aromatic ring group, or a group composed of a combination of a bivalent aromatic ring group and an alkylene group.

A substituent may be introduced in the bivalent aromatic ring group. As preferred examples of the bivalent aromatic ring groups, there can be mentioned an arylene group having 6 to 18 carbon atoms, such as a phenylene group, a tolylene group or a naphthylene group, and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

As preferred substituents that can be introduced in these groups, there can be mentioned any of the alkyl groups set forth above with respect to $R_{21}$ to $R_{23}$; an alkoxy group, such as a methoxy group, an ethoxy group, a hydroxyethoxy group, a propoxy group, a hydroxypropoxy group or a butoxy group; and an aryl group, such as a phenyl group.

As a preferred example of the group composed of a combination of a bivalent aromatic ring group and an alkylene group, there can be mentioned an aralkylene group composed of a combination of the above-mentioned bivalent aromatic ring group and, for example, an alkylene group (linear or branched) having 1 to 8 carbon atoms, such as a methylene group, an ethylene group, a propylene group, a butylene group, a hexylene group or an octylene group.

$Ar_2$ is preferably an optionally substituted arylene group having 6 to 18 carbon atoms or an aralkylene group consisting of an arylene group having 6 to 18 carbon atoms combined with an alkylene having 1 to 4 carbon atoms. $Ar_2$ is most preferably a phenylene group, a naphthylene group, a biphenylene group or a phenylene group substituted with a phenyl group.

$L_{22}$ represents an alkylene group, an alkenylene group, a bivalent aliphatic hydrocarbon ring group, a bivalent aromatic ring group or a group composed of a combination of two or more of these, provided that the hydrogen atoms of each of these groups are partially or entirely substituted with a substituent selected from among a fluorine atom, a fluoroalkyl group, a nitro group and a cyano group. In the group composed of a combination, two or more groups combined together may be identical to or different from each other and may be linked to each other through, as a connecting group, —O—, —S—, —CO—, —SO$_2$—, —NR— (R represents a hydrogen atom or an alkyl group), a bivalent nitrogenous nonaromatic heterocyclic group or a group composed of a combination of these;

Preferably, $L_{22}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group and bivalent aromatic ring group at least partially or entirely substituted with a fluorine atom are especially preferred. $L_{22}$ is most preferably an alkylene group or bivalent aromatic ring group, 30 to 100% of the hydrogen atoms of which are substituted with a fluorine atom.

The alkylene group represented by $L_{22}$ may be linear or branched. As preferred examples thereof, there can be mentioned alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group.

Particular examples of the bivalent aromatic ring groups are the same as set forth above with respect to the bivalent aromatic ring group as a connecting group in $L_{21}$.

Particular examples of the —NR— and bivalent nitrogenous nonaromatic heterocyclic groups as connecting groups in $L_{22}$ are the same as set forth above in connection with $X_{21}$. Preferred examples are also the same.

As preferred specific examples of the groups represented by $L_{22}$, there can be mentioned the structures set forth above by way of example in connection with $L_{12}$ of general formula (I).

$Z_2$ has the same meaning as $Z_1$ of general formula (I). The above description regarding $Z_1$ applies to $Z_2$. Further, particular examples thereof are also the same as set forth above in connection with $Z_1$.

Specific examples of the polymerizable monomers corresponding to the repeating units of general formula (II) are shown below in the form of structures after the decomposition upon exposure to actinic rays or radiation.

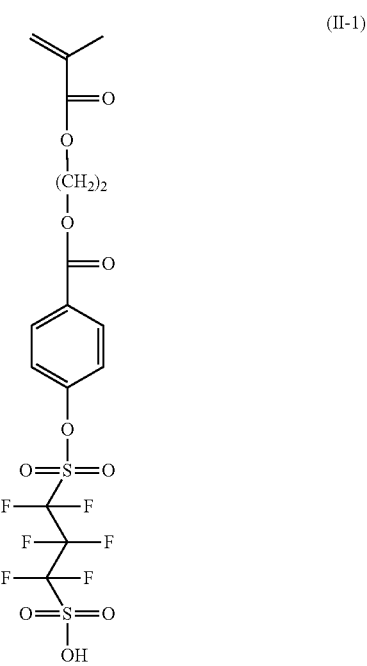

(II-1)

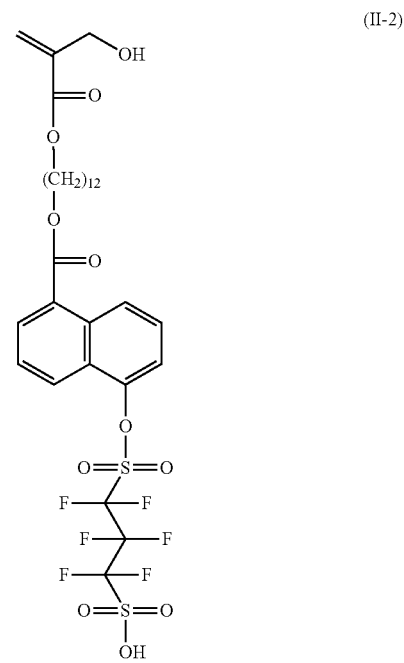

(II-2)

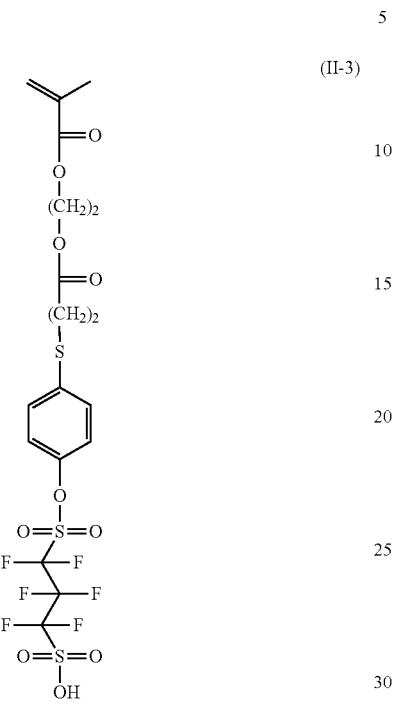
(II-3)
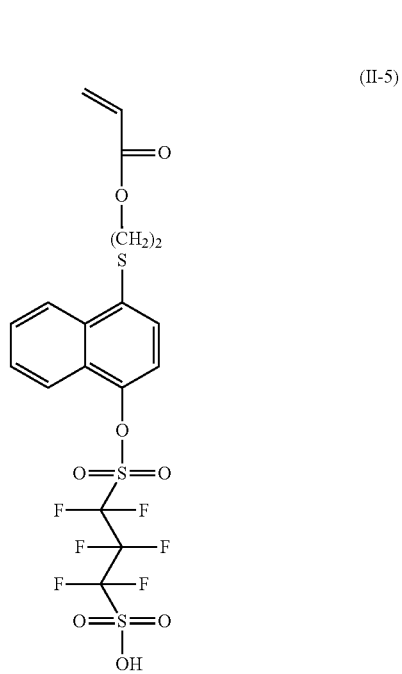
(II-5)
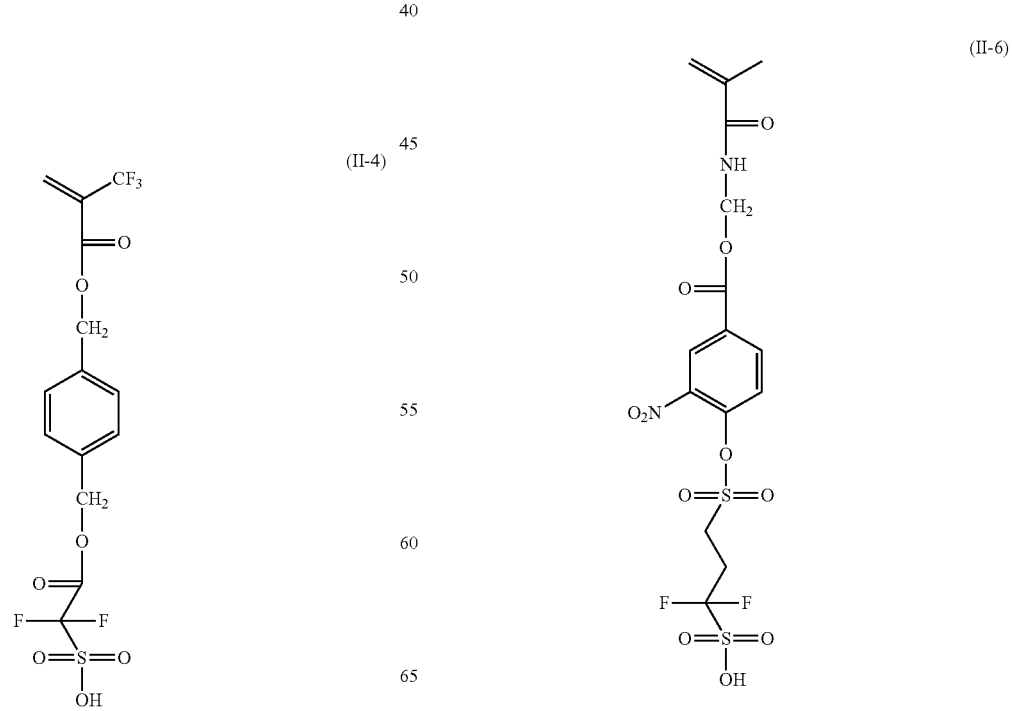
(II-4)
(II-6)

(II-7)
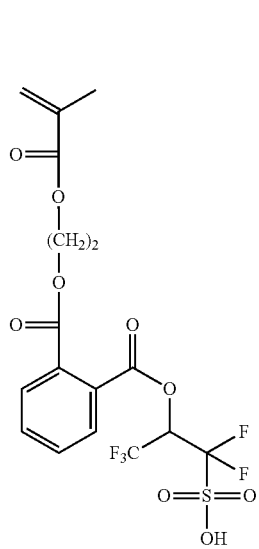
(II-8)
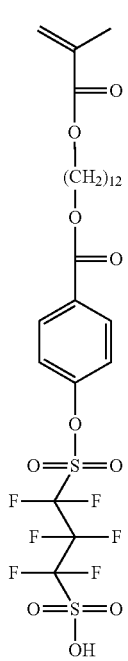
(II-9)
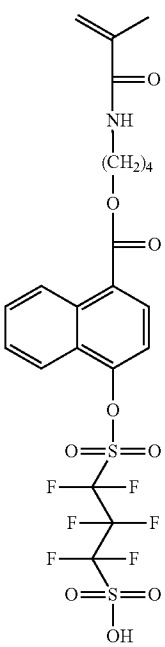
(II-10)
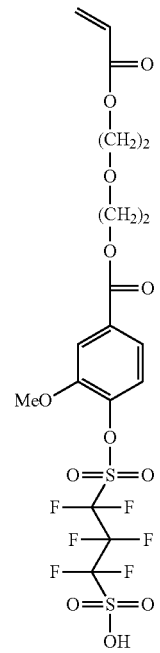

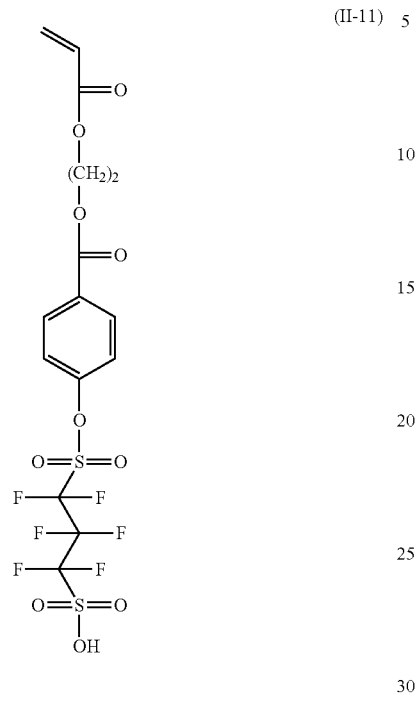
(II-11)
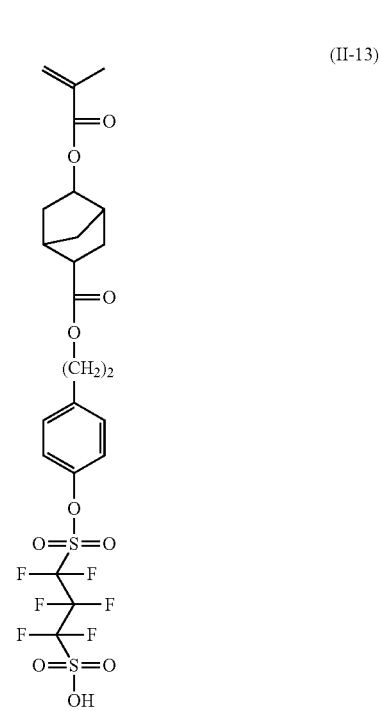
(II-13)
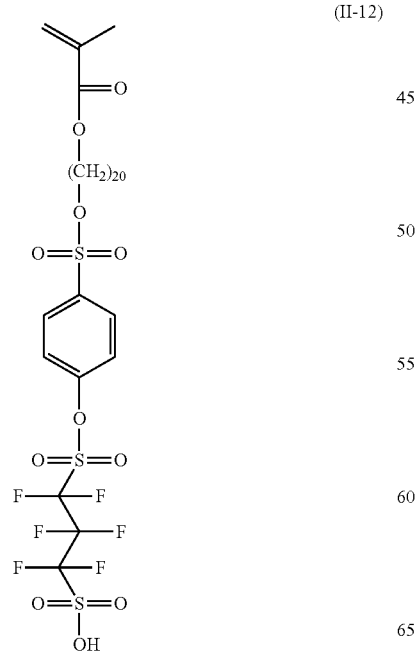
(II-12)
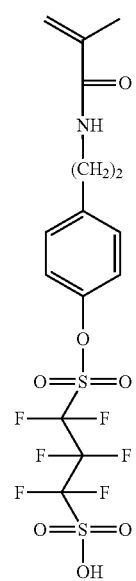
(II-14)

(II-15)
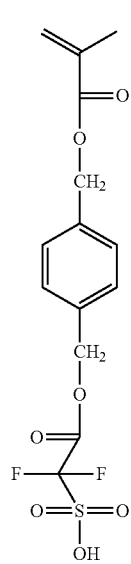
(II-16)
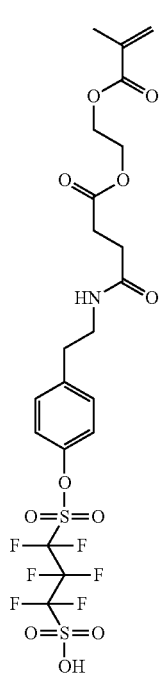
(II-17)
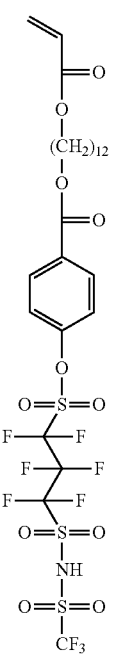
(II-18)
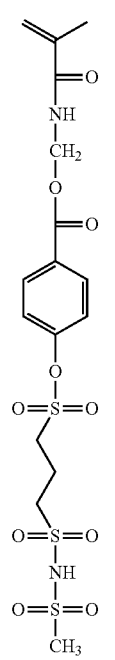

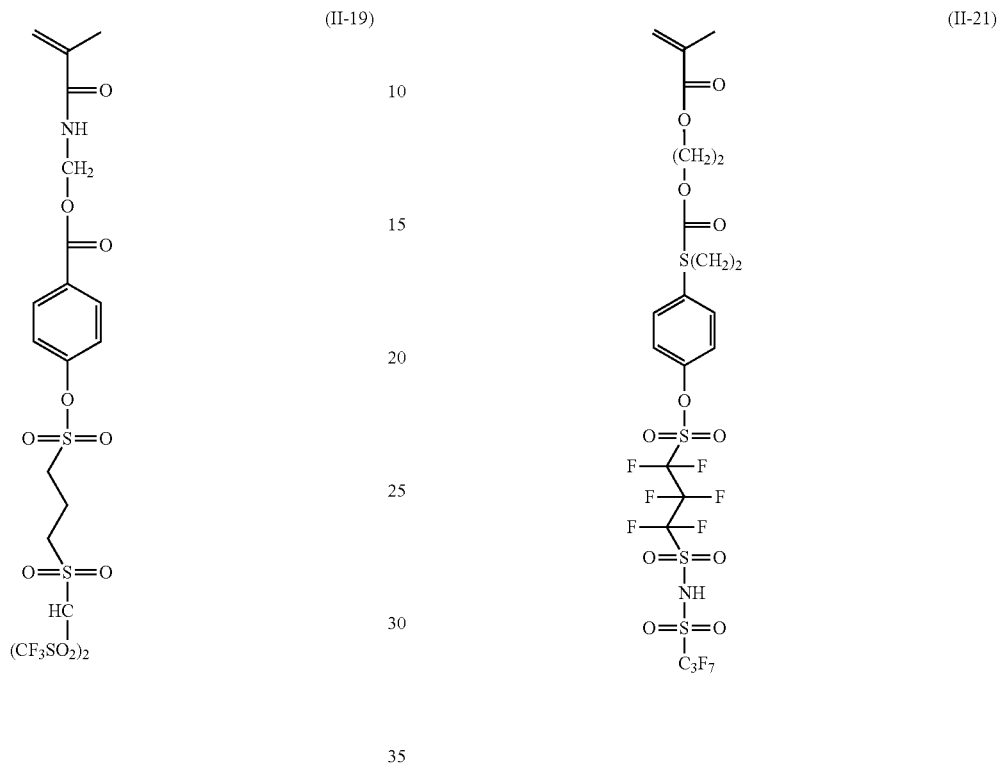
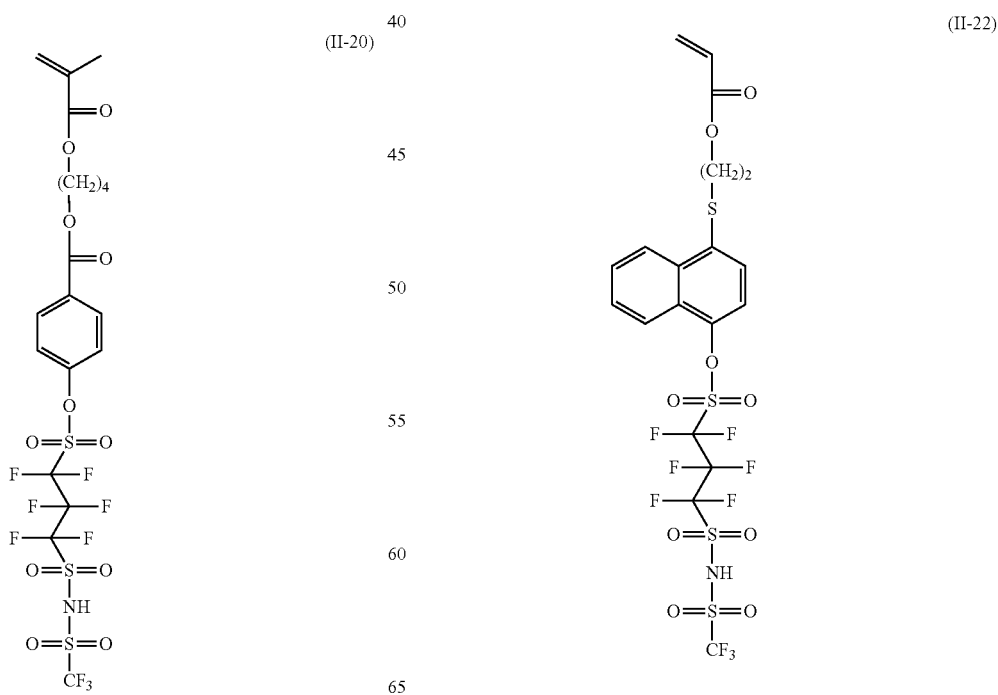

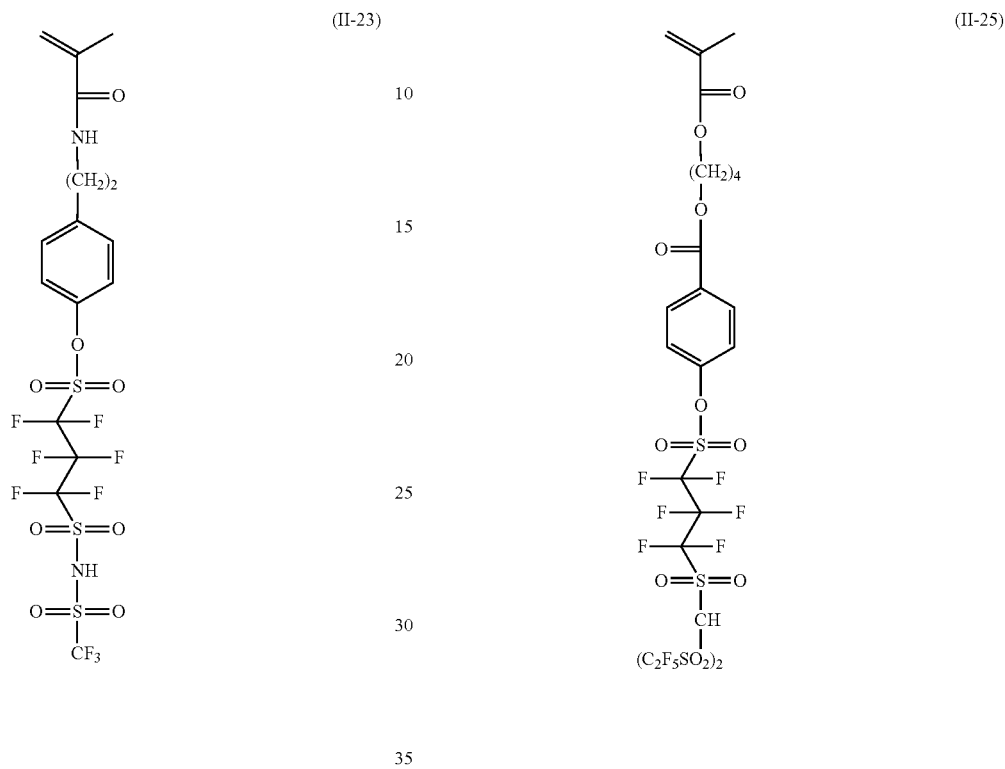
(II-23)
(II-24)
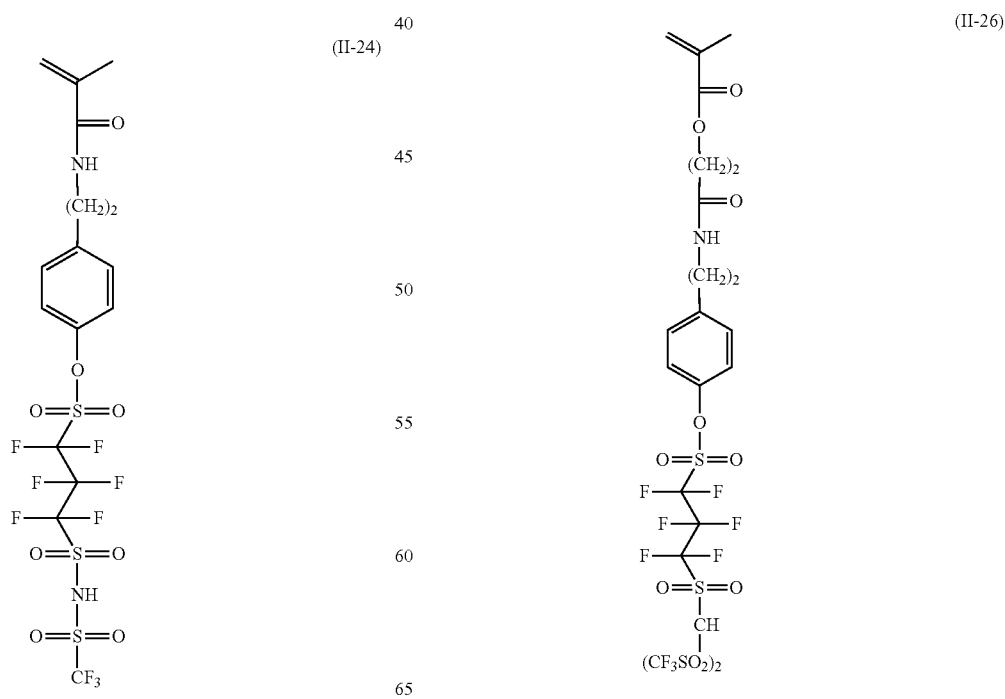
(II-25)
(II-26)

(II-27)

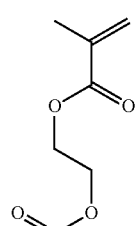

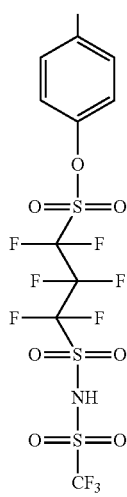

The repeating unit (A) in its other form may be a repeating unit other than those of general formula (I) and general formula (II).

Specific examples of the polymerizable monomers corresponding to such other repeating units are shown below in the form of structures after the decomposition upon exposure to actinic rays or radiation.

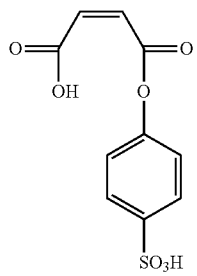 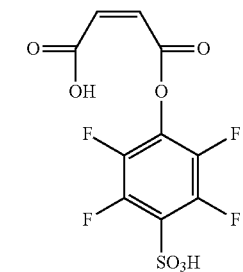

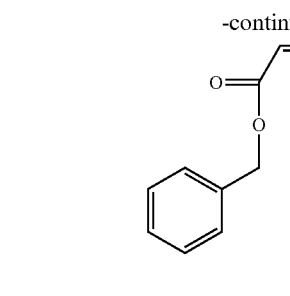

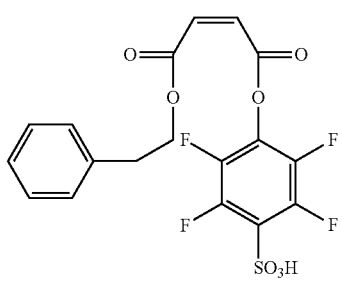

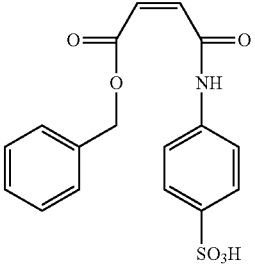 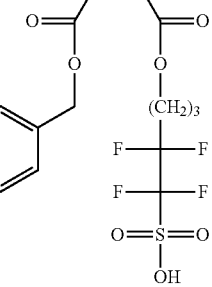

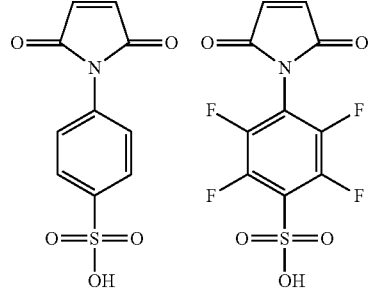

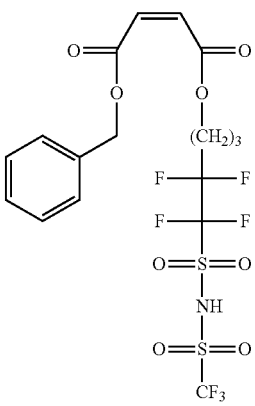 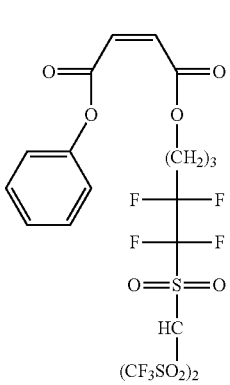

It is also preferred for the repeating unit (A) to be any of those of general formula (III).

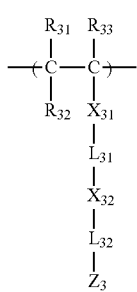
(III)

In general formula (III), each of $R_{31}$, $R_{32}$ and $R_{33}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having up to 20 carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having up to 8 carbon atoms is more preferred, and an alkyl group having up to 3 carbon atoms is most preferred.

The alkyl group contained in the alkoxycarbonyl group is preferably the same as that represented by each of $R_{31}$, $R_{32}$ and $R_{33}$ above.

As the monovalent aliphatic hydrocarbon ring group, there can be mentioned an optionally substituted monocyclic or polycyclic aliphatic hydrocarbon ring group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is most preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{21}$ to $R_{23}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (III), each of $R_{31}$, $R_{32}$ and $R_{33}$ is preferably a hydrogen atom, an alkyl group or a halogen atom. A hydrogen atom, a methyl group, an ethyl group, a trifluoromethyl group (—$CF_3$), a hydroxymethyl group (—$CH_2$—OH), a chloromethyl group (—$CH_2$—Cl) and a fluorine atom (—F) are especially preferred.

Each of $X_{31}$ and $X_{32}$ independently represents a single bond, —O—, —S—, —CO—, —$SO_2$—, —NR— (R represents a hydrogen atom or an alkyl group), a bivalent nitrogenous nonaromatic heterocyclic group or a group composed of a combination of these.

With respect to —NR—, the alkyl group represented by R is an optionally substituted linear or branched alkyl group. Particular examples thereof are the same as those of the alkyl groups represented by $R_{31}$, $R_{32}$ and $R_{33}$. R is most preferably a hydrogen atom, a methyl group or an ethyl group.

The bivalent nitrogenous nonaromatic heterocyclic group refers to a preferably 3- to 8-membered nonaromatic heterocyclic group containing at least one nitrogen atom. In particular, there can be mentioned the structures shown above by way of example in connection with $X_{11}$ to $X_{13}$ of general formula (I).

$X_{31}$ is preferably a single bond, —O—, —CO—, —NR—(R represents a hydrogen atom or an alkyl group) or a group composed of a combination of these. $X_{31}$ is most preferably —COO— or —CONR— (R represents a hydrogen atom or an alkyl group).

$X_{32}$ is preferably a single bond, —O—, —CO—, —$SO_2$—, a bivalent nitrogenous nonaromatic heterocyclic group or a group composed of a combination of these. $X_{32}$ is most preferably a single bond, —COO—, —$OSO_2$—, or a group composed of a combination of a bivalent nitrogenous nonaromatic heterocyclic group and —$SO_2$—.

$L_{31}$ represents a single bond, an alkylene group, an alkenylene group, a bivalent aliphatic hydrocarbon ring group or a group composed of a combination of two or more of these. In the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogenous nonaromatic heterocyclic group or a group composed of a combination of these.

The alkylene group represented by $L_{31}$ may be linear or branched. As preferred examples thereof, there can be mentioned alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group mentioned above in connection with $L_{31}$.

The bivalent aliphatic hydrocarbon ring group may be monocyclic or polycyclic. As preferred examples thereof, there can be mentioned bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group. A bivalent aliphatic hydrocarbon ring group having 5 to 12 carbon atoms is more preferred. A bivalent aliphatic hydrocarbon ring group having 6 to 10 carbon atoms is most preferred.

Particular examples of the —NR— and bivalent nitrogenous nonaromatic heterocyclic groups are the same as set forth above in connection with $X_{31}$. Preferred examples are also the same.

Most preferably, $L_{31}$ is a single bond, an alkylene group, a bivalent aliphatic hydrocarbon ring group or a group comprising alkylene groups and/or bivalent aliphatic hydrocarbon ring groups combined together through —OCO—, —O— or —CONH— (for example, -alkylene-O-alkylene-, -alkylene-OCO-alkylene-, -bivalent aliphatic hydrocarbon ring group-O-alkylene-, -alkylene-CONH-alkylene- or the like).

$L_{32}$ represents an alkylene group, an alkenylene group, a bivalent aliphatic hydrocarbon ring group or a group composed of a combination of two or more of these, provided that the hydrogen atoms of these groups are partially or entirely substituted with a substituent selected from among a fluorine atom, a fluoroalkyl group, a nitro group and a cyano group. In the group composed of a combination, two or more groups combined together may be identical to or different from each other and may be linked to each other through, as a connecting group, —O—, —S—, —CO—, —SO₂—, —NR— (R represents a hydrogen atom or an alkyl group), a bivalent nitrogenous nonaromatic heterocyclic group or a group composed of a combination of these.

Preferably, $L_{32}$ is an alkylene group whose hydrogen atoms are partially or entirely substituted with a fluorine atom or a fluoroalkyl group (more preferably a perfluoroalkyl group). An alkylene group whose hydrogen atoms are partially or entirely substituted with a fluorine atom is especially preferred. $L_{32}$ is most preferably an alkylene group, 30 to 100% of the hydrogen atoms of which are substituted with a fluorine atom.

The alkylene group represented by $L_{32}$ may be linear or branched. As preferred examples thereof, there can be mentioned alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group.

Particular examples of the —NR— and bivalent nitrogenous nonaromatic heterocyclic groups as connecting groups in $L_{32}$ are the same as mentioned above in connection with $X_{31}$. Preferred examples are also the same.

As preferred specific examples of the groups represented by $L_{32}$, there can be mentioned the structures set forth above by way of example in connection with $L_{12}$ of general formula (I).

$Z_3$ has the same meaning as $Z_1$ of general formula (I). The above description regarding $Z_1$ applies to $Z_3$. Further, particular examples thereof are also the same as set forth above in connection with $Z_1$.

Specific examples of the polymerizable monomers corresponding to the repeating units of general formula (III) are shown below in the form of structures after the decomposition upon exposure to actinic rays or radiation.

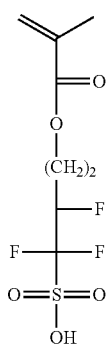

(III-1)

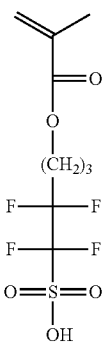

(III-2)

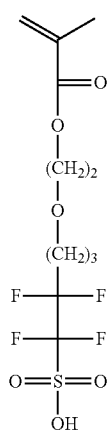

(III-3)

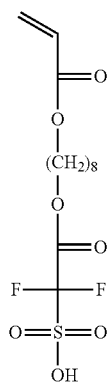

(III-4)

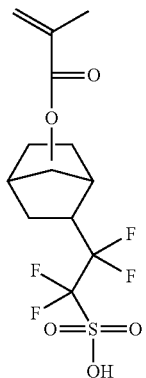

(III-5)

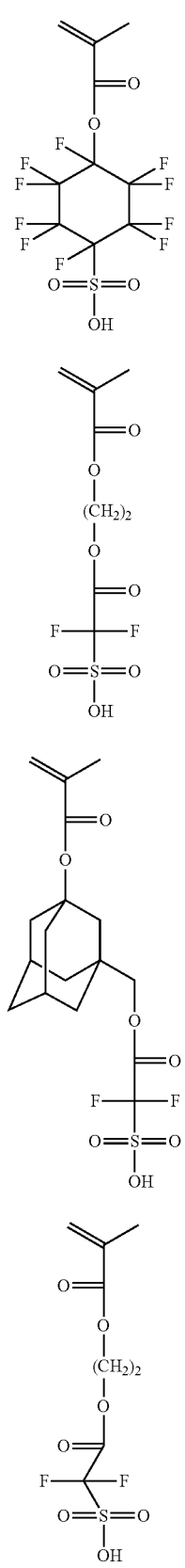
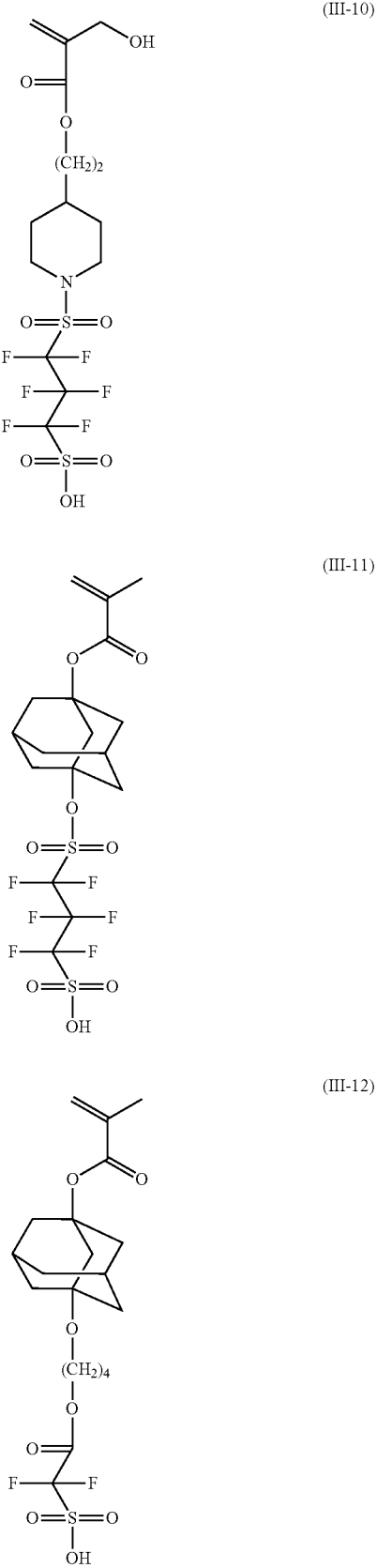

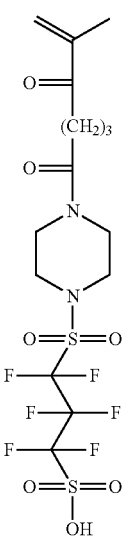 (III-13)
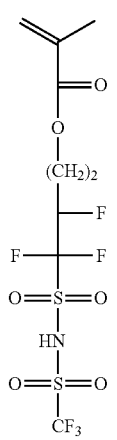 (III-14)
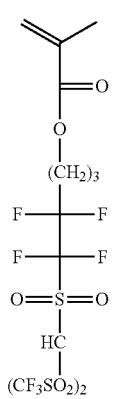 (III-15)
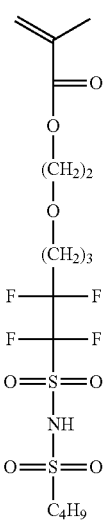 (III-16)
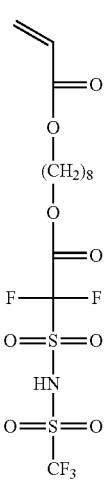 (III-17)
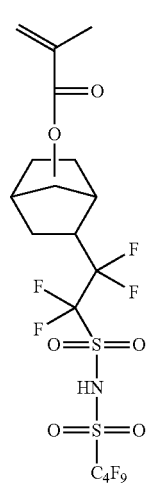 (III-18)

(III-19) 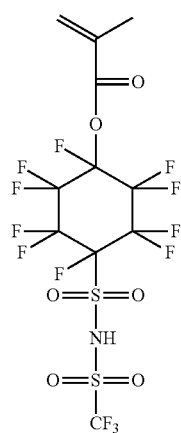
(III-20) 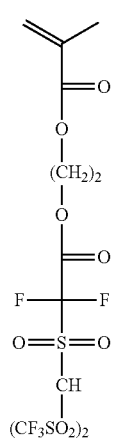
(III-21) 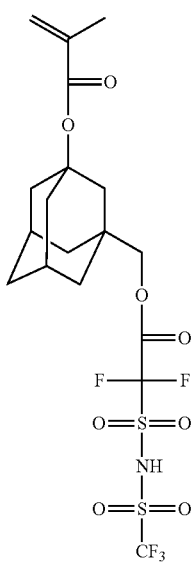
(III-22) 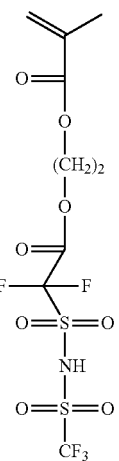
(III-23) 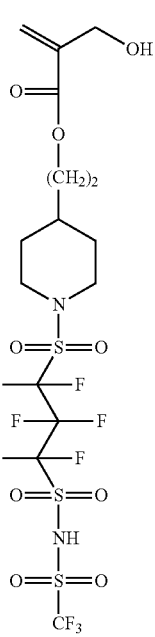
(III-24) 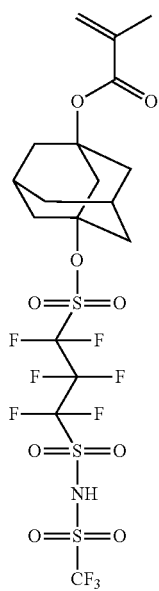

(III-25) 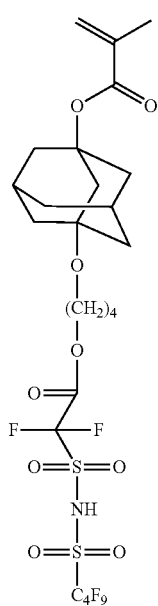
(III-26) 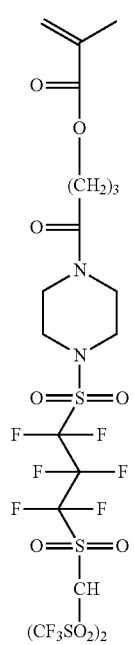
(III-27) 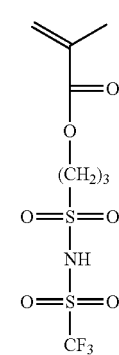
(III-28) 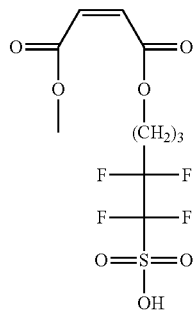
(III-29) 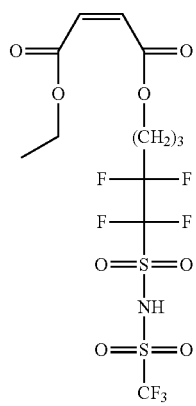
(III-30) 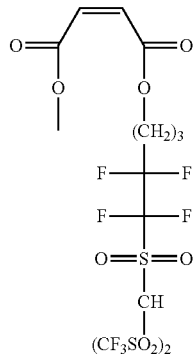
(III-31) 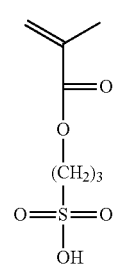
(III-32) 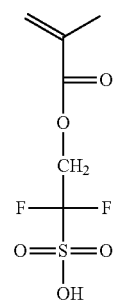

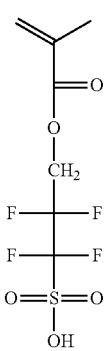
(III-33)

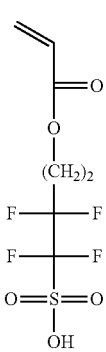
(III-34)

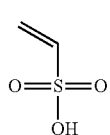
(III-35)

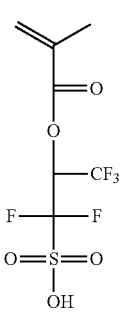
(III-36)

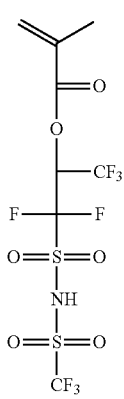
(III-37)

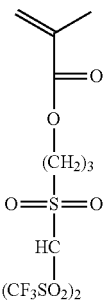
(III-38)

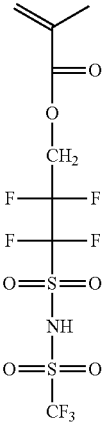
(III-39)

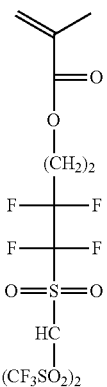
(III-40)

The polymerizable compounds corresponding to the repeating units (A) can be synthesized through the general sulfonating reaction or sulfonamidating reaction. For example, the polymerizable compounds can be obtained by either a method in which one of the sulfonyl halide moieties of a bissulfonyl halide compound is selectively reacted with an amine, an alcohol or the like to thereby form a sulfonamide bond or a sulfonic ester bond and thereafter the other sulfonyl halide moiety is hydrolyzed, or a method in which the ring of a cyclic sulfonic anhydride is opened by an amine or an alcohol. Further, the polymerizable compounds can be easily synthesized through the methods described in U.S. Pat. No. 5,554,664, J. Fluorine Chem. 105 (2000) 129-136 and J. Fluorine Chem. 116 (2002) 45-48.

The polymerizable compounds corresponding to the repeating units (A) can be easily synthesized from a lithium, sodium or potassium salt of organic acid synthesized above, a hydroxide, bromide or chloride of iodonium or sulfonium, etc. through the salt exchange method described in Jpn. PCT National Publication No. H11-501909 and JP-A-2003-

246786 or through the salt exchange method described in JP-A-H10-232490, Japanese Patent 4025039, etc.

As particular examples of the polymerizable compounds (M) corresponding to the repeating units (A), there can be mentioned arbitrary structures composed of combinations of anions resulting from the removal of a hydrogen atom from the organic acid of each of the examples (I-1) to (I-65), (II-1) to (II-27) and (III-1) to (III-40) given above and cations of the particular examples of $Z_1$ given above.

The content of repeating unit (A) in the resin (P), based on all the repeating units of the resin, is preferably in the range of 0.5 to 80 mol %, more preferably 1 to 60 mol % and further more preferably 3 to 40 mol %.

[Repeating Unit (B)]

The resin (P) contains not only the above repeating unit (A) but also a repeating unit (B) with a structure that when acted on by an acid, is decomposed to thereby increase its solubility in an alkali developer (hereinafter may be referred to as a "repeating unit containing an acid-decomposable group"). This repeating unit (B) is typically decomposed by the action of an acid to thereby produce an alkali-soluble group.

As the alkali-soluble group, there can be mentioned a phenolic hydroxyl group, a carboxyl group, a fluoroalcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a phenolic hydroxyl group, a carboxyl group, a fluoroalcohol group (preferably hexafluoroisopropanol) and a sulfonic acid group.

The acid-decomposable group is preferably a group as obtained by substituting the hydrogen atom of any of these alkali-soluble groups with an acid-cleavable group.

As the acid-cleavable group, there can be mentioned, for example, —C($R_{36}$)($R_{37}$)($R_{38}$), —C($R_{01}$)($R_{02}$)(OR$_{39}$), —C(=O)—O—C($R_{36}$)($R_{37}$)($R_{38}$), —C($R_{01}$)($R_{02}$)—C(=O)—O—C($R_{36}$)($R_{37}$)($R_{38}$), —CH($R_{36}$)(Ar) or the like.

In the formulae, each of $R_{36}$ to $R_{39}$ independently represents an alkyl group, a monovalent aliphatic hydrocarbon ring group, a monovalent aromatic ring group, a group composed of a combination of an alkylene group and a monovalent aromatic ring group, or an alkenyl group. $R_{36}$ and $R_{37}$ may be bonded to each other to thereby form a ring.

Each of $R_{01}$ and $R_{02}$ independently represents a hydrogen atom, an alkyl group, a monovalent aliphatic hydrocarbon ring group, a monovalent aromatic ring group, a group composed of a combination of an alkylene group and a monovalent aromatic ring group, or an alkenyl group.

Ar represents a monovalent aromatic ring group.

Each of the alkyl groups represented by $R_{36}$ to $R_{39}$, $R_{01}$ and $R_{02}$ preferably has 1 to 8 carbon atoms. For example, there can be mentioned a methyl group, an ethyl group, a propyl group, an n-butyl group, a sec-butyl group, a hexyl group, an octyl group or the like.

The monovalent aliphatic hydrocarbon ring groups represented by $R_{36}$ to $R_{39}$, $R_{01}$ and $R_{02}$ may be monocyclic or polycyclic. When the monovalent aliphatic hydrocarbon ring group is monocyclic, it is preferably an aliphatic hydrocarbon ring group having 3 to 8 carbon atoms. As such, there can be mentioned, for example, a cyclopropyl group, a cyclobutyl group, a cyclopentyl group, a cyclohexyl group, a cyclooctyl group or the like. When the monovalent aliphatic hydrocarbon ring group is polycyclic, it is preferably an aliphatic hydrocarbon ring group having 6 to 20 carbon atoms. As such, there can be mentioned, for example, an adamantyl group, a norbornyl group, an isobornyl group, a camphonyl group, a dicyclopentyl group, an α-pinel group, a tricyclodecanyl group, a tetracyclododecyl group, an androstanyl group or the like. With respect to these, the carbon atoms of each of the aliphatic hydrocarbon ring groups may be partially substituted with a heteroatom, such as an oxygen atom.

Each of the monovalent aromatic ring groups represented by $R_{36}$ to $R_{39}$, $R_{01}$, $R_{02}$ and Ar is preferably one having 6 to 10 carbon atoms. For example, there can be mentioned an aryl group, such as a phenyl group, a naphthyl group or an anthryl group, or a monovalent aromatic ring group containing a heteroring, such as thiophene, furan, pyrrole, benzothiophene, benzofuran, benzopyrrole, triazine, imidazole, benzimidazole, triazole, thiadiazole or thiazole.

Each of the groups consisting of an alkylene group combined with a monovalent aromatic ring group, represented by $R_{36}$ to $R_{39}$, $R_{01}$ and $R_{02}$ is preferably an aralkyl group having 7 to 12 carbon atoms. For example, there can be mentioned a benzyl group, a phenethyl group, a naphthylmethyl group or the like.

Each of the alkenyl groups represented by $R_{36}$ to $R_{39}$, $R_{01}$ and $R_{02}$ preferably has 2 to 8 carbon atoms. For example, there can be mentioned a vinyl group, an allyl group, a butenyl group, a cyclohexenyl group or the like.

The ring formed by the mutual bonding of $R_{36}$ and $R_{37}$ may be monocyclic or polycyclic. The monocyclic structure is preferably an aliphatic hydrocarbon ring structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure or the like. The polycyclic structure is preferably an aliphatic hydrocarbon ring structure having 6 to 20 carbon atoms. As such, there can be mentioned, for example, an adamantane structure, a norbornane structure, a dicyclopentane structure, a tricyclodecane structure, a tetracyclododecane structure or the like. With respect to these, the carbon atoms of each of the aliphatic hydrocarbon ring structures may be partially substituted with a heteroatom, such as an oxygen atom.

A substituent may be introduced in each of the above groups represented by $R_{36}$ to $R_{39}$, $R_{01}$, $R_{02}$ and Ar. As the substituent, there can be mentioned, for example, an alkyl group, a monovalent aliphatic hydrocarbon ring group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group or the like. Preferably, the number of carbon atoms of each of the substituents is up to 8.

It is preferred for the repeating unit (B) to be any of the repeating units of general formulae (V) and (VI) below.

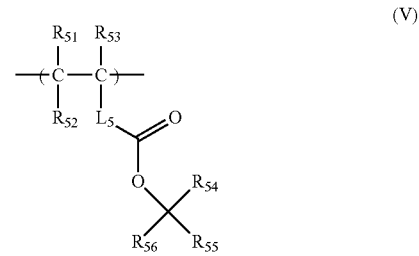

(V)

-continued

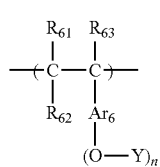
(VI)

In general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring (preferably, a 5- or 6-membered ring), which $R_{52}$ represents an alkylene group.

$L_5$ represents a single bond or a bivalent connecting group, provided that when a ring is formed in cooperation with $R_{52}$, $L_5$ represents a trivalent connecting group.

$R_{54}$ represents an alkyl group, and each of $R_{55}$ and $R_{56}$ independently represents a hydrogen atom, an alkyl group, a monovalent aliphatic hydrocarbon ring group or a monovalent aromatic ring group. $R_{55}$ and $R_{56}$ may be bonded to each other to thereby form a ring, provided that $R_{55}$ and $R_{56}$ are not simultaneously hydrogen atoms.

In general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring (preferably, a 5- or 6-membered ring), which $R_{62}$ represents an alkylene group.

$Ar_6$ represents a bivalent aromatic ring group, provided that when a ring is formed by bonding to $R_{62}$, $Ar_6$ represents a trivalent aromatic ring group.

Y represents a hydrogen atom or a group that when acted on by an acid, is cleaved. When there are a plurality of Y's, they may be identical to or different from each other, provided that at least one thereof is a group that when acted on by an acid, is cleaved.

In the formula, n is an integer of 1 to 4.

General formula (V) will be described in greater detail below.

As a preferred alkyl group represented by each of $R_{51}$ to $R_{53}$ in general formula (V), there can be mentioned an optionally substituted alkyl group having up to 8 carbon atoms. An alkyl group having up to 3 carbon atoms is most preferred.

The alkyl group contained in the alkoxycarbonyl group is preferably the same as that represented by each of $R_{51}$ to $R_{53}$ above.

The monovalent aliphatic hydrocarbon ring group may be monocyclic or polycyclic. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is most preferred.

When $R_{52}$ is an alkylene group, the alkylene group is preferably an alkylene group having 1 to 8 carbon atoms, such as a methylene group, an ethylene group, a propylene group, a butylene group, a hexylene group or an octylene group. An alkylene group having 1 to 4 carbon atoms is more preferred, and an alkylene group having 1 or 2 carbon atoms is most preferred.

In formula (V), each of $R_{51}$ and $R_{53}$ is more preferably a hydrogen atom, an alkyl group or a halogen atom, most preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_{52}$ is more preferably a hydrogen atom, an alkyl group, a halogen atom or an alkylene group (forming a ring in cooperation with Q), most preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forming a ring in cooperation with $L_5$) or an ethylene group (forming a ring in cooperation with $L_5$).

As the bivalent connecting group represented by $L_5$, there can be mentioned an alkylene group, a bivalent aromatic ring group, —OCO-$L_1$-, —O-$L_1$-, -$L_1$-O—, a group composed of a combination of two or more of these, or the like. $L_1$ represents an alkylene group, a bivalent aliphatic hydrocarbon ring group, a bivalent aromatic ring group or a group composed of a combination of an alkylene group and a bivalent aromatic ring group, and a substituent, such as a fluorine atom, may further be introduced in these groups.

$L_5$ is preferably a single bond, any of the groups of the formula —OCO-$L_1$- ($L_1$ is preferably an alkylene group having 1 to 5 carbon atoms, more preferably a methylene group or a propylene group) or a bivalent aromatic ring group.

The alkyl group represented by each of $R_{54}$ to $R_{56}$ is preferably an alkyl group having 1 to 20 carbon atoms, more preferably one having 1 to 10 carbon atoms. An alkyl group having 1 to 4 carbon atoms, such as a methyl group, an ethyl group, an n-propyl group, an isopropyl group, an n-butyl group, an isobutyl group or a t-butyl group, is most preferred.

The monovalent aliphatic hydrocarbon ring group represented by each of $R_{55}$ and $R_{56}$ is preferably one having 3 to 20 carbon atoms. It may be a monocyclic one, such as a cyclopentyl group or a cyclohexyl group, or a polycyclic one, such as a norbornyl group, an adamantyl group, a tetracyclododecanyl group or a tetracyclododecanyl group.

The ring formed by the mutual bonding of $R_{55}$ and $R_{56}$ is preferably one having 3 to 20 carbon atoms. The ring may be a monocyclic one, such as a cyclopentyl group or a cyclohexyl group, or a polycyclic one, such as a norbornyl group, an adamantyl group, a tetracyclododecanyl group or a tetracyclododecanyl group. When a ring is formed by the mutual bonding of $R_{55}$ and $R_{56}$, $R_{54}$ is preferably an alkyl group having 1 to 3 carbon atoms, more preferably a methyl group or an ethyl group.

The monovalent aromatic ring group represented by each of $R_{55}$ and $R_{56}$ is preferably one having 6 to 20 carbon atoms. As such, there can be mentioned, for example, a phenyl group, a naphthyl group or the like. When either $R_{55}$ or $R_{56}$ is a hydrogen atom, the other is preferably a monovalent aromatic ring group.

In the synthesis of the monomers corresponding to the repeating units of general formula (V), any of the common methods of synthesizing an ester containing a polymerizable group can be used, and the synthetic method is not particularly limited.

Particular examples of the repeating units of general formula (V) are shown below, which in no way limit the scope of the present invention.

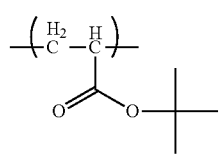 (V-1)
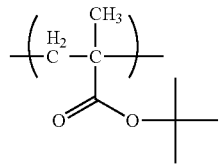 (V-2)
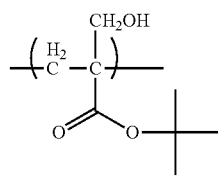 (V-3)
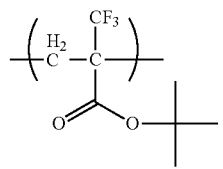 (V-4)
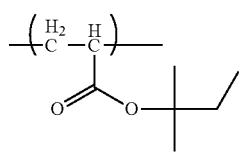 (V-5)
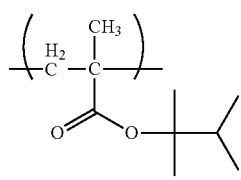 (V-6)
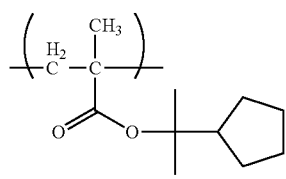 (V-7)
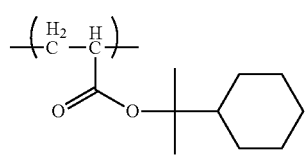 (V-8)
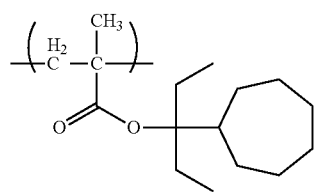 (V-9)
-continued
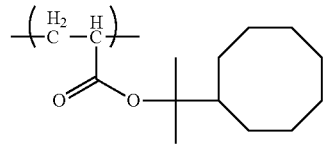 (V-10)
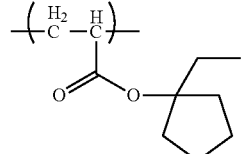 (V-11)
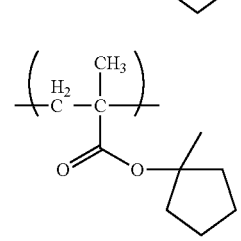 (V-12)
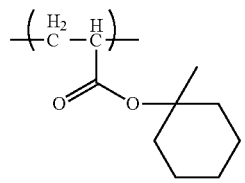 (V-13)
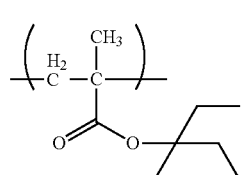 (V-14)
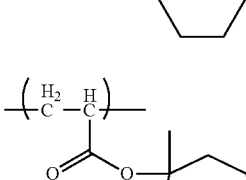 (V-15)
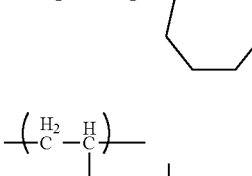 (V-16)
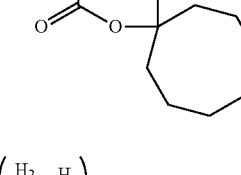 (V-17)
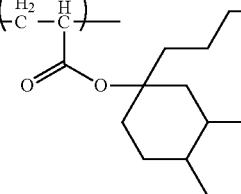

(V-18) 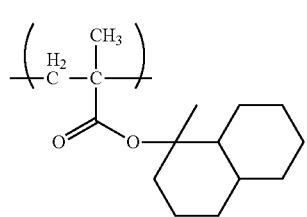
(V-19) 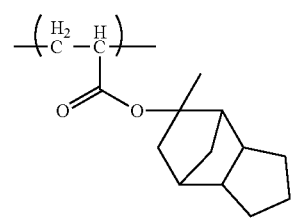
(V-20) 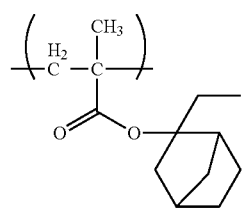
(V-21) 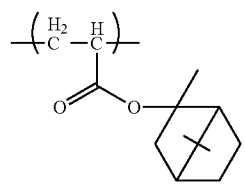
(V-22) 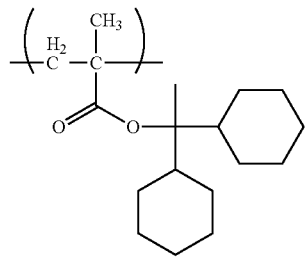
(V-23) 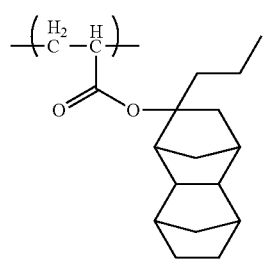
(V-24) 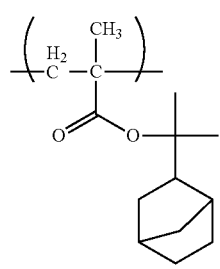
(V-25) 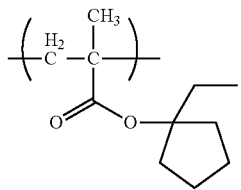
(V-26) 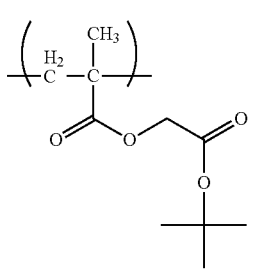
(V-27) 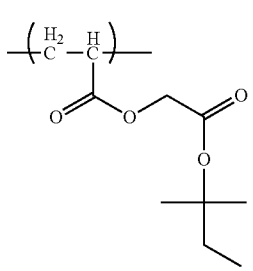
(V-28) 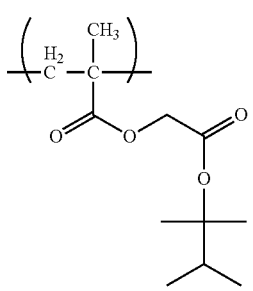
(V-29) 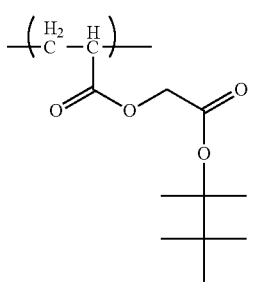
(V-30) 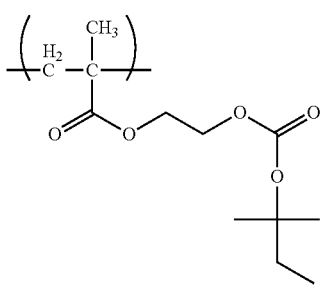

(V-31) 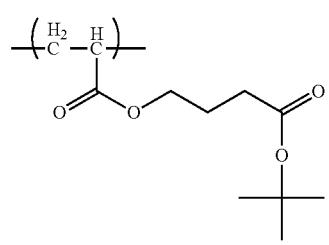
(V-32) 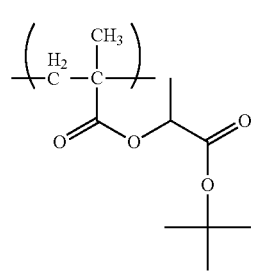
(V-33) 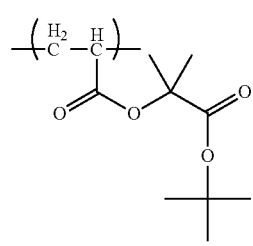
(V-34) 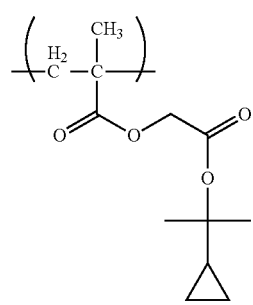
(V-35) 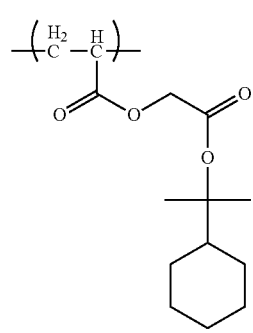
(V-36) 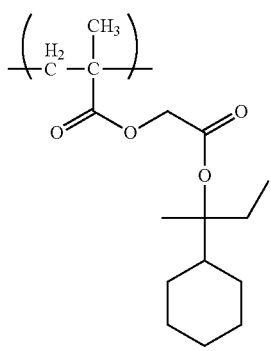
(V-37) 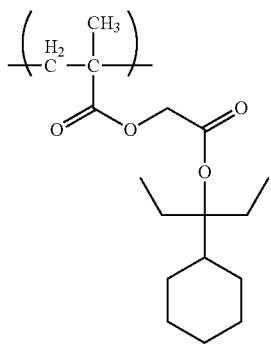
(V-38) 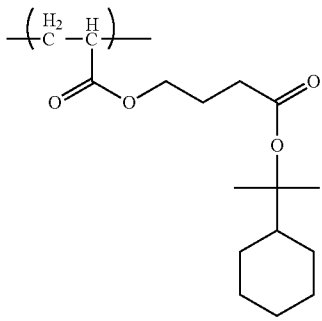
(V-39) 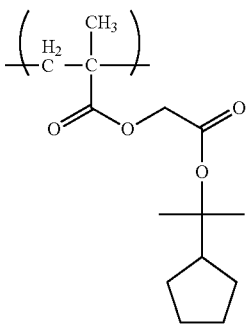
(V-40) 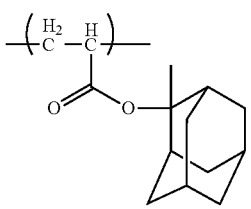

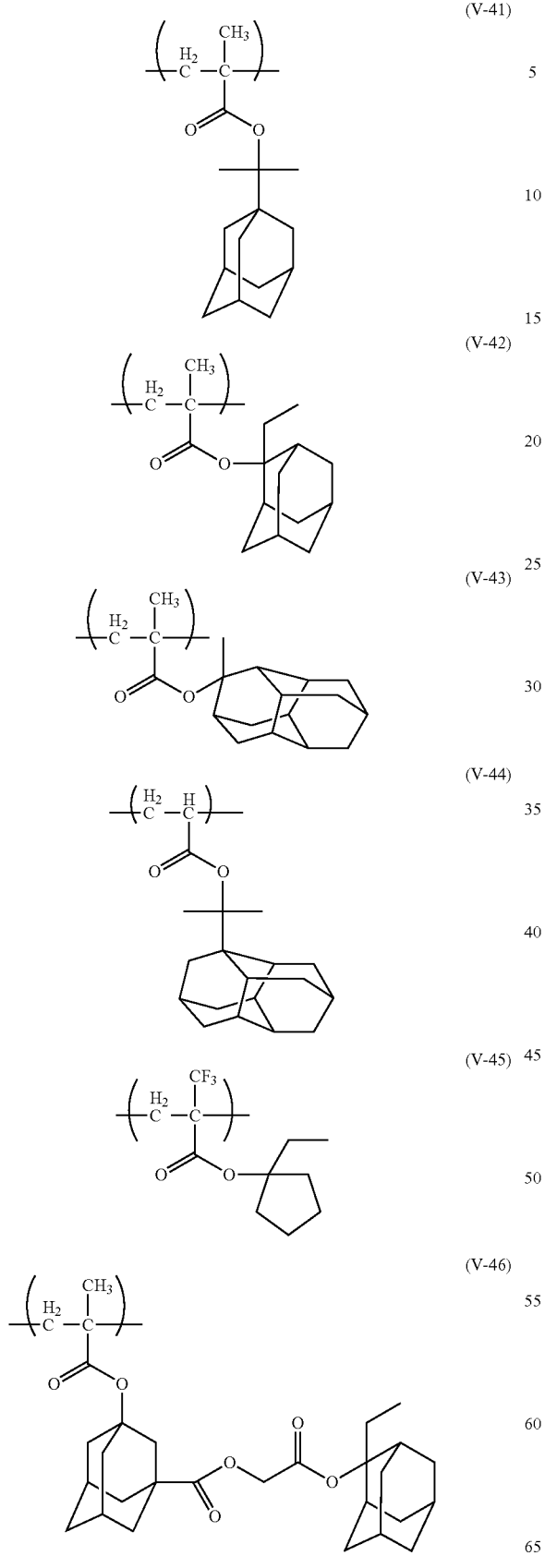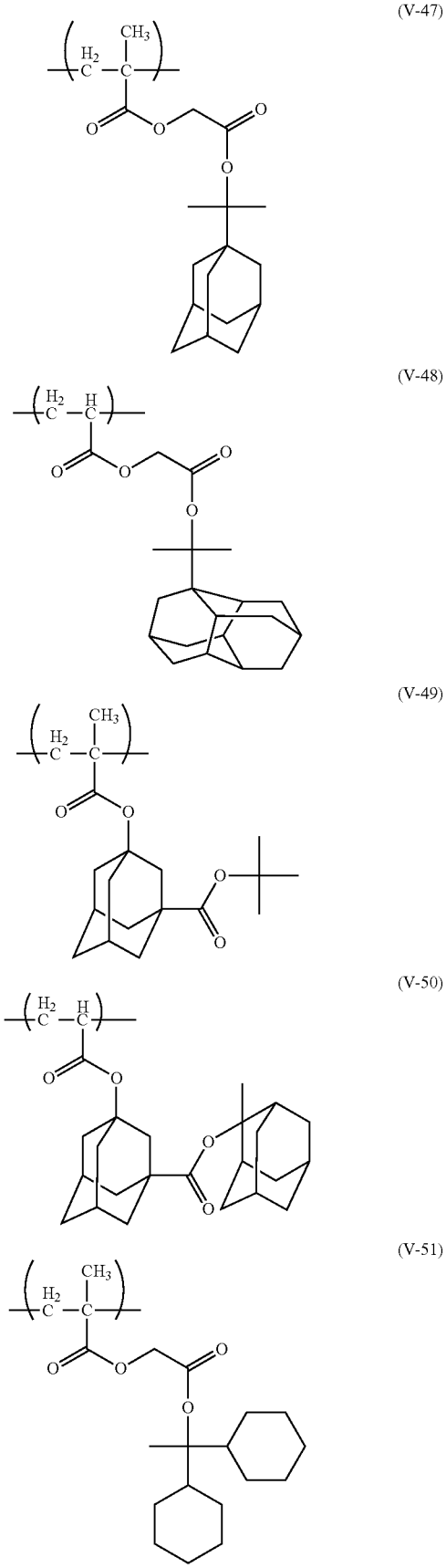

(V-52)
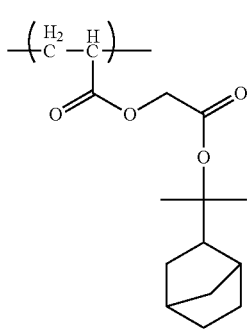
(V-53)
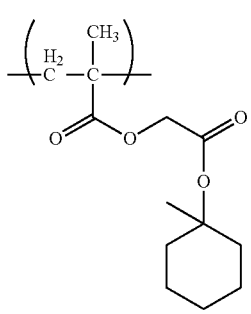
(V-54)
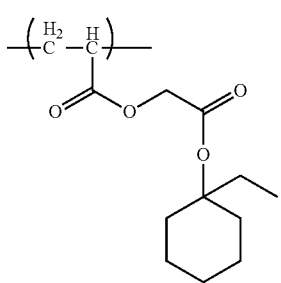
(V-55)
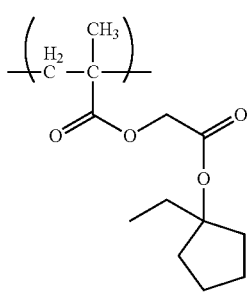
(V-56)
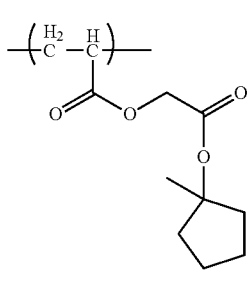
(V-57)
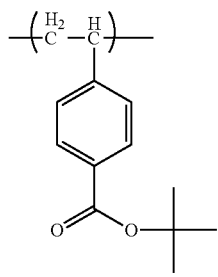
(V-58)
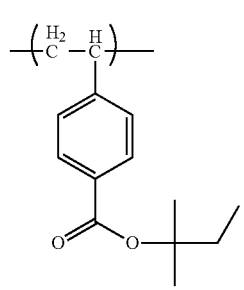
(V-59)
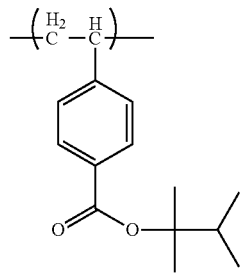
(V-60)
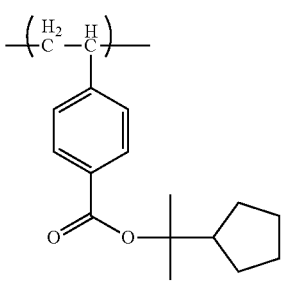
(V-61)
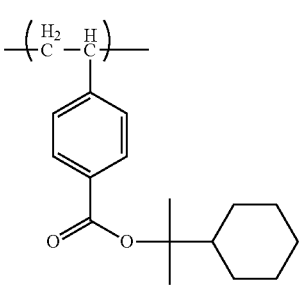

(V-62) 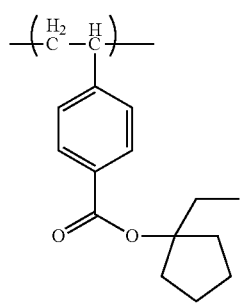
(V-63) 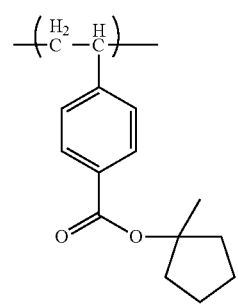
(V-64) 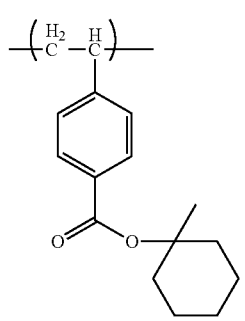
(V-65) 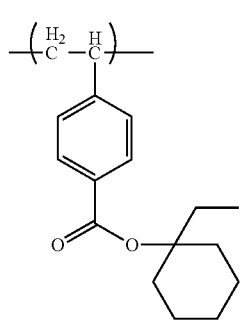
(V-66) 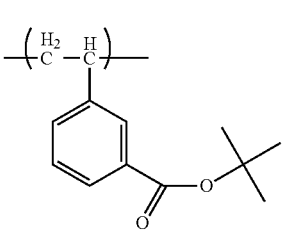
(V-67) 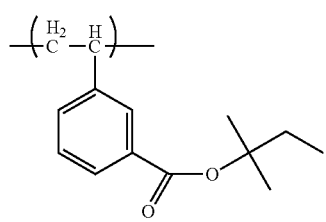
(V-68) 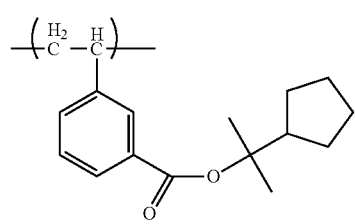
(V-69) 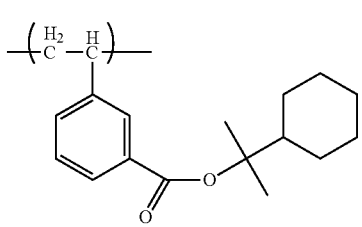
(V-70) 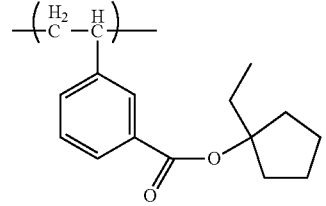
(V-71) 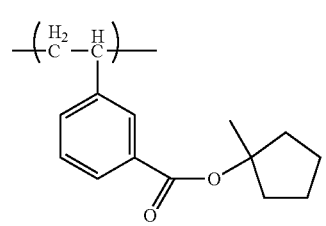
(V-72) 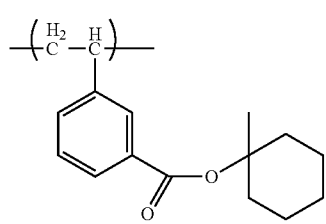
(V-73) 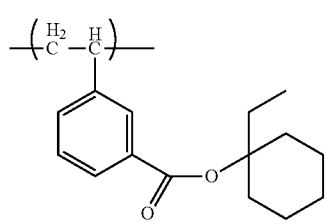

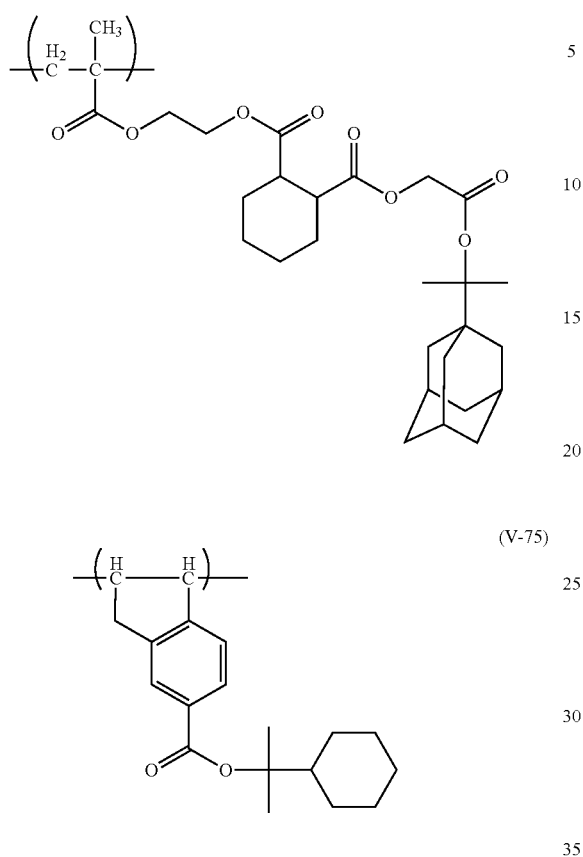
(V-74)
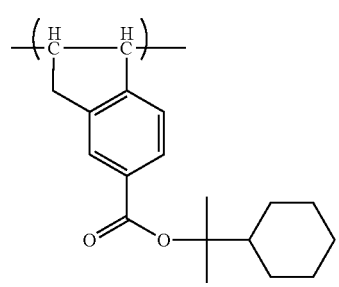
(V-75)
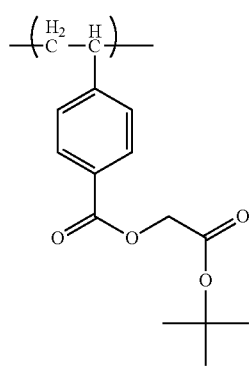
(V-76)
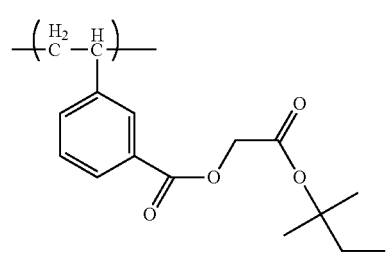
(V-77)
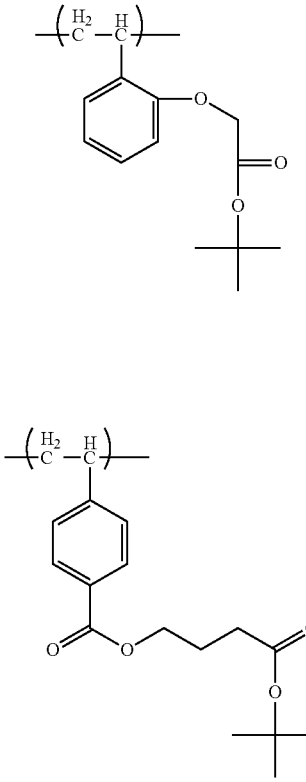
(V-78)
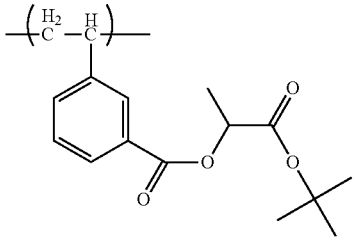
(V-79)
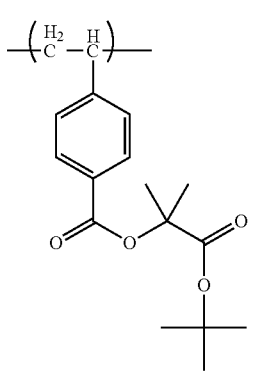
(V-80)
(V-81)

(V-82) 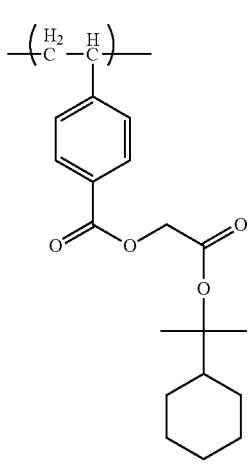
(V-83) 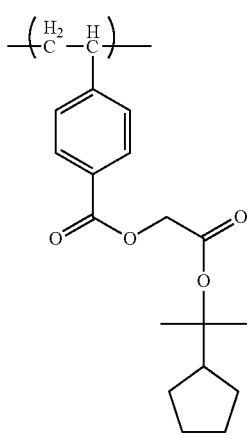
(V-84) 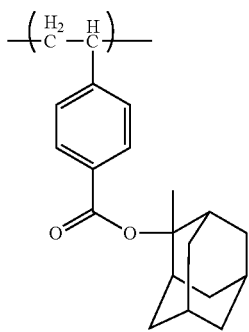
(V-85) 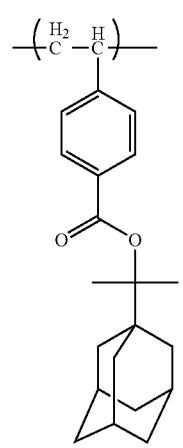
(V-86) 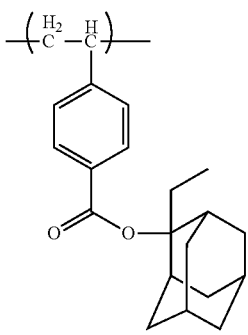
(V-87) 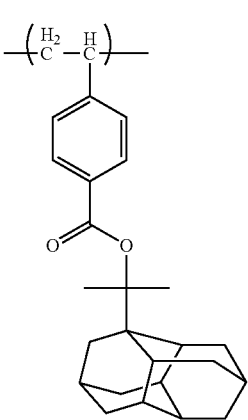
(V-88) 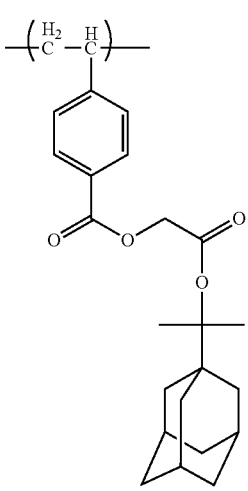
(V-89) 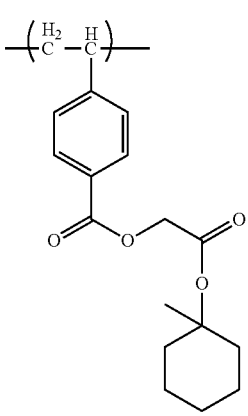

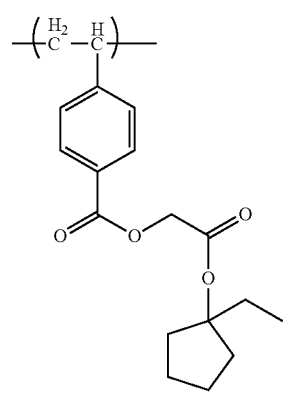
(V-90)
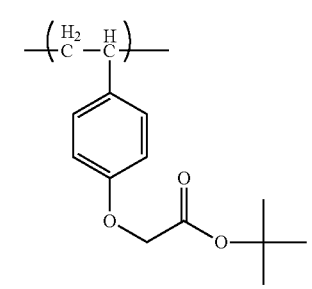
(V-91)
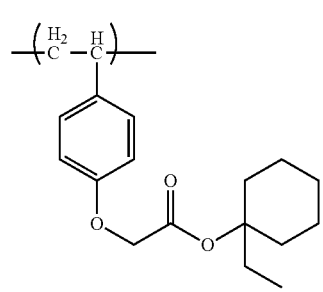
(V-92)
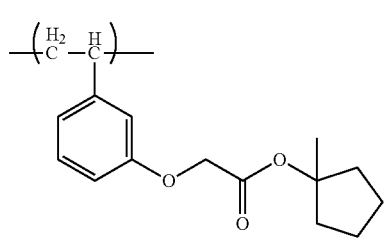
(V-93)
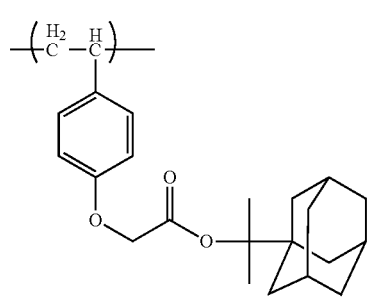
(V-94)
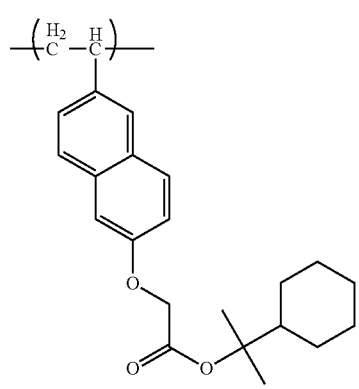
(V-95)
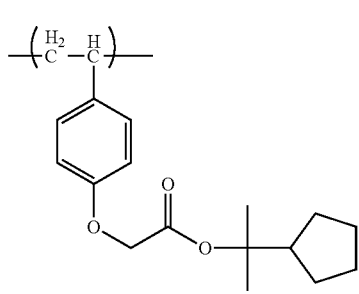
(V-96)
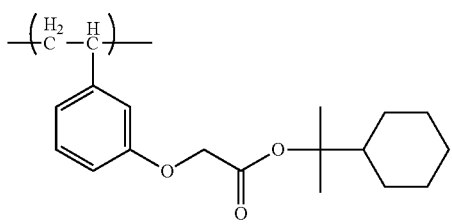
(V-97)
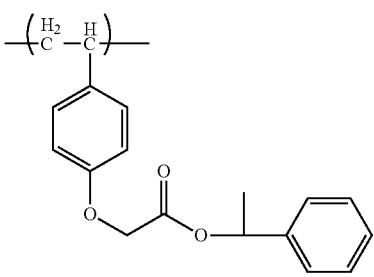
(V-98)
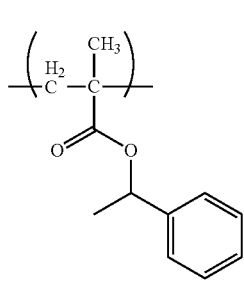
(V-99)

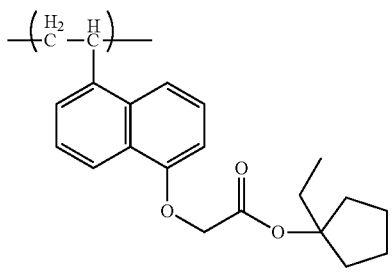

(V-100)

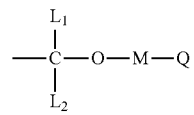

(VI-A)

General formula (VI) will be described in detail below.

The alkyl group represented by each of $R_{61}$ to $R_{63}$ of general formula (VI) is preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred.

The alkyl group contained in the alkoxycarbonyl group is preferably the same as the alkyl group mentioned above with respect to $R_{61}$ to $R_{63}$.

The monovalent aliphatic hydrocarbon ring group may be monocyclic or polycyclic. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is preferred.

When $R_{62}$ represents an alkylene group, the alkylene group is preferably an optionally substituted alkylene group having 1 to 8 carbon atoms, such as a methylene group, an ethylene group, a propylene group, a butylene group, a hexylene group or an octylene group.

$Ar_6$ represents a bivalent aromatic ring group. A substituent may be introduced in the bivalent aromatic ring group. As preferred examples of the bivalent aromatic ring groups, there can be mentioned an arylene group having 6 to 18 carbon atoms, such as a phenylene group, a tolylene group or a naphthylene group, and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

In the formula, n is preferably 1 or 2, more preferably 1.

Each of n Y's independently represents a hydrogen atom or a group that is cleaved by the action of an acid, provided that at least one of n Y's is a group that is cleaved by the action of an acid.

As the group (Y) that is cleaved by the action of an acid, there can be mentioned any of those set forth above by way of example, namely, —$C(R_{36})(R_{37})(R_{38})$, —$C(=O)$—O—$C(R_{36})(R_{37})(R_{38})$, —$C(R_{01})(R_{02})(OR_{39})$, —$C(R_{01})(R_{02})$—$C(=O)$—O—$C(R_{36})(R_{37})(R_{38})$, —$CH(R_{36})(Ar)$ or the like. In these formulae, $R_{36}$ to $R_{39}$, $R_{01}$ and $R_{02}$ are as defined above.

The group that is cleaved by the action of an acid, Y, preferably has any of the structures of general formula (VI-A) below.

In the formula, each of $L_1$ and $L_2$ independently represents a hydrogen atom, an alkyl group, a monovalent aliphatic hydrocarbon ring group, a monovalent aromatic ring group or a group consisting of an alkylene group combined with a monovalent aromatic ring group.

M represents a single bond or a bivalent connecting group.

Q represents an alkyl group, a monovalent aliphatic hydrocarbon ring group optionally containing a heteroatom, a monovalent aromatic ring group optionally containing a heteroatom, an amino group, an ammonium group, a mercapto group, a cyano group or an aldehyde group.

At least two of Q, M and $L_1$ may be bonded to each other to thereby form a ring (preferably, a 5-membered or 6-membered ring).

The alkyl groups represented by $L_1$ and $L_2$ are, for example, alkyl groups each having 1 to 8 carbon atoms. As preferred examples thereof, there can be mentioned a methyl group, an ethyl group, a propyl group, an n-butyl group, a sec-butyl group, a hexyl group and an octyl group.

The monovalent aliphatic hydrocarbon ring groups represented by $L_1$ and $L_2$ are, for example, aliphatic hydrocarbon ring groups each having 3 to 15 carbon atoms. As preferred examples thereof, there can be mentioned a cyclopentyl group, a cyclohexyl group, a norbornyl group, an adamantyl group and the like.

The monovalent aromatic ring groups represented by $L_1$ and $L_2$ are, for example, aryl groups each having 6 to 15 carbon atoms. As preferred examples thereof, there can be mentioned a phenyl group, a tolyl group, a naphthyl group, an anthryl group and the like.

The groups each consisting of an alkylene group combined with a monovalent aromatic ring group, represented by $L_1$ and $L_2$ are, for example, aralkyl groups each having 6 to 20 carbon atoms, such as a benzyl group and a phenethyl group.

The bivalent connecting group represented by M is, for example, an alkylene group (e.g., a methylene group, an ethylene group, a propylene group, a butylene group, a hexylene group, an octylene group, etc.), a bivalent aliphatic hydrocarbon ring group (e.g., a cyclopentylene group, a cyclohexylene group, an adamantylene group, etc.), an alkenylene group (e.g., an ethylene group, a propenylene group, a butenylene group, etc.), a bivalent aromatic ring group (e.g., a phenylene group, a tolylene group, a naphthylene group, etc.), —S—, —O—, —CO—, —$SO_2$—, —$N(R_0)$— or a bivalent connecting group resulting from combination of two or more of these groups. $R_0$ represents a hydrogen atom or an alkyl group (for example, an alkyl group having 1 to 8 carbon atoms; in particular, a methyl group, an ethyl group, a propyl group, an n-butyl group, a sec-butyl group, a hexyl group, an octyl group or the like).

The alkyl group represented by Q is the same as mentioned above with respect to $L_1$ and $L_2$.

As the aliphatic hydrocarbon ring group containing no heteroatom and monovalent aromatic ring group containing no heteroatom respectively contained in the monovalent aliphatic hydrocarbon ring group optionally containing a heteroatom and monovalent aromatic ring group optionally containing a heteroatom both represented by Q, there can be mentioned, for example, the monovalent aliphatic hydrocarbon ring group and monovalent aromatic ring group mentioned above as being represented by each of $L_1$ and $L_2$. Preferably, each thereof has 3 to 15 carbon atoms.

As the monovalent aliphatic hydrocarbon ring group containing a heteroatom and monovalent aromatic ring group containing a heteroatom, there can be mentioned, for example, groups having a heterocyclic structure, such as thiirane, cyclothiorane, thiophene, furan, pyrrole, benzothiophene, benzofuran, benzopyrrole, triazine, imidazole, benzimidazole, triazole, thiadiazole, triazole and pyrrolidone. However, the above monovalent aliphatic hydrocarbon ring groups and monovalent aromatic ring groups are not limited to these as long as a structure generally known as a heteroring (ring formed by carbon and a heteroatom, or ring formed by heteroatoms) is established.

As the ring that may be formed by the mutual bonding of at least two of Q, M and $L_1$, there can be mentioned one resulting from the mutual bonding of at least two of Q, M and $L_1$ so as to form, for example, a propylene group or a butylene group and the subsequent formation of a 5-membered or 6-membered ring containing an oxygen atom.

In general formula (VI-A), a substituent may be introduced in each of the groups represented by $L_1$, $L_2$, M and Q. As the substituent, there can be mentioned, for example, any of those set forth above as being optionally introduced in $R_{36}$ to $R_{39}$, $R_{01}$, $R_{02}$ and Ar. Preferably, the number of carbon atoms of each of the substituents is up to 8.

The groups of the formula -M-Q are preferably groups each comprising 1 to 30 carbon atoms, more preferably groups each comprising 5 to 20 carbon atoms.

Particular examples of the repeating units of general formula (VI) are shown below, which in no way limit the scope of the present invention.

(VI-1)

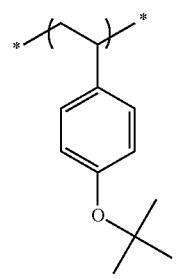

(VI-2)

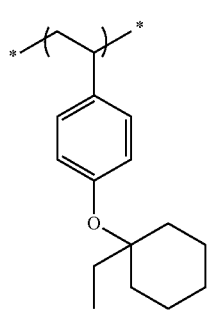

(VI-3)

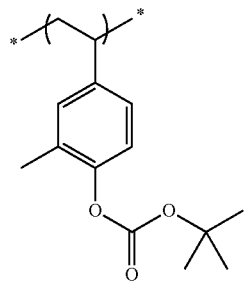

(VI-4)

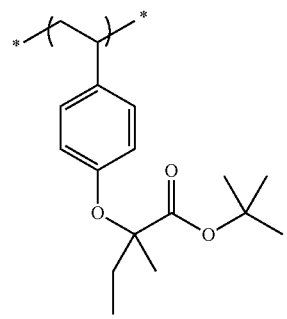

(VI-5)

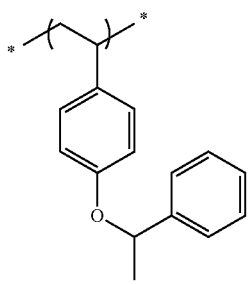

(VI-6)

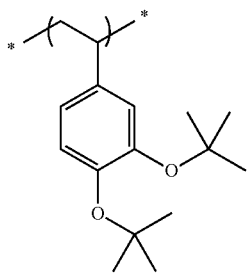

(VI-7)

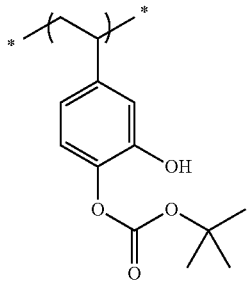

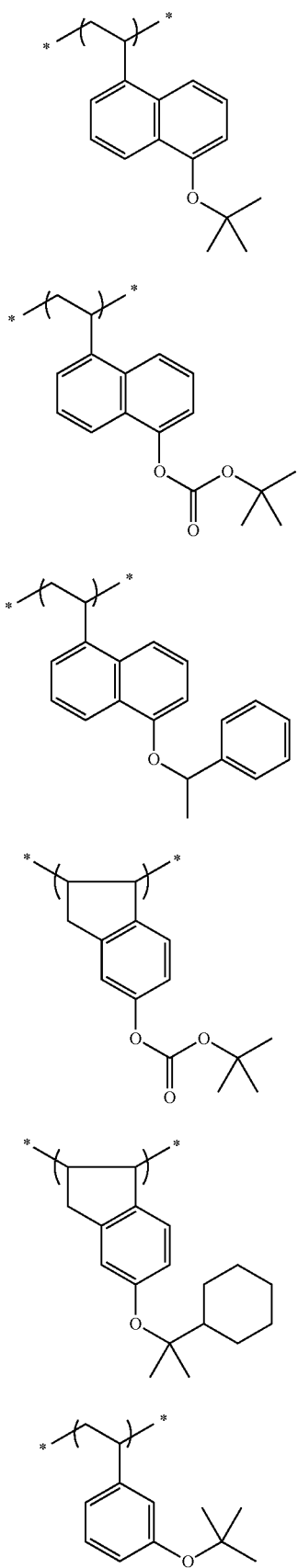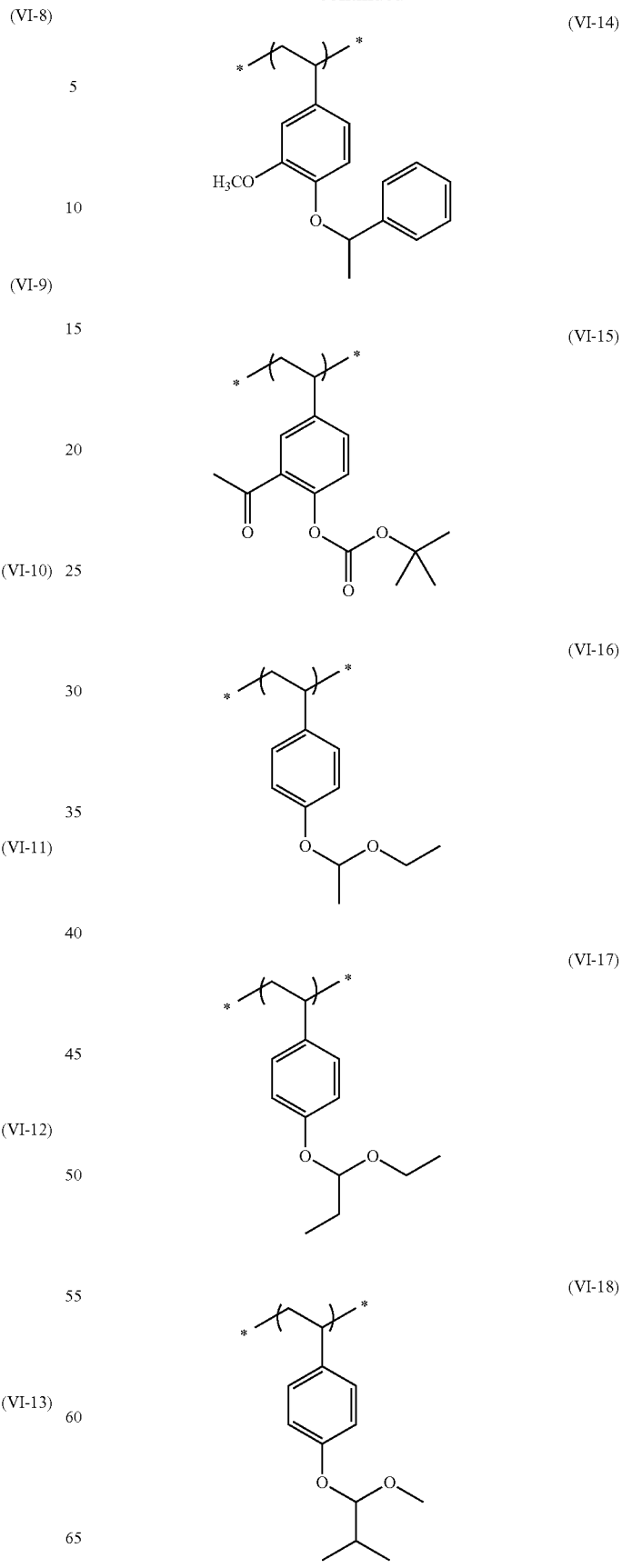

(VI-19)
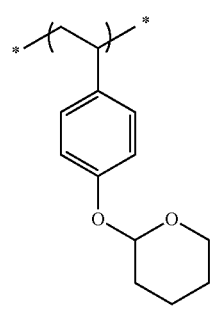
(VI-20)
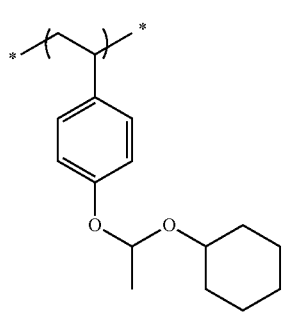
(VI-21)
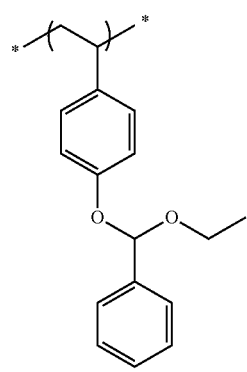
(VI-22)
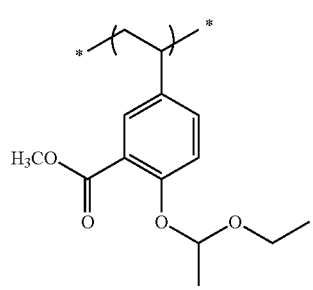
(VI-23)
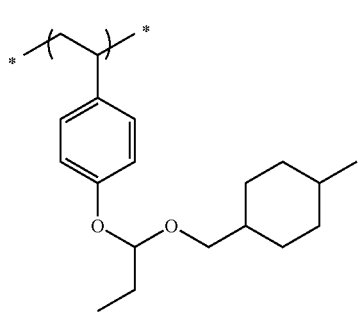
(VI-24)
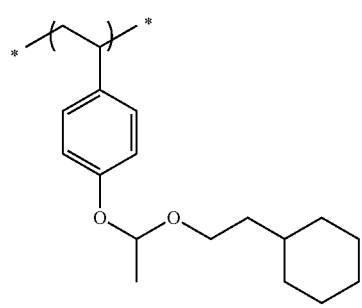
(VI-25)
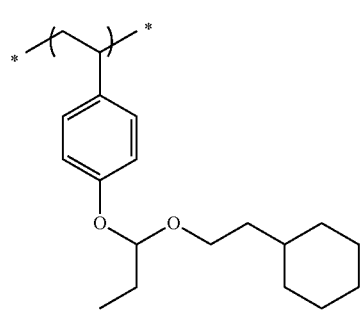
(VI-26)
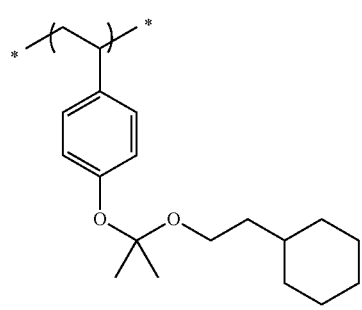
(VI-27)
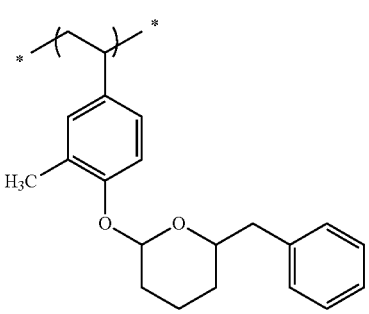
(VI-28)
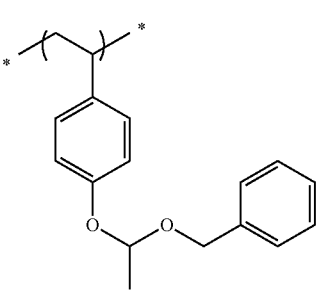

(VI-29)
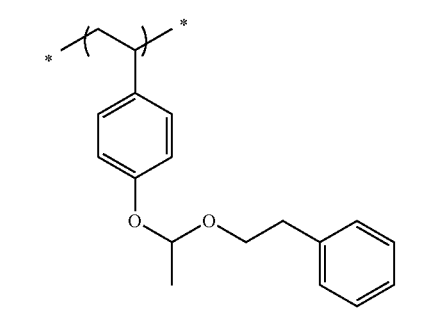
(VI-30)
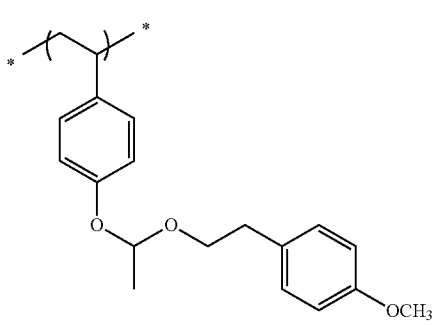
(VI-31)
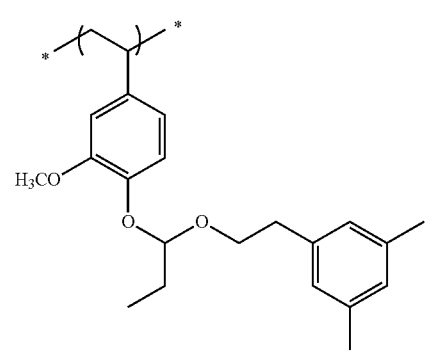
(VI-32)
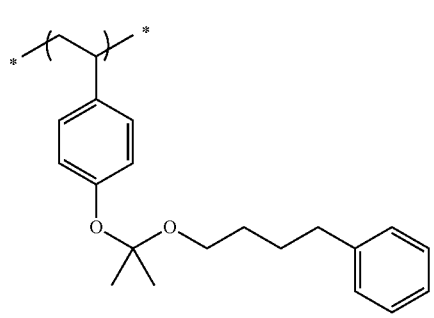
(VI-33)
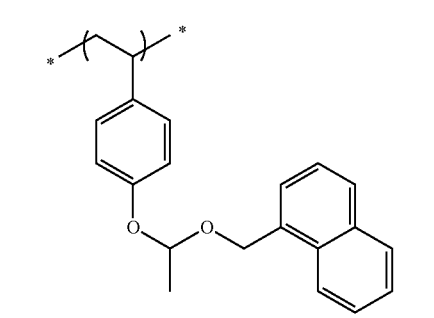
(VI-34)
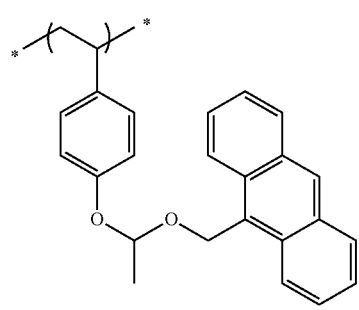
(VI-35)
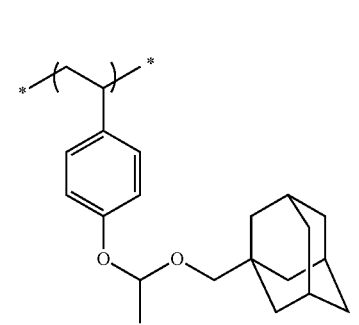
(VI-36)
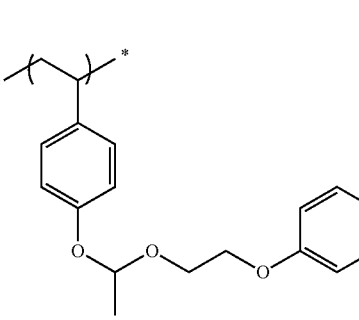
(VI-37)
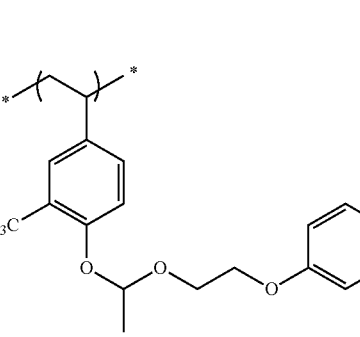
(VI-38)
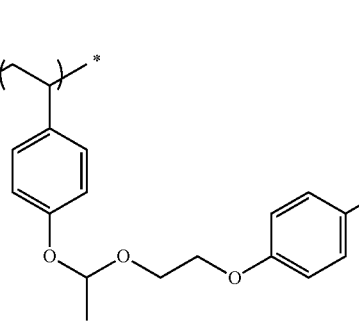

-continued
(VI-39)
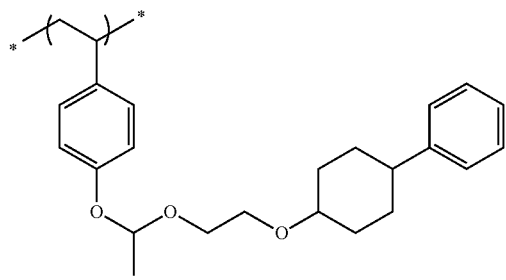
(VI-40)
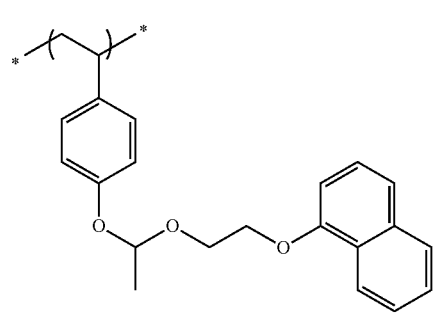
(VI-41)
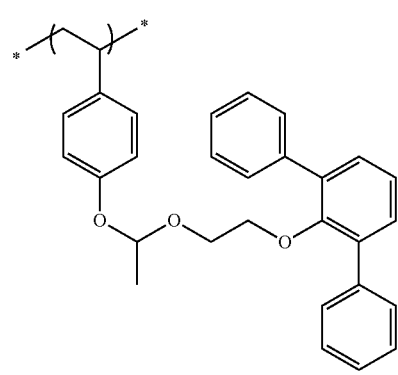
(VI-42)
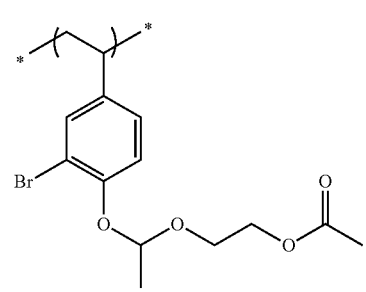
(VI-43)
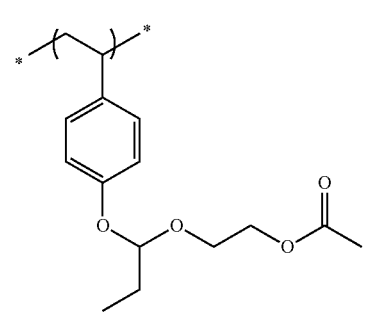
-continued
(VI-44)
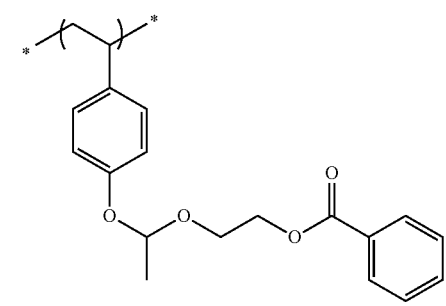
(VI-45)
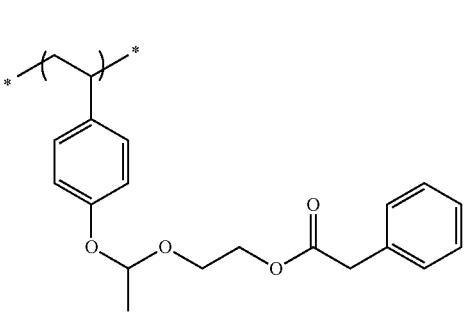
(VI-46)
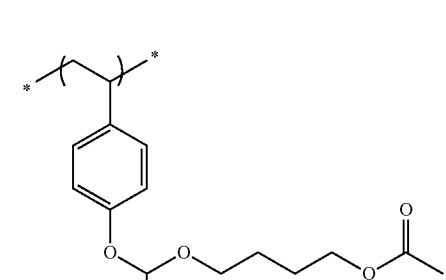
(VI-47)
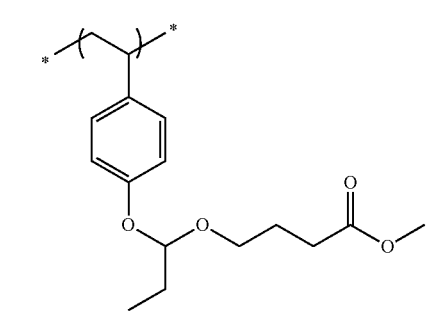
(VI-48)
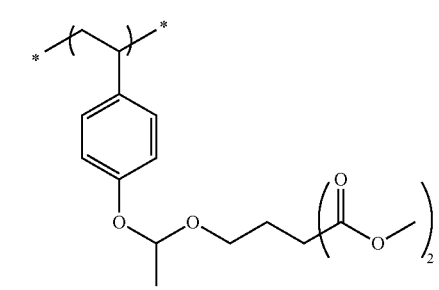

(VI-49)
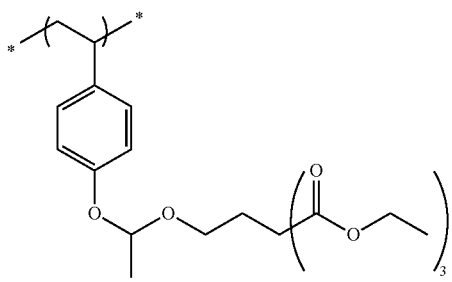
(VI-50)
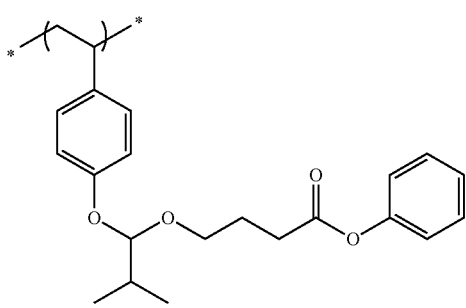
(VI-51)
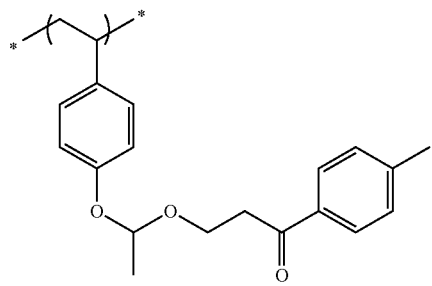
(VI-52)
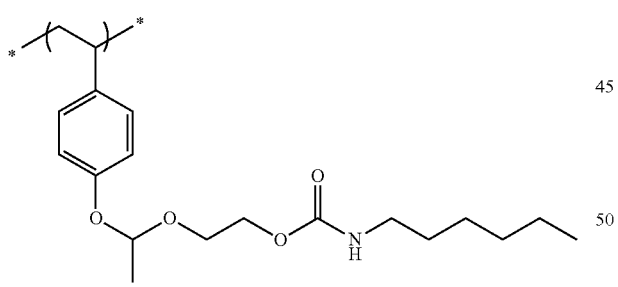
(VI-53)
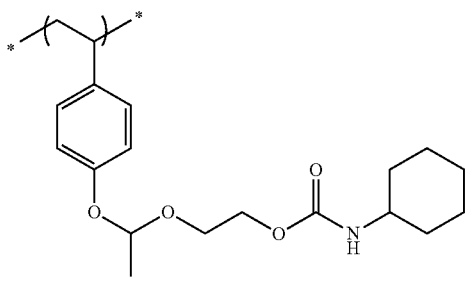
(VI-54)
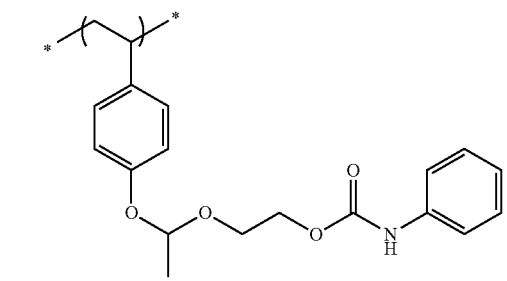
(VI-55)
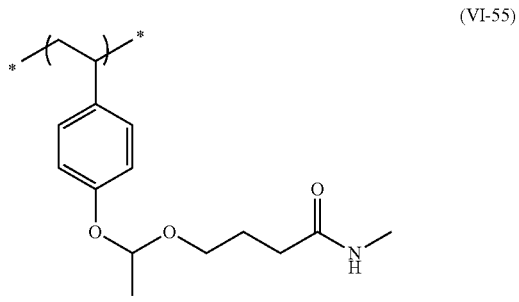
(VI-56)
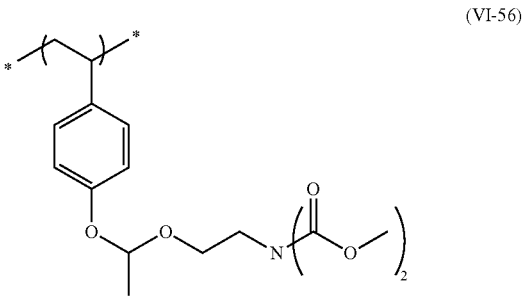
(VI-57)
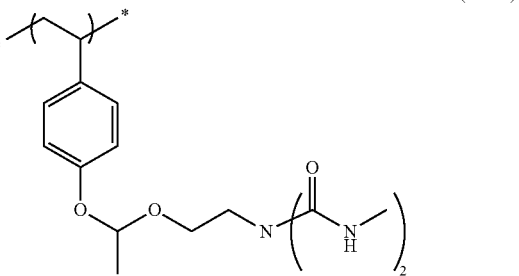
(VI-58)
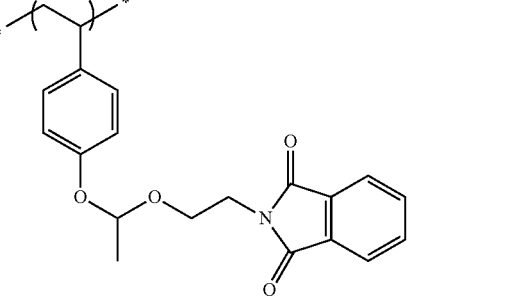

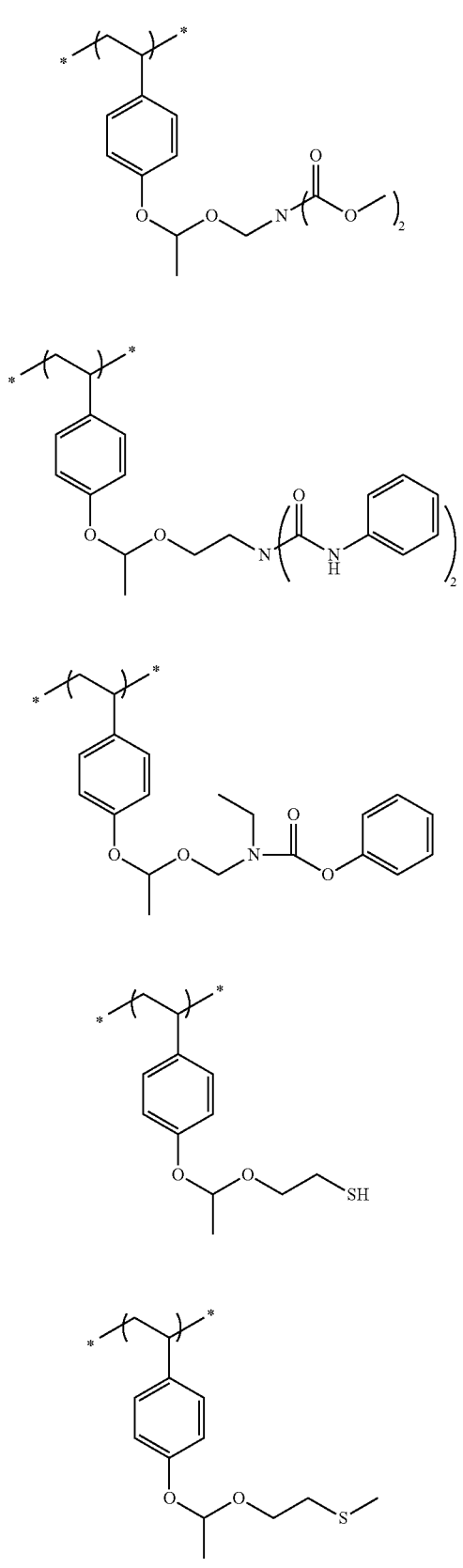
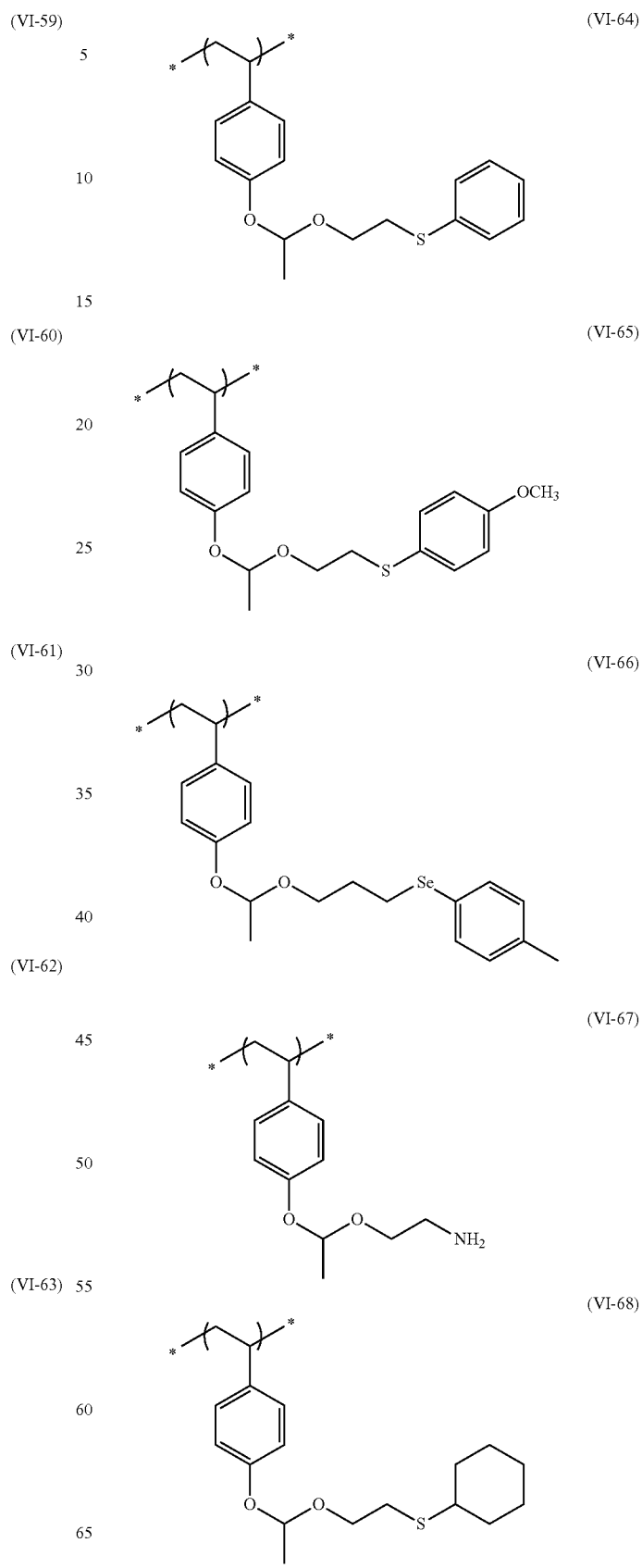

(VI-69)
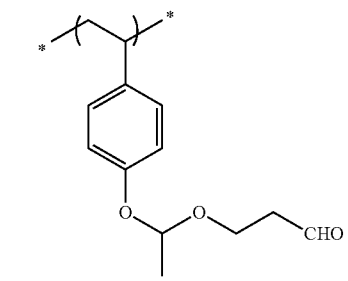
(VI-70)
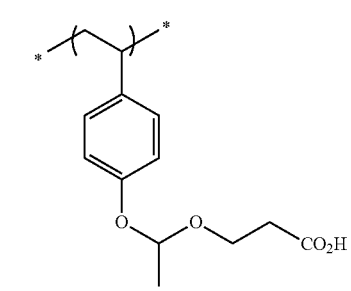
(VI-71)
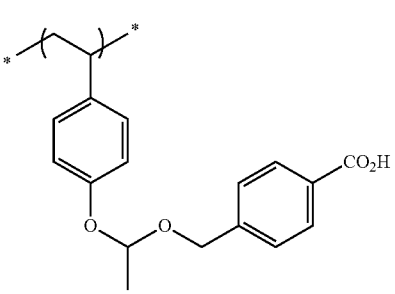
(VI-72)
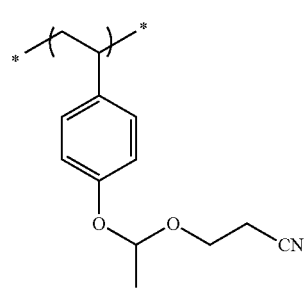
(VI-73)
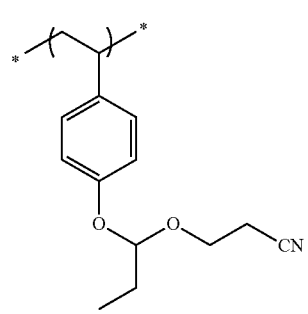
(VI-74)
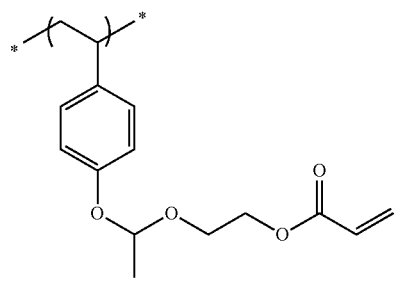
(VI-75)
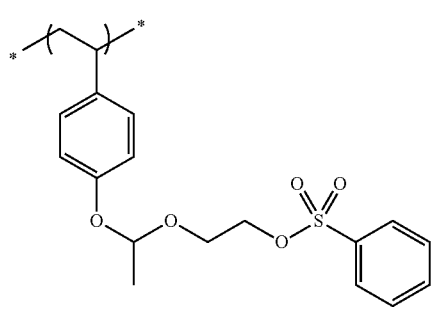
(VI-76)
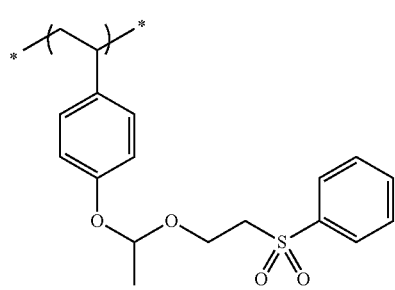
(VI-77)
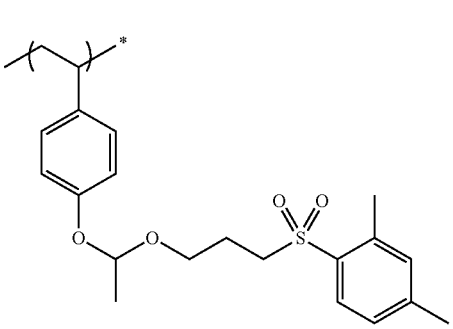
(VI-78)
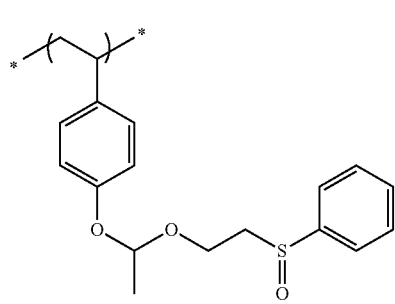

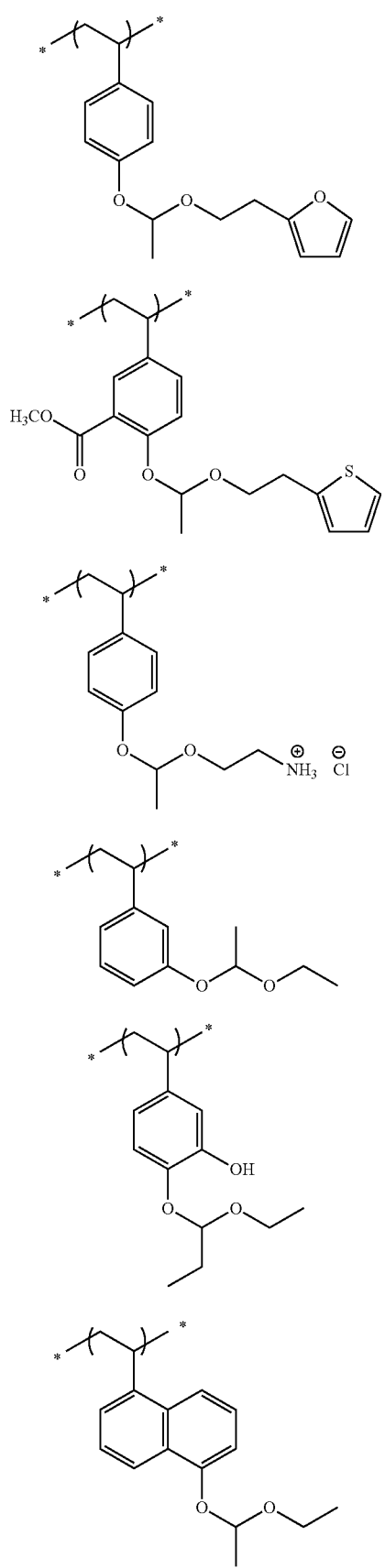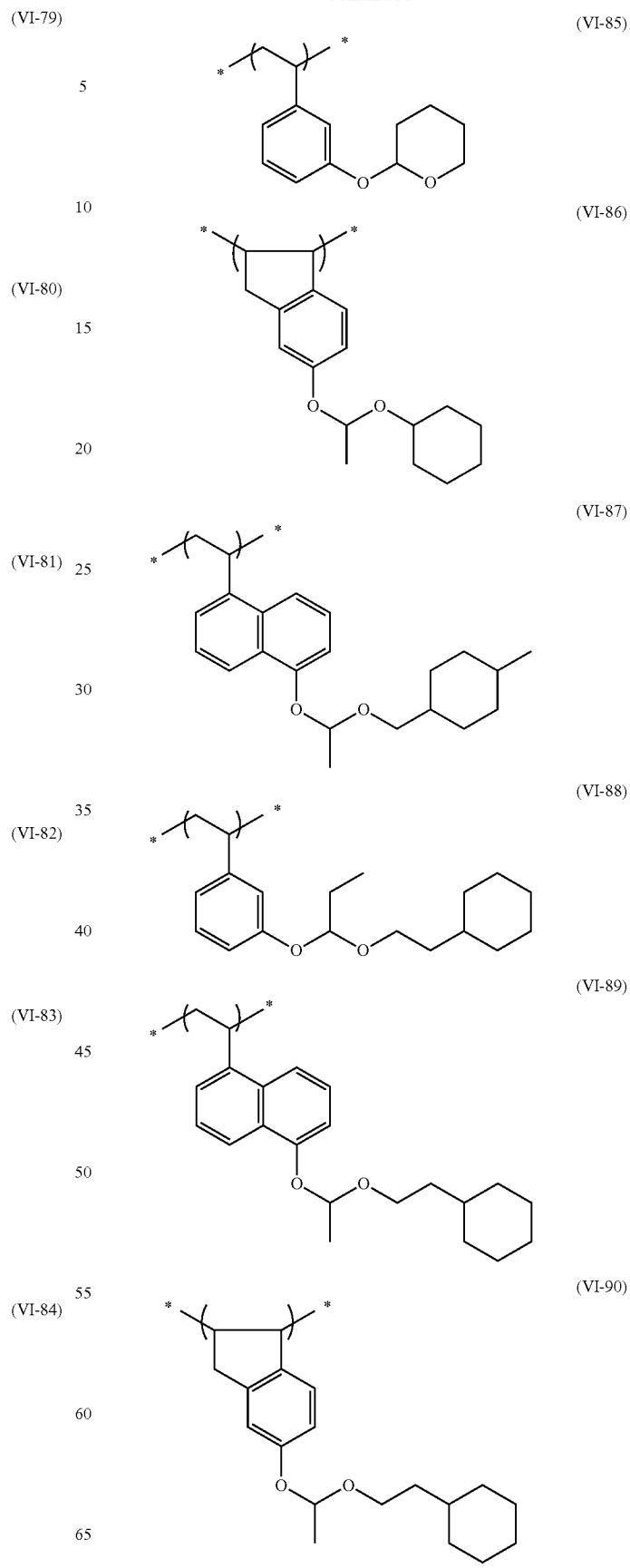

(VI-91) 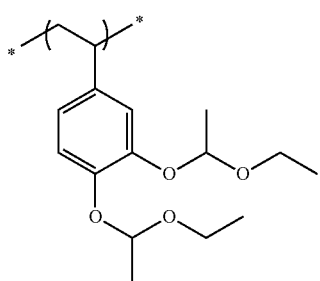
(VI-92) 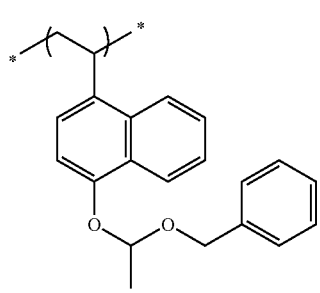
(VI-93) 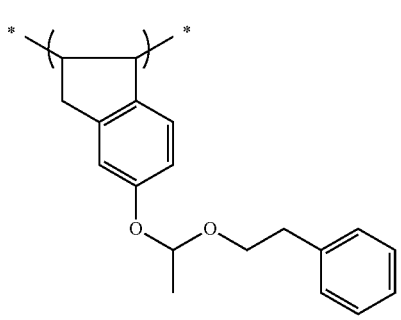
(VI-94) 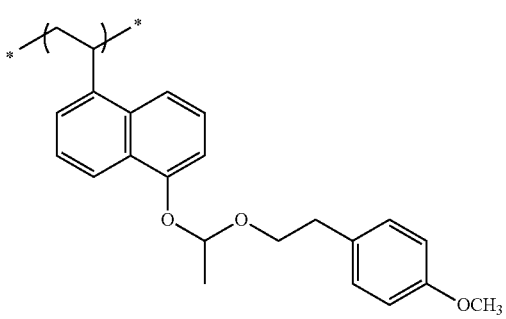
(VI-95) 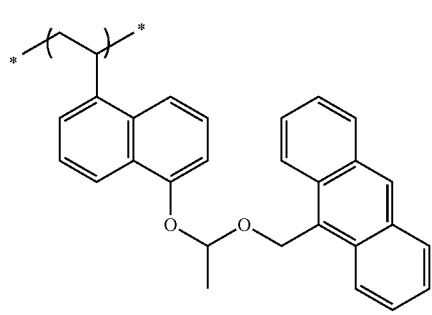
(VI-96) 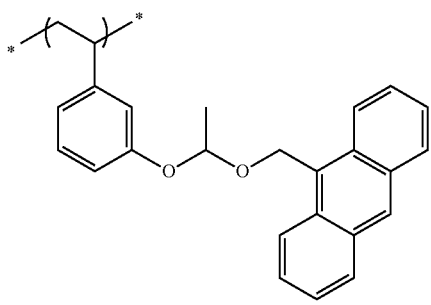
(VI-97) 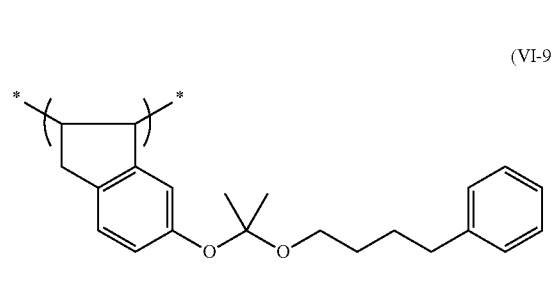
(VI-98) 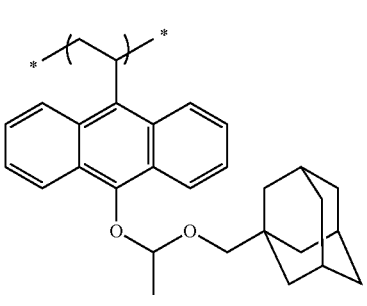
(VI-99) 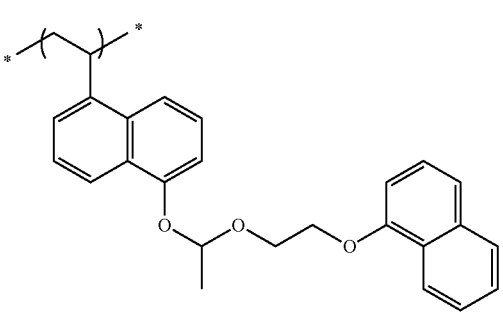
(VI-100) 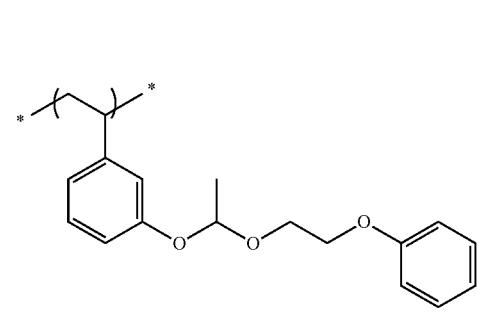

-continued
(VI-101)
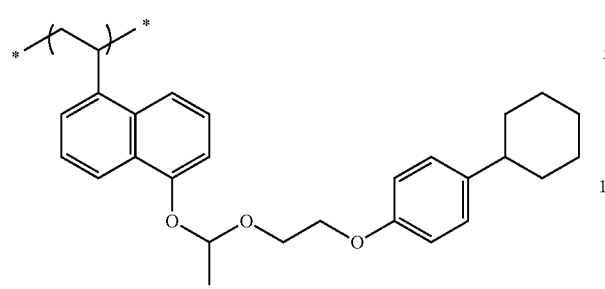
(VI-102)
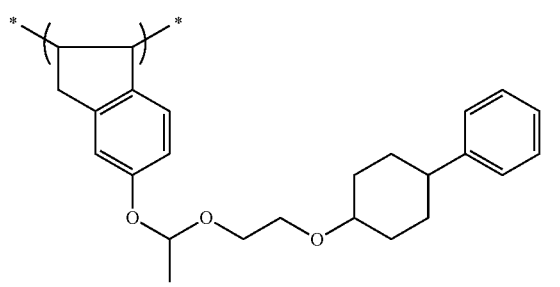
(VI-103)
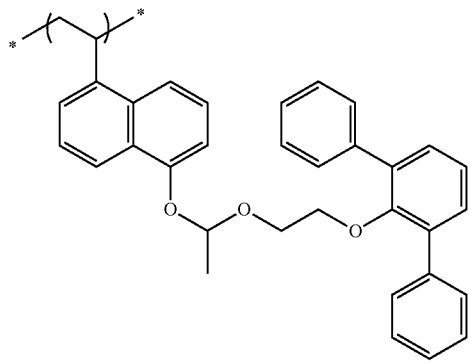
(VI-104)
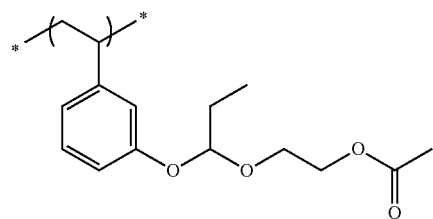
(VI-105)
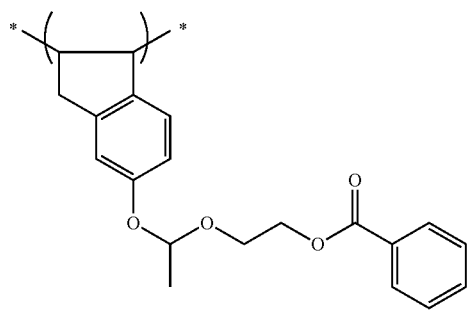
-continued
(VI-106)
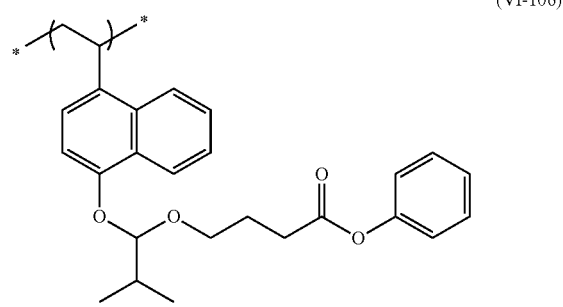
(VI-107)
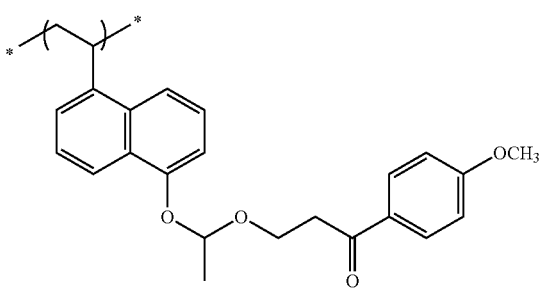
(VI-108)
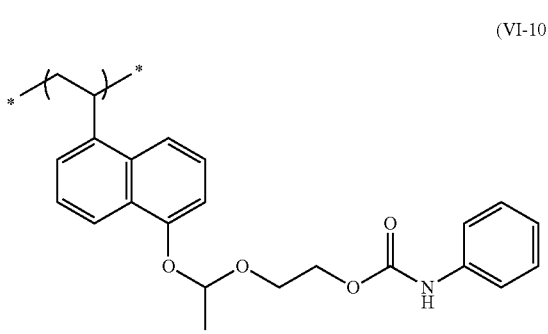
(VI-109)
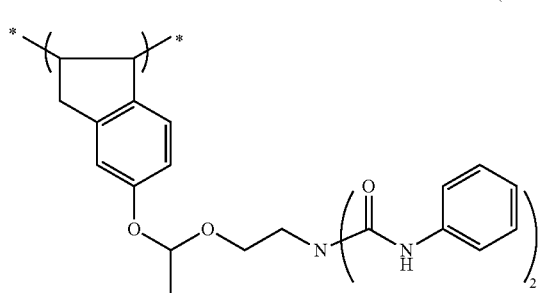
(VI-110)
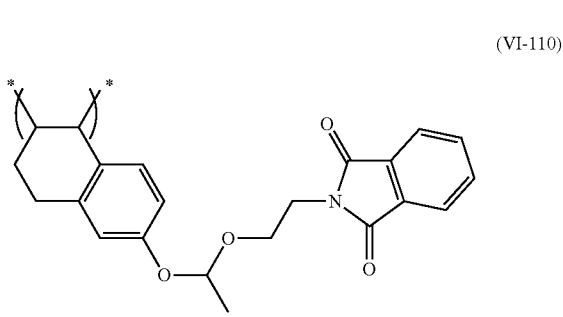

(VI-111)

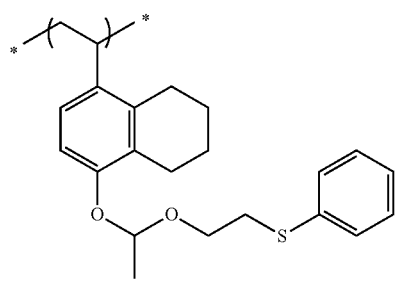

(VI-112)

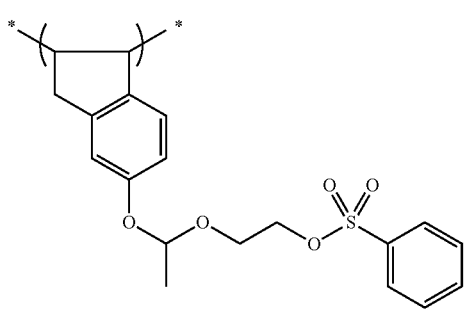

Preferably, the acid-decomposable group is a cumyl ester group, an enol ester group, an acetal ester group, a tertiary alkyl ester group or the like. A tertiary alkyl ester group is more preferred.

It is preferred for the repeating unit containing an acid-decomposable group that can be introduced in the resin (P) to be any of the repeating units of general formula (ES) below. When this repeating unit is introduced in the resin (P), the effect of the compound (U) in the reduction of development defects can be enhanced.

(ES)

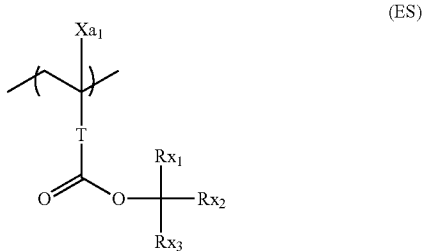

In the formula, $Xa_1$ represents a hydrogen atom, a methyl group, a trifluoromethyl group or a hydroxymethyl group;

T represents a single bond or a bivalent connecting group; and each of $Rx_1$ to $Rx_3$ independently represents an alkyl group or a cycloalkyl group, provided that at least two of $Rx_1$ to $Rx_3$ may be bonded to each other to thereby form a ring.

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —CH$_2$— group or —(CH$_2$)$_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group.

The cycloalkyl group formed by the mutual bonding of at least two of $Rx_1$ to $Rx_3$ is preferably a monocycloalkyl group, such as a cyclopentyl group or a cyclohexyl group, or a polycycloalkyl group, such as a norbornyl group, a tetracyclodecanyl group, a tetracyclododecanyl group or an adamantyl group. A monocycloalkyl group having 5 or 6 carbon atoms is especially preferred.

In a preferred mode, $Rx_1$ is a methyl group or an ethyl group, and $Rx_2$ and $Rx_3$ are bonded to each other to thereby form any of the above-mentioned cycloalkyl groups.

A substituent may be introduced in these groups. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like. The number of carbon atoms of any of these groups is preferably not larger than 8.

Particular examples of the repeating units of general formula (ES) are shown below, which however in no way limit the scope of the present invention. In the particular examples, each of Rx and $Xa_1$ represents a hydrogen atom, CH$_3$, CF$_3$ or CH$_2$OH. Each of Rxa and Rxb represents an alkyl group having 1 to 4 carbon atoms. Z, or each of Z's independently, represents a substituent containing a polar group. In the formulae, p is 0 or a positive integer.

1

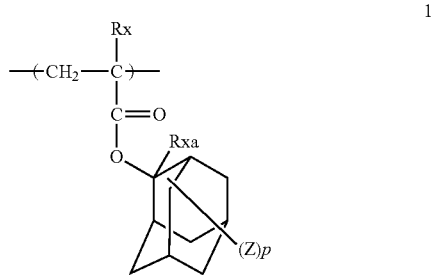

2

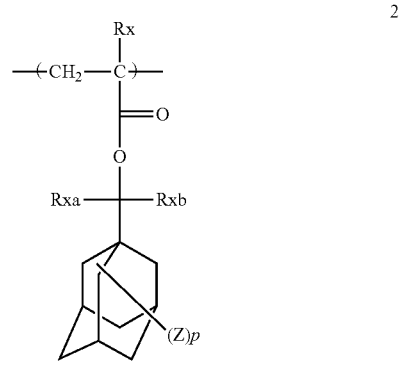

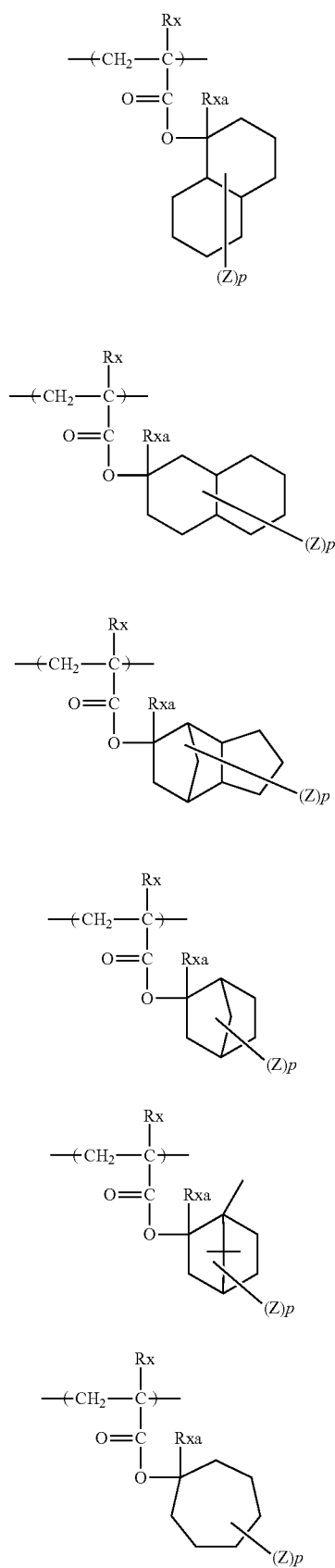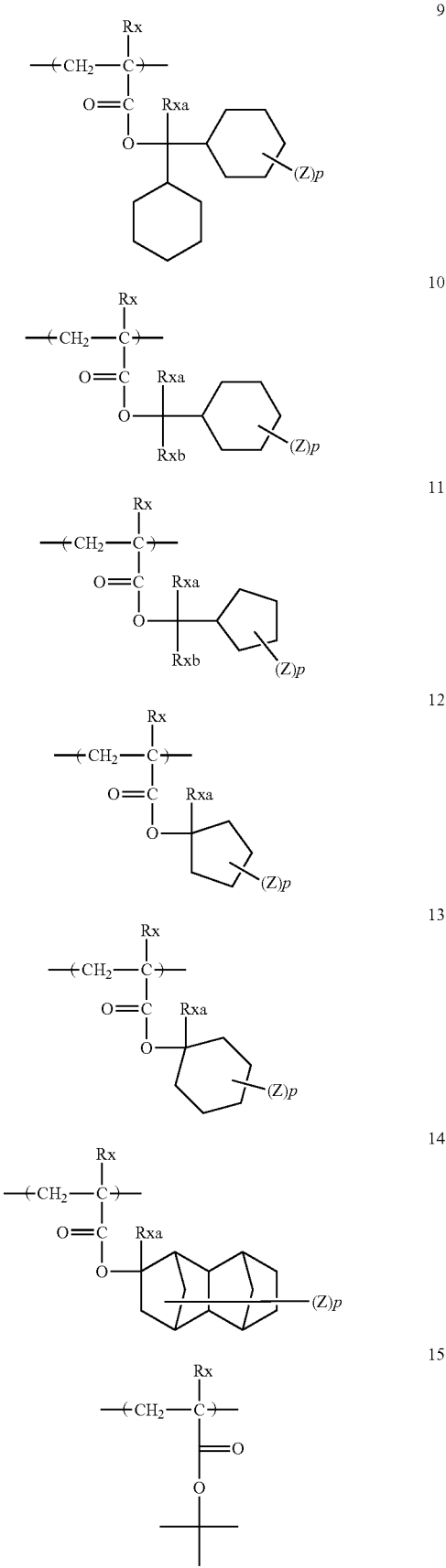

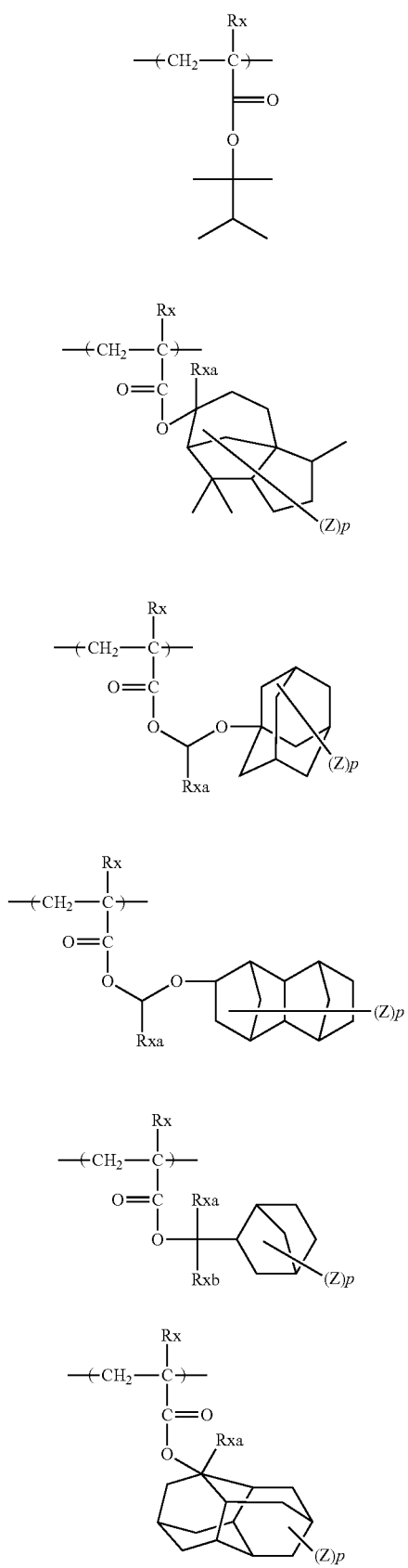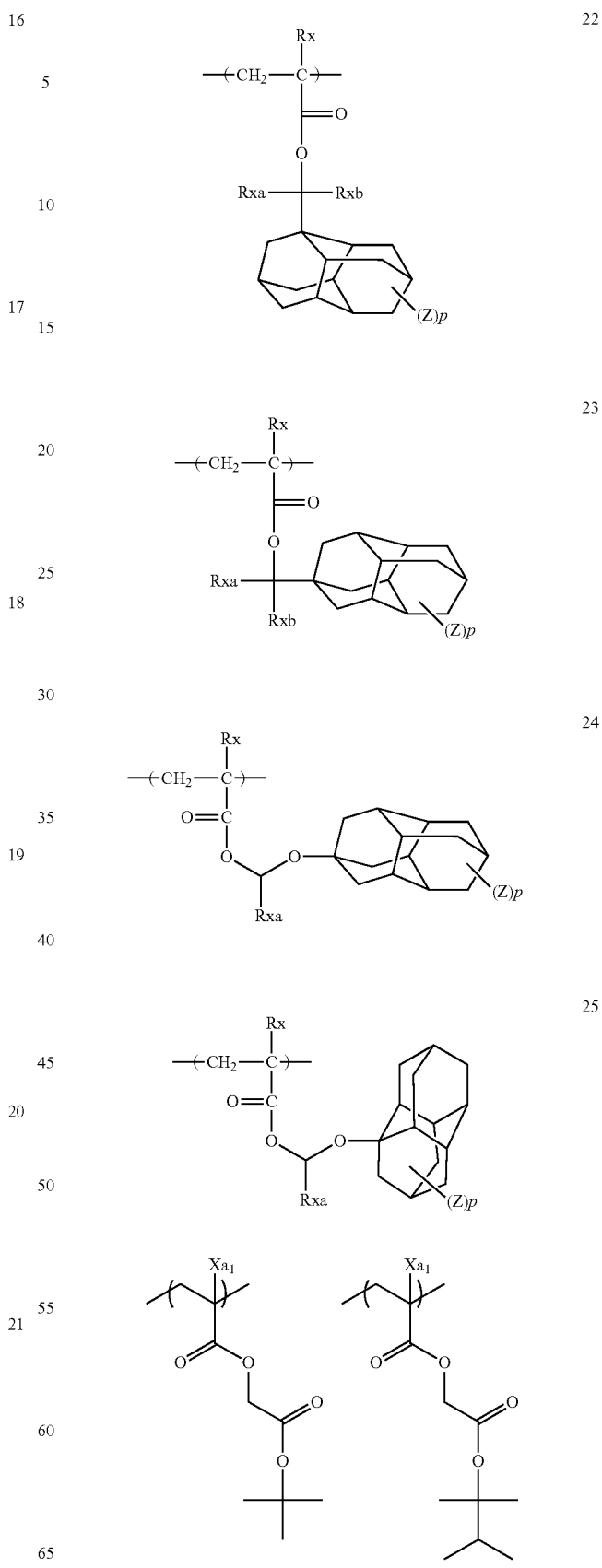

153
-continued
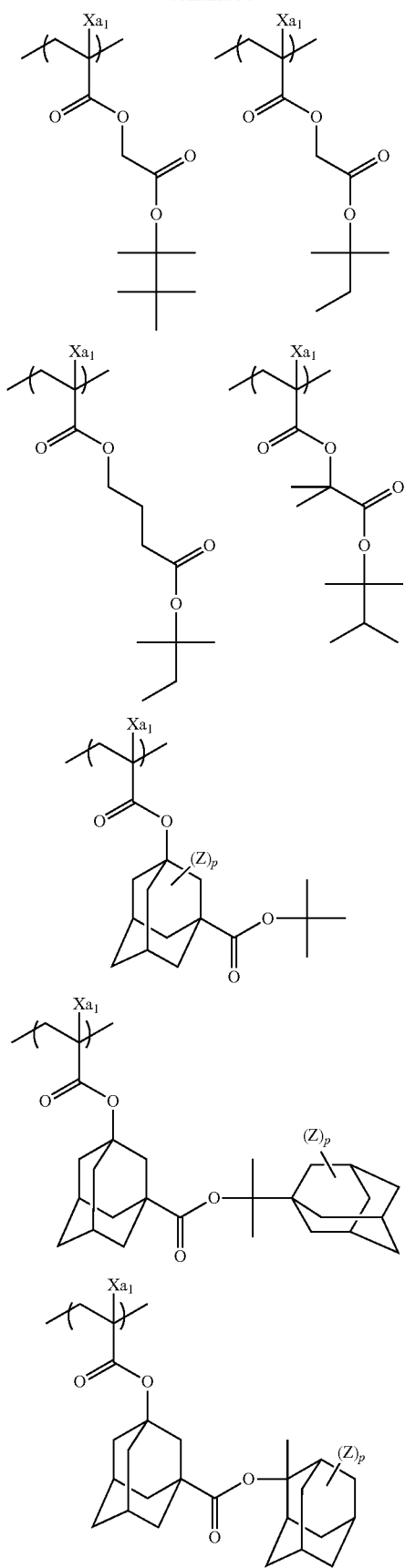
154
-continued
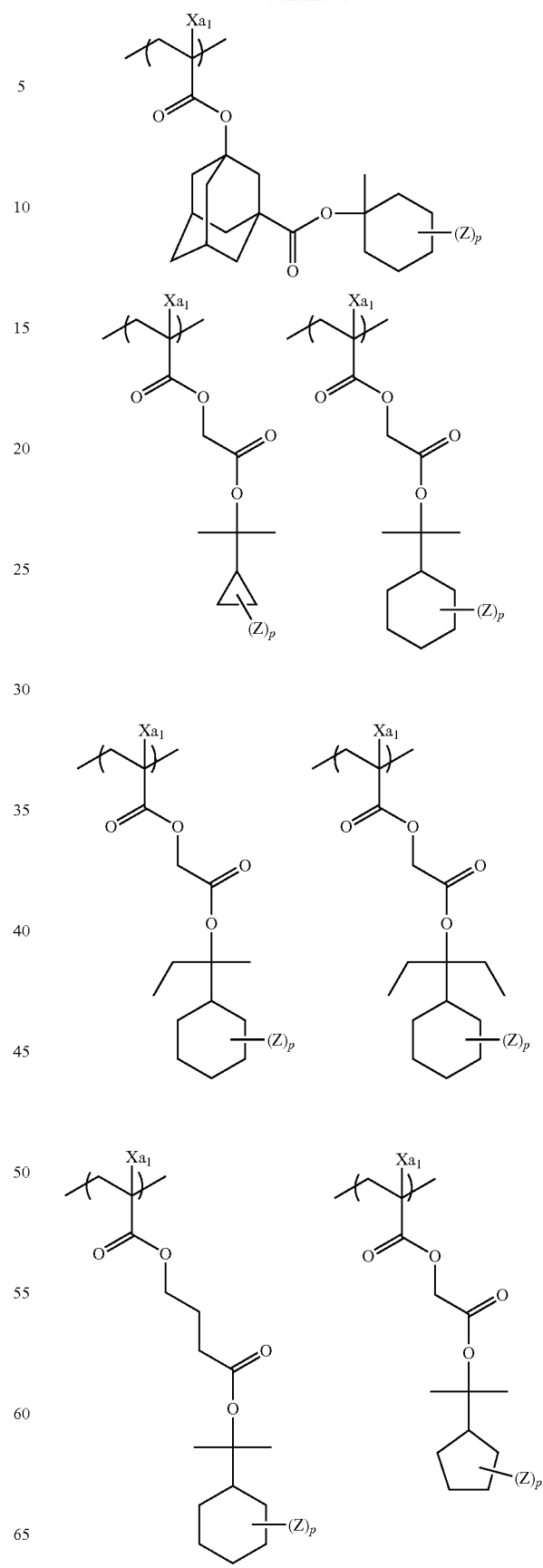

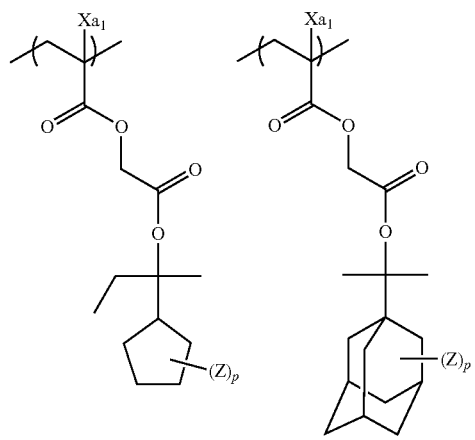
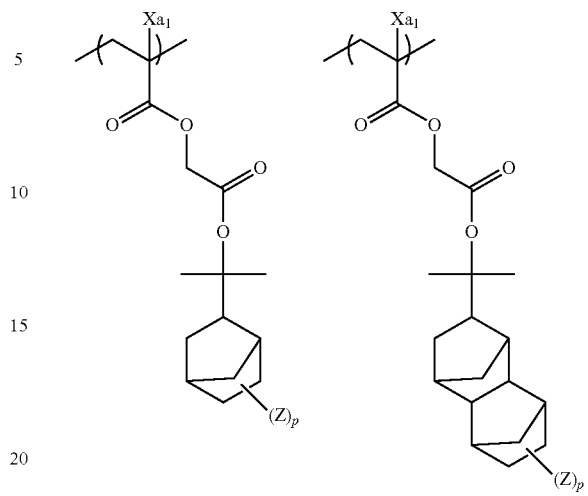
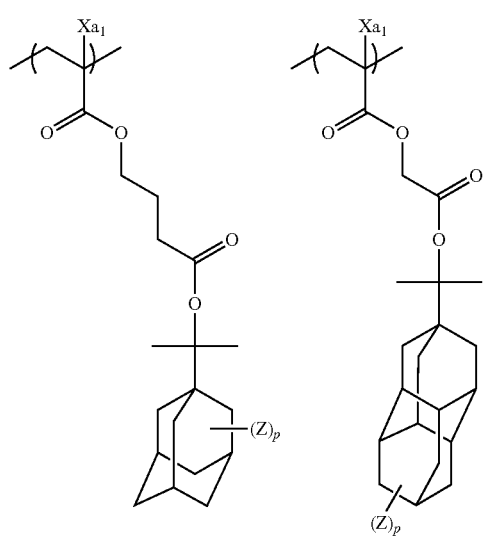
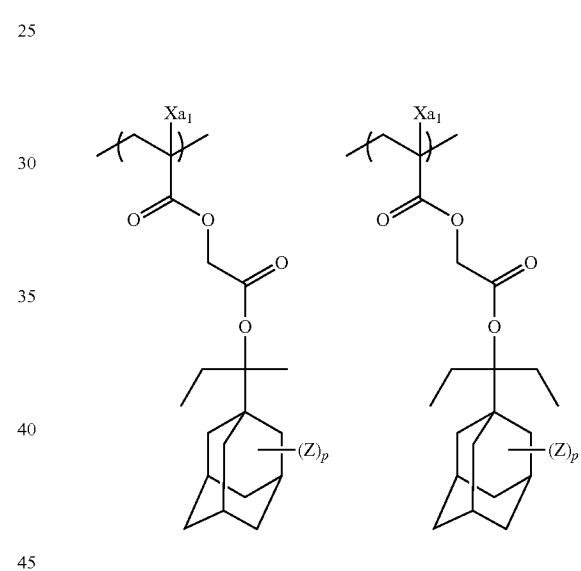
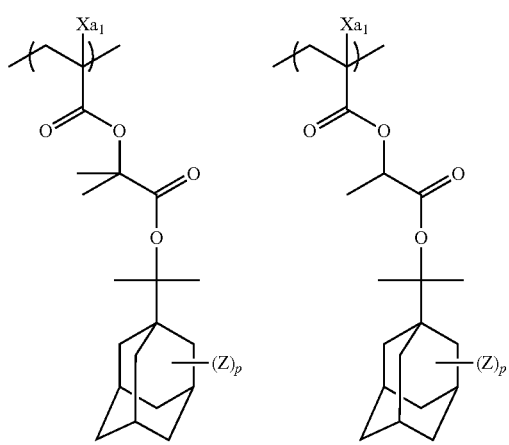

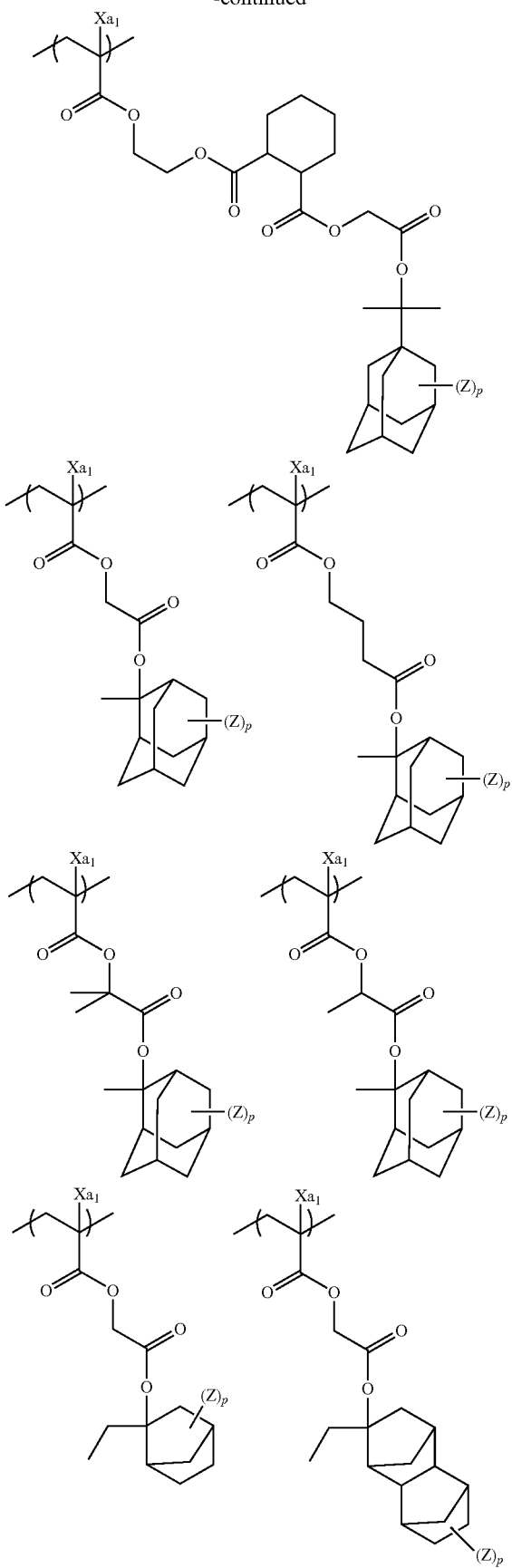
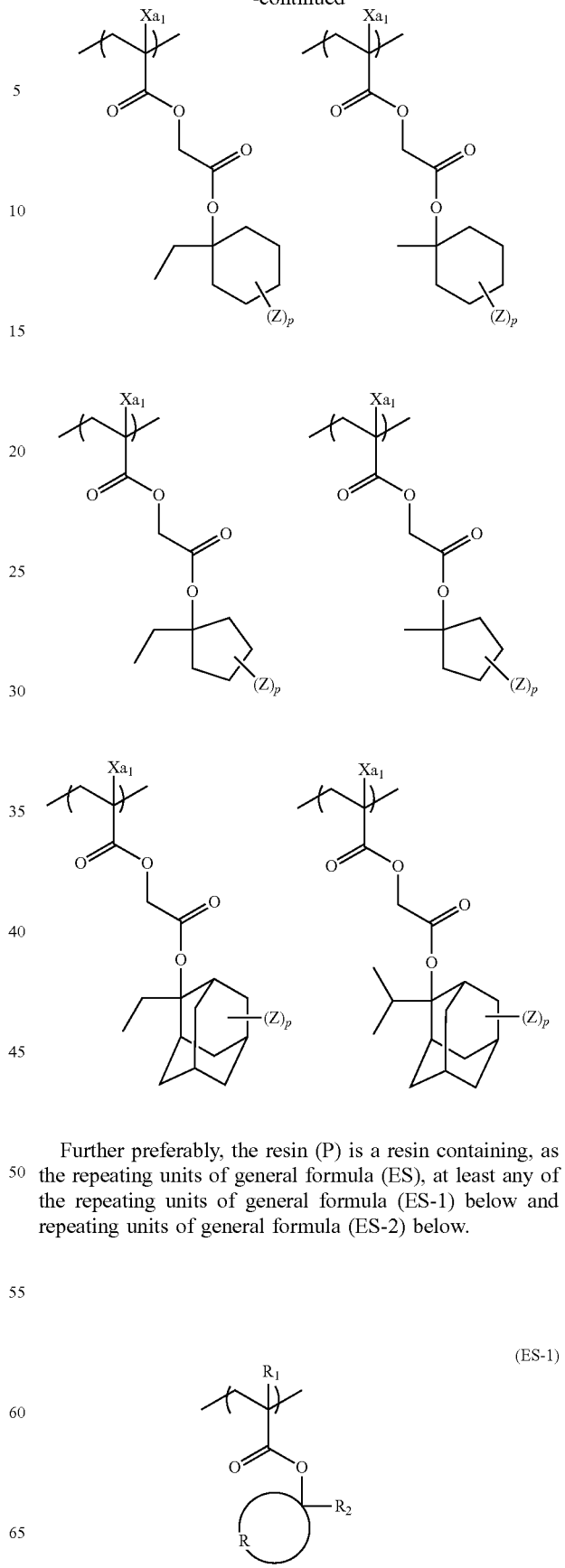
Further preferably, the resin (P) is a resin containing, as the repeating units of general formula (ES), at least any of the repeating units of general formula (ES-1) below and repeating units of general formula (ES-2) below.
(ES-1)

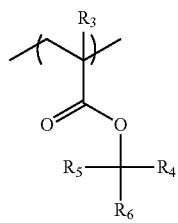

(ES-2)

In general formulae (ES-1) and (ES-2), each of $R_1$ and $R_3$ independently has the same meaning as $Xa_1$ of general formula (ES).

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and a substituent may be introduced therein.

The cycloalkyl group represented by $R_2$ may be monocyclic or polycyclic, and a substituent may be introduced therein.

$R_2$ is preferably an alkyl group, more preferably an alkyl group having 1 to 10 carbon atoms, further more preferably 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and a substituent may be introduced therein. The alkyl groups are preferably those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and a substituent may be introduced therein. The cycloalkyl groups are preferably a monocycloalkyl group, such as a cyclopentyl group or a cyclohexyl group, and a polycycloalkyl group, such as a norbornyl group, a tetracyclodecanyl group, a tetracyclododecanyl group or an adamantyl group.

As the repeating units of general formula (ES-1), there can be mentioned, for example, those of general formula (ES-1a) below.

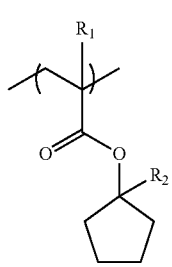

(ES-1a)

In the formula, $R_1$ and $R_2$ are as defined above in connection with general formula (ES-1).

The repeating units of general formula (ES-2) are preferably those of general formula (ES-2a) below.

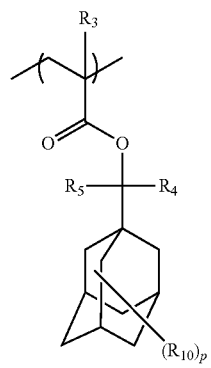

(ES-2a)

In general formula (ES-2a), $R_3$ to $R_5$ have are as defined above in connection with general formula (ES-2).

$R_{10}$ represents a substituent containing a polar group. When a plurality of $R_{10}$s exist, they may be identical to or different from each other. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. An isopropyl group is especially preferred as the branched alkyl group.

In the formula, p is an integer of 0 to 15, preferably in the range of 0 to 2, and more preferably 0 or 1.

It is more preferred for the acid-decomposable resin to be a resin containing, as the repeating units of general formula (ES), at least either any of the repeating units of general formula (ES-1) or any of the repeating units of general formula (ES-2). In another form, it is more preferred for the acid-decomposable resin to be a resin containing, as the repeating units of general formula (ES), at least two types selected from among the repeating units of general formula (ES-1).

When acid-decomposable repeating units are used in combination in the resin (P), preferred combinations are as shown below. In the following formulae, each of R's independently represents a hydrogen atom or a methyl group.

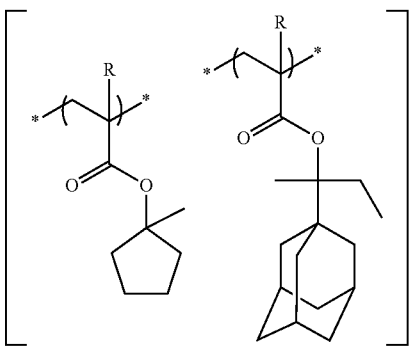

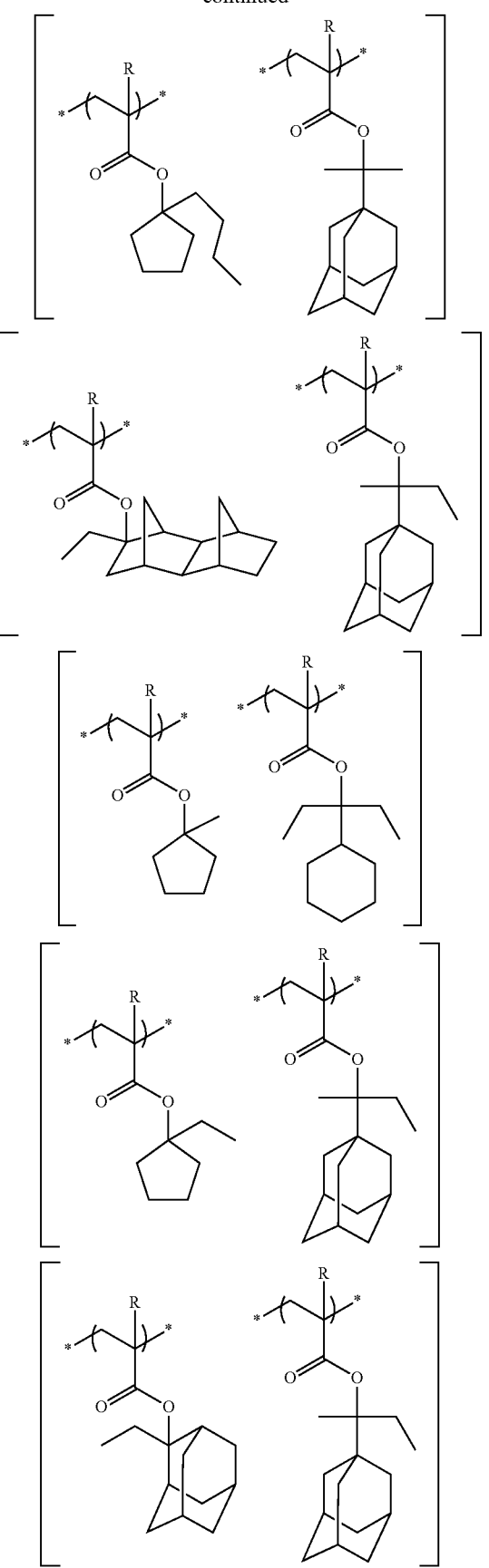
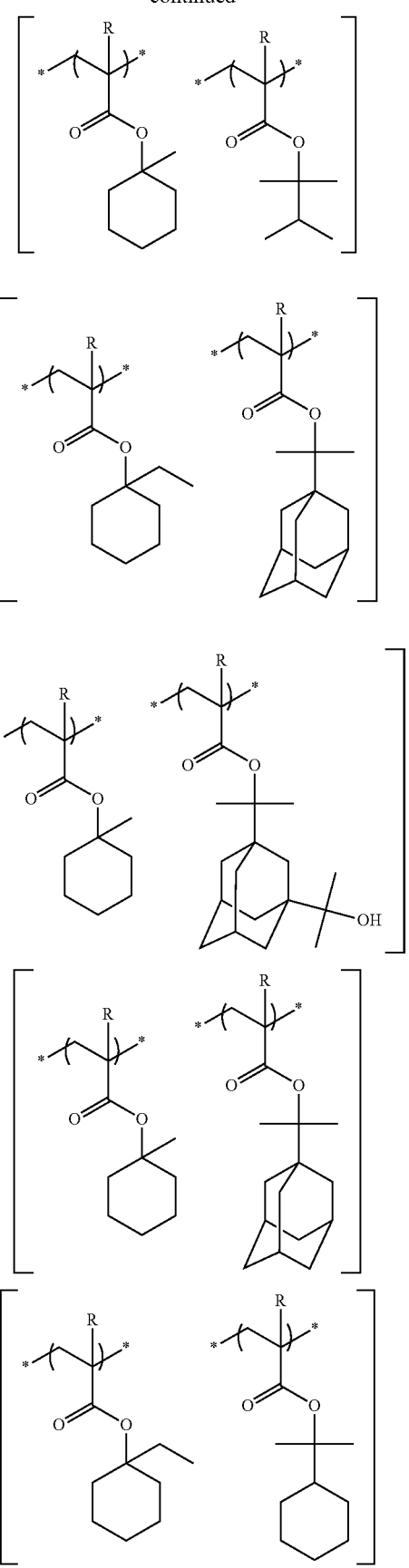

163
-continued
164
-continued
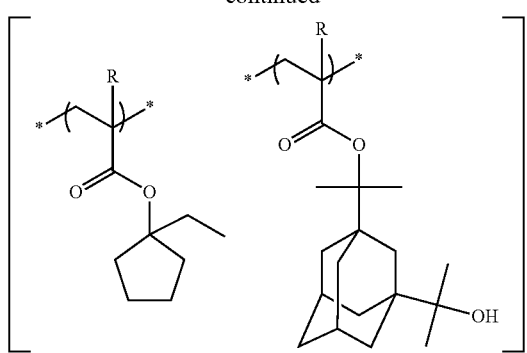
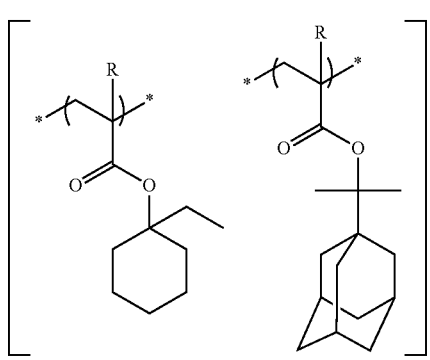
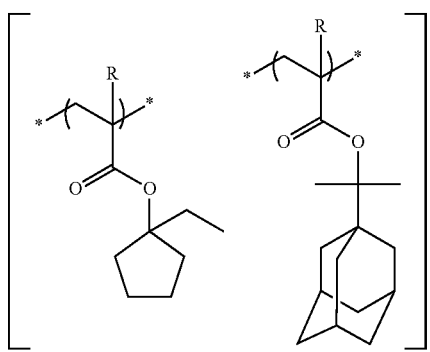
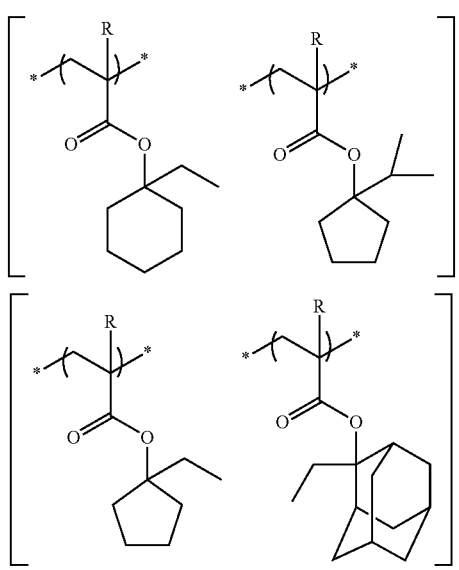
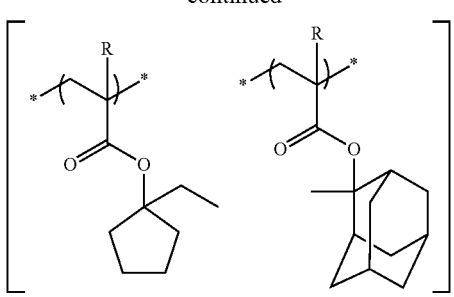
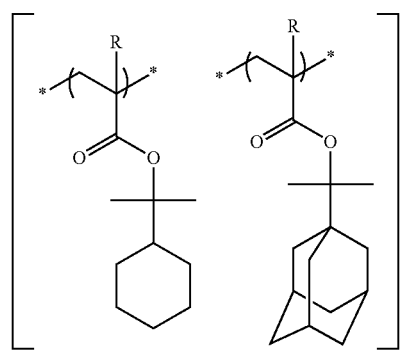
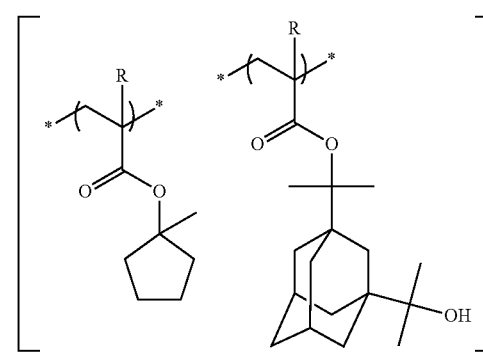
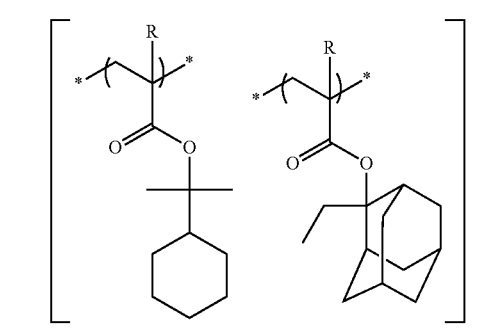
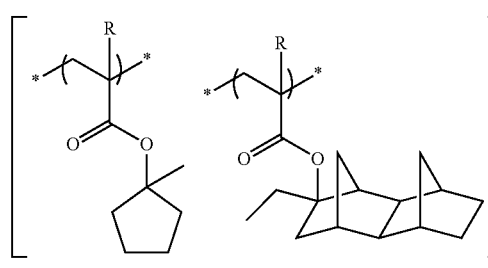

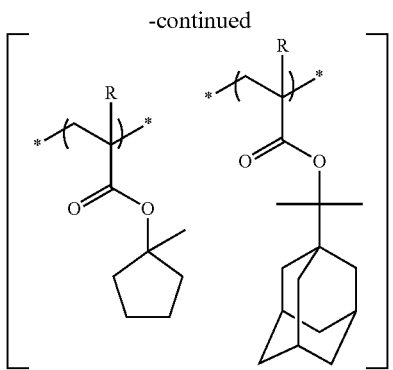

In the resin (P) according to the present invention, the content of repeating unit (B) based on all the repeating units of the resin is preferably in the range of 3 to 90 mol %, more preferably 5 to 80 mol % and most preferably 7 to 70 mol %.

In the resin, the ratio between repeating unit (A) and repeating unit (B) (molar quantity of A/molar quantity of B) is preferably in the range of 0.04 to 1.0, more preferably 0.05 to 0.8 and most preferably 0.06 to 0.6.

[Repeating Unit (C)]

It is preferred for the resin (P) according to the present invention to contain a repeating unit (C) containing an alkali-soluble group. The repeating unit (C) preferably contains an alkali-soluble group with an aromatic ring group, more preferably having the structure of general formula (C-I) below.

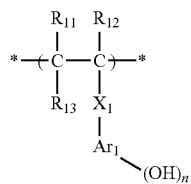

(C-I)

In the formula, each of $R_{11}$, $R_{12}$ and $R_{13}$ independently represents a hydrogen atom, an alkyl group, a cycloalkyl group, a halogen atom, a cyano group or an alkoxycarbonyl group. $R_{13}$ may be bonded to $Ar_1$ to thereby form a ring (preferably a 5- or 6-membered ring), which $R_{13}$ is preferably an alkylene group.

$X_1$ represents a single bond or a bivalent connecting group.

$Ar_1$ represents a bivalent aromatic ring group, provided that when a ring is formed by bonding to $R_{13}$, $Ar_1$ represents a trivalent aromatic ring group, and n is an integer of 1 to 4.

Particular examples of the alkyl groups, cycloalkyl groups, halogen atoms and alkoxycarbonyl groups represented by $R_{11}$, $R_{12}$ and $R_{13}$ of formula (C-I) and also particular examples of the substituents that can be introduced in these groups are the same as set forth above in connection with general formula (V).

$X_1$ represents a single bond or a bivalent connecting group. As the bivalent connecting group represented by $X_1$, there can be mentioned, for example, —COO—, —CONH—, —OCO—, —CO—, —O—, —S—, —SO—, —SO$_2$—, —SO$_3$—, —NH—, an alkylene group, a cycloalkylene group or an alkenylene group. Of these, —COO—, —CONH—, —OCO—, —CO—, —S—, —SO—, —SO$_2$— and —SO$_3$— are preferred. —COO—, —CONH—, —COO—, —SO$_2$— and —SO$_3$— are more preferred.

$Ar_1$ represents a bivalent aromatic ring group. A substituent may be introduced in the bivalent aromatic ring group. As preferred examples of the bivalent aromatic ring groups, there can be mentioned an arylene group having 6 to 18 carbon atoms, such as a phenylene group, a tolylene group, a naphthylene group or an anthracenylene group, and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Preferred substituents that can be introduced in these groups include an alkyl group, an alkoxy group such as a methoxy group, an ethoxy group, a hydroxyethoxy group, a propoxy group, a hydroxypropoxy group or a butoxy group and an aryl group such as a phenyl group, as mentioned in connection with $R_{51}$ to $R_{53}$.

$Ar_1$ is more preferably an optionally substituted arylene group having 6 to 18 carbon atoms. A phenylene group, a naphthylene group and a biphenylene group are most preferred.

The content of repeating unit containing an alkali-soluble group expressed by general formula (C-I), based on all the repeating units of the resin (P), is preferably in the range of 3 to 90 mol %, more preferably 5 to 80 mol % and further more preferably 7 to 70 mol %.

Particular examples of the repeating units each containing an alkali-soluble group of general formula (C-I) are shown below, which in no way limit the scope of the present invention. In the following formulae, a is an integer of 0 to 2.

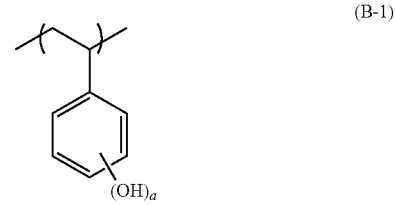

(B-1)

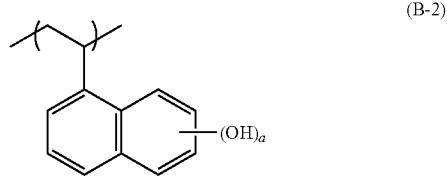

(B-2)

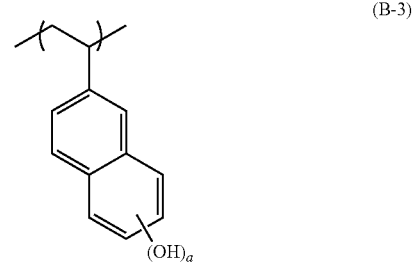

(B-3)

(B-4) 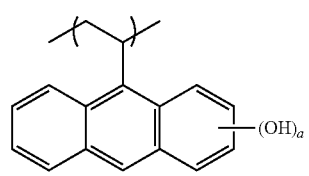
(B-5) 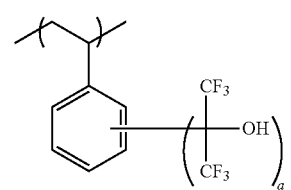
(B-6) 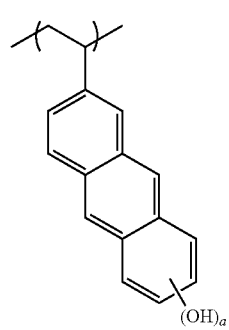
(B-7) 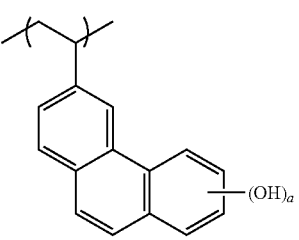
(B-8) 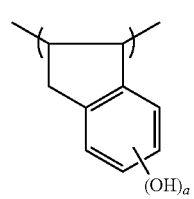
(B-9) 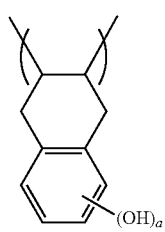
(B-10) 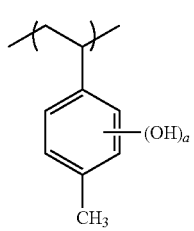
(B-11) 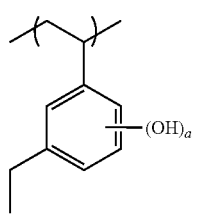
(B-12) 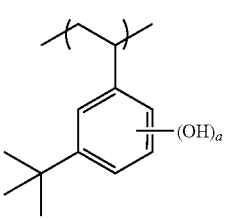
(B-13) 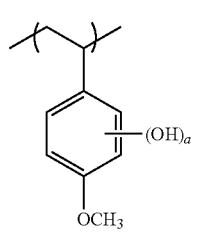
(B-14) 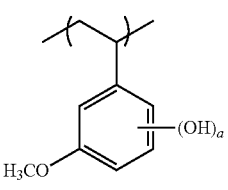
(B-15) 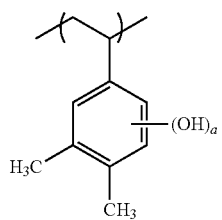
(B-16) 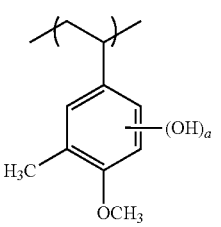
(B-17) 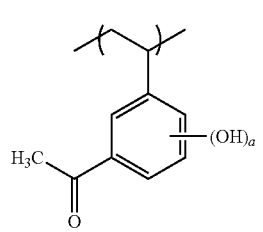

(B-18) 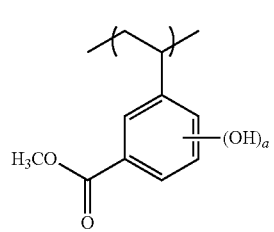
(B-19) 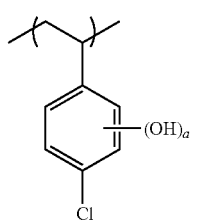
(B-20) 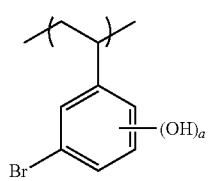
(B-21) 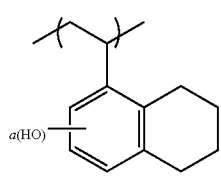
(B-22) 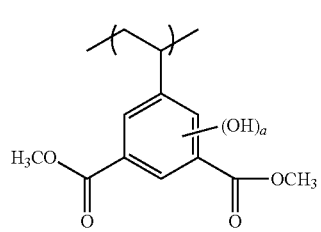
(B-23) 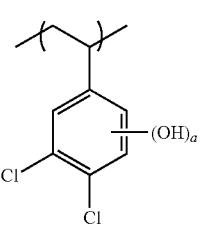
(B-24) 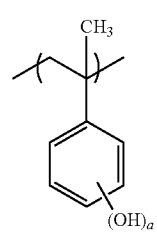
(B-25) 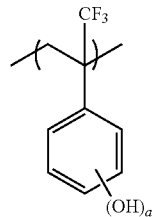
(B-26) 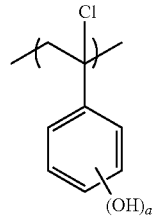
(B-27) 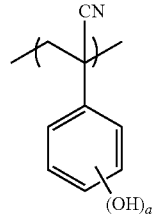
(B-28) 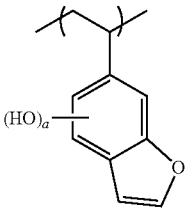
(B-29) 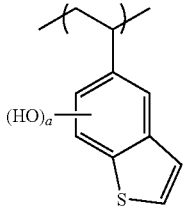
(B-30) 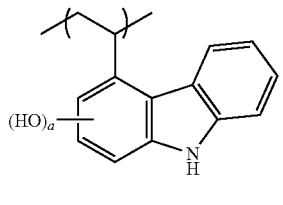
(B-31) 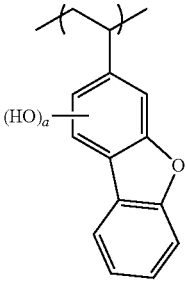

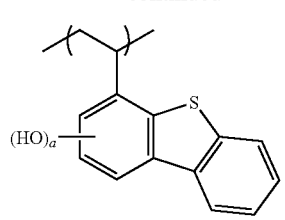
(B-32)

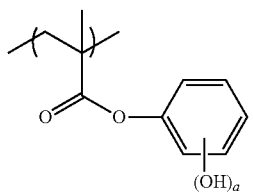
(B-33)

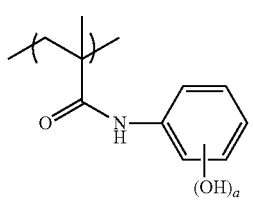
(B-34)

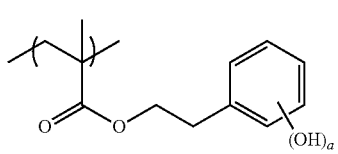
(B-35)

[Repeating Unit (D)]

Still further preferably, the resin (P) contains a repeating unit (D) containing a group that is decomposed by the action of an alkali developer to thereby increase its rate of dissolution into the alkali developer.

As the group that is decomposed by the action of an alkali developer to thereby increase its rate of dissolution into the alkali developer, there can be mentioned a lactone structure, a phenyl ester structure or the like.

It is preferred for the repeating unit (D) to be any of the repeating units of general formula (AII) below.

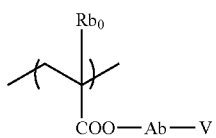
(AII)

In general formula (AII), $Rb_0$ represents a hydrogen atom, a halogen atom or an optionally substituted alkyl group (preferably having 1 to 4 carbon atoms).

As preferred substituents that may be introduced in the alkyl group represented by $Rb_0$, there can be mentioned a hydroxyl group and a halogen atom. As the halogen atom represented by $Rb_0$, there can be mentioned a fluorine atom, a chlorine atom, a bromine atom or an iodine atom. $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with a monocyclic or polycyclic aliphatic hydrocarbon ring structure, an ether group, an ester group, a carbonyl group, or a bivalent connecting group resulting from combination of these. Ab is preferably a single bond or any of the bivalent connecting groups of the formula -$Ab_1$-$CO_2$—.

$Ab_1$ represents a linear or branched alkylene group or a monocyclic or polycyclic aliphatic hydrocarbon ring group, preferably a methylene group, an ethylene group, a cyclohexylene group, an adamantylene group or a norbornylene group.

V represents a group that is decomposed by the action of an alkali developer to thereby increase its rate of dissolution into the alkali developer. V is preferably a group with an ester bond. In particular, a group with a lactone structure is more preferred.

The group with a lactone structure is not limited as long as a lactone structure is introduced therein. A 5 to 7-membered ring lactone structure is preferred, and one resulting from the condensation of a 5 to 7-membered ring lactone structure with another cyclic structure effected in a fashion to form a bicyclo structure or spiro structure is especially preferred. More preferably, V is a group with any of the lactone structures of general formulae (LC1-1) to (LC1-17) below. The lactone structures may be directly bonded to the principal chain. Preferred lactone structures are those of formulae (LC1-1), (LC1-4), (LC1-5), (LC1-6), (LC1-13), (LC1-14) and (LC1-17).

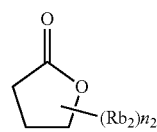
LC1-1

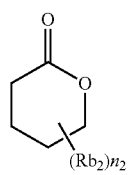
LC1-2

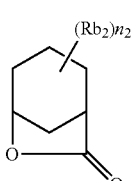
LC1-3

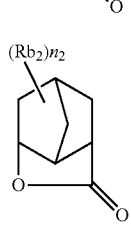
LC1-4

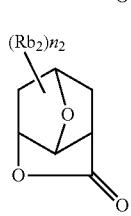
LC1-5

LC1-6 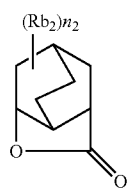

LC1-7 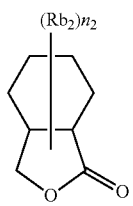

LC1-8 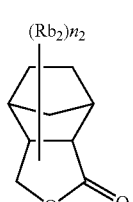

LC1-9 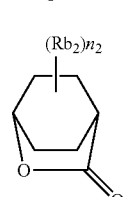

LC1-10 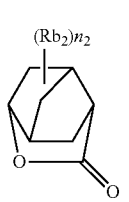

LC1-11 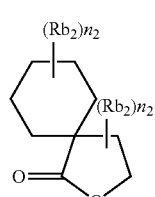

LC1-12 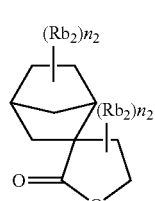

LC1-13 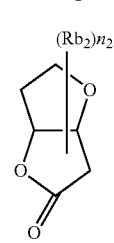

LC1-14 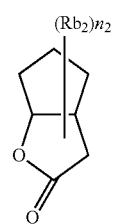

LC1-15 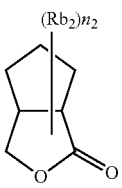

LC1-16 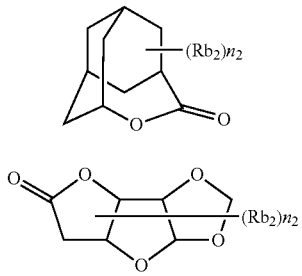

LC1-17

The presence of a substituent ($Rb_2$) on the portion of the lactone structure is optional. As preferred substituents ($Rb_2$), there can be mentioned an alkyl group having 1 to 8 carbon atoms, a monovalent aliphatic hydrocarbon ring group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like. An alkyl group having 1 to 4 carbon atoms, a cyano group and an acid-decomposable group are more preferred. In the formulae, $n_2$ is an integer of 0 to 4. When $n_2$ is 2 or greater, the plurality of introduced substituents ($Rb_2$) may be identical to or different from each other. Further, the plurality of introduced substituents ($Rb_2$) may be bonded to each other to thereby form a ring.

The repeating unit containing a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90% or higher, more preferably 95% or higher.

The content of repeating unit (D) in the resin (P), based on all the repeating units of the resin, is preferably in the range of 0.5 to 80 mol %, more preferably 1 to 60 mol % and further more preferably 2 to 40 mol %. A single type of repeating unit (D) may be used alone, or two or more types may be used in combination. Line edge roughness and development defect performance can be enhanced by employing specified lactone structures.

Particular examples of the repeating units (D) are shown below, which in no way limit the scope of the present invention. In the following formulae, Rx represents H, $CH_3$, $CH_2OH$ or $CF_3$.

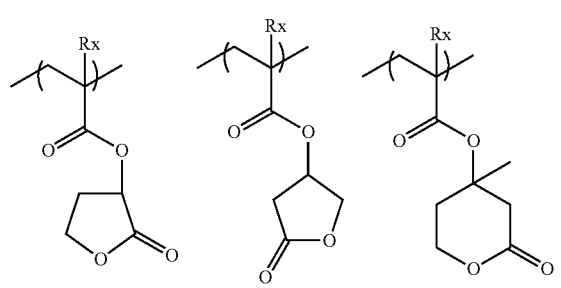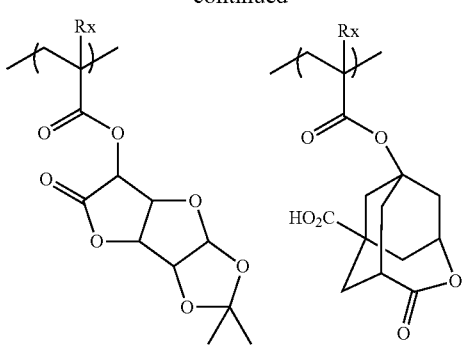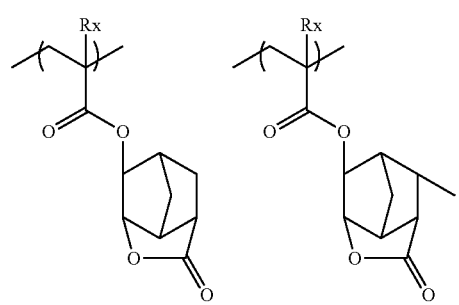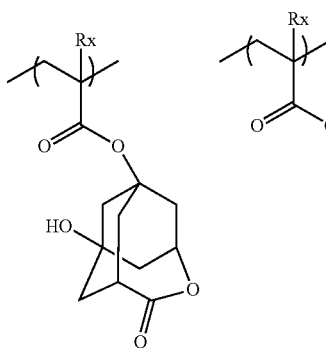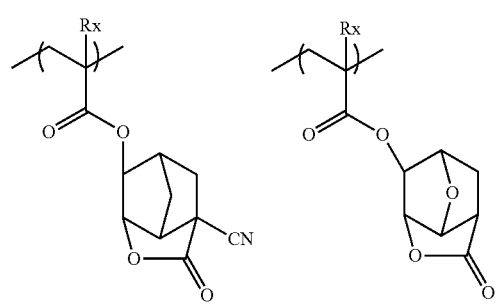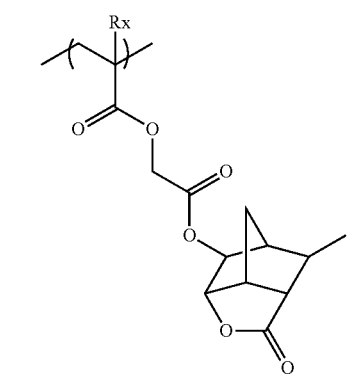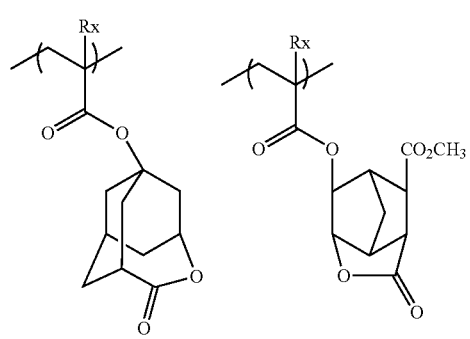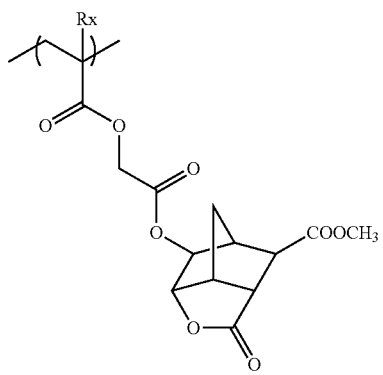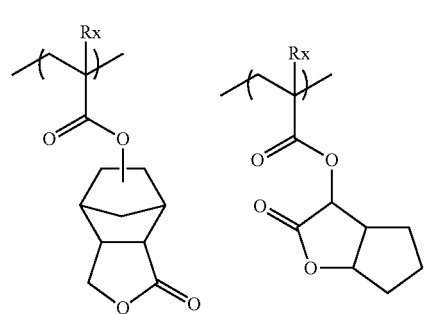

177
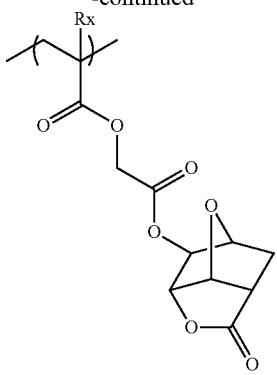
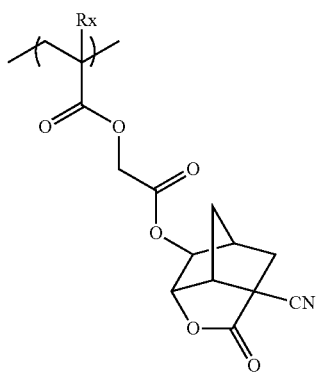
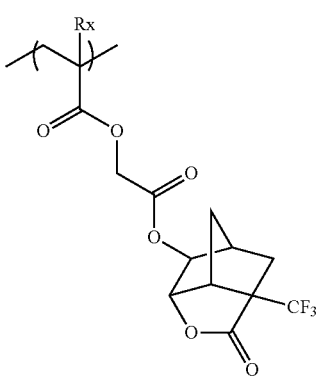
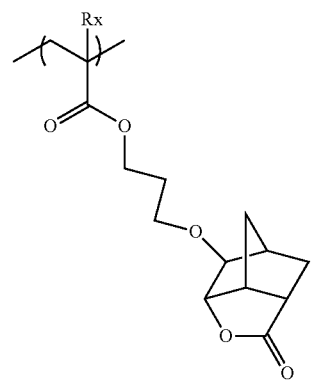
178
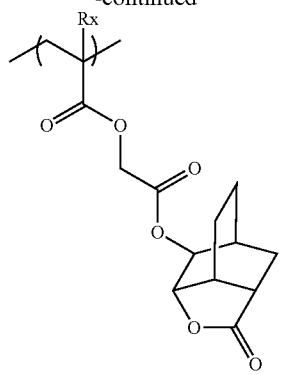
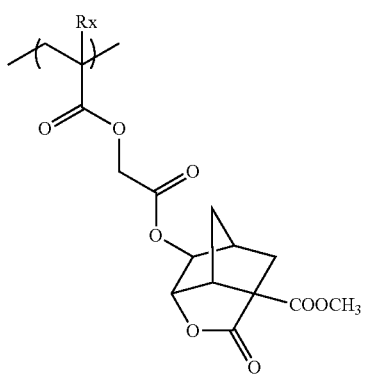
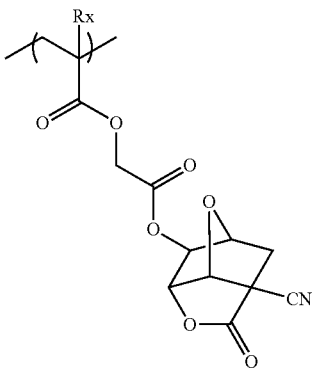
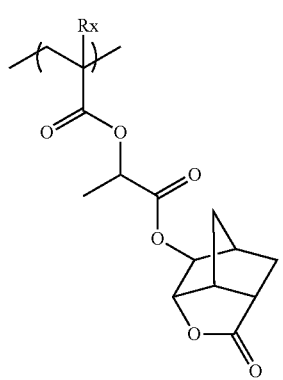

-continued

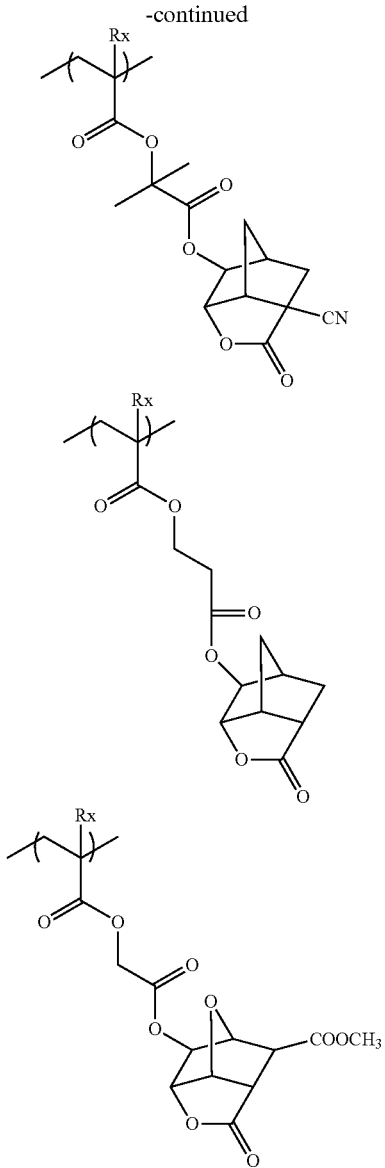

[Other Repeating Unit]

The resin (P) may further contain a repeating unit that is other than the repeating units mentioned hereinbefore and that has a polar group. As the polar group, there can be mentioned a hydroxyl group, a cyano group, a carboxyl group, a sulfonylimido group, a bissulfonylimido group, an aliphatic alcohol substituted at its α-position with an electron withdrawing group (for example, a hexafluoroisopropanol group —$C(CF_3)_2OH$) or the like. The incorporation of this other repeating unit in the resin (P) can enhance the adherence to substrates and the developer affinity. The repeating unit that is other than the repeating units mentioned hereinbefore and that has a polar group is preferably a repeating unit containing a hydroxyl group or a cyano group, more preferably a repeating unit containing an alicyclic hydrocarbon structure substituted with a hydroxyl group or a cyano group, in which further preferably no acid-decomposable group is contained. In the alicyclic hydrocarbon structure substituted with a hydroxyl group or a cyano group, the alicyclic hydrocarbon structure is preferably an adamantyl group, a diamantyl group or a norbornane group. As preferred alicyclic hydrocarbon structures substituted with a hydroxyl group or a cyano group, there can be mentioned the partial structures of general formulae (VIIa) to (VIId) below.

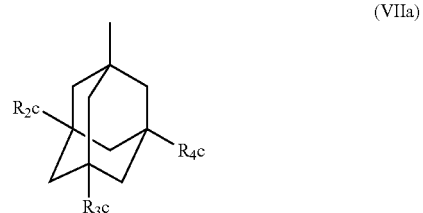

(VIIa)

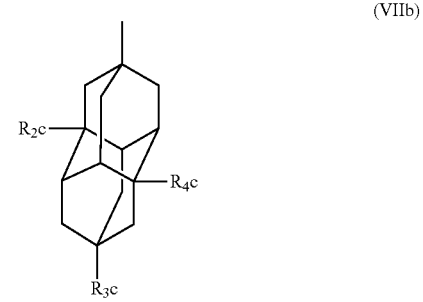

(VIIb)

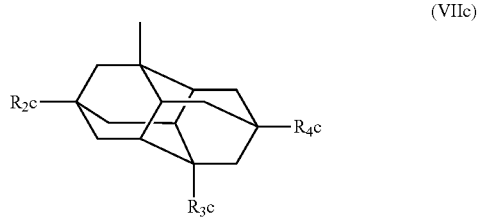

(VIIc)

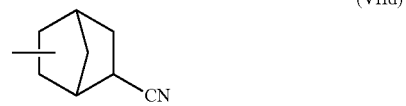

(VIId)

In general formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. Preferably, one or two of $R_2c$ to $R_4c$ are hydroxyl groups and the remainder is a hydrogen atom. In general formula (VIIa), more preferably, two of $R_2c$ to $R_4c$ are hydroxyl groups and the remainder is a hydrogen atom.

As the repeating units containing any of the partial structures of general formulae (VIIa) to (VIId), there can be mentioned those of general formulae (AIIa) to (AIId) below.

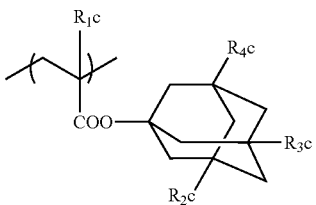

(AIIa)

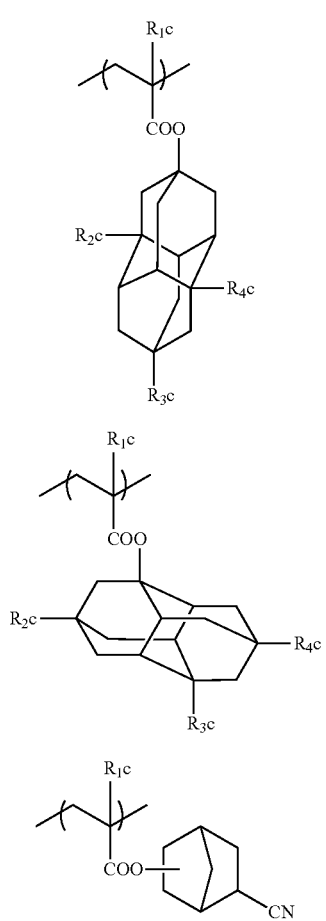
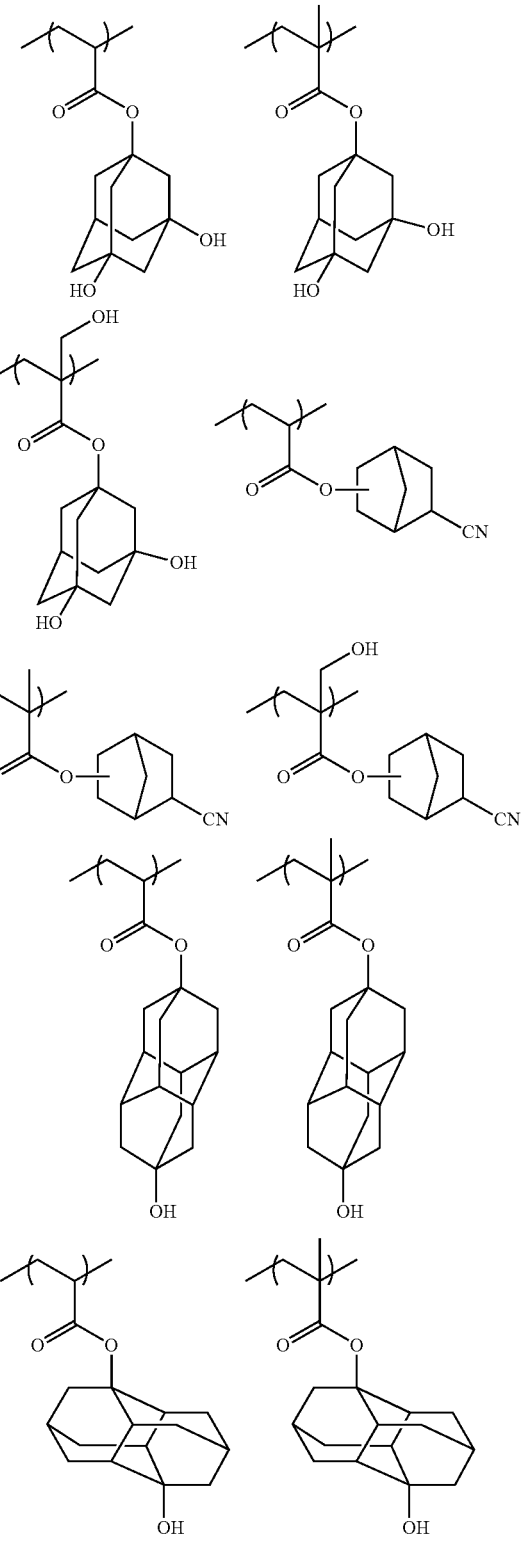

In general formulae (AIIa) to (AIId),

R₁c represents a hydrogen atom, a methyl group, a trifluoromethyl group or a hydroxymethyl group.

R₂c to R₄c have the same meaning as those of general formulae (VIIa) to (VIIc).

It is optional for the resin (P) to contain the repeating unit containing a polar group. When it is contained, the content thereof, based on all the repeating units of the resin (P), is preferably in the range of 1 to 60 mol %, more preferably 5 to 50 mol %.

Specific examples of the repeating units each containing a polar group are shown below, which in no way limit the scope of the present invention.

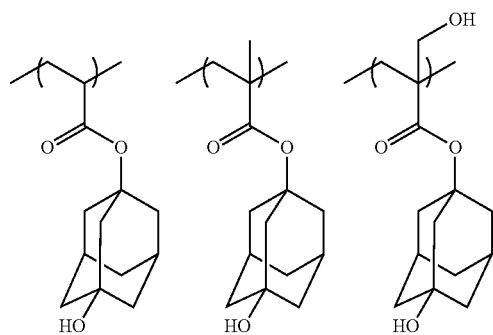

The resin (P) according to the present invention can further contain a repeating unit having a cyclic hydrocarbon structure in which no polar group is introduced and exhibiting no acid-decomposability. As such a repeating unit, there can be mentioned any of the repeating units of general formula (VII) below.

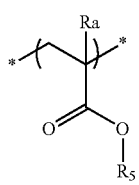

(VII)

In general formula (VII), $R_5$ represents a hydrocarbon group having at least one cyclic hydrocarbon structure in which no polar group (for example, a hydroxyl group or a cyano group) is introduced.

Ra represents a hydrogen atom, an alkyl group or a group of the formula —$CH_2$—O—$Ra_2$. In this formula, $Ra_2$ represents a hydrogen atom, an alkyl group or an acyl group. Ra is preferably a hydrogen atom, a methyl group, a hydroxyalkyl group or a trifluoromethyl group, most preferably a hydrogen atom or a methyl group.

The cyclic hydrocarbon structures introduced in $R_5$ include a monocyclic hydrocarbon group and a polycyclic hydrocarbon group. The monocyclic hydrocarbon group is preferably a monocyclic hydrocarbon group having 3 to 7 carbon atoms, more preferably a cyclopentyl group or a cyclohexyl group.

The polycyclic hydrocarbon groups include a ring-assembly hydrocarbon group and a crosslinked-ring hydrocarbon group. Examples of ring-assembly hydrocarbon groups include a bicyclohexyl group, a perhydronaphthalenyl group, a biphenyl group, a 4-cyclohexylphenyl group and the like.

As preferred crosslinked-ring hydrocarbon rings, there can be mentioned a norbornyl group, an adamantyl group, a bicyclooctanyl group, a tricyclo[5.2.1.0$^{2,6}$]decanyl group and the like. As more preferred crosslinked-ring hydrocarbon rings, there can be mentioned a norbornyl group and an adamantyl group.

It is optional for the resin (P) to contain the repeating unit having a cyclic hydrocarbon structure in which no polar group is introduced and exhibiting no acid-decomposability. When it is contained, the content thereof, based on all the repeating units of the resin (P), is preferably in the range of 1 to 40 mol %, more preferably 5 to 20 mol %.

Particular examples of the repeating units each having a cyclic hydrocarbon structure in which no polar group is introduced and exhibiting no acid-decomposability are shown below, which in no way limit the scope of the present invention. In the formulae, Ra represents H, $CH_3$, $CH_2OH$ or $CF_3$.

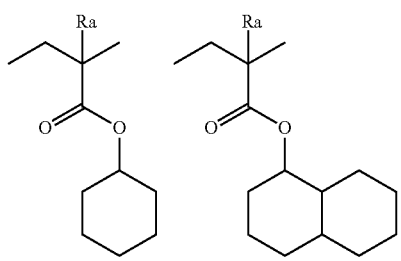

-continued

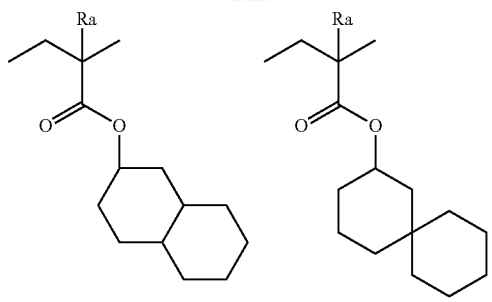

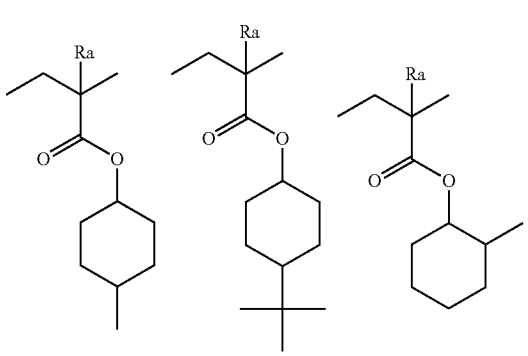

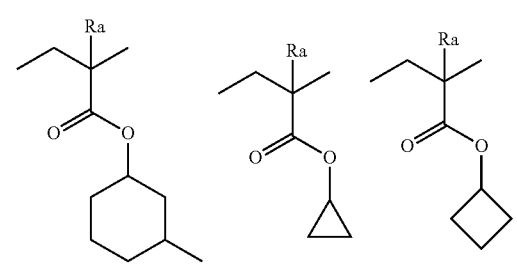

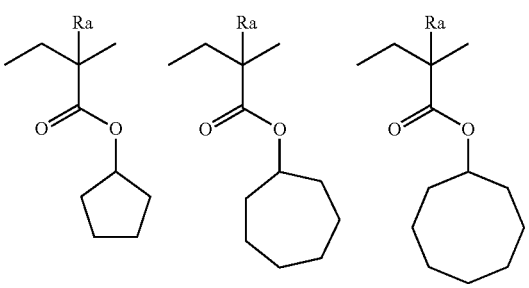

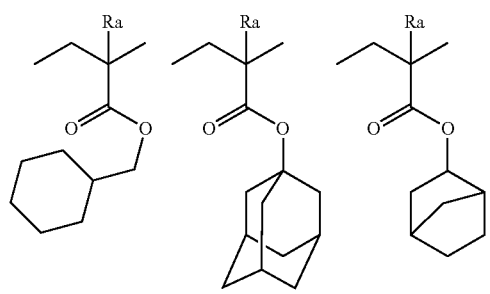

-continued

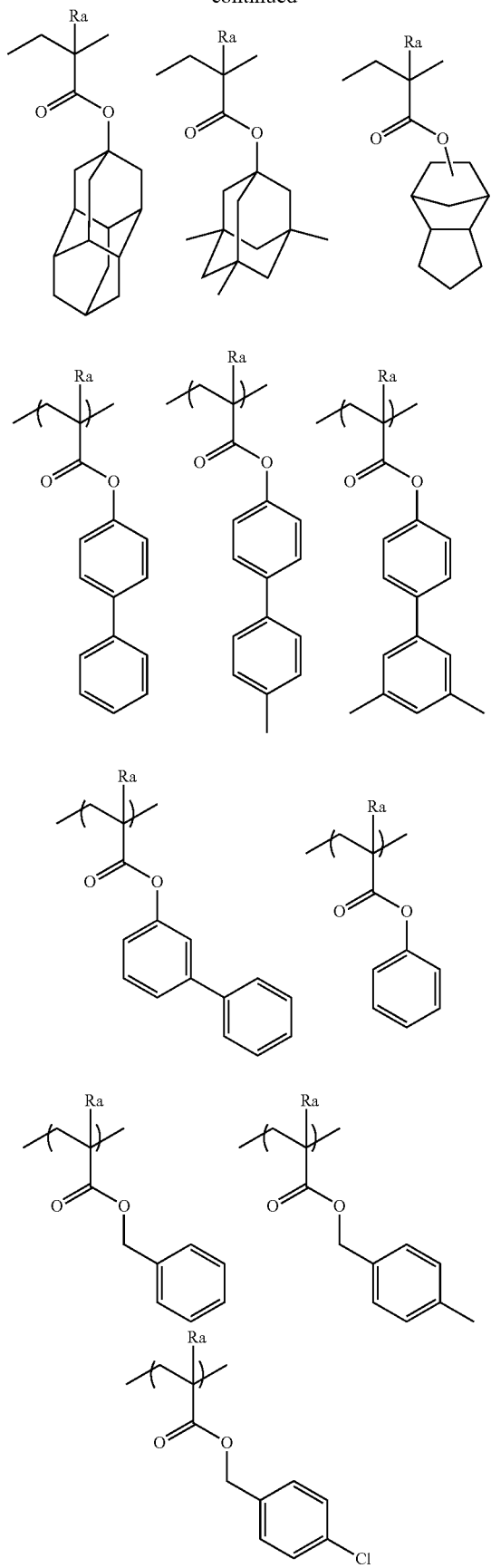

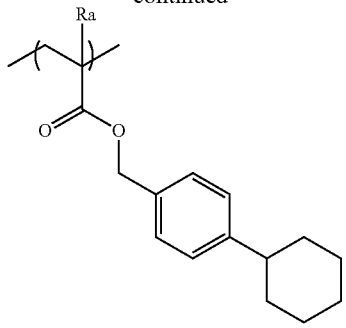

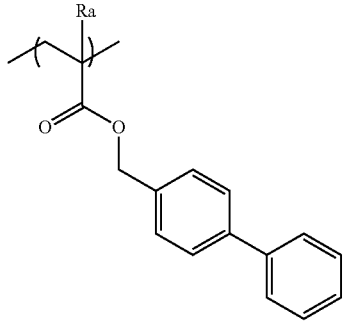

The resin (P) according to the present invention can contain, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would allow fine regulation of the required properties of the resin for use in the composition of the present invention, especially:

(1) solubility in application solvents, (2) film forming easiness (glass transition point), (3) alkali developability, (4) film thinning (selections of hydrophilicity/hydrophobicity and alkali-soluble group), (5) adhesion of unexposed area to substrate, (6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters, styrenes, crotonic esters and the like. Further, there can be mentioned maleic anhydride, maleimide, acrylonitrile, methacrylonitrile and maleironitrile.

In addition, any unsaturated compound capable of addition polymerization that is copolymerizable with monomers corresponding to the above various repeating structural units may be copolymerized therewith.

Preferred specific examples of the repeating units derived from such other polymerizable monomers are shown below, which are nonlimiting.

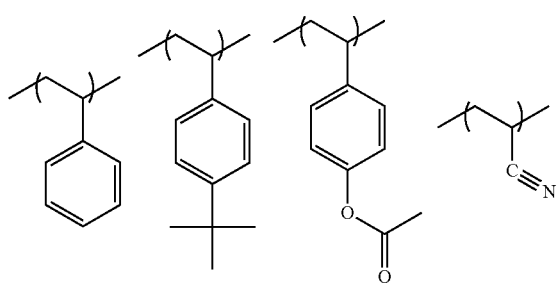

In the resin (P) for use in the composition of the present invention, the molar ratios of individual repeating structural units contained are appropriately determined from the viewpoint of regulation of not only the dry etching resistance of the resist but also the standard developer adaptability, substrate adhesion, resist profile and generally required properties of the resist such as the resolving power, heat resistance and sensitivity.

The resin (P) according to the present invention may have any of the random, block, comb and star configurations. The resin (P) can be synthesized by, for example, the radical, cation or anion polymerization of unsaturated monomers corresponding to given structures. Further, the intended resin can be obtained by first polymerizing unsaturated monomers corresponding to the precursors of given structures and thereafter carrying out a polymer reaction.

For example, as general synthetic methods, there can be mentioned a batch polymerization method in which an unsaturated monomer and a polymerization initiator are dissolved in a solvent and heated so as to accomplish polymerization, a dropping polymerization method in which a solution of unsaturated monomer and polymerization initiator is dropped into a heated solvent over a period of 1 to 10 hours, etc. The dropping polymerization method is preferred.

As the solvents for use in polymerization, there can be mentioned, for example, those employable in the preparation of the actinic-ray- or radiation-sensitive resin composition to be described hereinafter. It is preferred to perform the polymerization with the use of the same solvent as employed in the composition of the present invention. This inhibits any particle generation during storage.

The polymerization reaction is preferably carried out in an atmosphere of inert gas, such as nitrogen or argon. The polymerization is initiated using a commercially available radical initiator (azo initiator, peroxide, etc.) as a polymerization initiator. Among the radical initiators, an azo initiator is preferred. An azo initiator having an ester group, a cyano group or a carboxyl group is preferred. As preferred initiators, there can be mentioned azobisisobutyronitrile, azobisdimethylvaleronitrile, dimethyl 2,2'-azobis(2-methylpropionate) and the like. According to necessity, the polymerization may be carried out in the presence of a chain transfer agent (for example, an alkyl mercaptan or the like).

The concentration of solute in the reaction liquid is in the range of 5 to 70 mass %, preferably 10 to 50 mass %. The reaction temperature is generally in the range of 10 to 150° C., preferably 30 to 120° C. and more preferably 40 to 100° C.

The reaction time is generally in the range of 1 to 48 hours, preferably 1 to 24 hours and more preferably 1 to 12 hours.

After the completion of the reaction, the reaction mixture is allowed to stand still to cool to room temperature and purified. In the purification, use can be made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc., and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. Use can be made of any solvent appropriately selected from among a hydrocarbon, a halogenated hydrocarbon, a nitro compound, an ether, a ketone, an ester, a carbonate, an alcohol, a carboxylic acid, water, a mixed solvent containing these solvents and the like, according to the type of the polymer. Of these, it is preferred to employ a solvent containing at least an alcohol (especially methanol or the like) or water as the precipitation or re-precipitation solvent.

The amount of precipitation or re-precipitation solvent used can be appropriately selected taking efficiency, yield, etc. into account. Generally, the amount is in the range of 100 to 10,000 parts by mass, preferably 200 to 2000 parts by mass and more preferably 300 to 1000 parts by mass per 100 parts by mass of polymer solution.

The temperature at which the precipitation or re-precipitation is carried out can be appropriately selected taking efficiency and operation easiness into account. Generally, the temperature is in the range of about 0 to 50° C., preferably about room temperature (for example, about 20 to 35° C.). The operation of precipitation or re-precipitation can be carried out by a routine method, such as a batch or continuous method, with the use of a customary mixing container, such as an agitation vessel.

The polymer resulting from the precipitation or re-precipitation is generally subjected to customary solid/liquid separation, such as filtration or centrifugal separation, and dried before use. The filtration is carried out with the use of a filter medium ensuring solvent resistance, preferably under pressure. The drying is performed at about 30 to 100° C., preferably about 30 to 50° C. under ordinary pressure or reduced pressure (preferably reduced pressure).

Alternatively, after the precipitation and separation of the resin, the resultant resin may be once more dissolved in a solvent and brought into contact with a solvent in which the resin is poorly soluble or insoluble. Specifically, the method may include the steps of, after the completion of the radical polymerization reaction, bringing the polymer into contact with a solvent wherein the polymer is poorly soluble or insoluble to thereby attain resin precipitation (step a), separating the resin from the solution (step b), re-dissolving the resin in a solvent to thereby obtain a resin solution A (step c), thereafter bringing the resin solution A into contact with a solvent wherein the resin is poorly soluble or insoluble amounting to less than 10 times (preferably 5 times or less)

the volume of the resin solution A to thereby precipitate a resin solid (step d) and separating the precipitated resin (step e).

The molecular weight of the resin (P) according to the present invention is not particularly limited. Preferably, the weight average molecular weight thereof is in the range of 1000 to 100,000. It is more preferably in the range of 1500 to 60,000, most preferably 2000 to 30,000. By regulating the weight average molecular weight so as to fall within the range of 1000 to 100,000, not only can any deteriorations of heat resistance and dry etching resistance be prevented but also any deterioration of developability and any increase of viscosity leading to poor film forming property can be prevented. Herein, the weight average molecular weight of the resin refers to the polystyrene-equivalent molecular weight measured by GPC (carrier: THF or N-methyl-2-pyrrolidone (NMP)).

The molecular weight dispersity (Mw/Mn) of the resin is preferably in the range of 1.00 to 5.00, more preferably 1.03 to 3.50 and further more preferably 1.05 to 2.50. The narrower the molecular weight distribution, the more excellent the resolution and resist configuration and also the smoother the side wall of the resist pattern to thereby attain an excellence in roughness characteristics.

One type of rein (P) according to the present invention may be used alone, or two or more types thereof may be used in combination. The content of resin (P) is preferably in the range of 30 to 100 mass %, more preferably 50.0 to 99.95 mass % and most preferably 70.0 to 99.90 mass %, based on the total solids of the actinic-ray- or radiation-sensitive resin composition of the present invention.

Preferred specific examples of the resins (P) are shown below, which in no way limit the scope of the present invention.

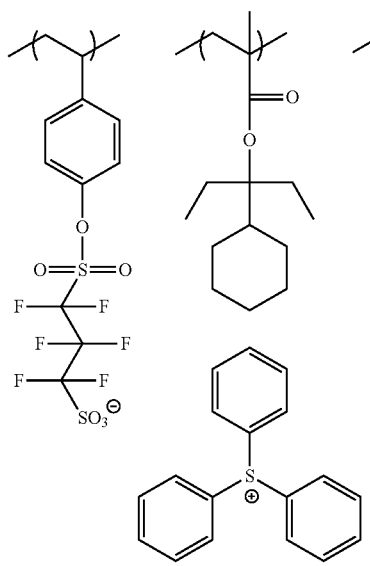

-continued

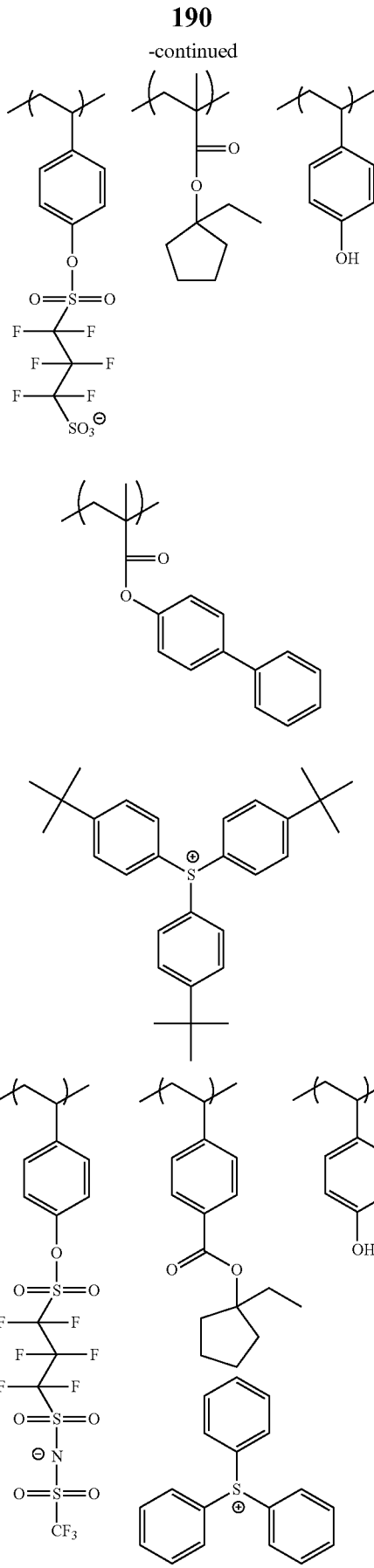

191
-continued
192
-continued
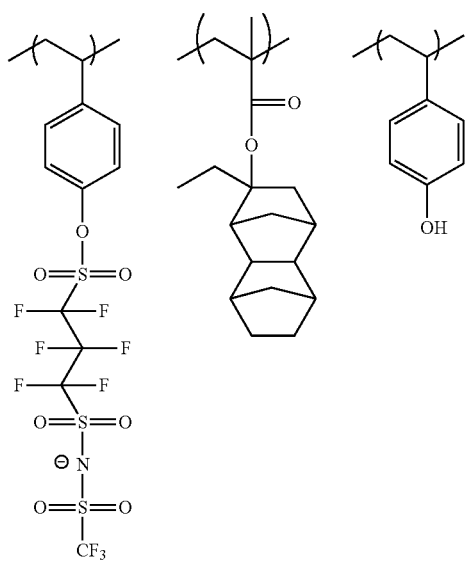
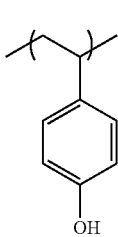
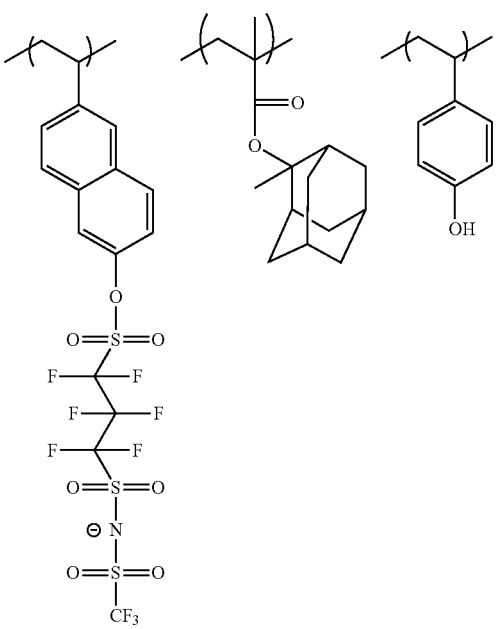
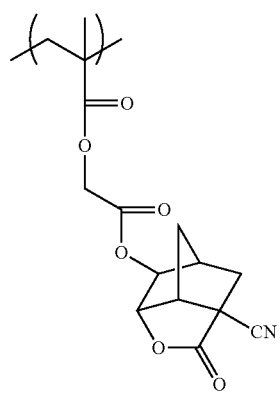
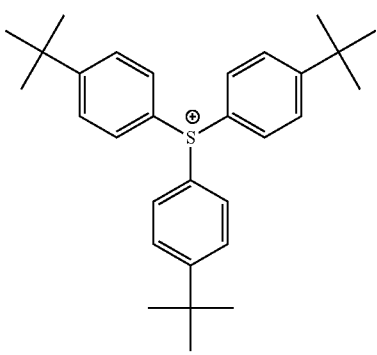
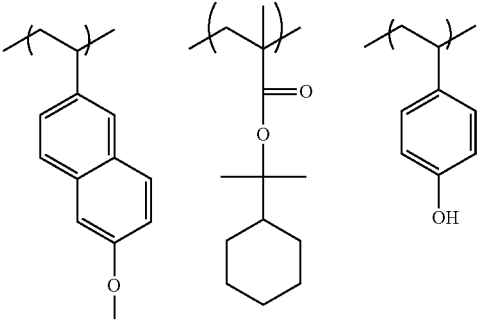
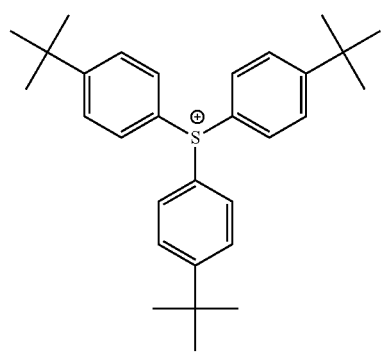
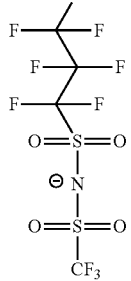

193
-continued
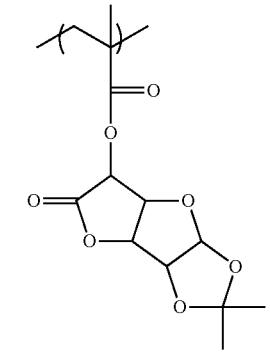
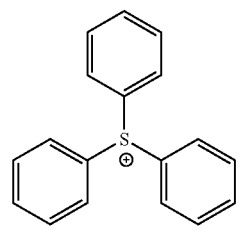
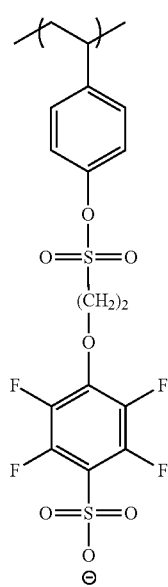
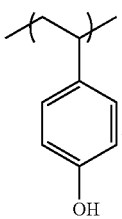
194
-continued
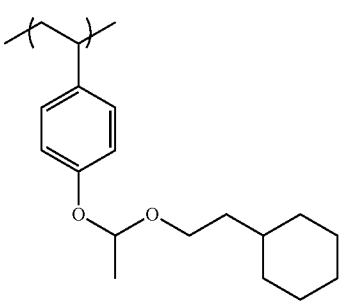

195
-continued
196
-continued
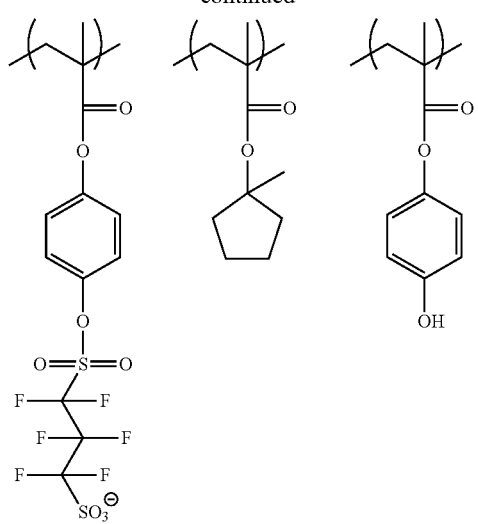
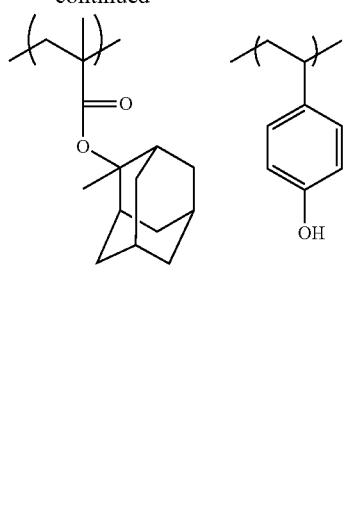
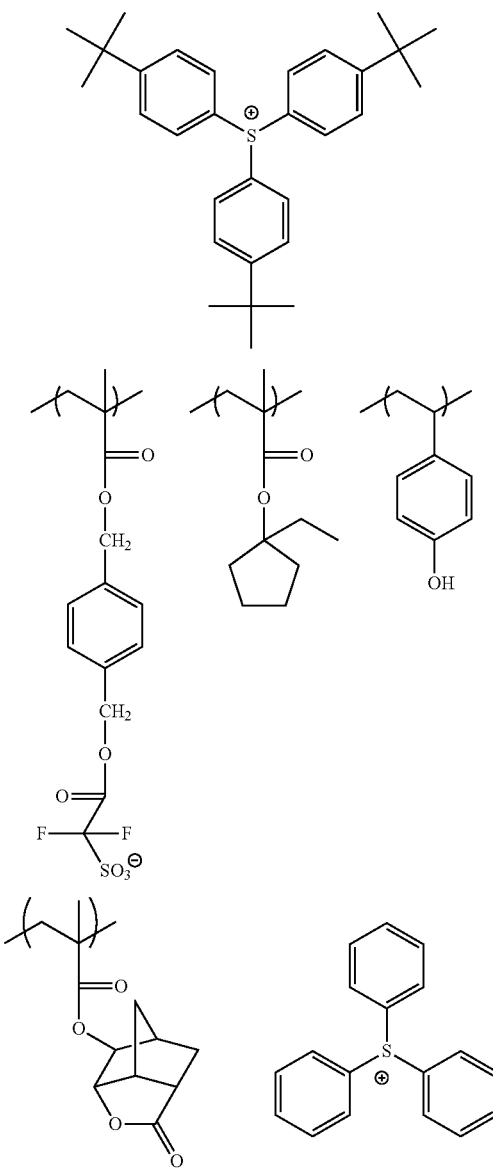
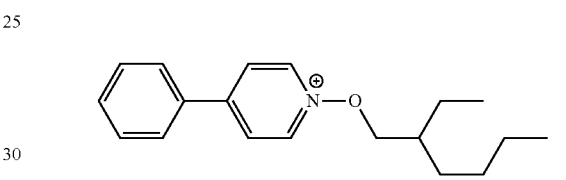
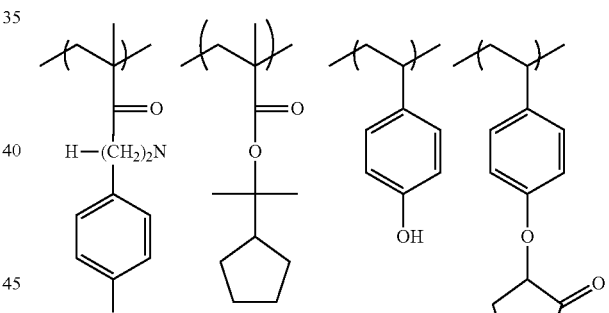
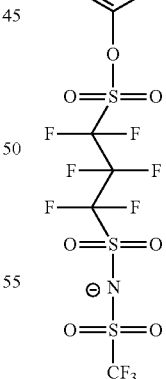
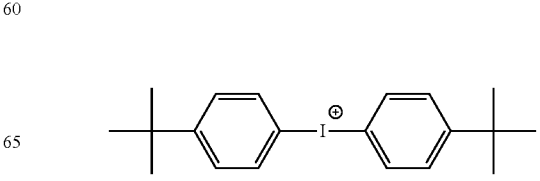

197
-continued
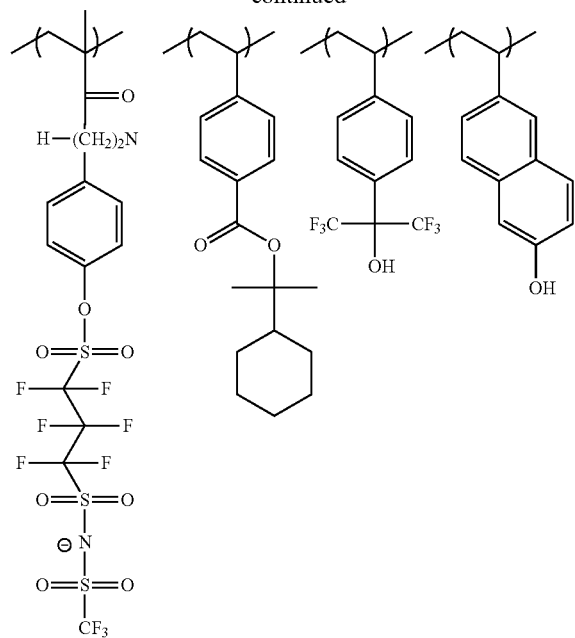
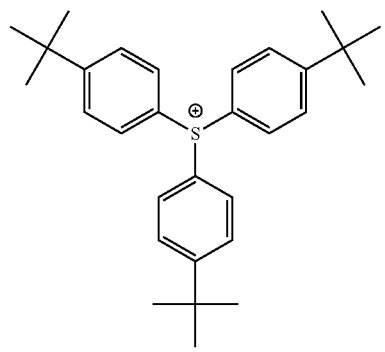
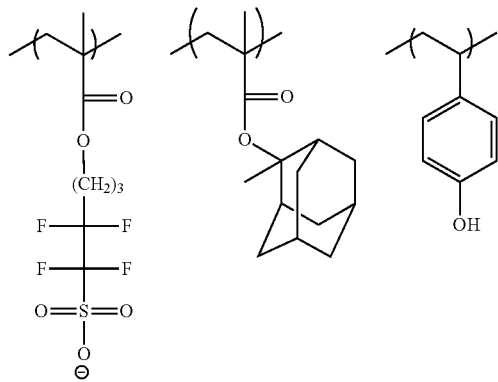
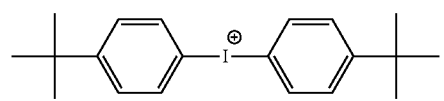
198
-continued
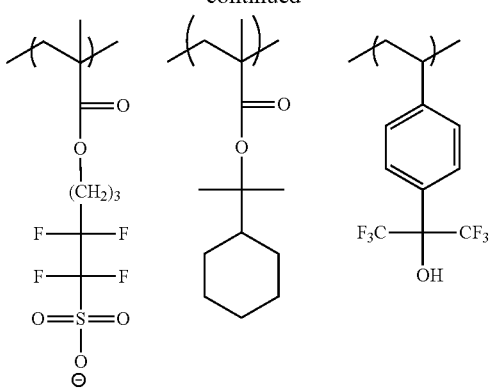
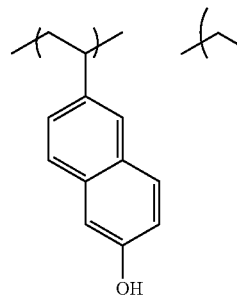
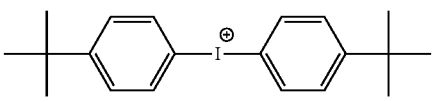
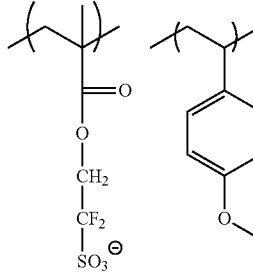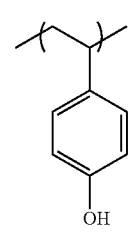
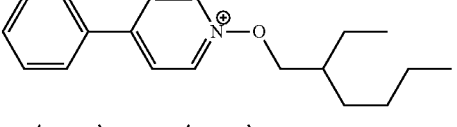
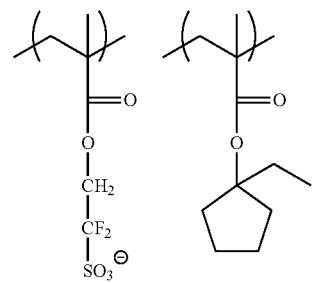

199
-continued
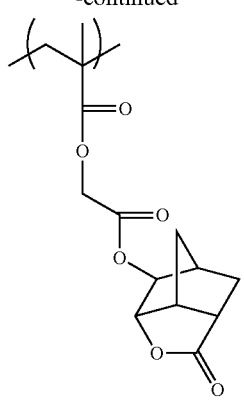
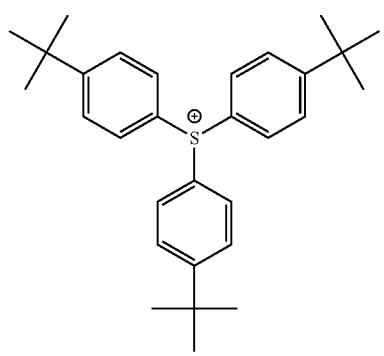
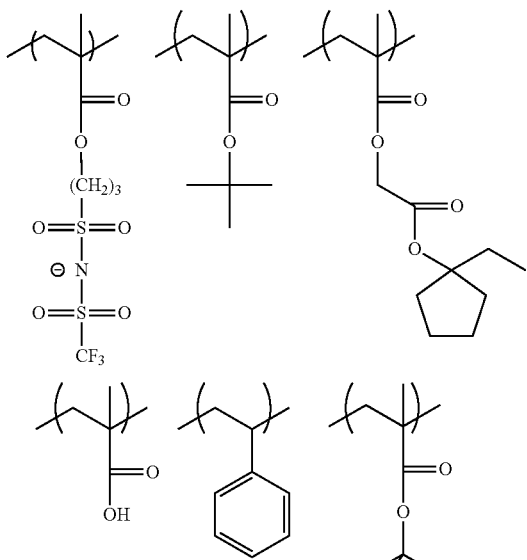
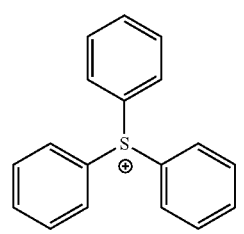
200
-continued
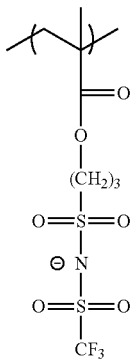
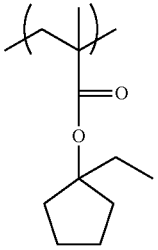
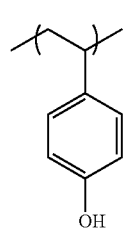
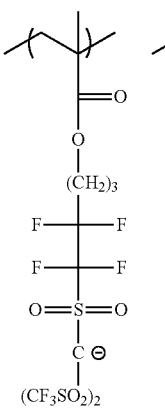
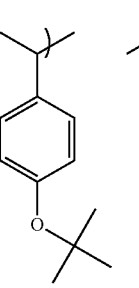
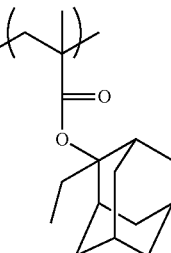

201
-continued
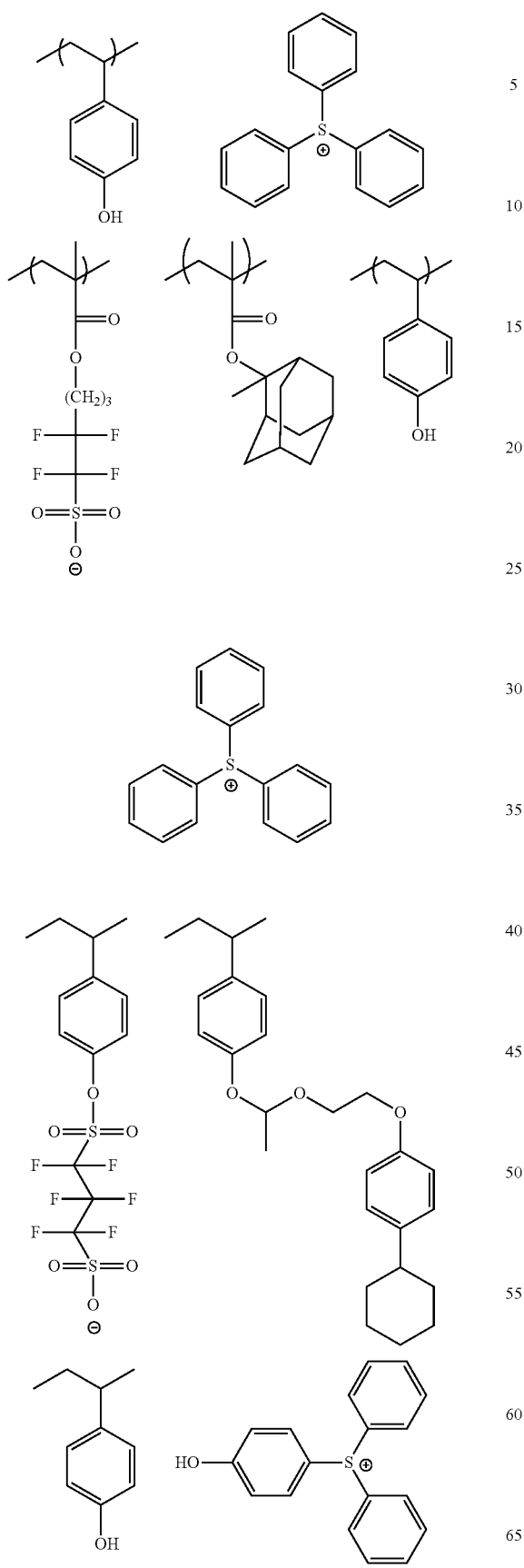
202
-continued
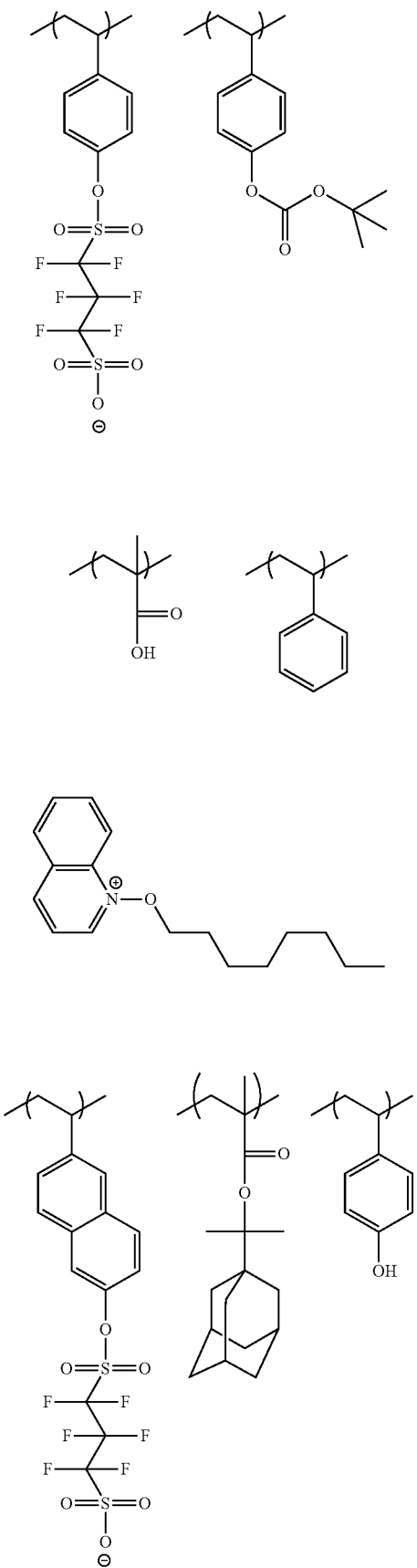

203
-continued
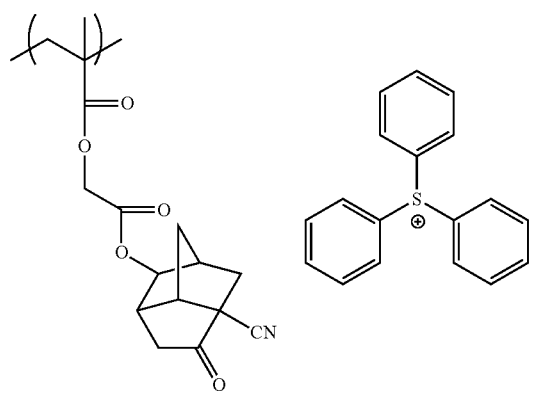
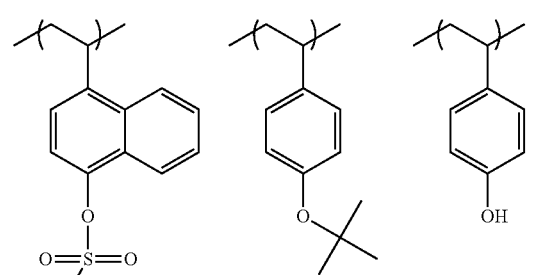
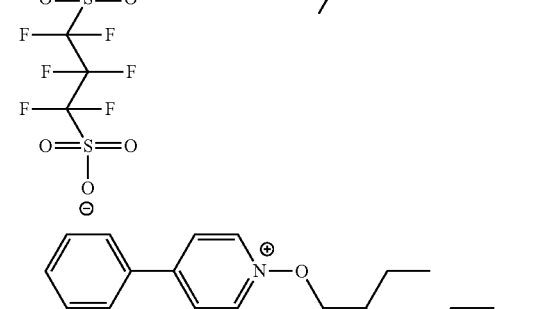
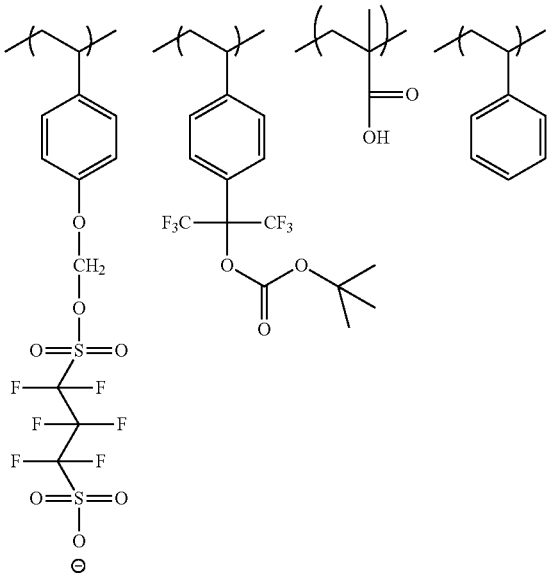
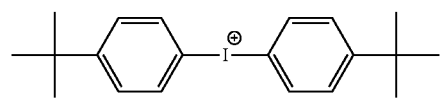
204
-continued
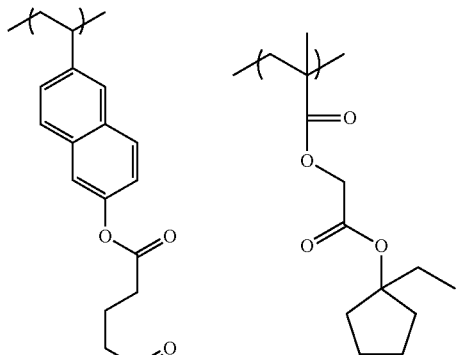
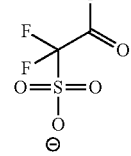
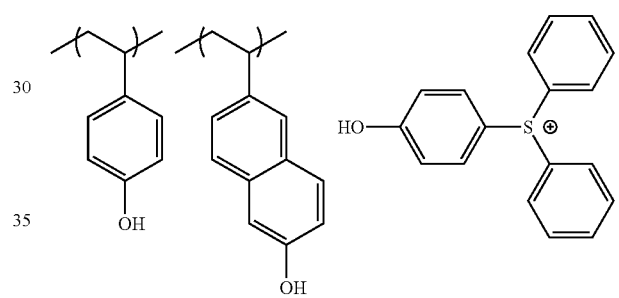
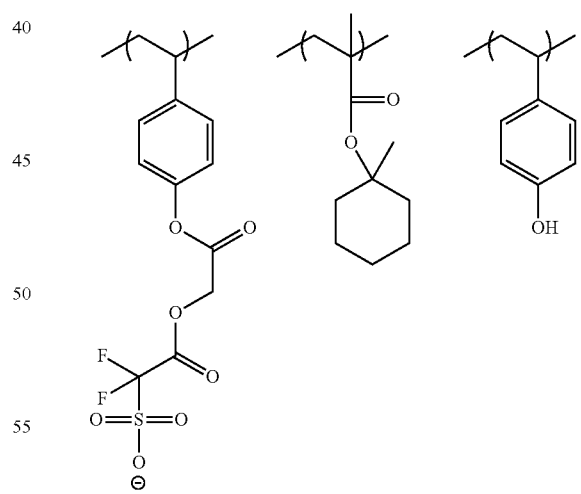
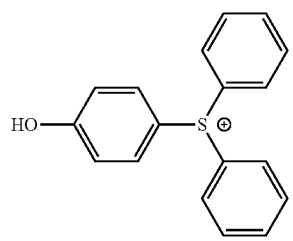

205
-continued
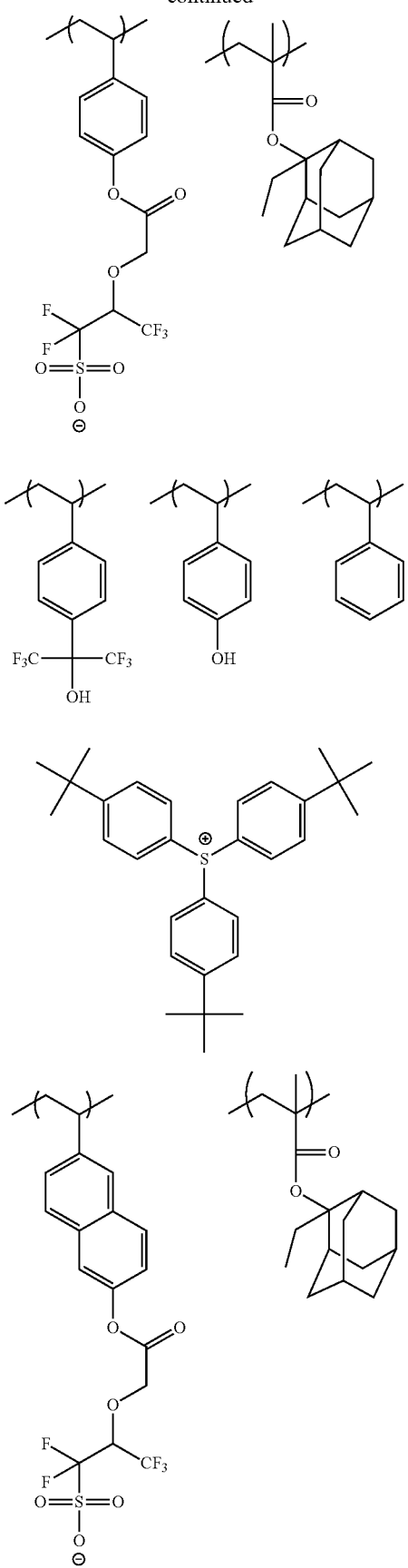
206
-continued
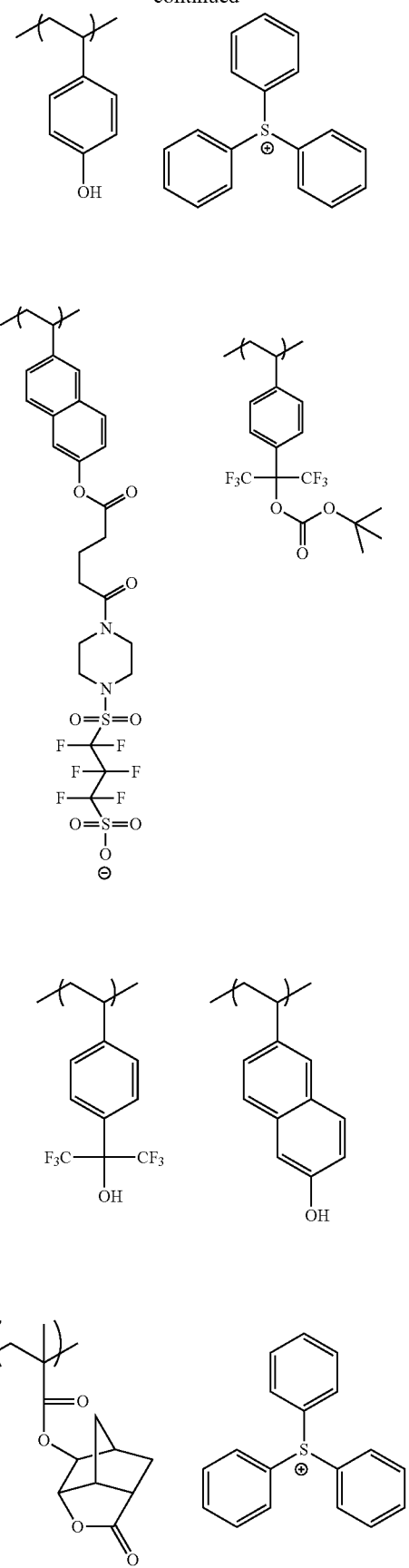

207
-continued
208
-continued
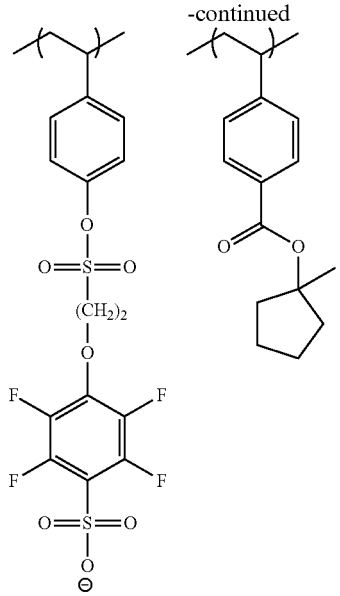
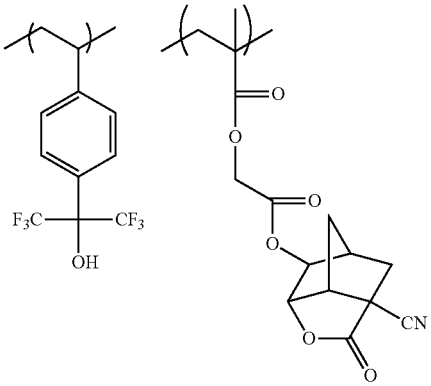
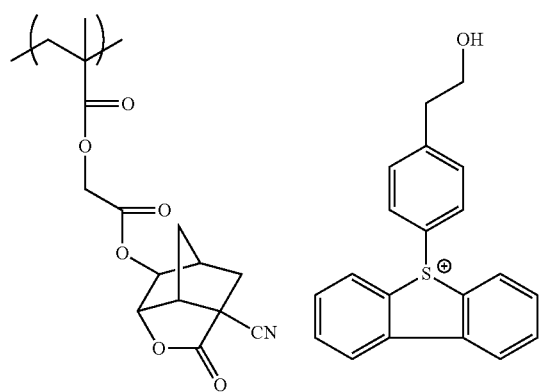
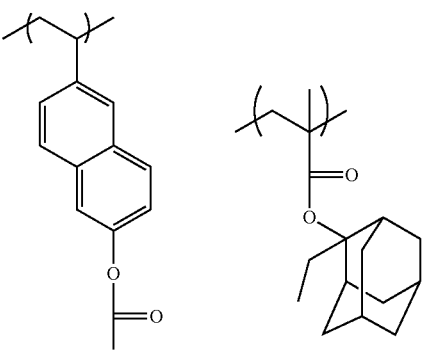
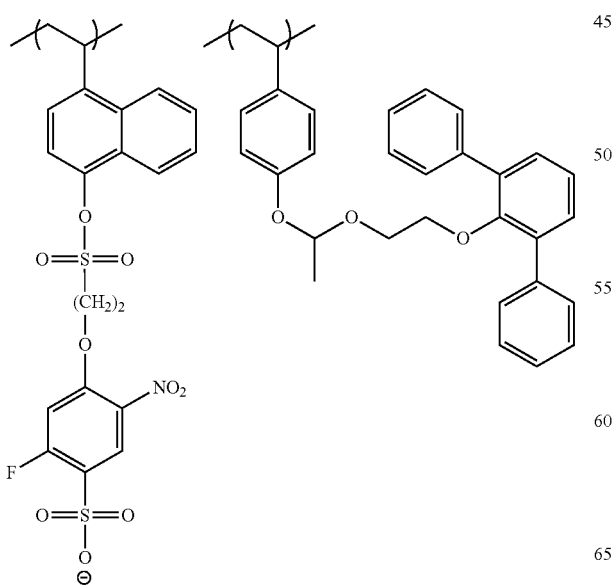
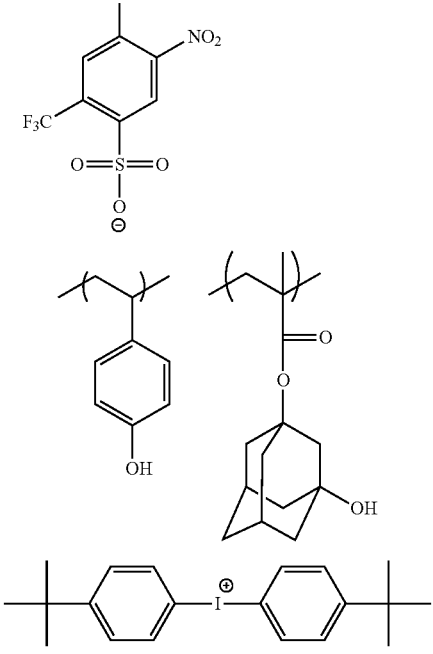

209
-continued
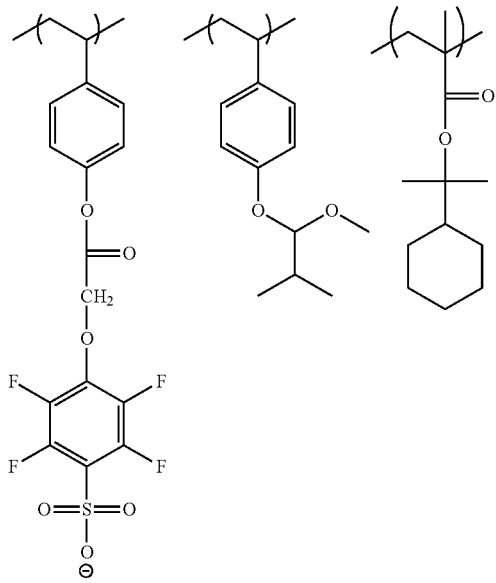
210
-continued
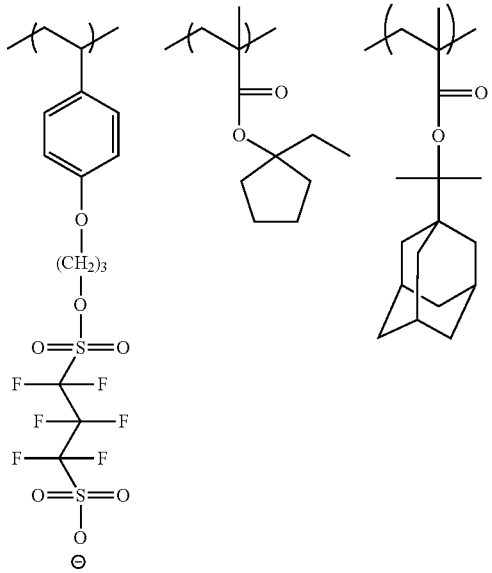
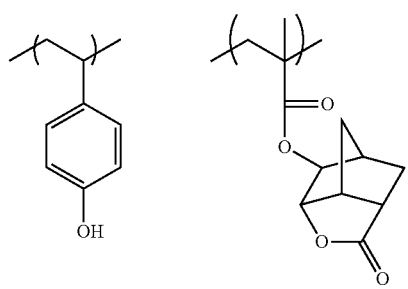
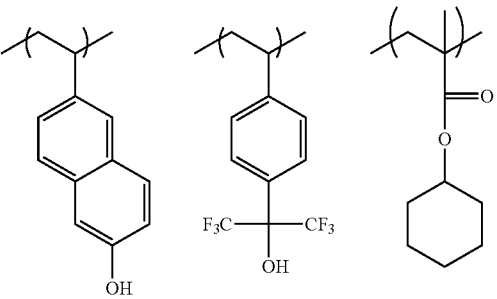
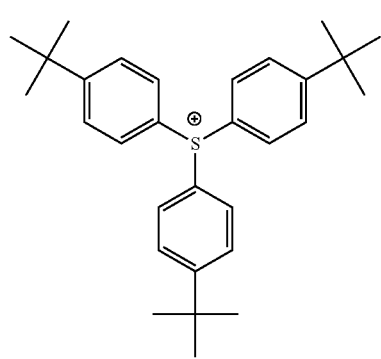
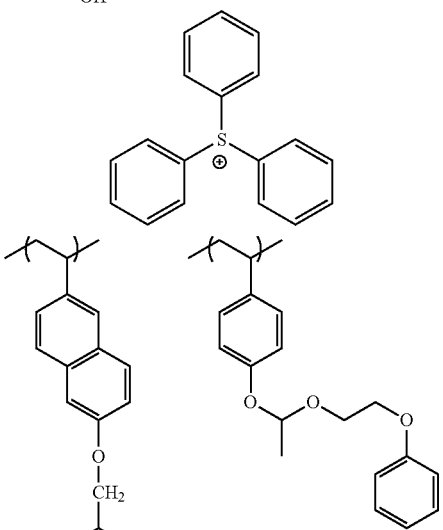
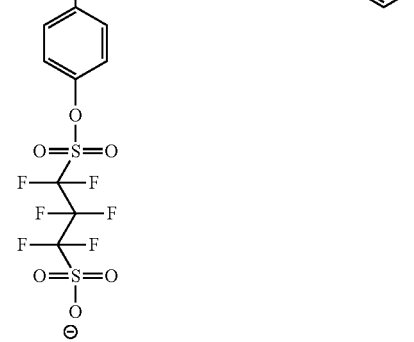

211
-continued
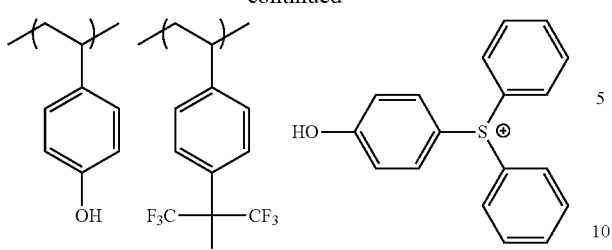
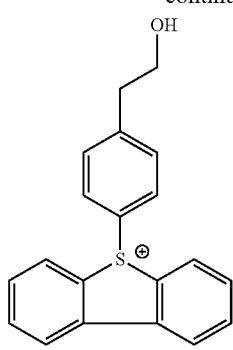
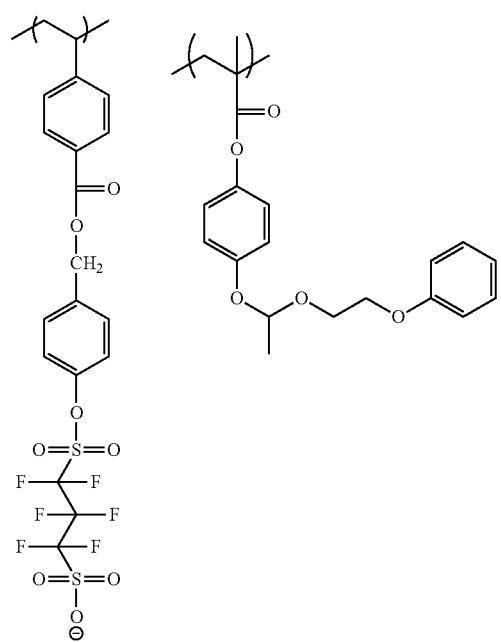
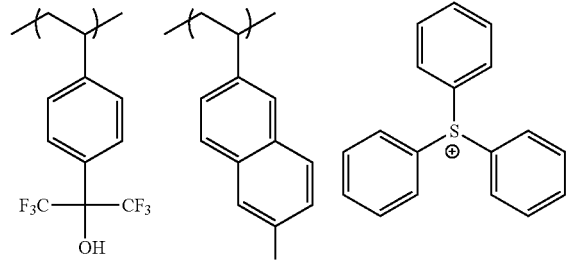
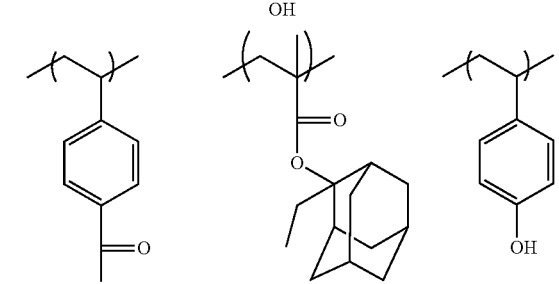
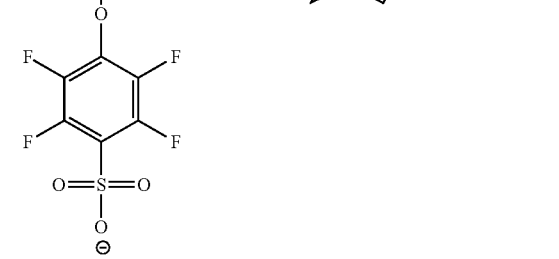
212
-continued
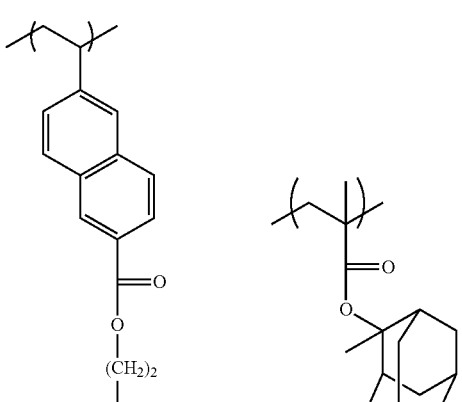
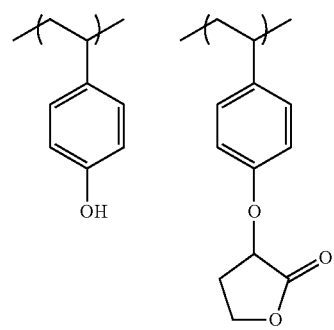
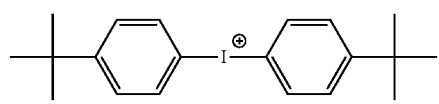

213
-continued
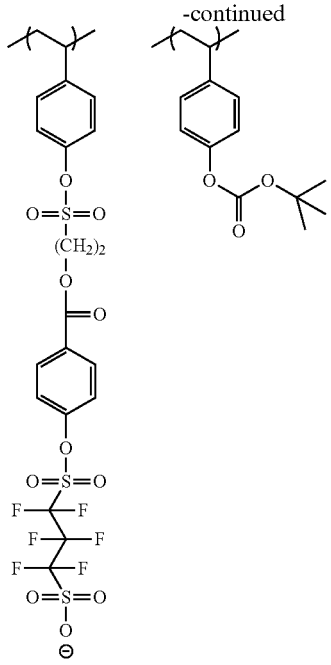
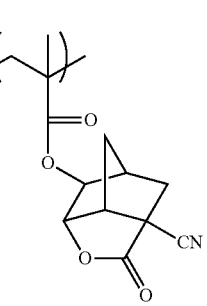
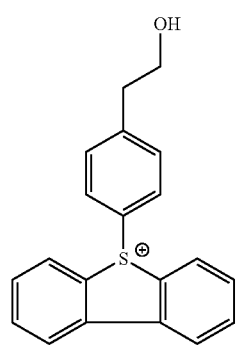
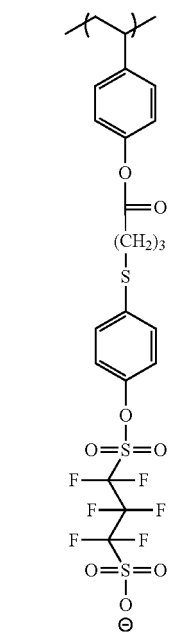
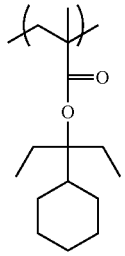
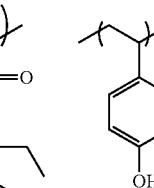
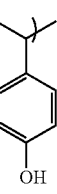
214
-continued
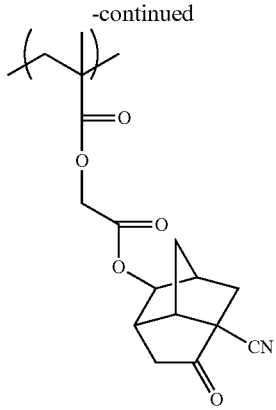
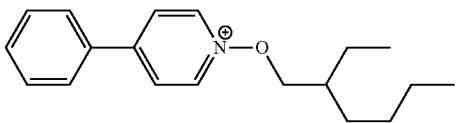
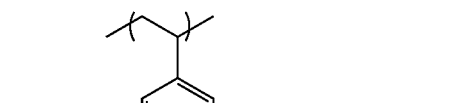
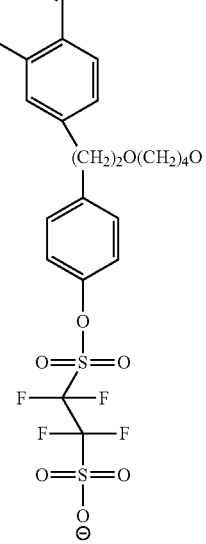
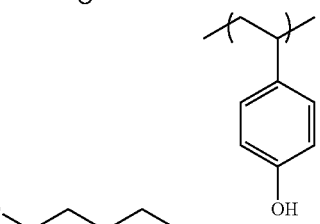
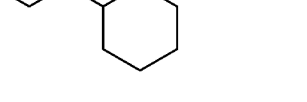
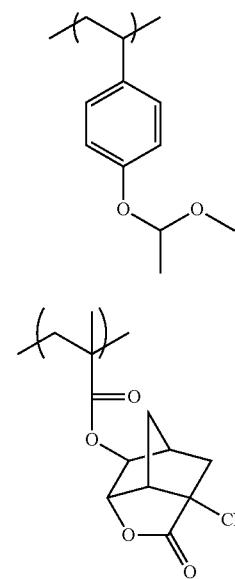
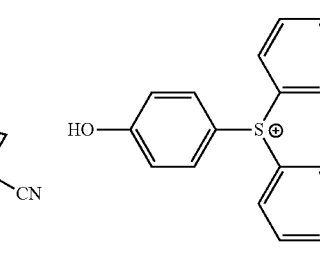

215
-continued

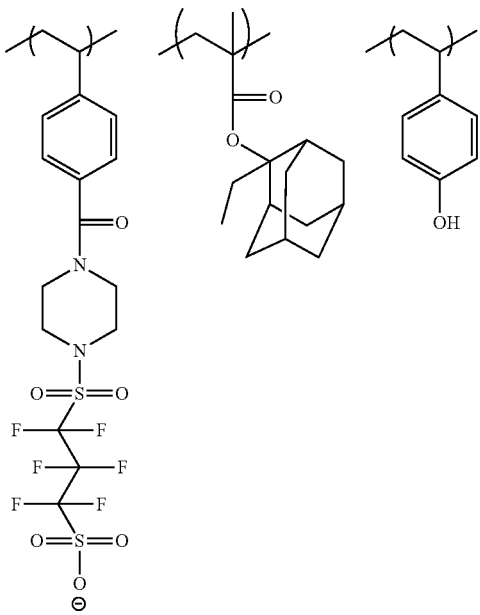

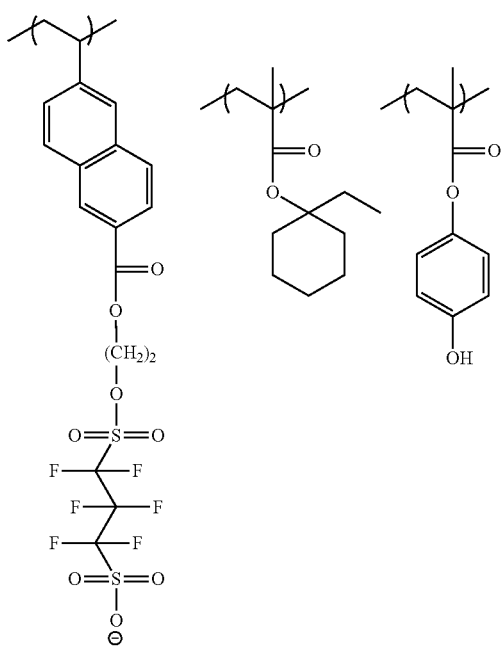

216
-continued

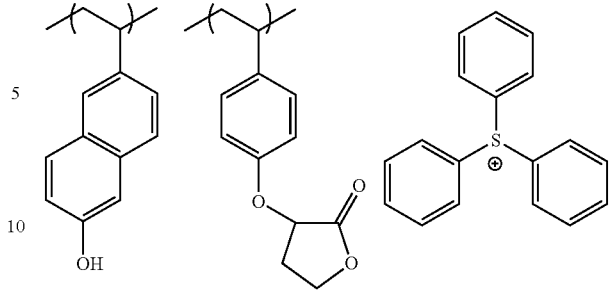

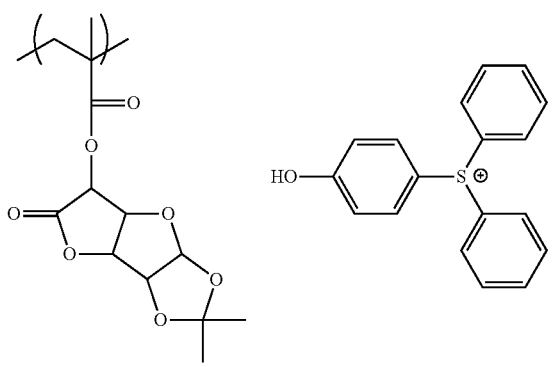

[2] Compound (U)

The compound (U) unevenly distributed in a surface of the film according to the present invention refers to a compound capable of forming a protective layer unevenly distributed in a surface of the film of the composition upon the addition thereof to the composition. With respect to whether or not the protective layer is formed, for example, the formation of the protective layer can be presumed when an increase of static contact angle is recognized upon comparison of the static contact angle (angle of contact with pure water) of the surface of the film of the composition to which the compound (U) is not added with the static contact angle of the surface of the film of the composition to which the compound (U) has been added.

It is preferred for the compound (U) to contain either an acid group or a group that when acted on by an alkali developer, is decomposed to thereby produce an acid group. The acid group is, for example, an alkali-soluble group (x) to be described hereinafter. The group that when acted on by an alkali developer, is decomposed to thereby produce an acid group is, for example, a polarity conversion group (y) to be described hereinafter.

Although the compound (U) is unevenly distributed in the interface as mentioned above, as different from surfactants, the compound (U) does not necessarily have to contain a hydrophilic group in its molecule and does not need to contribute toward uniform mixing of polar/nonpolar substances.

The compound (U) is not particularly limited as long as the above characteristics are satisfied. However, the compound (U) is preferably a resin, most preferably a resin whose weight average molecular weight is in the range of 1000 to 100,000 (hereinafter, when the compound (U) is a resin, it is also referred to as a compound (U')).

From the viewpoint of promoting the uneven distribution in the surface of the film, it is preferred for the compound (U') to satisfy at least one of the characteristics of (i) containing a fluorine atom in the principal chain or a side chain of the resin, (ii) containing a silicon atom in the principal chain or a side chain of the resin and (iii) containing a hydrocarbon group in a side chain of the resin.

When the compound (U') contains a fluorine atom in the principal chain or a side chain of the resin (i), it is preferred for the compound (U') to be a resin containing, as a partial structure containing a fluorine atom, an alkyl group containing a fluorine atom, a cycloalkyl group containing a fluorine atom or an aryl group containing a fluorine atom.

The alkyl group containing a fluorine atom (preferably 1 to 10 carbon atoms, more preferably 1 to 4 carbon atoms) is a linear or branched alkyl group having its at least one hydrogen atom substituted with a fluorine atom. Another substituent may further be introduced in the alkyl group.

The cycloalkyl group containing a fluorine atom is a mono- or polycycloalkyl group having its at least one hydrogen atom substituted with a fluorine atom. Another substituent may further be introduced in the cycloalkyl group.

The aryl group containing a fluorine atom is an aryl group, such as a phenyl group or a naphthyl group, having its at least one hydrogen atom substituted with a fluorine atom. Another substituent may further be introduced in the aryl group.

The alkyl group containing a fluorine atom, cycloalkyl group containing a fluorine atom and aryl group containing a fluorine atom are preferably those of general formulae (F2) to (F4) below. These however in no way limit the scope of the present invention.

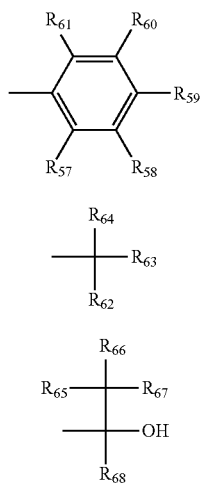

In general formulae (F2) to (F4), each of $R_{57}$ to $R_{68}$ independently represents a hydrogen atom, a fluorine atom or an alkyl group, provided that in each of $R_{57}$-$R_{61}$, $R_{62}$-$R_{64}$ and $R_{65}$-$R_{68}$, at least one thereof is a fluorine atom or an alkyl group (preferably having 1 to 4 carbon atoms) substituted with at least one fluorine atom. It is preferred for all of $R_{57}$-$R_{61}$ and $R_{65}$-$R_{67}$ to represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded to each other to thereby form a ring.

Specific examples of the groups of general formula (F2) include a p-fluorophenyl group, a pentafluorophenyl group, a 3,5-di(trifluoromethyl)phenyl group and the like.

Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, the hexafluoroisopropyl group, a heptafluoroisopropyl group, a hexafluoro(2-methyl) isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include —C(CF$_3$)$_2$OH, —C(C$_2$F$_5$)$_2$OH, —C(CF$_3$)(CH$_3$)OH, —CH(CF$_3$)OH and the like. —C(CF$_3$)$_2$OH is preferred.

Preferred repeating units each containing a fluorine atom are as follows.

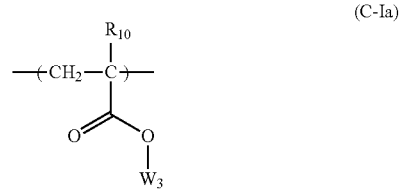

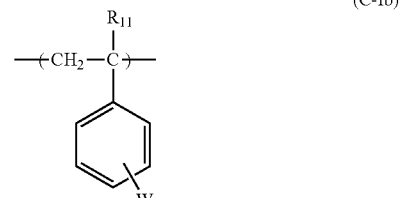

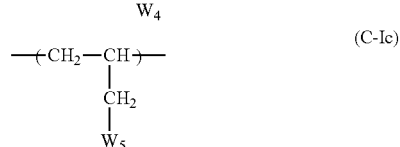

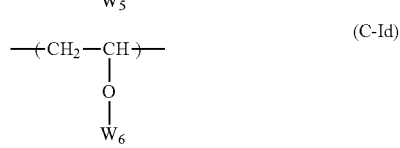

In the formulae, each of $R_{10}$ and $R_{11}$ independently represents a hydrogen atom, a fluorine atom or an alkyl group (preferably a linear or branched alkyl group having 1 to 4 carbon atoms; as a substituted alkyl group, there can be mentioned, in particular, a fluoroalkyl group).

Each of $W_3$ to $W_6$ independently represents an organic group containing at least one fluorine atom. As such, for example, there can be mentioned the atomic groups of general formulae (F2) to (F4) above.

Further, resins comprising, besides these, the following units can be used.

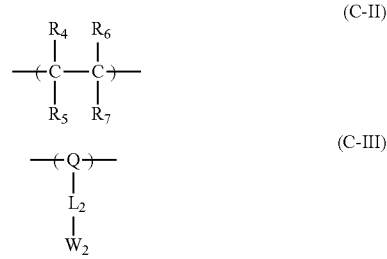

In the formulae, each of $R_4$ to $R_7$ independently represents a hydrogen atom, a fluorine atom or an alkyl group (preferably a linear or branched alkyl group having 1 to 4 carbon atoms; as a substituted alkyl group, there can be mentioned, in particular, a fluoroalkyl group), provided that at least one of $R_4$ to $R_7$ represents a fluorine atom. $R_4$ and $R_5$, or $R_6$ and $R_7$ may cooperate with each other to thereby form a ring.

$W_2$ represents an organic group containing at least one fluorine atom. As such, for example, there can be mentioned the atomic groups of general formulae (F2) to (F4) above.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —SO$_2$—, —CO—, —N(R)— (in the formula, R is a hydrogen atom or an alkyl group) or a bivalent connecting group consisting of a combination of two or more of these.

Specific examples of the repeating units each containing a fluorine atom are shown below, which in no way limit the scope of the present invention. In the specific examples, $X_1$ represents a hydrogen atom, —CH$_3$, —F or —CF$_3$. $X_2$ represents —F or —CF$_3$.

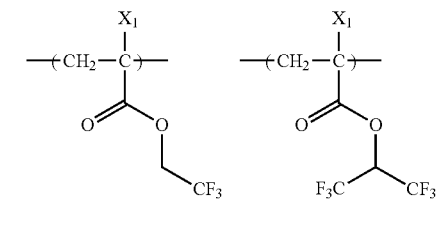
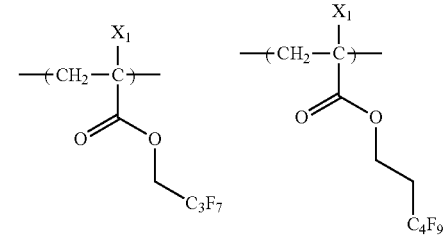
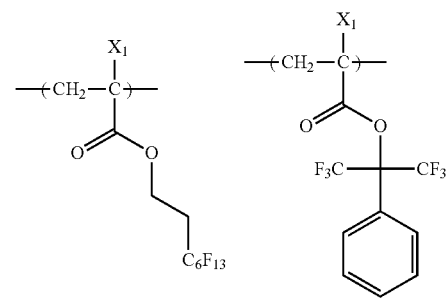
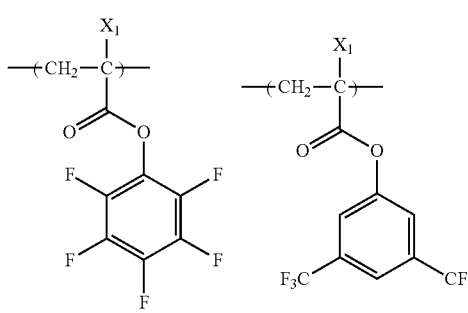

-continued

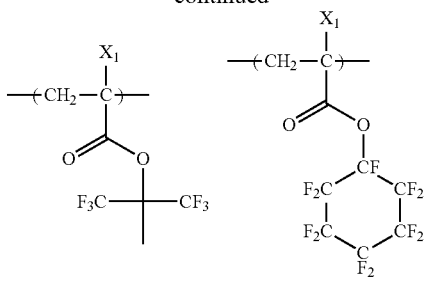
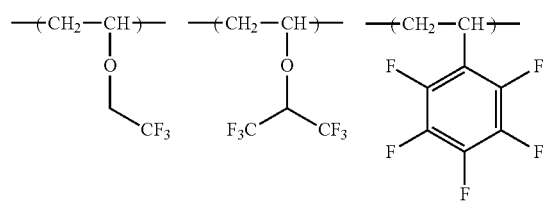
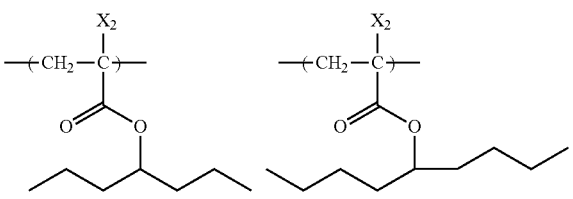
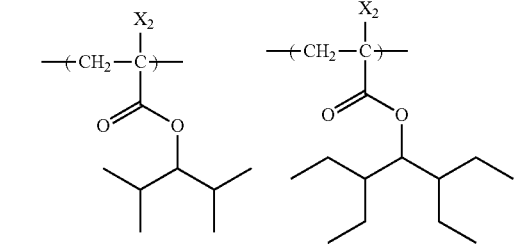
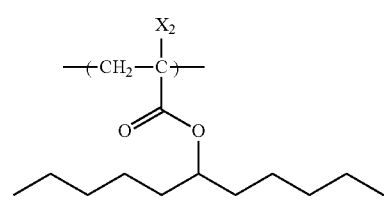
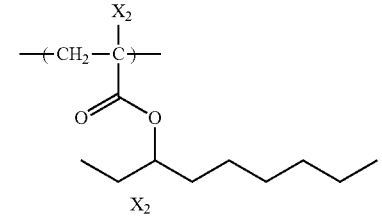
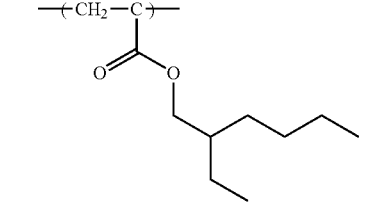

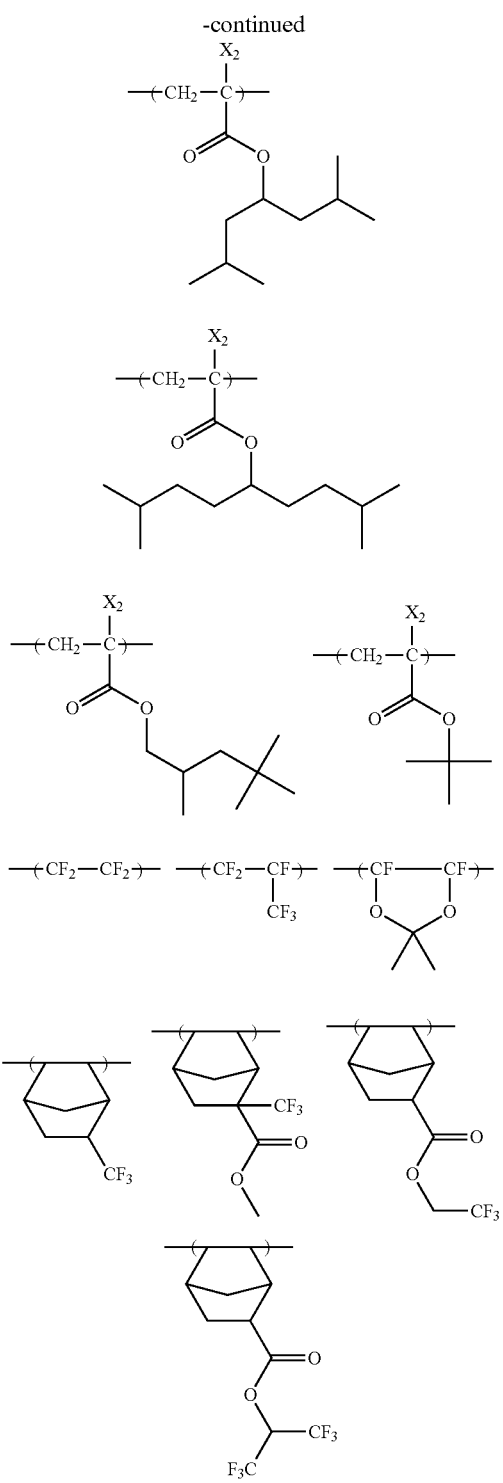

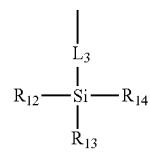

(CS-1)

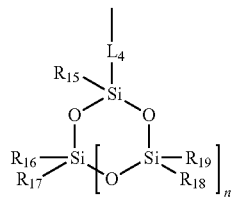

(CS-2)

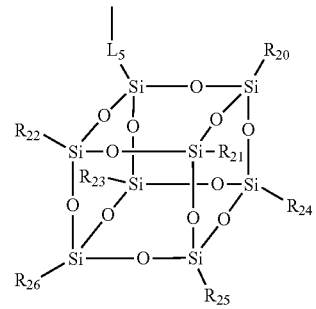

(CS-3)

In general formulae (CS-1) to (CS-3), each of $R_{12}$ to $R_{26}$ independently represents a linear or branched alkyl group (preferably 1 to 20 carbon atoms) or a cycloalkyl group (preferably 3 to 20 carbon atoms).

Each of $L_3$ to $L_5$ is a single bond or a bivalent connecting group. As the bivalent connecting group, there can be mentioned any one, or a combination of two or more groups, selected from the group consisting of an alkylene group, a phenylene group, an ether group, a thioether group, a carbonyl group, an ester group, an amido group, a urethane group and a urea group.

In the formulae, n is an integer of 1 to 5.

As repeating units each containing a silicon atom, there can be mentioned the repeating units of general formulae (C-Ia) to (C-Id) and (C-III) above (provided that $W_3$ to $W_6$ are read as "each representing an atomic group containing at least one silicon atom, in particular, any of the atomic groups of general formulae (CS-1) to (CS-3)").

Particular examples of the repeating units containing the groups of general formulae (CS-1) to (CS-3) are shown below, which in no way limit the scope of the present invention. In the particular examples, $X_1$ represents a hydrogen atom, —$CH_3$, —F or —$CF_3$.

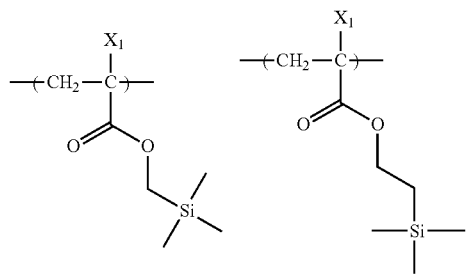

When the compound (U') contains a silicon atom in the principal chain or a side chain of the resin (i), it is preferred for the compound (U') to be a resin containing, as a partial structure containing a silicon atom, an alkylsilyl structure (preferably a trialkylsilyl group) or a cyclosiloxane structure.

As the alkylsilyl structure and cyclosiloxane structure, there can be mentioned, for example, the groups of general formulae (CS-1) to (CS-3) below.

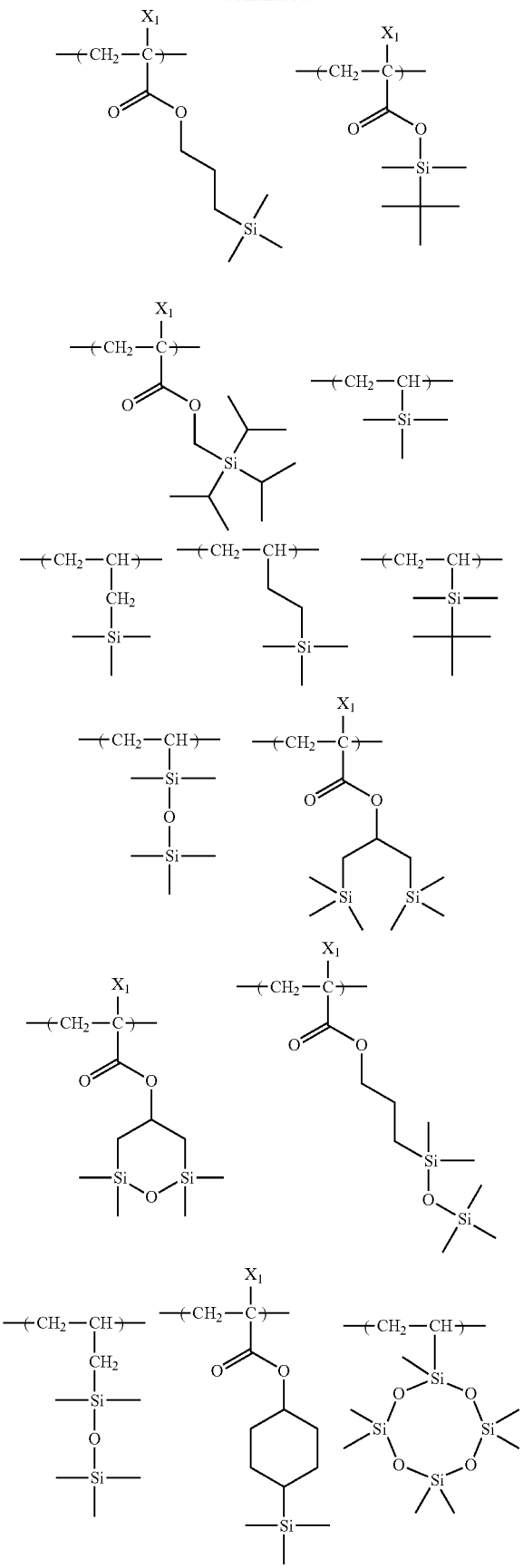
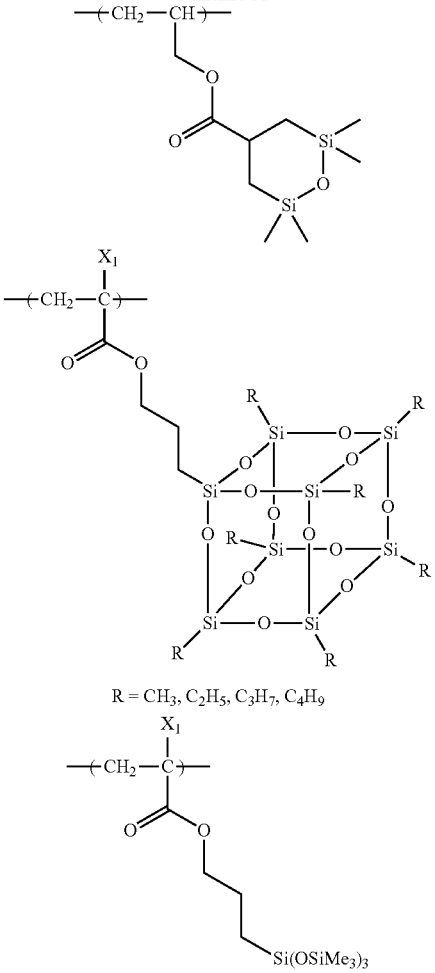

When the compound (U') contains a hydrocarbon group in a side chain of the resin (iii), the hydrocarbon group introduced in the side chain preferably has 4 or more carbon atoms, more preferably 6 or more carbon atoms.

In another aspect, the hydrocarbon group introduced in the side chain preferably has at least one —$CH_3$ structure, more preferably at least two —$CH_3$ structures. In this case, it is preferred for the hydrocarbon group to be a branched alkyl group.

As particular structures of repeating units, there can be mentioned the repeating units of general formulae (C-Ia) to (C-Id) and (C-III) above (provided that $W_3$ to $W_6$ are read as "each representing a hydrocarbon group").

The hydrocarbon group introduced in the side chain is preferably an alkyl group or an alkyl-substituted cycloalkyl group.

The alkyl group is preferably a linear alkyl group having 1 to 20 carbon atoms or a branched alkyl group having 3 to 20 carbon atoms. As preferred branched alkyl groups, there can be mentioned, for example, an isopropyl group, an isobutyl group, a t-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group and the like. An isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group are more preferred.

As preferred linear alkyl groups, there can be mentioned, for example, a methyl group, an ethyl group, a propyl group, a butyl group, a pentyl group, a hexyl group, a heptyl group, an octyl group, a nonyl group and the like.

As the alkyloxy group, there can be mentioned a group resulting from bonding of an ether group to any of the above alkyl groups.

The cycloalkyl group may be monocyclic or polycyclic. As preferred cycloalkyl groups, there can be mentioned an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. As more preferred cycloalkyl groups, there can be mentioned an adamantyl group, a norbornyl group, a cyclohexyl group, a cyclopentyl group, a tetracyclododecanyl group and a tricyclodecanyl group. A norbornyl group, a cyclopentyl group and a cyclohexyl group are further more preferred.

Any of the cycloalkyl groups may be substituted with an alkyl group. As examples thereof, there can be mentioned a 3,5-dimethylcyclohexyl group, a 4-isopropylcyclohexyl group, a 4-t-butyl cyclohexyl group and the like.

The alkenyl group is preferably a linear or branched alkenyl group having 1 to 20 carbon atoms, more preferably a branched alkenyl group.

The aryl group is preferably an aryl group having 6 to 20 carbon atoms, such as a phenyl group or a naphthyl group, more preferably a phenyl group.

The aralkyl group is preferably one having 7 to 12 carbon atoms. For example, there can be mentioned a benzyl group, a phenethyl group, a naphthylmethyl group or the like.

Preferred particular examples of the repeating units each containing a hydrocarbon group in a side chain of the resin (iii) are shown below. These in no way limit the scope of the present invention. In the particular examples, Rx represents a hydrogen atom or a methyl group, and each of Rxa to Rxc represents an alkyl group having 1 to 4 carbon atoms.

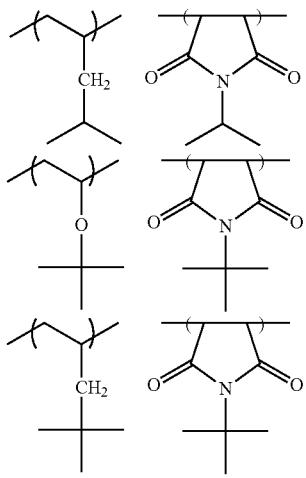

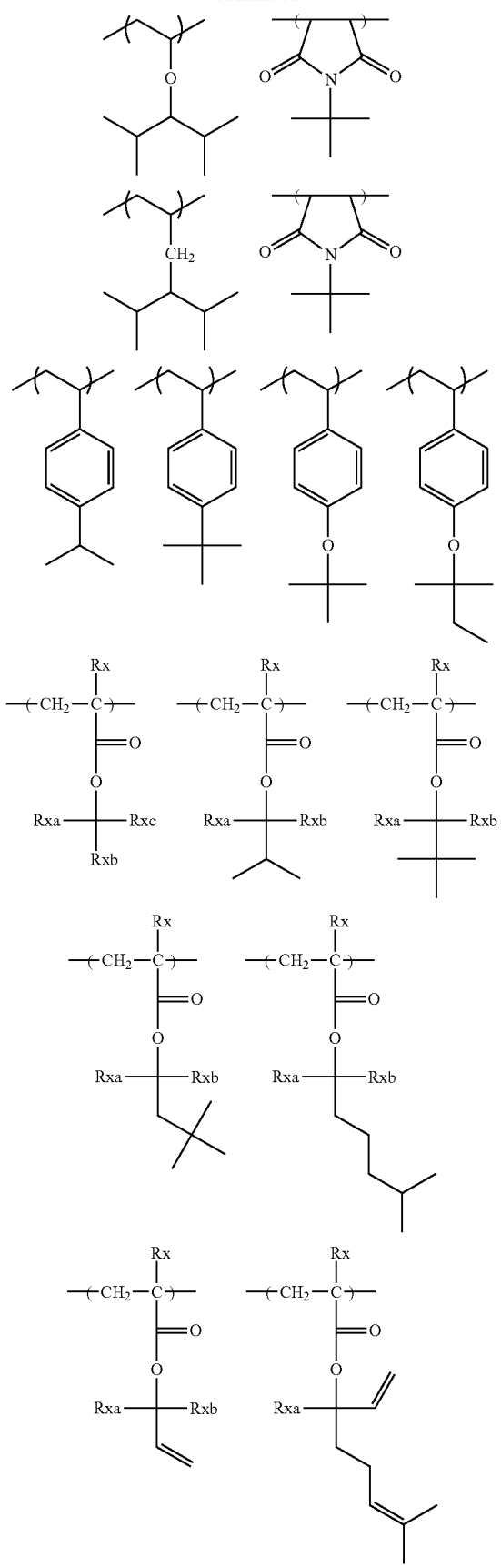

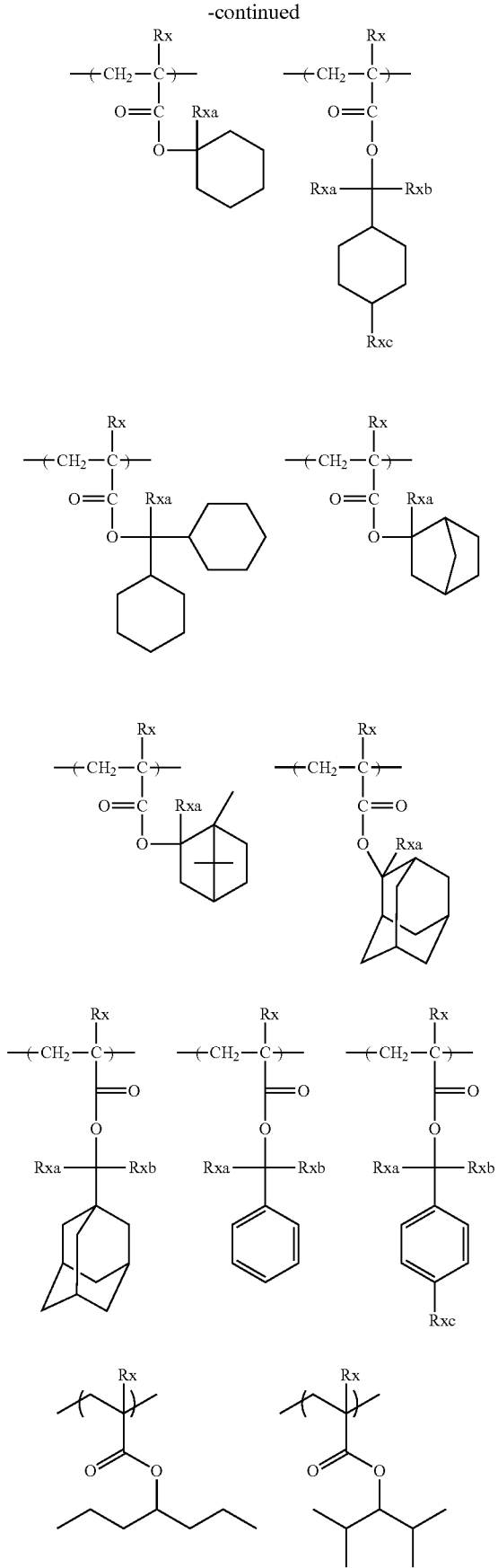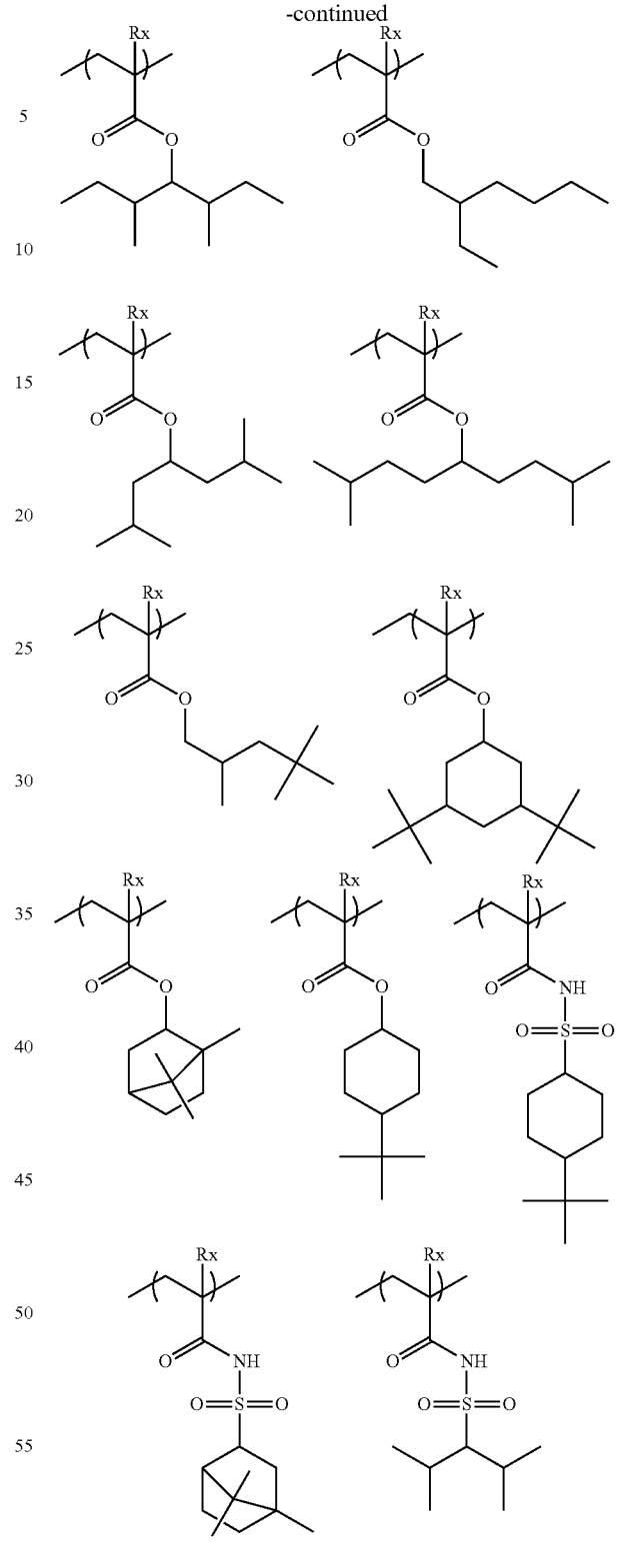
The total content of repeating units satisfying any of the above features (i) to (iii), based on all the repeating units of the compound (U'), is preferably in the range of 50 to 100 mol %, more preferably 80 to 100 mol % and further more preferably 90 to 100 mol %.
The compound (U') may further contain at least one group selected from among the following groups (x to z):

(x) an alkali-soluble group,
(y) a group that is decomposed by the action of an alkali developer to thereby increase its solubility in the alkali developer (hereinafter also referred to as a polarity conversion group), and
(z) a group that is decomposed by the action of an acid.

As the alkali-soluble group (x), there can be mentioned a phenolic hydroxyl group, a carboxylic acid group, a fluoroalcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali-soluble groups, there can be mentioned a fluoroalcohol group (preferably hexafluoroisopropanol), a sulfonylimido group and a bis(alkylcarbonyl)methylene group.

As the repeating unit containing an alkali-soluble group (x), there can be mentioned, for example, a repeating unit resulting from direct bonding of an alkali-soluble group to the principal chain of a resin like a repeating unit of acrylic acid or methacrylic acid, or a repeating unit resulting from bonding, via a connecting group, of an alkali-soluble group to the principal chain of a resin. Further, such a repeating unit can be obtained by conducting polymerization with the use of a chain transfer agent or polymerization initiator containing an alkali-soluble group to thereby introduce the same in a polymer chain terminal. All of these repeating units are preferred.

The content of repeating unit containing an alkali-soluble group (x) is preferably in the range of 1 to 50 mol %, more preferably 3 to 35 mol % and further more preferably 5 to 20 mol % based on all the repeating units of the polymer.

Particular examples of the repeating units each containing an alkali-soluble group (x) are shown below, which in no way limit the scope of the present invention.

In the formulae, Rx represents H, CH$_3$, CF$_3$ or CH$_2$OH.

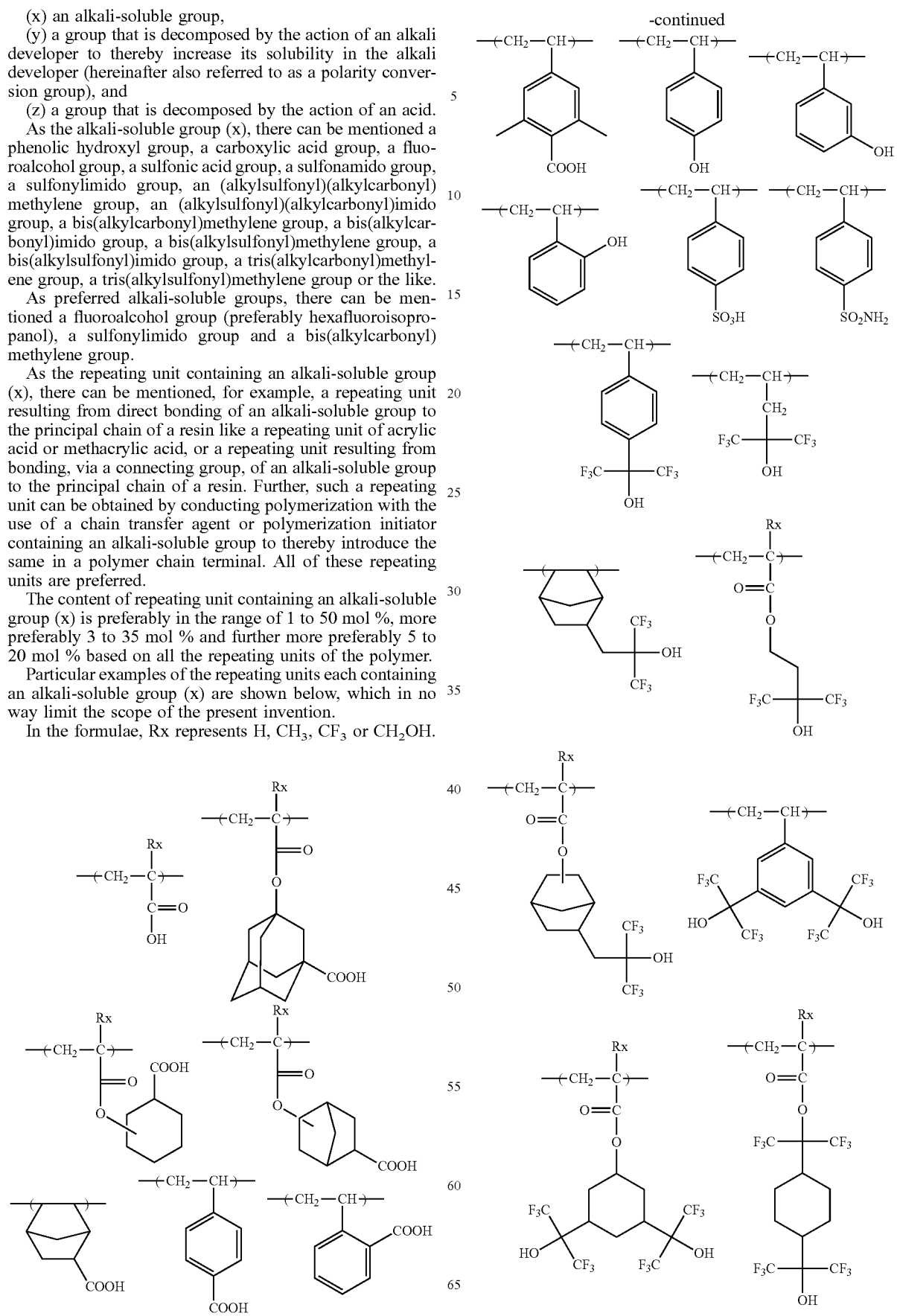

-continued

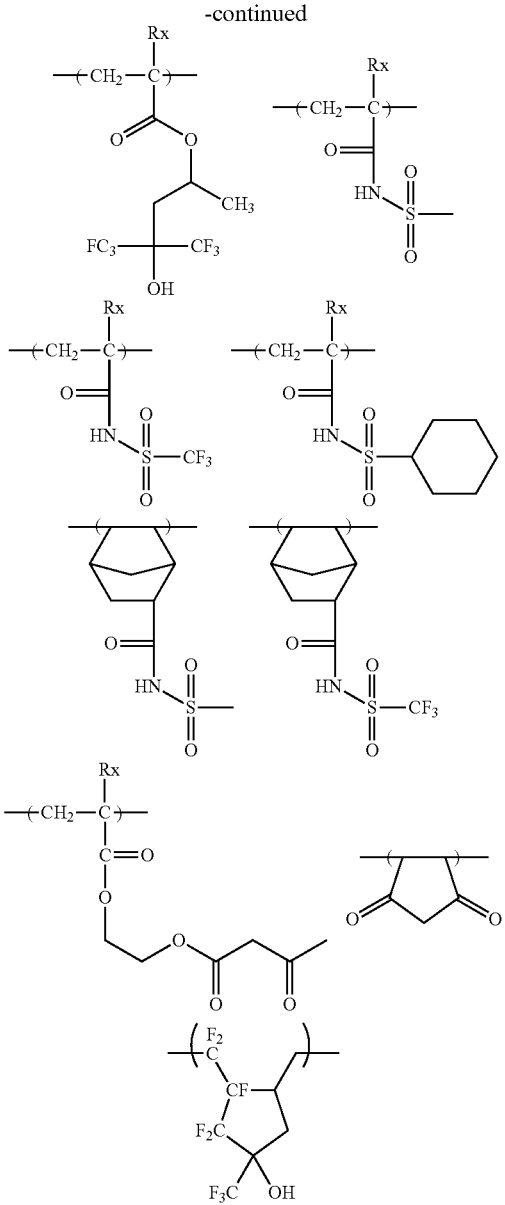

As the polarity conversion group (y), there can be mentioned, for example, a lactone group, a carboxylic ester group (—COO—), an acid anhydride group (—C(O)OC(O)—), an acid imido group (—NHCONH—), a carboxylic thioester group (—COS—), a carbonic ester group (—OS(O)O—), a sulfuric ester group (—OSO$_2$O—), a sulfonic ester group (—SO$_2$O—) or the like. A lactone group is preferred.

Both the form in which the polarity conversion group (y) is contained in a repeating unit of, for example, acrylic ester or methacrylic ester and thus introduced in a side chain of the resin and the form in which the polarity conversion group (y) is introduced in a polymer chain terminal by conducting polymerization with the use of a chain transfer agent or polymerization initiator containing the polarity conversion group (y) are preferred.

As particular examples of the repeating units (b) each containing the polarity conversion group (y), there can be mentioned those of the repeating units each having a lactone structure as set forth in connection with the resin (A) to be described hereinafter.

It is preferred for the repeating unit (b) containing the polarity conversion group (y) to be one containing at least either a fluorine atom or a silicon atom. A resin comprising this repeating unit is hydrophobic and is especially preferred from the viewpoint of the reduction of development defects.

As the repeating unit (b), there can be mentioned, for example, any of the repeating units of formula (K0) below.

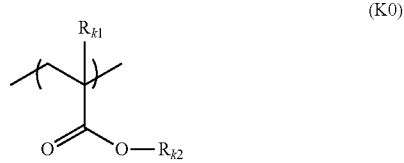

(K0)

In the formula, $R_{k1}$ represents a hydrogen atom, a halogen atom, a hydroxyl group, an alkyl group, a cycloalkyl group, an aryl group or a group containing a polarity conversion group, and $R^{k2}$ represents an alkyl group, a cycloalkyl group, an aryl group or a group containing a polarity conversion group, provided that at least one of $R_{k1}$ and $R_{k2}$ is a group containing a polarity conversion group.

The polarity conversion group, as mentioned above, refers to a group that is decomposed by the action of an alkali developer to thereby increase its solubility in the alkali developer. It is preferred for the polarity conversion group to be a group represented by X in the partial structures of general formulae (KA-1) and (KB-1) below.

In general formulae (KA-1) and (KB-1), X represents a polarity conversion group, preferably a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—) or a sulfonic ester group (—SO$_2$O—).

Each of $Y^1$ and $Y^2$ independently represents an electron withdrawing group.

The repeating unit (b) contains a preferred group whose solubility in an alkali developer is increased by containing a group with the partial structure of general formula (KA-1) or (KB-1). When the partial structure has no bonding hand as in the case of the partial structure of general formula (KA-1) or the partial structure of general formula (KB-1) in which $Y^1$ and $Y^2$ are monovalent, the above group with the partial structure refers to a group containing a monovalent or higher-valent group resulting from the deletion of at least one arbitrary hydrogen atom from the partial structure.

The partial structure of general formula (KA-1) or (KB-1) is linked at its arbitrary position to the principal chain of the compound (U') via a substituent.

The partial structure of general formula (KA-1) is a structure in which a ring structure is formed in cooperation with a group represented by X.

In general formula (KA-1), X is preferably a carboxylic ester group (namely, in the case of the formation of a lactone ring structure as KA-1), an acid anhydride group or a carbonic ester group. More preferably, X is a carboxylic ester group.

A substituent may be introduced in the ring structure of general formula (KA-1). For example, nka substituents each represented by $Z_{ka1}$ may be introduced.

$Z_{ka1}$, or each of a plurality of $Z_{ka1}$s independently, represents a halogen atom, an alkyl group, a cycloalkyl group, an ether group, a hydroxyl group, an amido group, an aryl group, a lactone ring group or an electron withdrawing group.

$Z_{ka1}$s may be linked to each other to thereby form a ring. As the ring formed by the mutual linkage of $Z_{ka1}$s, there can be mentioned, for example, a cycloalkyl ring or a heterocycle (for example, a cycloether ring or a lactone ring).

The above nka is an integer of 0 to 10, preferably 0 to 8, more preferably 0 to 5, further more preferably 1 to 4 and most preferably 1 to 3.

The electron withdrawing groups represented by $Z_{ka1}$ are the same as those represented by $Y^1$ and $Y^2$ to be described hereinafter. These electron withdrawing groups may be substituted with other electron withdrawing groups.

$Z_{ka1}$ is preferably an alkyl group, a cycloalkyl group, an ether group, a hydroxyl group or an electron withdrawing group. $Z_{ka1}$ is more preferably an alkyl group, a cycloalkyl group or an electron withdrawing group. It is preferred for the ether group to be one substituted with, for example, an alkyl group or a cycloalkyl group, namely, to be an alkyl ether group or the like. The electron withdrawing group is as mentioned above.

As the halogen atom represented by $Z_{ka1}$, there can be mentioned a fluorine atom, a chlorine atom, a bromine atom, an iodine atom or the like. Among these, a fluorine atom is preferred.

A substituent may be introduced in the alkyl group represented by $Z_{ka1}$. The alkyl group is preferably one having 1 to 4 carbon atoms, such as a methyl group, an ethyl group, an n-propyl group, an i-propyl group, an n-butyl group, an i-butyl group or a t-butyl group.

As preferred alicyclic moieties among the above, there can be mentioned an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. As more preferred alicyclic moieties, there can be mentioned an adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group.

Preferably, X of general formula (KA-1) represents a carboxylic ester group and the partial structure of general formula (KA-1) is a lactone ring. A 5- to 7-membered lactone ring is preferred.

As shown in formulae (KA-1-1) to (KA-1-17) below, the 5- to 7-membered lactone ring as the partial structure of general formula (KA-1) is preferably condensed with another ring structure in such a fashion that a bicyclo structure or a spiro structure is formed.

The peripheral ring structures to which the ring structure of general formula (KA-1) may be bonded can be, for example, those shown in formulae (KA-1-1) to (KA-1-17) below, or those similar to the same.

It is preferred for the structure containing the lactone ring structure of general formula (KA-1) to be the structure of any of formulae (KA-1-1) to (KA-1-17) below. The lactone structure may be directly bonded to the principal chain. As preferred structures, there can be mentioned those of formulae (KA-1-1), (KA-1-4), (KA-1-5), (KA-1-6), (KA-1-13), (KA-1-14) and (KA-1-17).

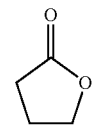
KA-1-1

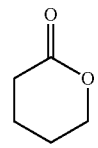
KA-1-2

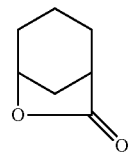
KA-1-3

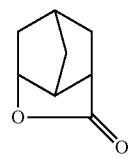
KA-1-4

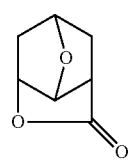
KA-1-5

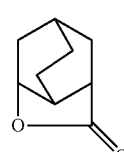
KA-1-6

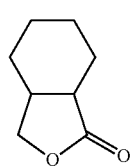
KA-1-7

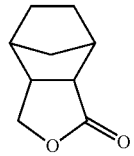
KA-1-8

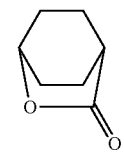
KA-1-9

KA-1-10 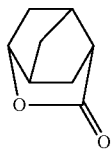

KA-1-11 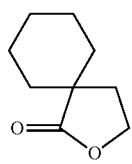

KA-1-12 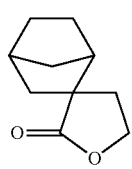

KA-1-13 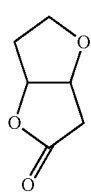

KA-1-14 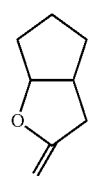

KA-1-15 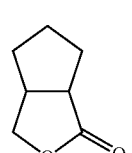

KA-A-16 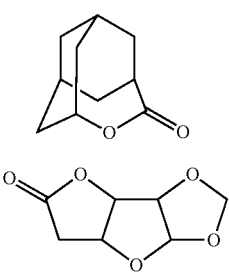

KA-1-17

A substituent is optionally introduced in the above structures containing the lactone ring structure. As preferred substituents, there can be mentioned the same as the substituents $Z_{ka1}$ that may be introduced in the ring structure of general formula (KA-1) above.

In general formula (KB-1), X is preferably a carboxylic ester group (—COO—).

In general formula (KB-1), each of $Y^1$ and $Y^2$ independently represents an electron withdrawing group.

The electron withdrawing group has the partial structure of formula (EW) below. In formula (EW), * represents either a bonding hand directly bonded to the structure of general formula (KA-1) or a bonding hand directly bonded to X of general formula (KB-1).

(EW)

In formula (EW),
$n_{ew}$ is the number of repetitions of each of the connecting groups of the formula —C($R_{ew1}$)($R_{ew2}$)—, being an integer of 0 or 1. When $n_{ew}$ is 0, a single bond is represented, indicating the direct bonding of $Y_{ew1}$.

$Y_{ew1}$ can be any of a halogen atom, a cyano group, a nitrile group, a nitro group, any of the halo(cyclo)alkyl groups or haloaryl groups of the formula —C($R_{f1}$)($R_{f2}$)—$R_{f3}$ to be described hereinafter, an oxy group, a carbonyl group, a sulfonyl group, a sulfinyl group and a combination thereof. The electron withdrawing groups may have, for example, the following structures. Herein, the "halo(cyclo)alkyl group" refers to an at least partially halogenated alkyl group or cycloalkyl group. The "haloaryl group" refers to an at least partially halogenated aryl group. In the following structural formulae, each of $R_{ew3}$ and $R_{ew4}$ independently represents an arbitrary structure. Regardless of the types of the structures of $R_{ew3}$ and $R_{ew4}$, the partial structures of formula (EW) exhibit electron withdrawing properties, and may be linked to, for example, the principal chain of the resin. Preferably, each of $R_{ew3}$ and $R_{ew4}$ is an alkyl group, a cycloalkyl group or a fluoroalkyl group.

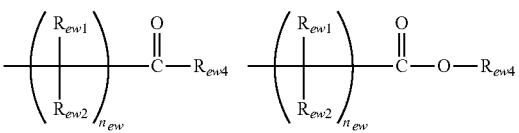

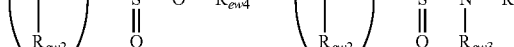

When $Y_{ew1}$ is a bivalent or higher-valent group, the remaining bonding hand or hands form a bond with an arbitrary atom or substituent. At least any of the groups represented by $Y_{ew1}$, $R_{ew1}$ and $R_{ew2}$ may be linked via a further substituent to the principal chain of the resin.

$Y_{ew1}$ is preferably a halogen atom or any of the halo (cyclo)alkyl groups or haloaryl groups of the formula —C($R_{f1}$)($R_{f2}$)—$R_{f3}$.

Each of $R_{ew1}$ and $R_{ew2}$ independently represents an arbitrary substituent, for example, a hydrogen atom, an alkyl group, a cycloalkyl group or an aryl group.

At least two of $R_{ew1}$, $R_{ew2}$ and $Y_{ew1}$ may be linked to each other to thereby form a ring.

In the above formula, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group. $R_{f2}$ and $R_{f3}$ may be linked to each other to thereby form a ring. As the organic group, there can be mentioned, for example, an alkyl group, a cycloalkyl group, an alkoxy group or the like. It is preferred for $R_{f2}$ to represent the same groups as $R_{f1}$ or to be linked to $R_{f3}$ to thereby form a ring.

$R_{f1}$ to $R_{f3}$ may be linked to each other to thereby form a ring. As the formed ring, there can be mentioned a (halo)cycloalkyl ring, a (halo)aryl ring or the like.

As the (halo)alkyl groups represented by $R_{f1}$ to $R_{f3}$, there can be mentioned, for example, the alkyl groups mentioned above as being represented by $Z_{ka1}$ and structures resulting from halogenation thereof.

As the (per)halocycloalkyl groups and (per)haloaryl groups represented by $R_{f1}$ to $R_{f3}$ or contained in the ring formed by the mutual linkage of $R_{f2}$ and $R_{f3}$, there can be mentioned, for example, structures resulting from halogenation of the cycloalkyl groups mentioned above as being represented by $Z_{ka1}$, preferably fluorocycloalkyl groups of the formula —$C_{(n)}F_{(2n-2)}H$, and perfluoroaryl groups of the formula —$C_{(n)}F_{(n-1)}$. The number of carbon atoms, n, is not particularly limited. Preferably, however, it is in the range of 5 to 13, more preferably 6.

As preferred rings that may be formed by the mutual linkage of at least two of $R_{ew1}$, $R_{ew2}$ and $Y_{ew1}$, there can be mentioned cycloalkyl groups and heterocyclic groups. Preferred heterocyclic groups are lactone ring groups. As the lactone rings, there can be mentioned, for example, the structures of formulae (KA-1-1) to (KA-1-17) above.

The repeating unit (b) may contain two or more of the partial structures of general formula (KA-1), or two or more of the partial structures of general formula (KB-1), or both any one of the partial structures of general formula (KA-1) and any one of the partial structures of general formula (KB-1).

A part or the whole of any of the partial structures of general formula (KA-1) may double as the electron withdrawing group represented by $Y^1$ or $Y^2$ of general formula (KB-1). For example, when X of general formula (KA-1) is a carboxylic ester group, the carboxylic ester group can function as the electron withdrawing group represented by $Y^1$ or $Y^2$ of general formula (KB-1).

The repeating unit (b) may be a repeating unit (b') containing at least either a fluorine atom or a silicon atom and a polarity conversion group simultaneously introduced in the same side chain thereof, or a repeating unit (b*) containing a polarity conversion group but containing neither a fluorine atom nor a silicon atom, or a repeating unit (b″) in which a polarity conversion group is introduced in its one side chain while at least either a fluorine atom or a silicon atom is introduced in a side chain other than the above side chain within the same repeating unit. However, it is preferred for the compound (U') to contain the repeating unit (b') as the repeating unit (b).

When the compound (U') contains the repeating unit (b*), it is preferred for the compound (U') to be a copolymer with a repeating unit (above-mentioned repeating unit (b)) containing at least either a fluorine atom or a silicon atom. In the repeating unit (b″), it is preferred for the side chain containing a polarity conversion group and the side chain containing at least either a fluorine atom or a silicon atom to be bonded to the same carbon atom of the principal chain, namely to be in a positional relationship shown in formula (K1) below.

In the formula, B1 represents a partial structure containing a group whose solubility is increased in an alkali developer, and B2 represents a partial structure containing at least either a fluorine atom or a silicon atom.

(K1)

In the repeating unit (b*) and repeating unit (b″), it is highly preferred for the polarity conversion group to be a partial structure expressed by —COO— in the structures of general formula (KA-1).

The receding contact angle with water of the resin composition film after alkali development can be decreased by the polarity conversion achieved by the decomposition of the polarity conversion group by the action of an alkali developer. The decrease of the receding contact angle between water and the film after alkali development is preferred from the viewpoint of the inhibition of development defects.

The receding contact angle with water of the resin composition film after alkali development is preferably 50° or less, more preferably 40° or less, at 23±3° C. in a humidity of 45±5%.

The receding contact angle refers to a contact angle determined when the contact line at a droplet-substrate interface draws back. It is generally known that the receding contact angle is useful in the simulation of droplet mobility in a dynamic condition. In brief, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

The above receding contact angle of the film after alkali development refers to the contact angle obtained by measuring the following film by the dilation/contraction method mentioned in the Examples to be described hereinafter. Namely, an organic antireflection film ARC29A (produced by Nissan Chemical Industries, Ltd.) was applied onto a silicon wafer (8-inch caliber) and baked at 205° C. for 60 seconds, thereby forming a 98 nm-thick antireflection film. Each of the compositions of the present invention was applied thereonto and baked at 120° C. for 60 seconds, thereby forming a 120 nm-thick film. The film was developed with an aqueous solution of tetramethylammonium hydroxide (2.38 mass %) for 30 seconds, rinsed with pure water and spin dried. The contact angle of the thus obtained film was measured in accordance with the dilation/contraction method.

The rate of hydrolysis of the compound (U') in an alkali developer is preferably 0.001 nm/sec or greater, more preferably 0.01 nm/sec or greater, further more preferably 0.1 nm/sec or greater and most preferably 1 nm/sec or greater.

Herein, the rate of hydrolysis of the compound (U') in an alkali developer refers to the rate of decrease of the thickness of a resin film formed from only the compound (U') in 23° C. TMAH (aqueous solution of tetramethylammonium hydroxide) (2.38 mass %)

It is preferred for the compound (U') to contain a repeating unit (b) containing at least two polarity conversion groups and contain at least either a fluorine atom or a silicon atom.

When the repeating unit (b) contains at least two polarity conversion groups, it is preferred for the repeating unit to contain a group with any of the partial structures having two polarity conversion groups of general formula (KY-1) below. When the structure of general formula (KY-1) has no bonding hand, a group with a mono- or higher-valent group resulting from the removal of at least any arbitrary one of the hydrogen atoms contained in the structure is referred to.

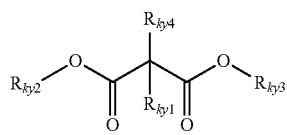

(KY-1)

In general formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group. Alternatively, both $R_{ky1}$ and $R_{ky4}$ may be bonded to the same atom to thereby form a double bond. For example, both $R_{ky1}$ and $R_{ky4}$ may be bonded to the same oxygen atom to thereby form a part (=O) of a carbonyl group.

Each of $R_{ky2}$ and $R_{ky3}$ independently represents an electron withdrawing group. Alternatively, $R_{ky1}$ and $R_{ky2}$ are linked to each other to thereby form a lactone structure, while $R_{ky3}$ is an electron withdrawing group. The formed lactone structure is preferably any of the above-mentioned structures (KA-1-1) to (KA-1-17). As the electron withdrawing group, there can be mentioned any of the same groups as mentioned above with respect to $Y^1$ and $Y^2$ of general formula (KB-1). This electron withdrawing group is preferably a halogen atom, or any of the halo(cyclo)alkyl groups or haloaryl groups of the formula $—C(R_{f1})(R_{f2})—R_{f3}$ above. Preferably, $R_{ky3}$ is a halogen atom, or any of the halo(cyclo) alkyl groups or haloaryl groups of the formula $—C(R_{f1})(R_{f2})—R_{f3}$ above, while $R_{ky2}$ is either linked to $R_{ky1}$ to thereby form a lactone ring, or an electron withdrawing group containing no halogen atom.

$R_{ky1}$, $R_{ky2}$ and $R_{ky4}$ may be linked to each other to thereby form a monocyclic or polycyclic structure.

As $R_{ky1}$ and $R_{ky4}$, there can be mentioned, for example, the same groups as set forth above with respect to $Z_{ka1}$ of general formula (KA-1).

The lactone rings formed by the mutual linkage of $R_{ky1}$ and $R_{ky2}$ preferably have the structures of formulae (KA-1-1) to (KA-1-17) above. As the electron withdrawing groups, there can be mentioned those set forth above as being represented by $Y^1$ and $Y^2$ of general formula (KB-1) above.

It is preferred for the structure of general formula (KY-1) to be the structure of general formula (KY-2) below. The structure of general formula (KY-2) refers to a group with a mono- or higher-valent group resulting from the removal of at least any arbitrary one of the hydrogen atoms contained in the structure.

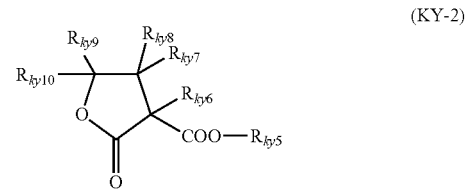

(KY-2)

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amido group or an aryl group.

At least two of $R_{ky6}$ to $R_{ky10}$ may be linked to each other to thereby form a monocyclic or polycyclic structure.

$R_{ky5}$ represents an electron withdrawing group. As the electron withdrawing group, there can be mentioned any of the same groups as set forth above with respect to $Y^1$ and $Y^2$. This electron withdrawing group is preferably a halogen atom, or any of the halo(cyclo)alkyl groups or haloaryl groups of the formula $—C(R_{f1})(R_{f2})—R_{f3}$ above.

As $R_{ky5}$ s to $R_{ky10}$, there can be mentioned, for example, the same groups as set forth above with respect to $Z_{ka1}$ of formula (KA-1).

It is more preferred for the structure of formula (KY-2) to be the partial structure of general formula (KY-3) below.

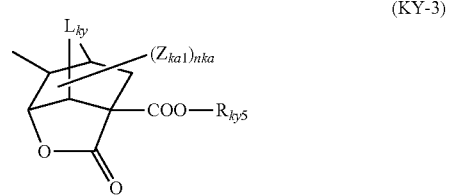

(KY-3)

In formula (KY-3), $Z_{ka1}$ and nka are as defined above in connection with general formula (KA-1). $R_{ky5}$ is as defined above in connection with formula (KY-2).

$L_{ky}$ represents an alkylene group, an oxygen atom or a sulfur atom. As the alkylene group represented by $L_{ky}$, there can be mentioned a methylene group, an ethylene group or the like. $L_{ky}$ is preferably an oxygen atom or a methylene group, more preferably a methylene group.

The repeating units (b) are not limited as long as they are derived by polymerization, such as addition polymerization, condensation polymerization or addition condensation. Preferred repeating units are those obtained by the addition polymerization of a carbon to carbon double bond. As such repeating units, there can be mentioned, for example, acrylate repeating units (including the family having a substituent at the α- and/or β-position), styrene repeating units (including the family having a substituent at the α- and/or β-position), vinyl ether repeating units, norbornene repeating units, repeating units of maleic acid derivatives (maleic anhydride, its derivatives, maleimide, etc.) and the like. Of these, acrylate repeating units, styrene repeating units, vinyl ether repeating units and norbornene repeating units are preferred. Acrylate repeating units, vinyl ether repeating units and norbornene repeating units are more preferred. Acrylate repeating units are most preferred.

The repeating unit (b) may be a repeating unit with the following partial structure.

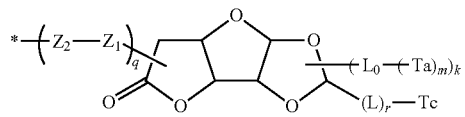

(bb)

In general formula (bb), $Z_1$, or each of $Z_1$s independently, represents a single bond, an ether bond, an ester bond, an amido bond, a urethane bond or a urea bond, preferably an ester bond.

$Z_2$, or each of $Z_2$s independently, represents a chain- or cycloalkylene group, preferably an alkylene group having 1 or 2 carbon atoms or a cycloalkylene group having 5 to 10 carbon atoms.

Ta, or each of Ta's independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1) above). An alkyl group, a cycloalkyl group and an electron withdrawing group are preferred. An electron withdrawing group is more preferred. Two or more Ta's may be bonded to each other to thereby form a ring.

$L_0$ represents a single bond or a hydrocarbon group with a valence of m+1 (preferably having 20 or less carbon atoms). A single bond is preferred. $L_0$ is a single bond when m is 1. The hydrocarbon group with a valence of m+1 represented by $L_0$ is, for example, one resulting from the removal of any m−1 hydrogen atoms from an alkylene group, a cycloalkylene group, a phenylene group or a combination thereof.

L, or each of L's independently, represents a carbonyl group, a carbonyloxy group or an ether group.

Tc represents a hydrogen atom, an alkyl group, a cycloalkyl group, a nitrile group, a hydroxyl group, an amido group, an aryl group or an electron withdrawing group (having the same meaning as that of the electron withdrawing group represented by $Y^1$ or $Y^2$ of general formula (KB-1)).

In the formula, * represents a bonding hand to the principal chain or a side chain of the resin. Specifically, the partial structure of formula (bb) may be directly bonded to the principal chain, or may be bonded to a side chain of the resin.

In the formula, m is an integer of 1 to 28, preferably an integer of 1 to 3, more preferably 1;

k is an integer of 0 to 2, preferably 1;

q is an integer of 0 to 5, preferably 1 or 2; and r is an integer of 0 to 5.

The moiety -(L)$_r$-Tc may be replaced with -L$_0$-(Ta)$_m$.

Among the lactone structures of general formula (bb), those in which a fluorine atom or a group containing a fluorine atom is introduced as a substituent in the location remotest from the above * (location at which the number of intervening atoms is the greatest) and those in which a fluorine atom is introduced in the side chain within the same repeating unit other than the side chain on the sugar lactone side (repeating unit (b")) are also preferred.

As further particular structures of the repeating units (bb), the repeating units with the following partial structures are preferred.

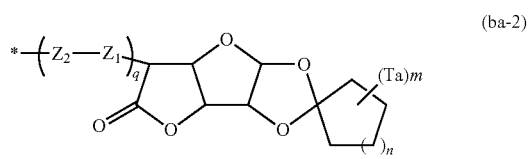

(ba-2)

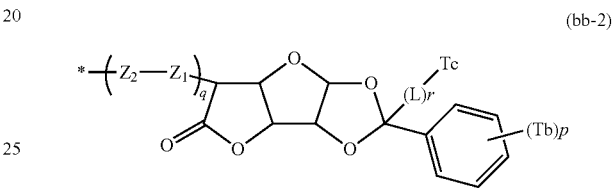

(bb-2)

In general formulae (ba-2) and (bb-2), n is an integer of 0 to 11, and p is an integer of 0 to 5.

Tb, or each of Tb's independently, represents an alkyl group, a cycloalkyl group, an alkoxy group, a nitrile group, a hydroxyl group, an amido group, an aryl group or an electron withdrawing group (having the same meaning as that of the electron withdrawing group represented by $Y^1$ or $Y^2$ of general formula (KB-1)). When there are a plurality of Tb's, they may be bonded to each other to thereby form a ring.

$Z_1$, $Z_2$, Ta, Tc, L, *, m, q and r are as defined above in connection with general formula (bb). Preferred examples thereof are also the same.

The repeating unit (b) can be a repeating unit with the partial structure of general formula (KY-4) below.

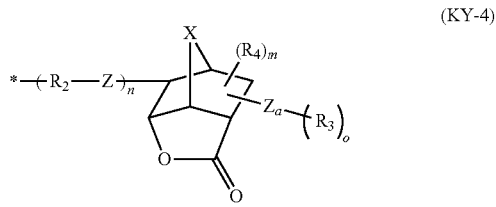

(KY-4)

In general formula (KY-4), $R_2$ represents a chain or cyclic alkylene group, provided that when there are a plurality of $R_{2s}$, they may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(═O)— or R—C(═O)O— in which R is an alkyl group or a cycloalkyl group. When there are a plurality of $R_{4s}$, they may be identical to or different from each other. Two or more $R_{4s}$ may be bonded to each other to thereby form a ring.

X represents an alkylene group, an oxygen atom or a sulfur atom.

Each of Z and Za represents a single bond, an ether bond, an ester bond, an amido bond, a urethane bond or a urea bond. When there are a plurality thereof, they may be identical to or different from each other.

In the formula, * represents a bonding hand to the principal chain or a side chain of the resin;
 o is the number of substituents, being an integer of 1 to 7;
 m is the number Of substituents, being an integer of 0 to 7; and
 n is the number of repetitions, being an integer of 0 to 5.

The structure —$R_2$—Z— is preferably the structure of formula —(CH2)l-OCO— in which l is an integer of 1 to 5.

The repeating unit (b) is preferably a repeating unit with the partial structure of general formula (KY-5) below.

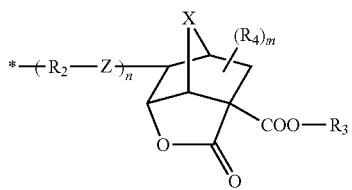

(KY-5)

In general formula (KY-5), $R_2$ represents a chain or cyclic alkylene group, provided that when there are a plurality of $R_{2s}$, they may be identical to or different from each other.

$R_3$ represents a linear, branched or cyclic hydrocarbon group whose hydrogen atoms on constituent carbons are partially or entirely substituted with fluorine atoms.

$R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(=O)— or R—C(=O)O— in which R is an alkyl group or a cycloalkyl group. When there are a plurality of $R_{4s}$, they may be identical to or different from each other. Two or more $R_{4s}$ may be bonded to each other to thereby form a ring.

X represents an alkylene group, an oxygen atom or a sulfur atom.

Z represents a single bond, an ether bond, an ester bond, an amido bond, a urethane bond or a urea bond. When there are a plurality thereof, they may be identical to or different from each other.

In the formula, * represents a bonding hand to the principal chain or a side chain of the resin;
 n is the number of repetitions, being an integer of 0 to 5; and
 m is the number of substituents, being an integer of 0 to 7.

The structure —$R_2$—Z— is preferably the structure of formula —(CH2)l-OCO— in which l is an integer of 1 to 5.

Moreover, as particular structures of the repeating units (b), there can be mentioned the repeating units with the following partial structures.

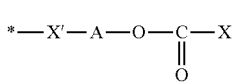

(rf-1)

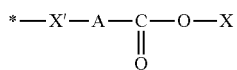

(rf-2)

In general formulae (rf-1) and (rf-2),

X' represents an electron withdrawing substituent, preferably a carbonyloxy group, an oxycarbonyl group, an alkylene group substituted with a fluorine atom or a cycloalkylene group substituted with a fluorine atom.

A represents a single bond or a bivalent connecting group, preferably a single bond, an alkylene group optionally substituted with a fluorine atom or a cycloalkylene group optionally substituted with a fluorine atom.

X represents an electron withdrawing group, preferably a fluoroalkyl group, a fluorocycloalkyl group, an aryl group substituted with fluorine or a fluoroalkyl group, or an aralkyl group substituted with fluorine or a fluoroalkyl group.

* represents a bonding hand to the principal chain or a side chain of the resin, namely, a bonding hand bonded to the principal chain of the resin through a single bond or a connecting group.

When X' is a carbonyloxy group or an oxycarbonyl group, A is not a single bond.

As the partial structure having a fluorine atom within the repeating unit (b), there can be mentioned those set forth above, preferably any of the groups of general formulae (F2) to (F4) above.

As the partial structure having a silicon atom within the repeating unit (b), there can be mentioned those set forth above, preferably any of the groups of general formulae (CS-1) to (CS-3) above.

The content of repeating unit (b) in the compound (U'), based on all the repeating units of the compound (U'), is preferably in the range of 10 to 99 mol %, more preferably 20 to 97 mol %, further more preferably 30 to 95 mol % and most preferably 40 to 95 mol %.

Particular examples of the repeating units containing polarity conversion groups are shown below, which are nonlimiting.

In the formulae, Ra represents a hydrogen atom, a fluorine atom, a methyl group or a trifluoromethyl group.

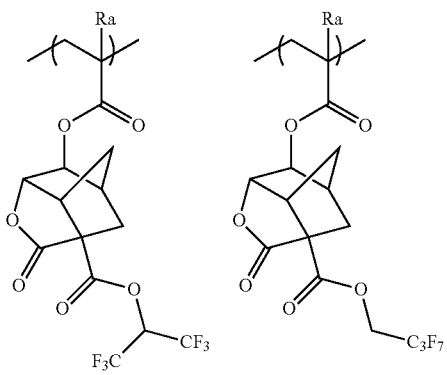

-continued
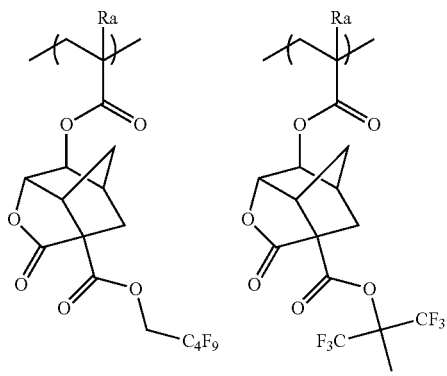
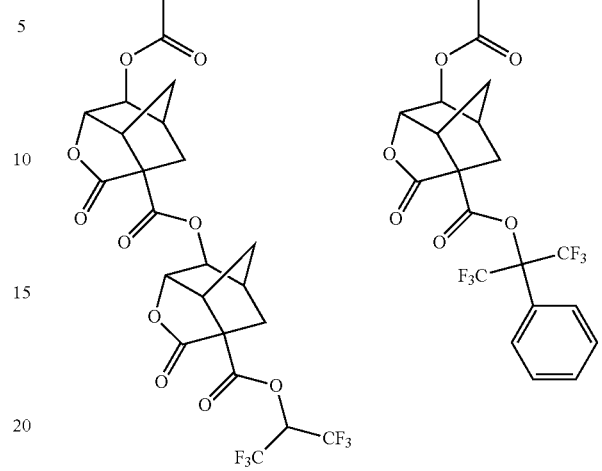
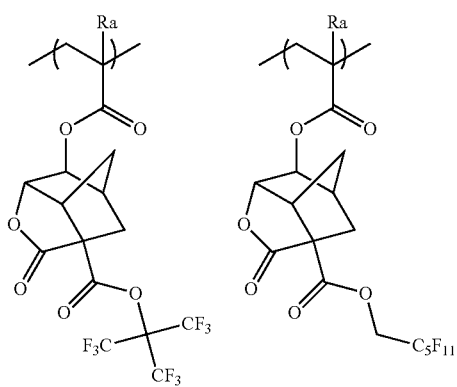
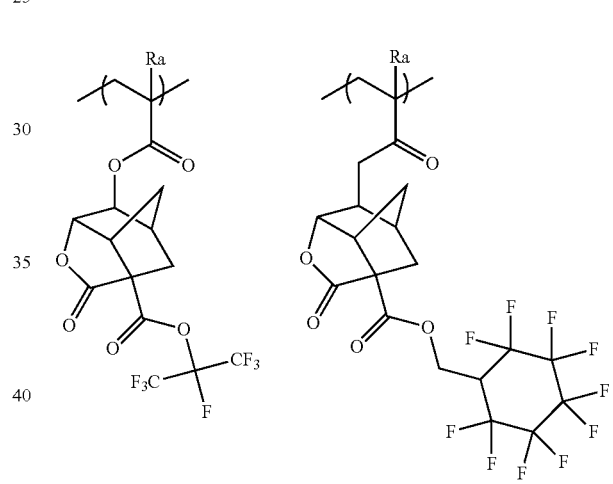
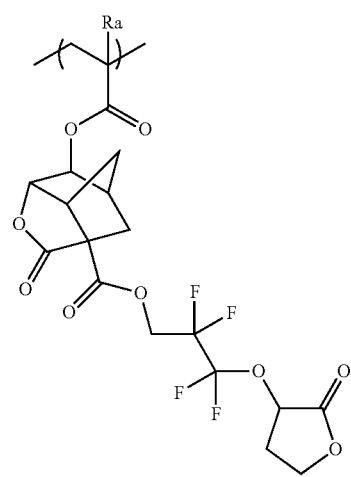
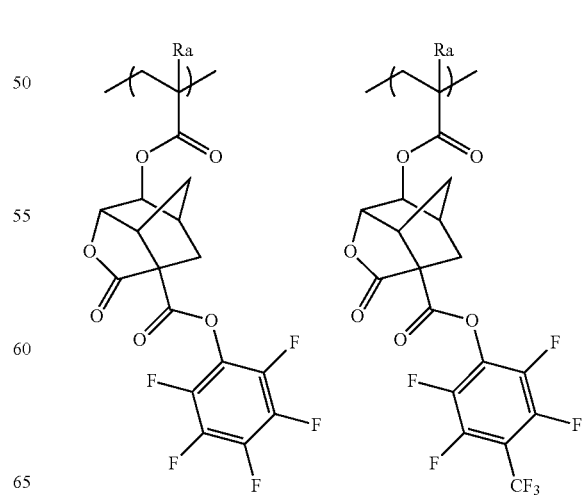

247
-continued
248
-continued
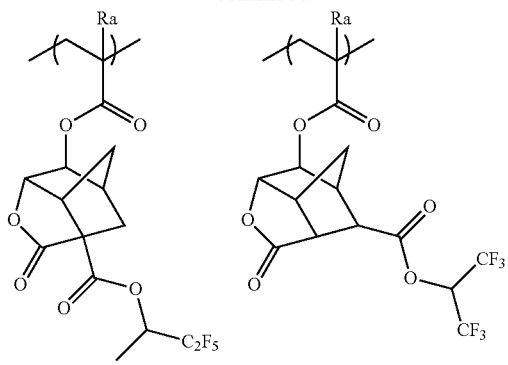
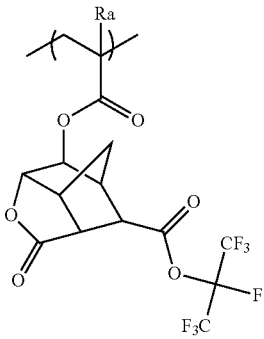
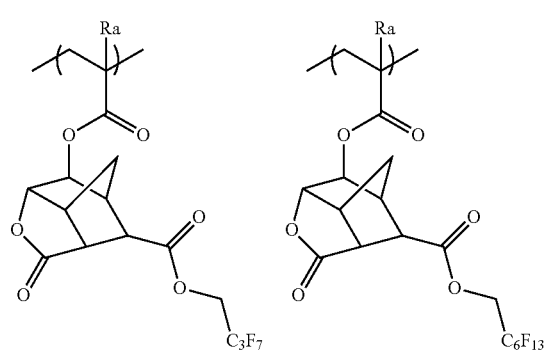
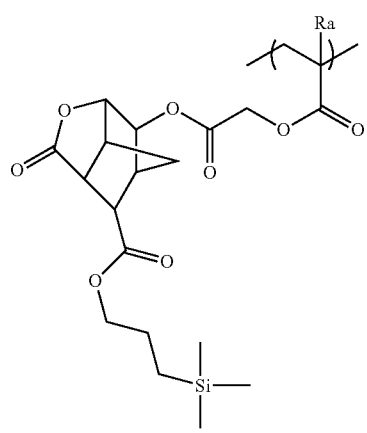
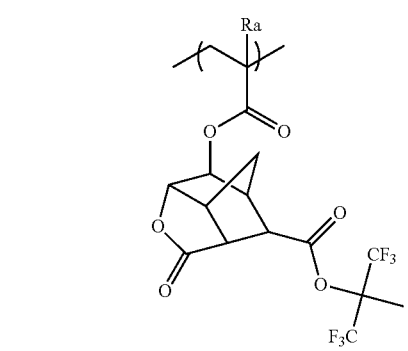
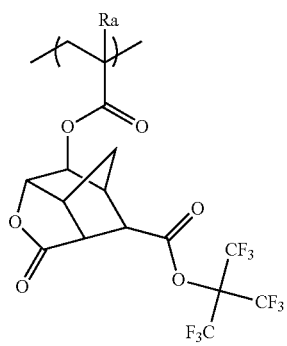
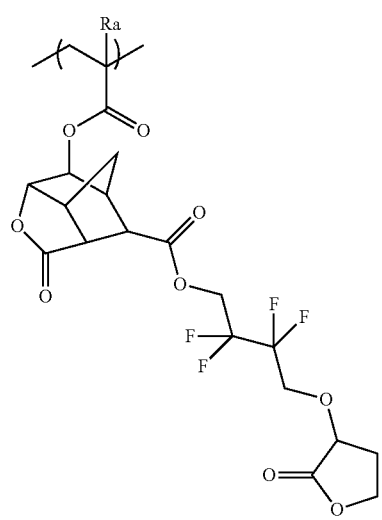
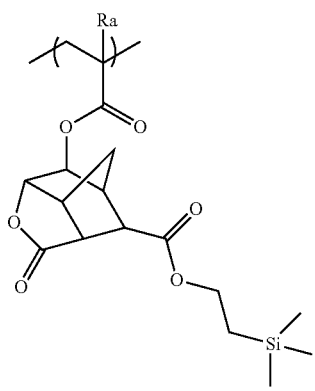

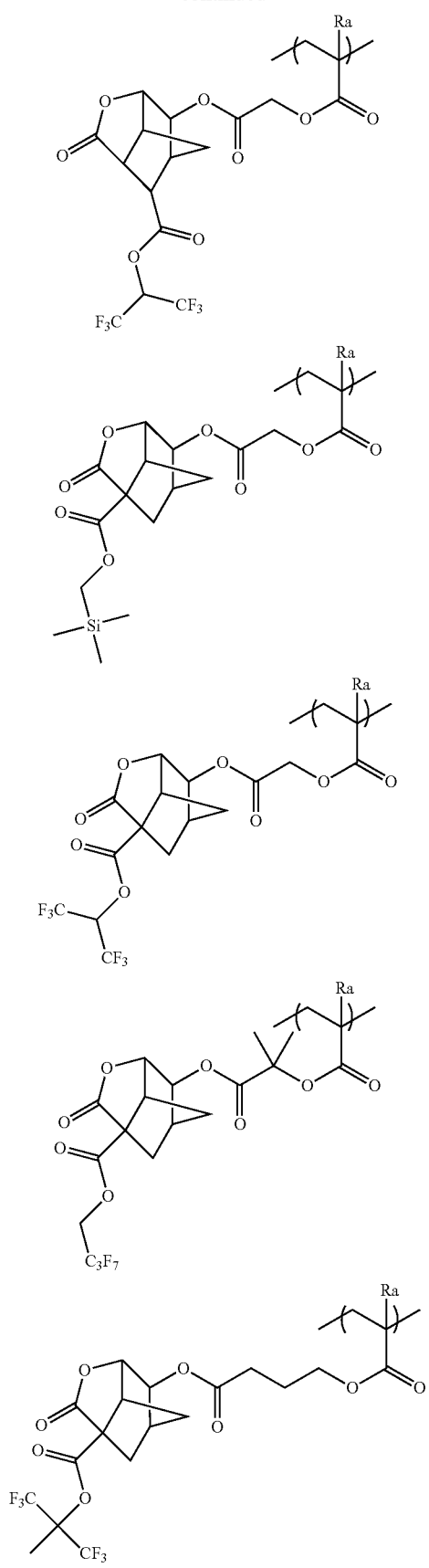
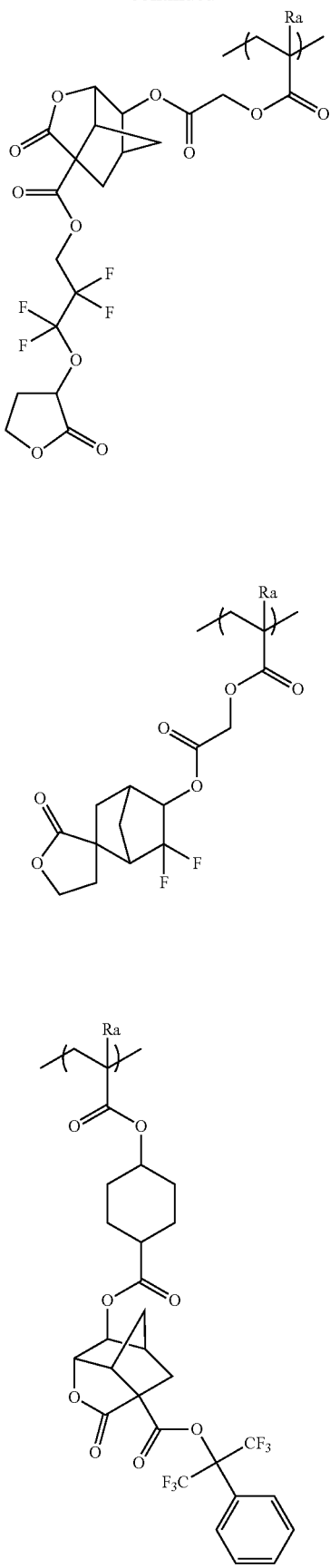

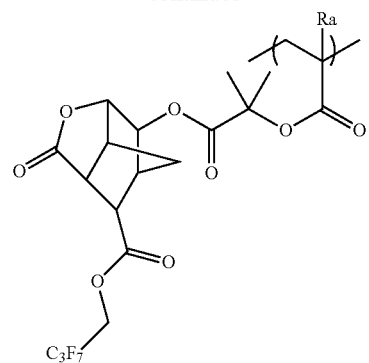
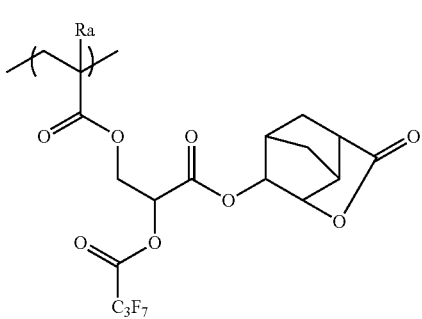
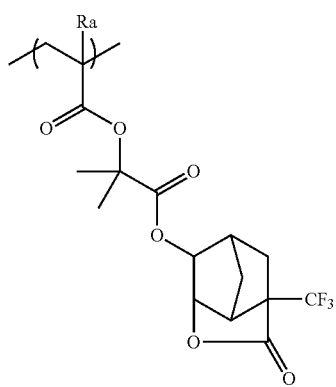
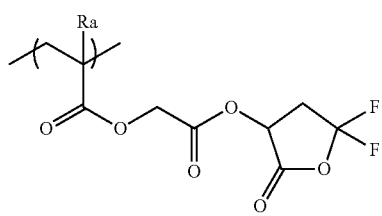
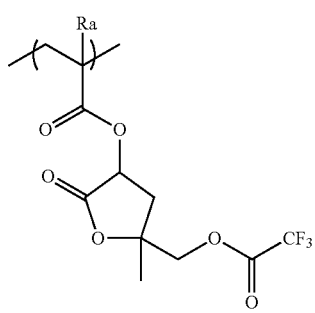
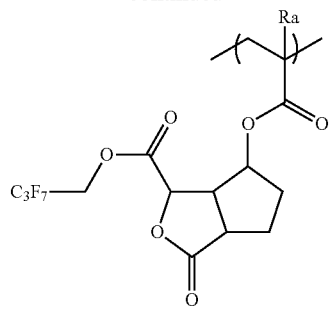
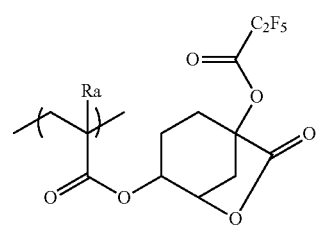
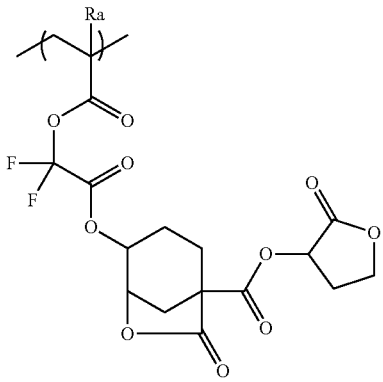
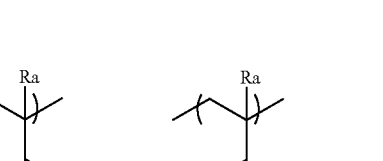
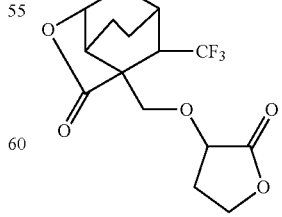
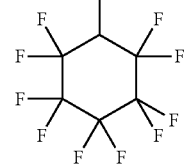

253
-continued
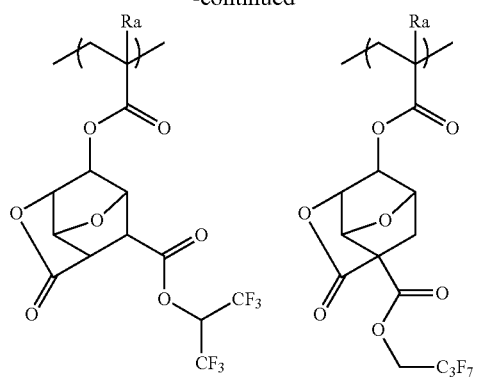
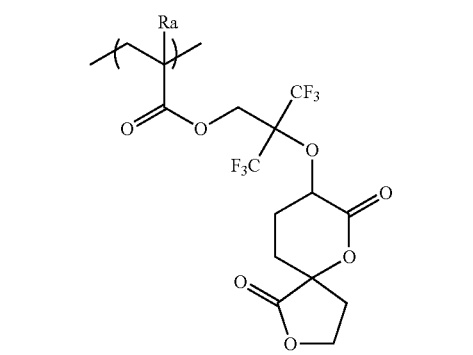
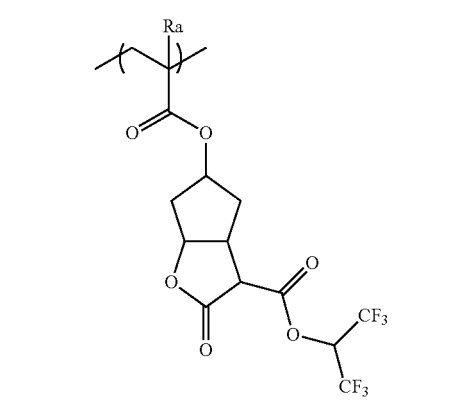
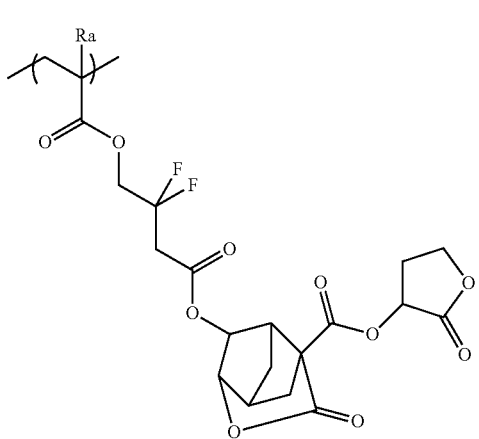
254
-continued
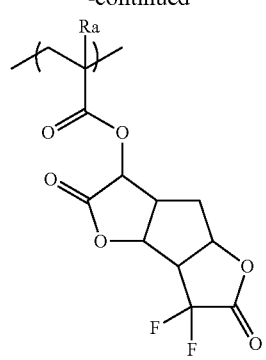
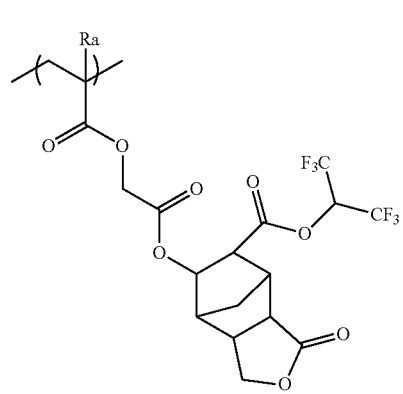

255
-continued
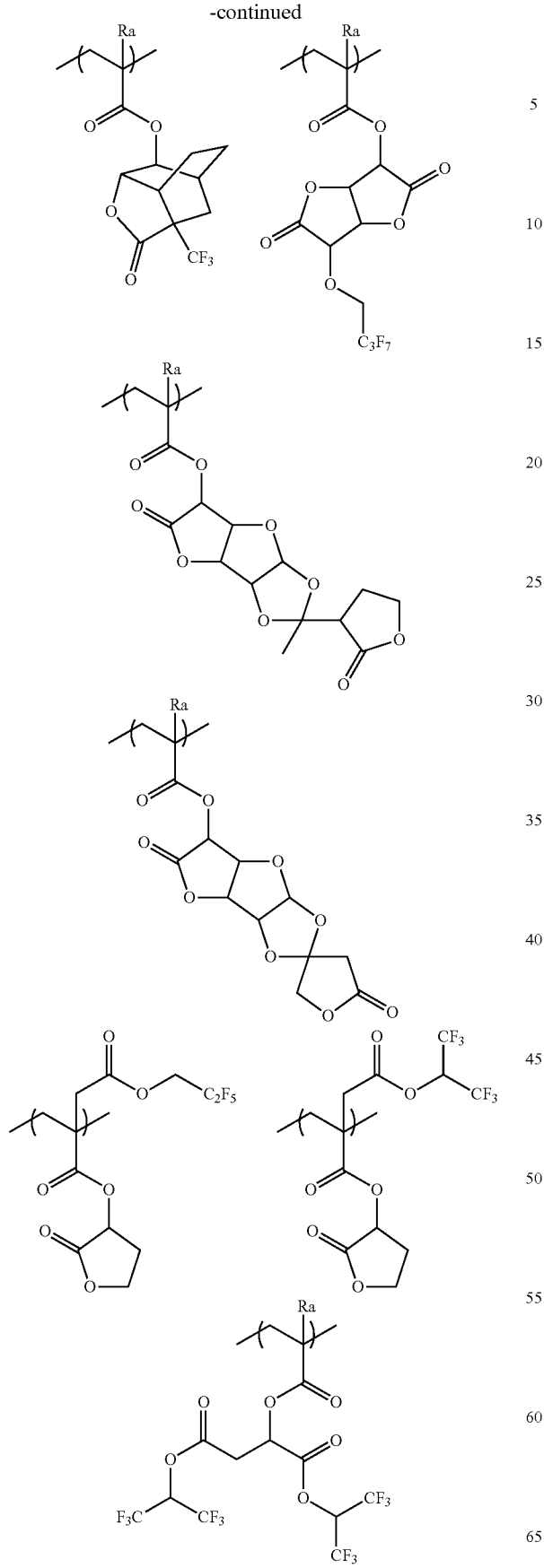
256
-continued
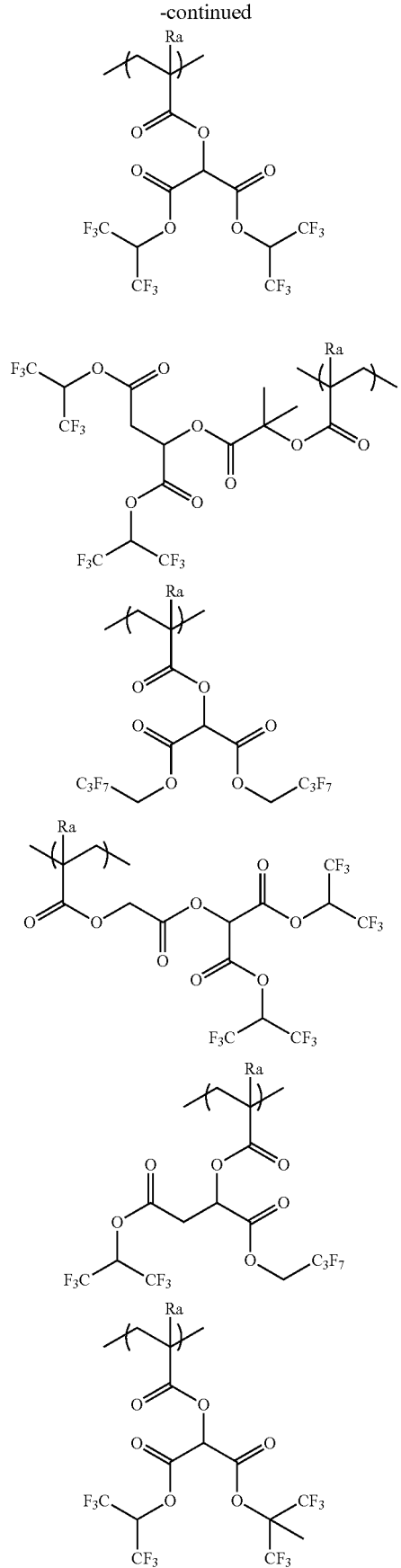

257
-continued
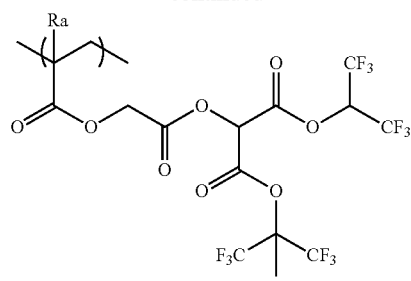
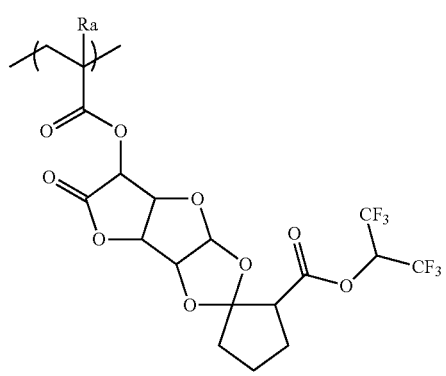
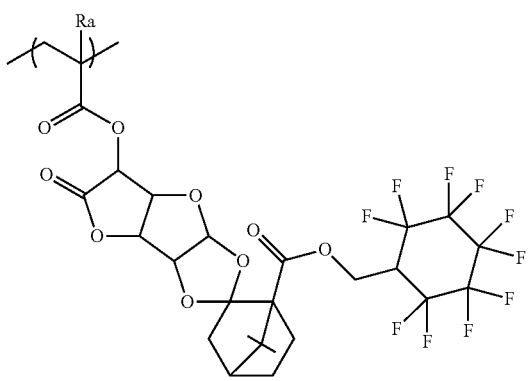
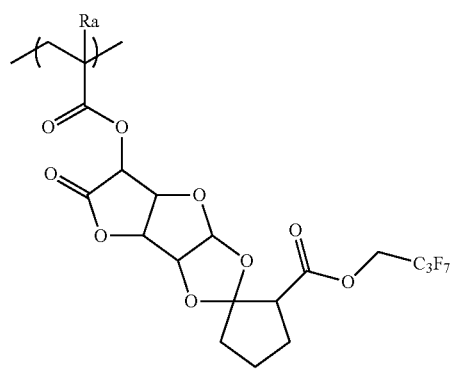
258
-continued
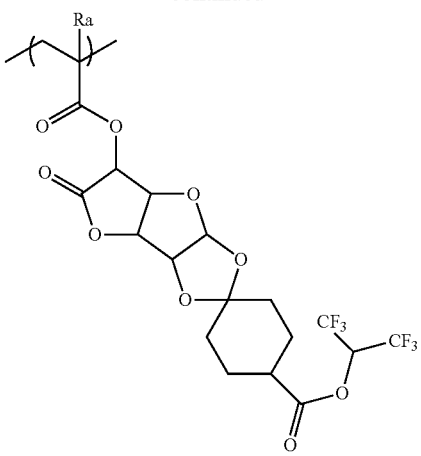
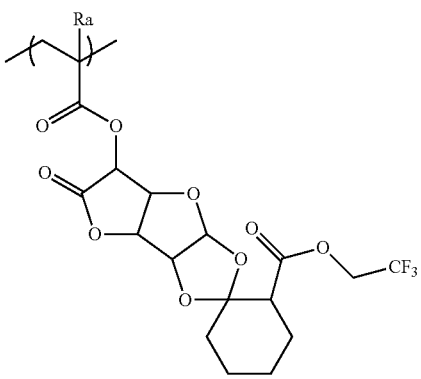
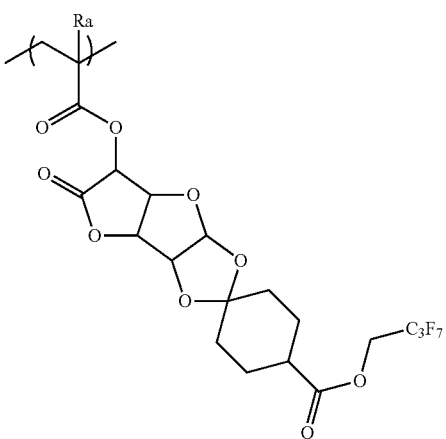
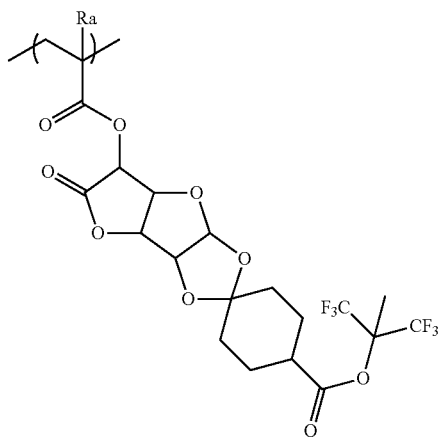

259
-continued
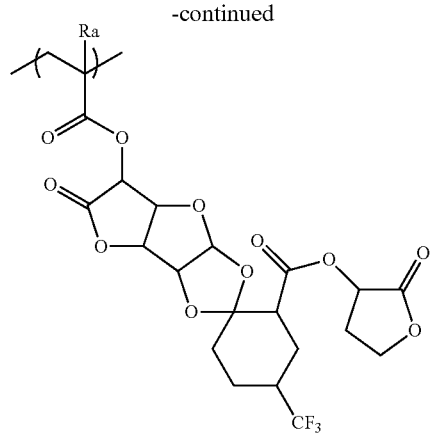
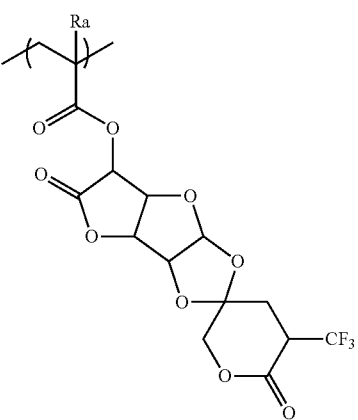
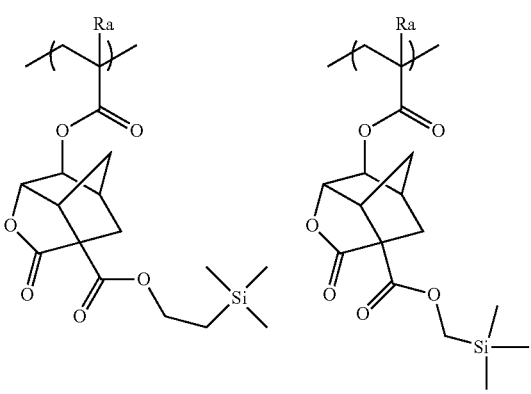
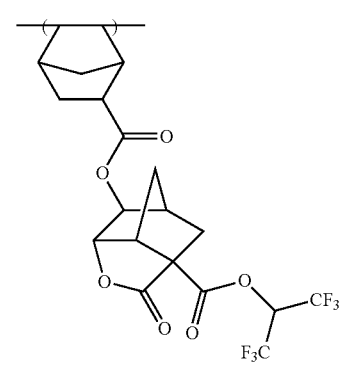
260
-continued
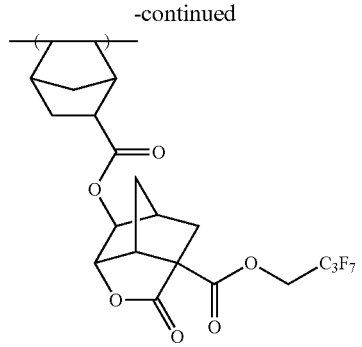
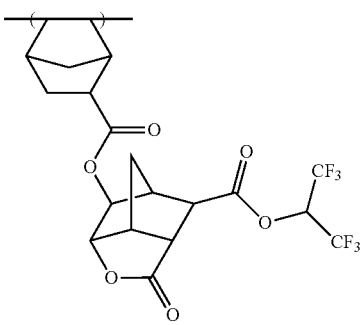
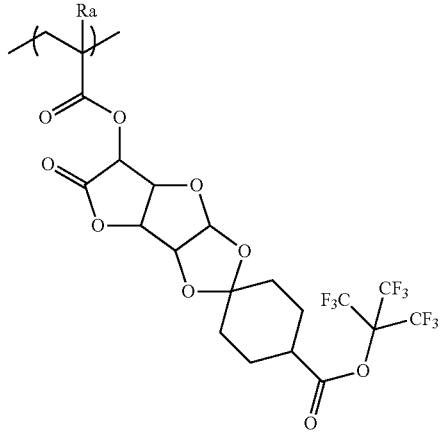
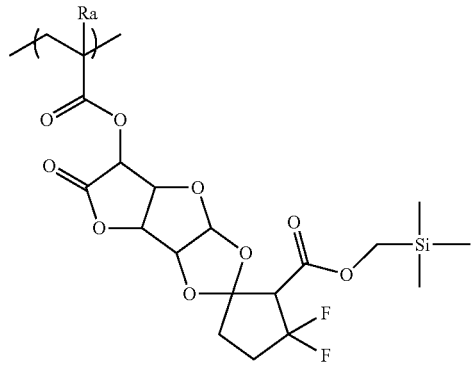

261
-continued
262
-continued
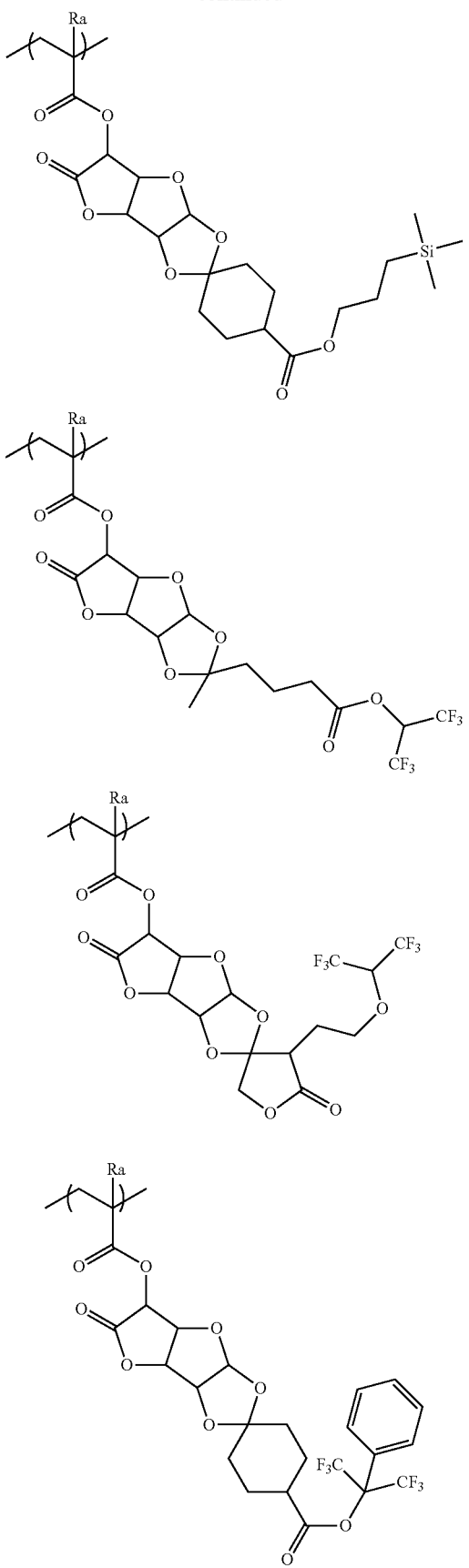
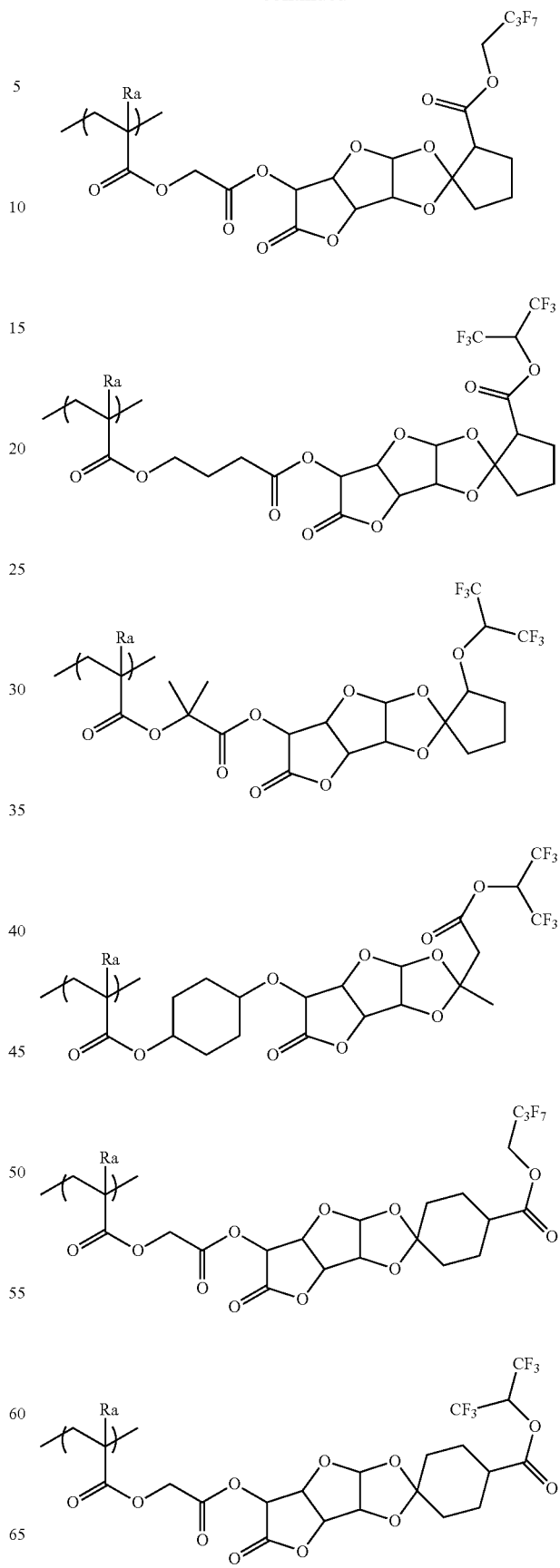

263
-continued
264
-continued
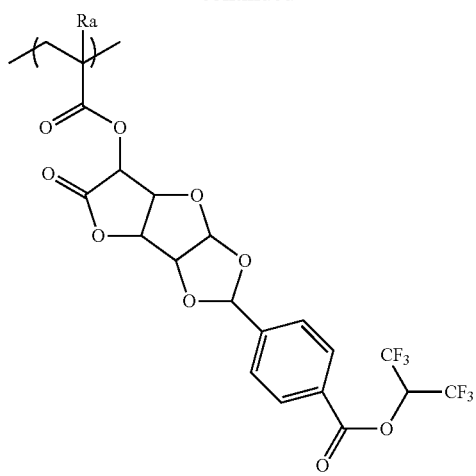
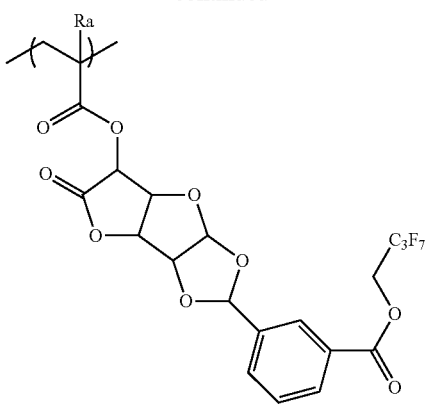
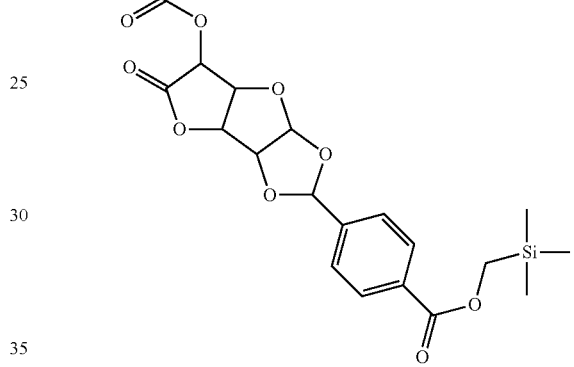
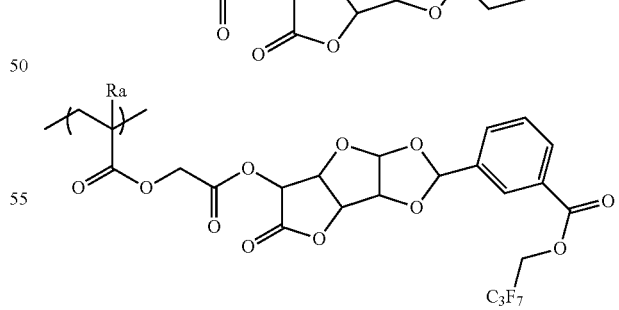
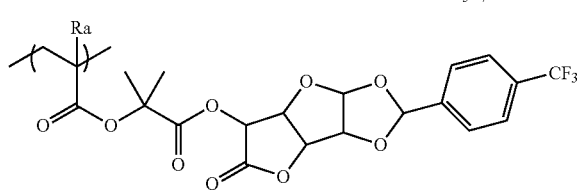

265
-continued
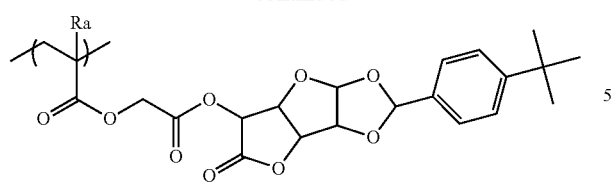
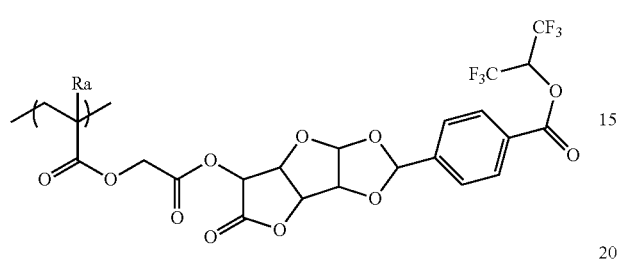
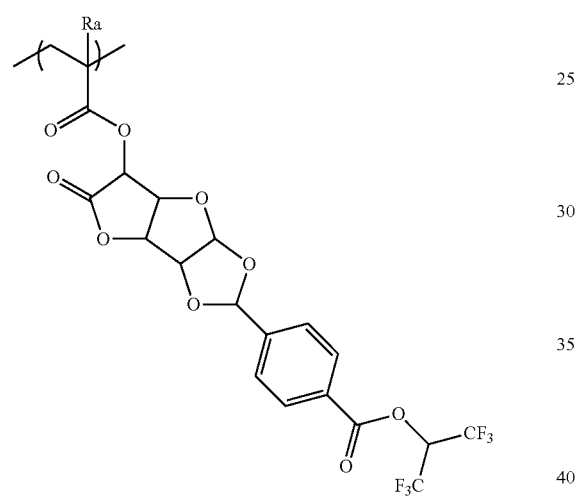
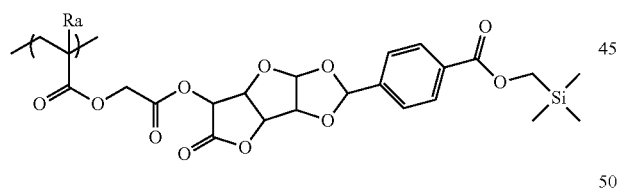
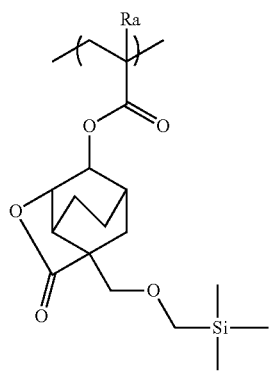
266
-continued
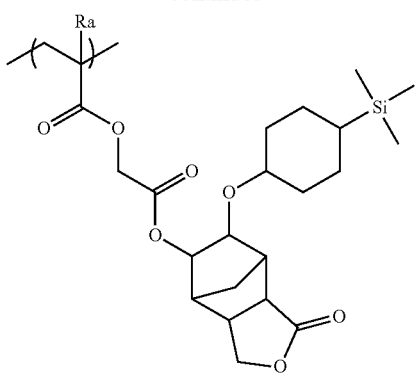
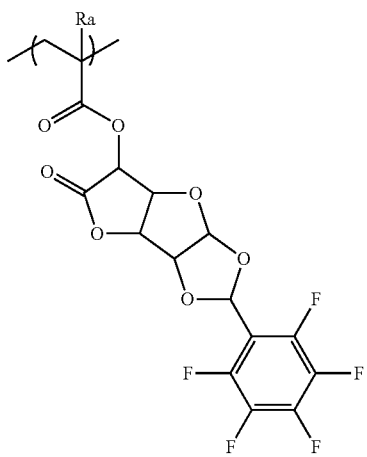
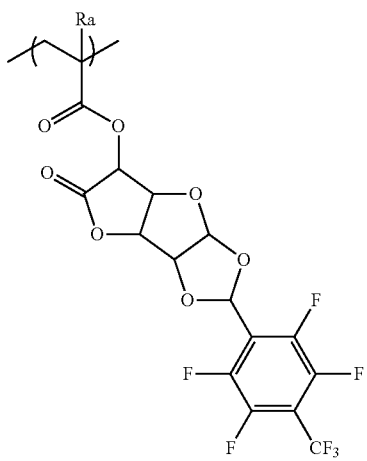
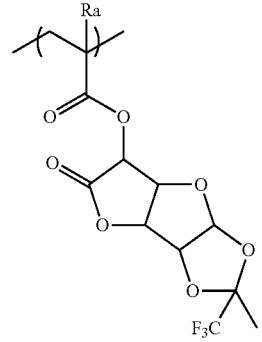

267
-continued
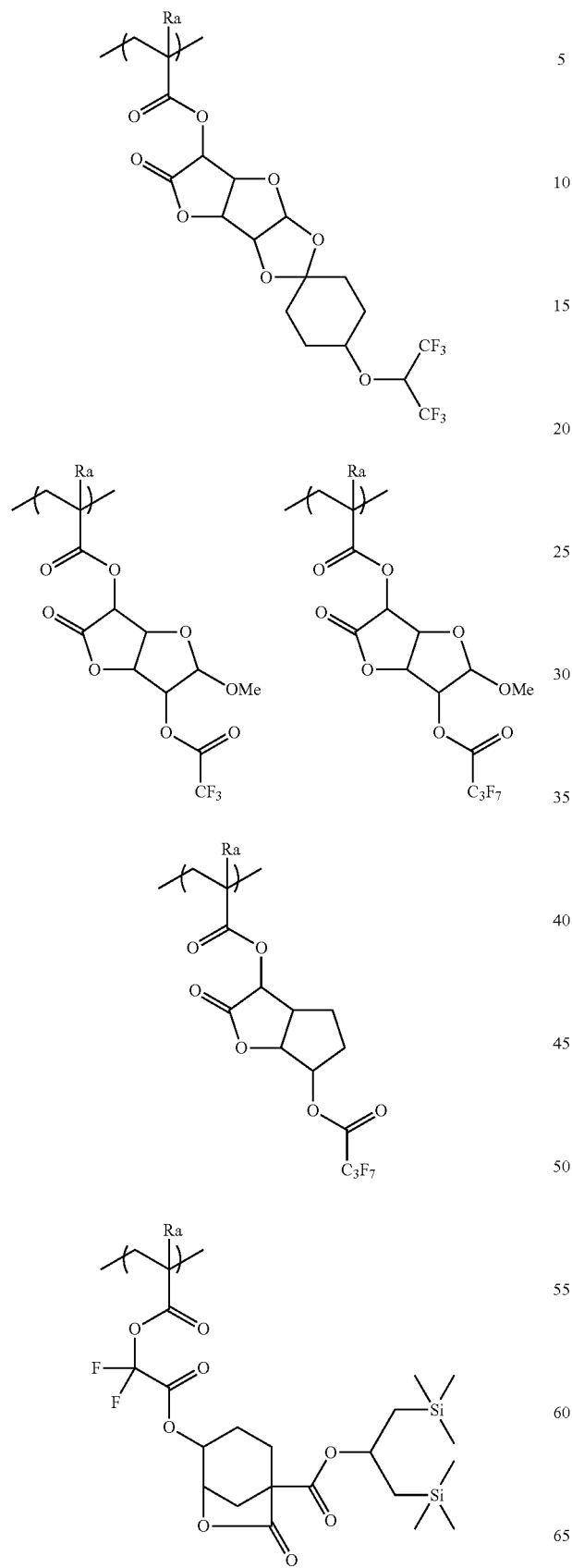
268
-continued
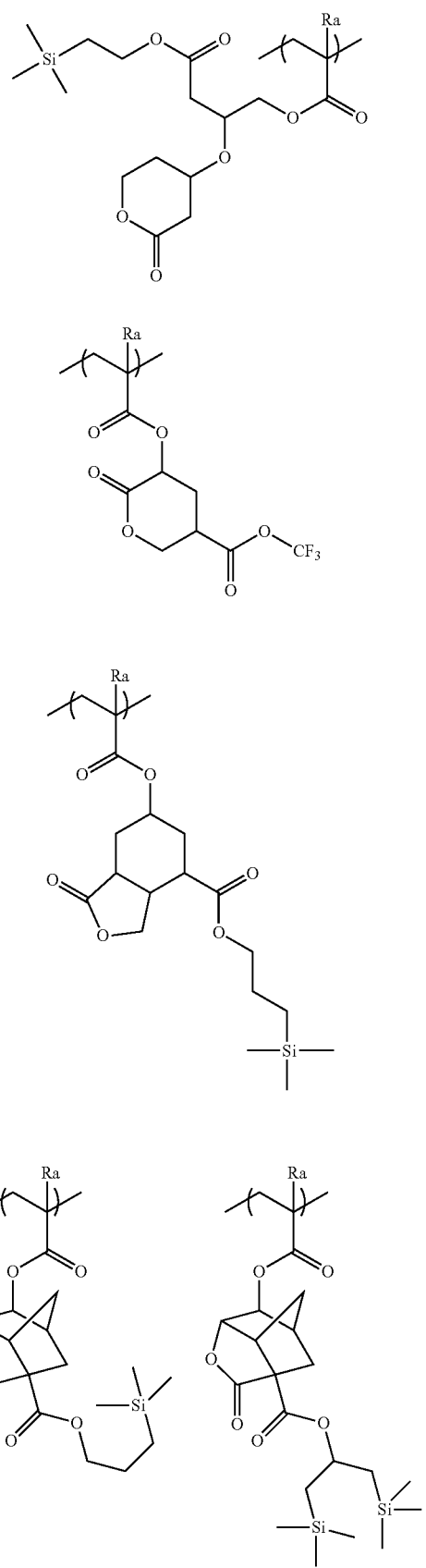

269
-continued
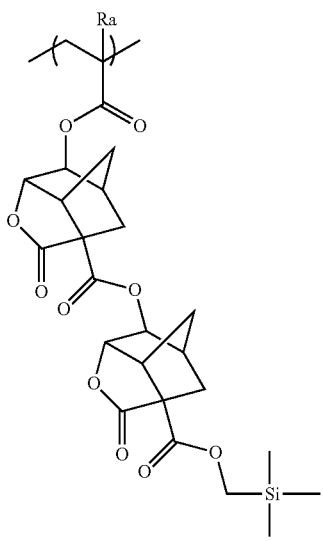
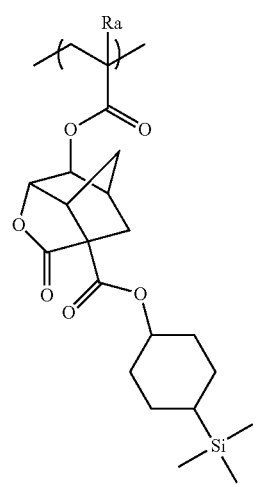
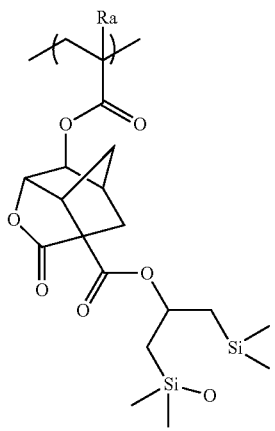
270
-continued
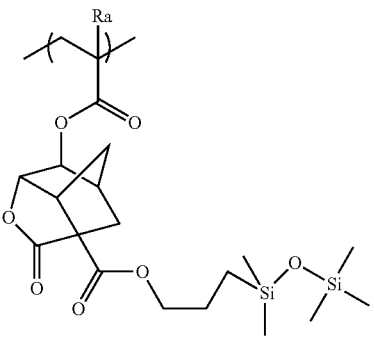
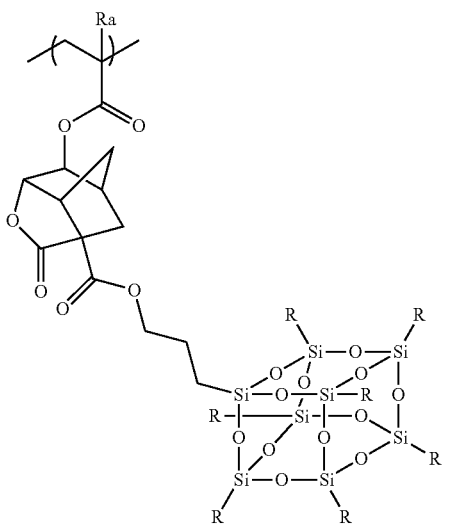
R = CH₃, C₂H₅, C₃H₇, C₄H₉
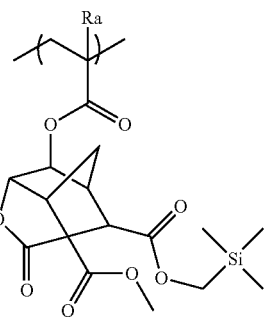
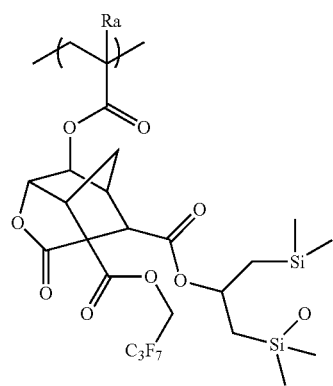

271
-continued
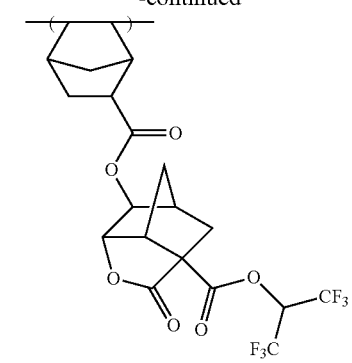
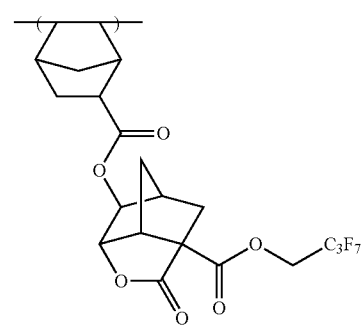
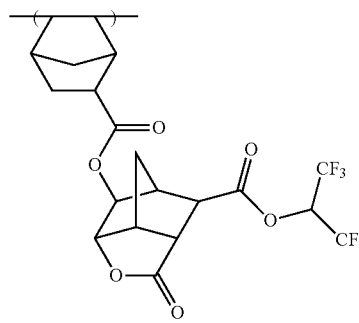
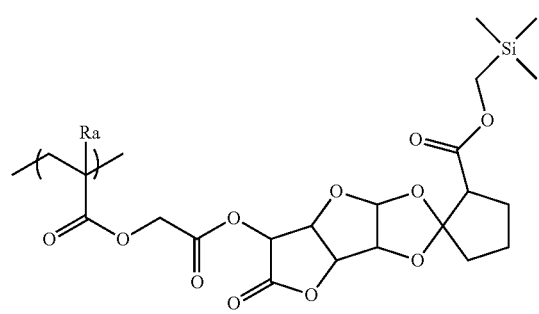
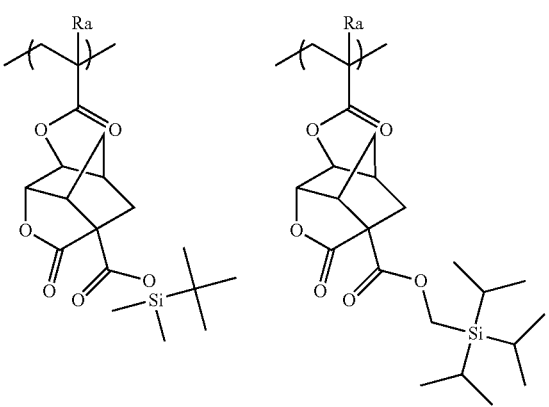
272
-continued
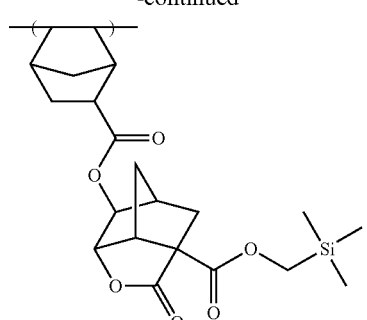
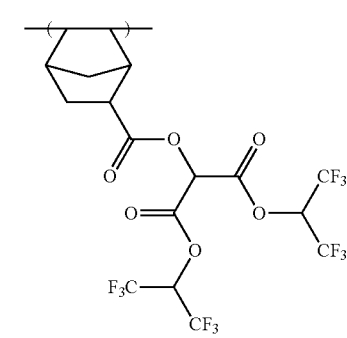
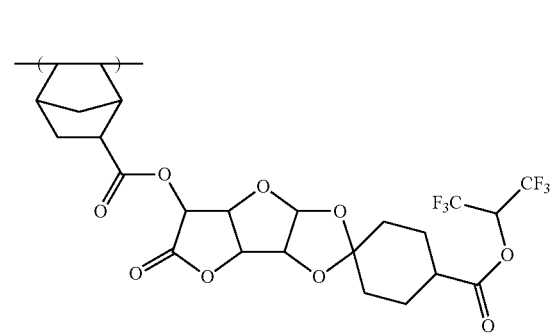
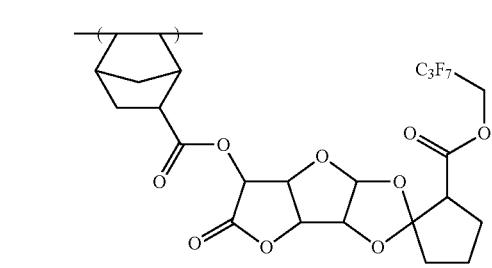
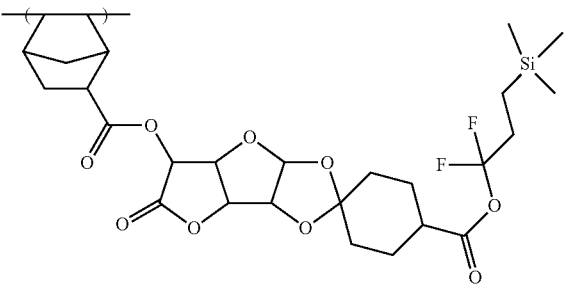

273
-continued
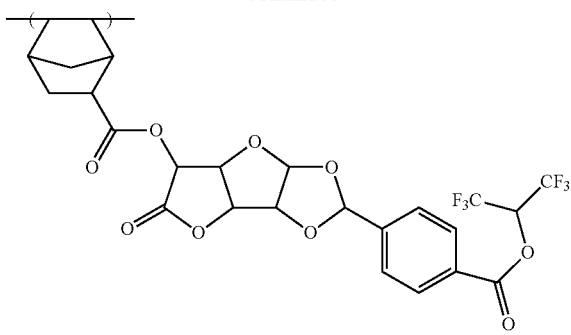
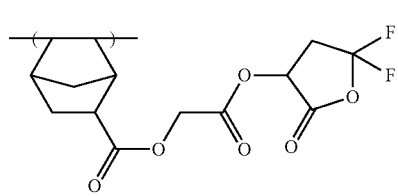
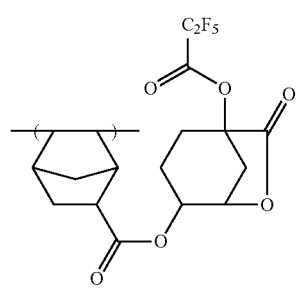
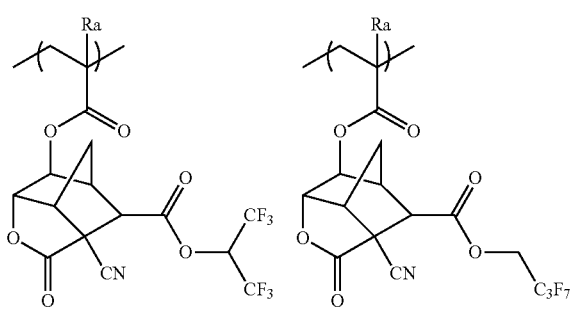
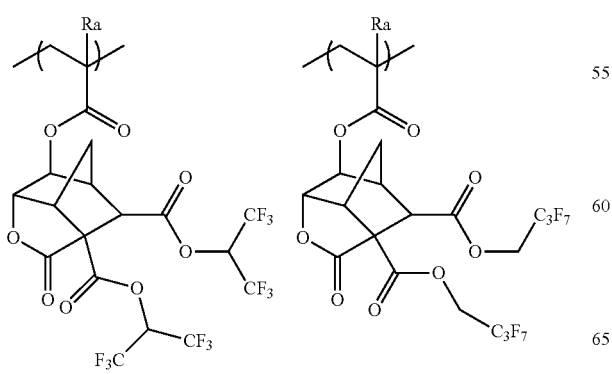
274
-continued
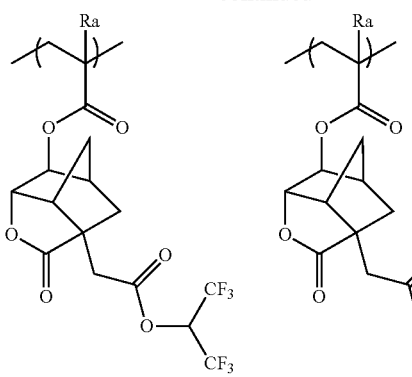
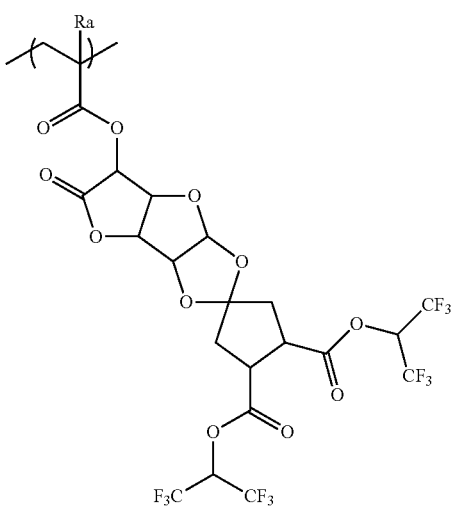
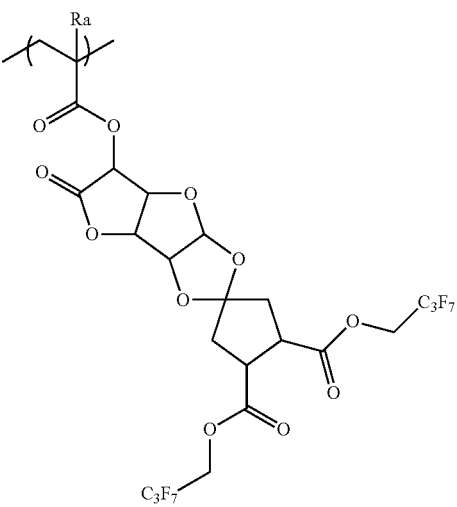

275
-continued
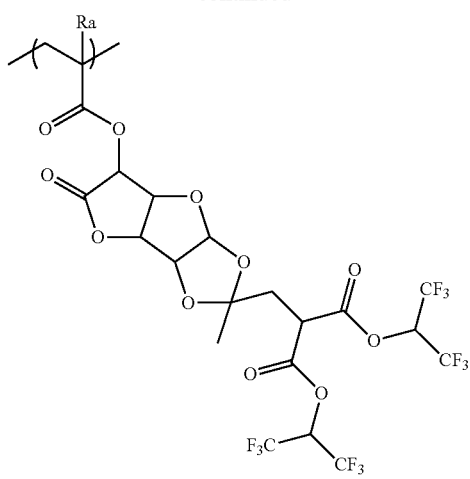
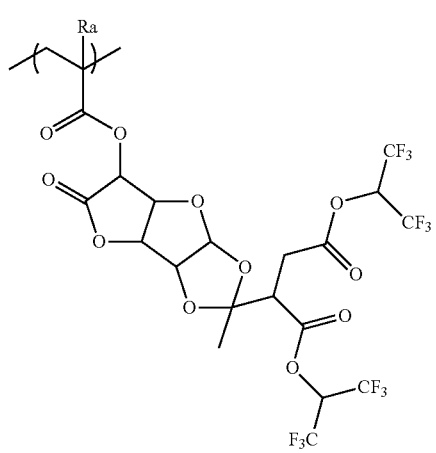
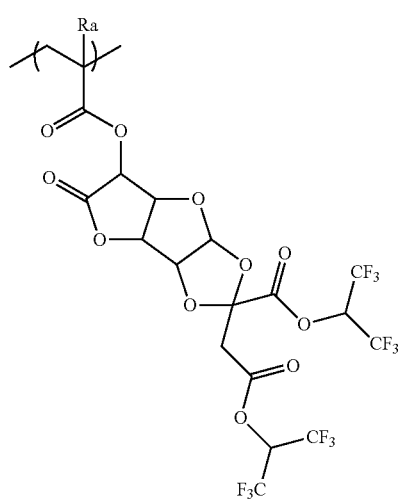
276
-continued
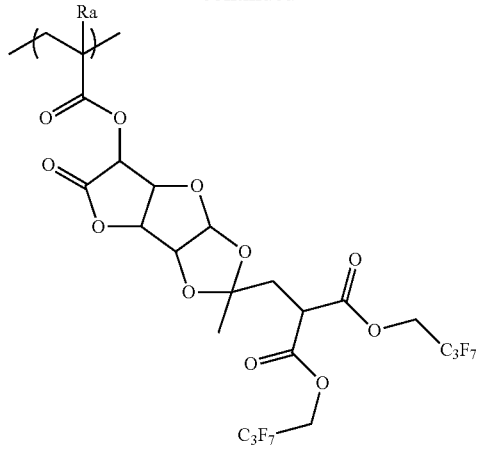
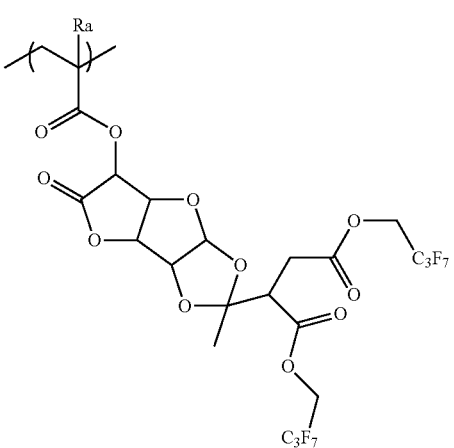
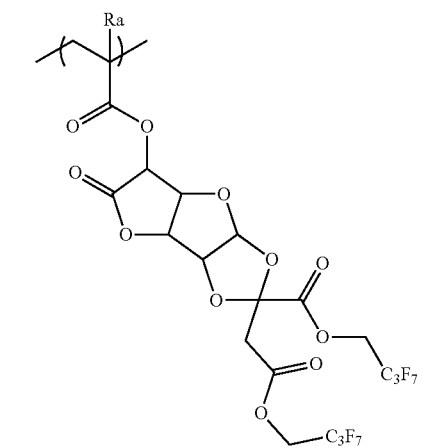
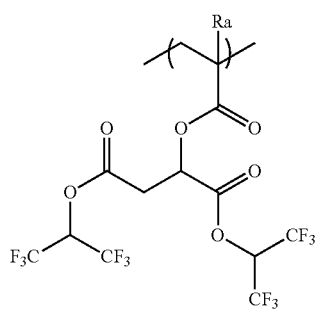

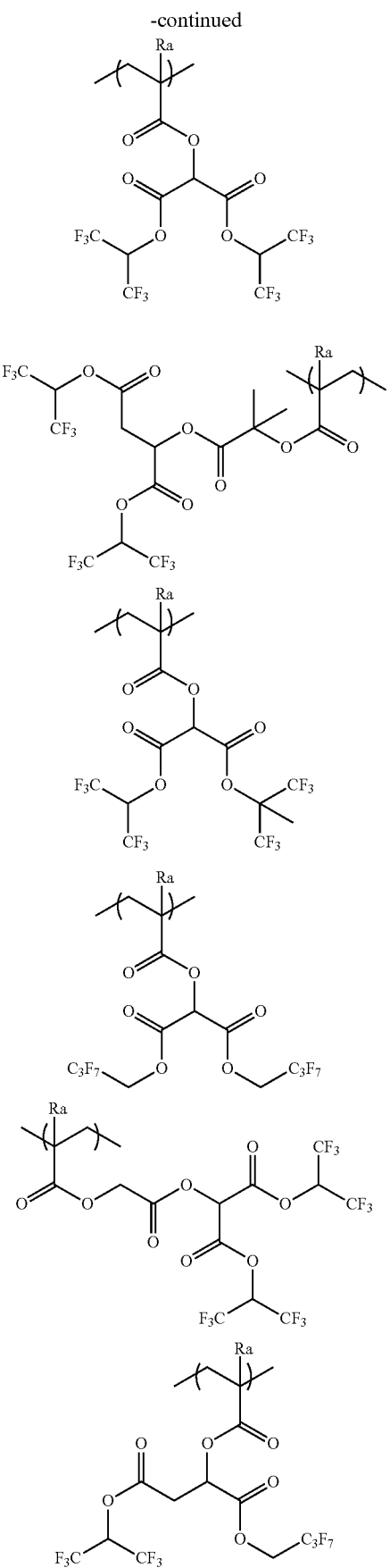

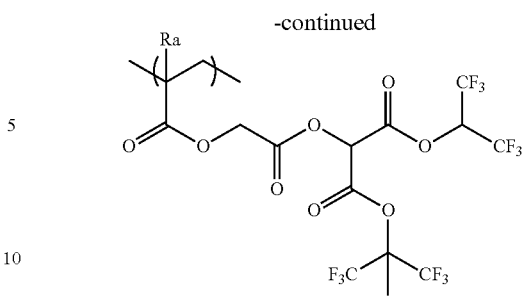

The repeating units each containing a group decomposed by the action of an acid (z) are the same as the repeating units each containing an acid-decomposable group set forth above in connection with the resin (P). The content of repeating unit containing a group decomposed by the action of an acid (z) in the compound (U), based on all the repeating units of the polymer, is preferably in the range of 1 to 80 mol %, more preferably 10 to 80 mol % and further more preferably 20 to 60 mol %.

The standard-polystyrene-equivalent weight average molecular weight of the compound (U') is preferably in the range of 1000 to 100,000, more preferably 1000 to 50,000 and further more preferably 2000 to 15,000.

Impurities, such as metals, should naturally be of low quantity in the compound (U'), as in the resin (P) above. The content of residual monomers and oligomer components is preferably 0 to 10 mass %, more preferably 0 to 5 mass % and further more preferably 0 to 1 mass %. If so, there can be obtained a resist being free from a change of in-liquid foreign matter, sensitivity, etc., over time. From the viewpoint of resolution, resist profile, side wall of resist pattern, roughness, etc., the molecular weight distribution (Mw/Mn, also referred to as dispersity) thereof is preferably in the range of 1 to 5, more preferably 1 to 3 and further more preferably 1 to 2.

A variety of commercially available products can be used as the compounds (U'). Alternatively, the compounds can be synthesized in accordance with routine methods (for example, radical polymerization). As general synthesizing methods, there can be mentioned, for example, a batch polymerization method in which a monomer species and an initiator are dissolved in a solvent and heated to thereby carry out polymerization, a dropping polymerization method in which a solution of monomer species and initiator is dropped into a heated solvent over a period of 1 to 10 hours, and the like. The dropping polymerization method is preferred. As a reaction solvent, there can be mentioned, for example, an ether such as tetrahydrofuran, 1,4-dioxane or diisopropyl ether, a ketone such as methyl ethyl ketone or methyl isobutyl ketone, an ester solvent such as ethyl acetate, an amide solvent such as dimethylformamide or dimethylacetamide, or the solvent capable of dissolving the composition of the present invention, such as propylene glycol monomethyl ether acetate, propylene glycol monomethyl ether or cyclohexanone, to be described hereinafter. Preferably, the polymerization is carried out with the use of the same solvent as that used in the positive resist composition of the present invention. This would inhibit any particle generation during storage.

The polymerization reaction is preferably carried out in an atmosphere consisting of an inert gas, such as nitrogen or argon. In the initiation of polymerization, a commercially available radical initiator (azo initiator, peroxide, etc.) is used as a polymerization initiator. Among the radical initiators, an azo initiator is preferred, and azo initiators having an ester group, a cyano group and a carboxyl group are especially preferred. As specific preferred initiators, there can be mentioned azobisisobutyronitrile, azobisdimethylvaleronitrile, dimethyl 2,2'-azobis(2-methylpropionate) and the like. The reaction concentration is in the range of 5 to 50 mass %, preferably 30 to 50 mass %. The reaction temperature is generally in the range of 10 to 150° C., preferably 30 to 120° C. and more preferably 60 to 100° C.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc., and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. The solvent is preferably one containing at least an alcohol (especially methanol or the like) or water.

The amount of precipitation or re-precipitation solvent used can be appropriately selected taking efficiency, yield, etc. into account. The amount is generally in the range of 100 to 10,000 parts by mass, preferably 200 to 2000 parts by mass and more preferably 300 to 1000 parts by mass per 100 parts by mass of polymer solution.

The temperature at which the precipitation or re-precipitation is carried out can be appropriately selected taking efficiency and operation easiness into account. The temperature is generally in the range of about 0 to 50° C., preferably about room temperature (for example, about 20 to 35° C.). The operation of precipitation or re-precipitation can be carried out by a routine method, such as a batch or continuous method, with the use of a common mixing container, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30 to 100° C., preferably about 30 to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution A (step c), thereafter bringing resin solution A into contact with a solvent wherein the resin is poorly soluble or insoluble amounting to less than 10 times (preferably 5 times or less) the volume of resin solution A to thereby precipitate a resin solid (step d) and separating the precipitated resin (step e).

Examples of the preferred resins as the compound (U') are shown below, which in no way limit the scope of the present invention.

(F, Si series)

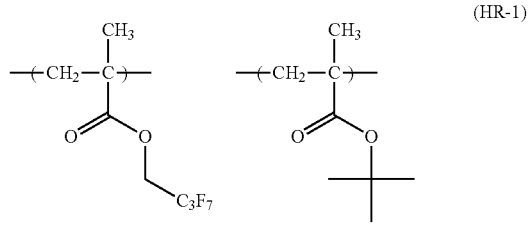

(HR-1)

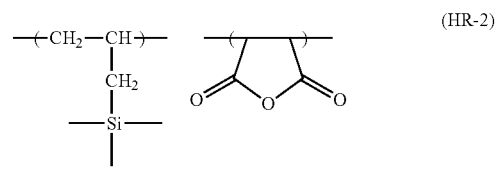

(HR-2)

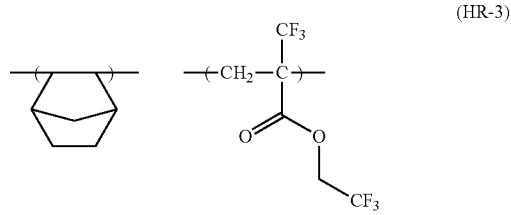

(HR-3)

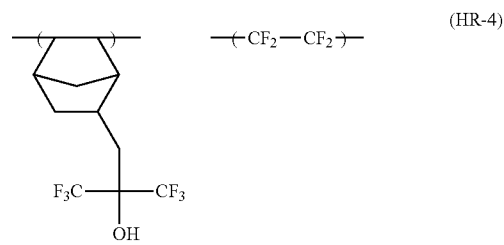

(HR-4)

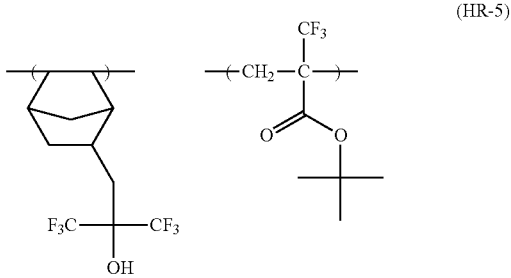

(HR-5)

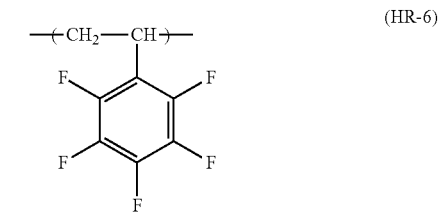

(HR-6)

-continued
(HR-7)
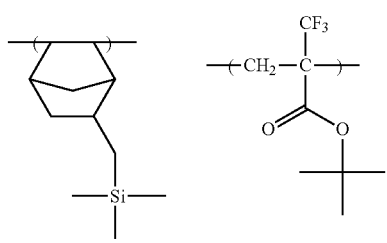
(HR-8)
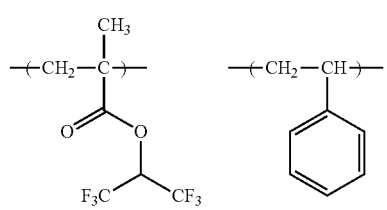
(HR-9)
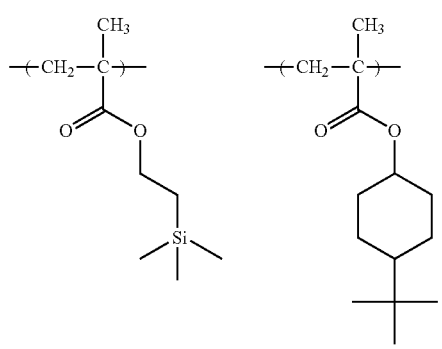
(HR-10)
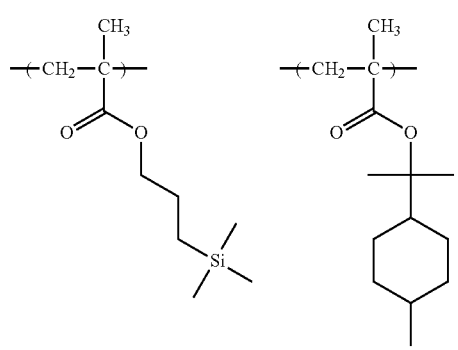
(HR-11)
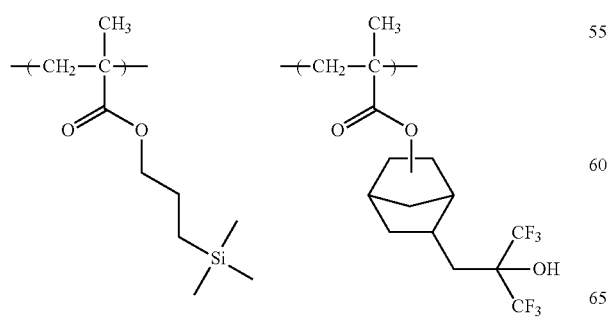
-continued
(HR-12)
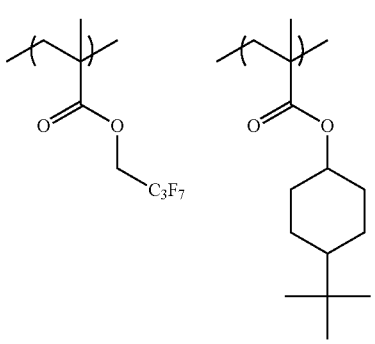
(HR-13)
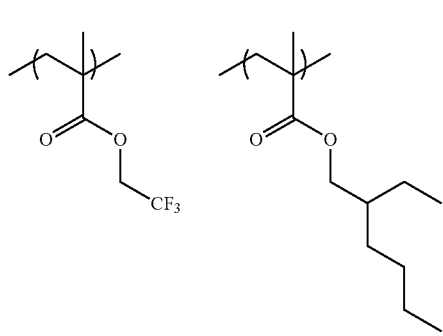
(HR-14)
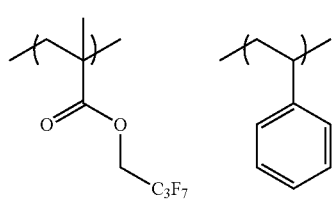
(HR-15)
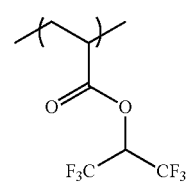
(HR-16)
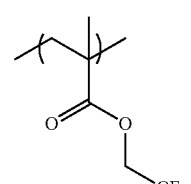
(HR-17)
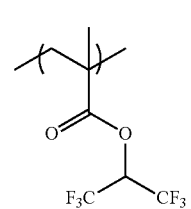

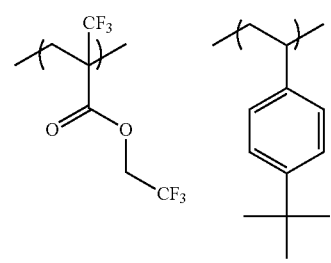
(HR-18)
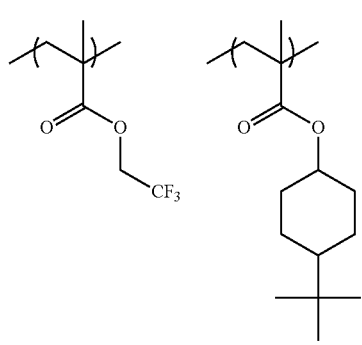
(HR-19)
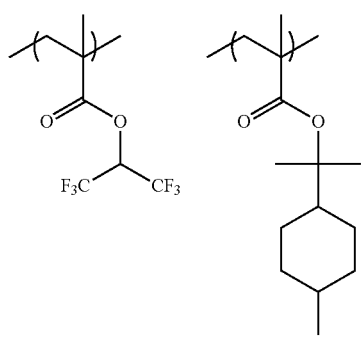
(HR-20)
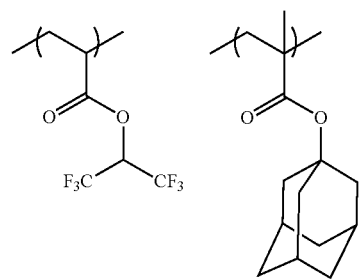
(HR-21)
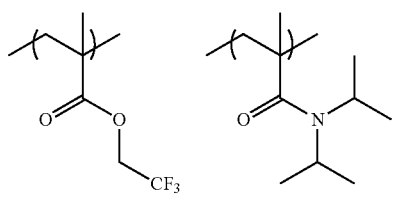
(HR-22)
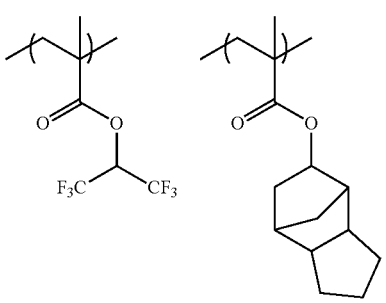
(HR-23)
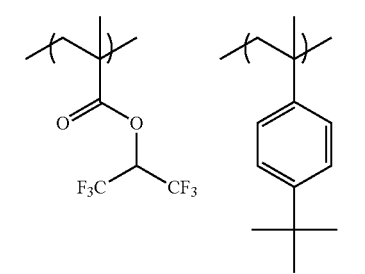
(HR-24)
(HR-25)
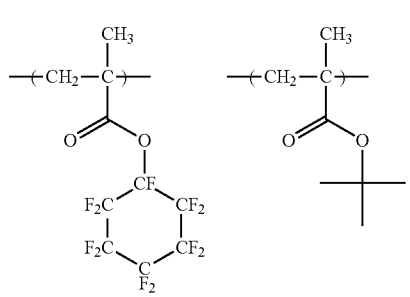
(HR-26)
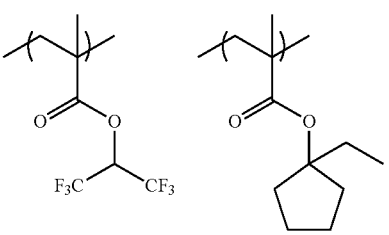
(HR-27)
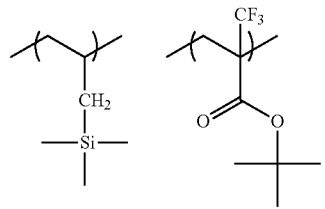
(HR-28)

-continued
(HR-29)
(HR-30)
(HR-31)
(HR-32)
(HR-33)
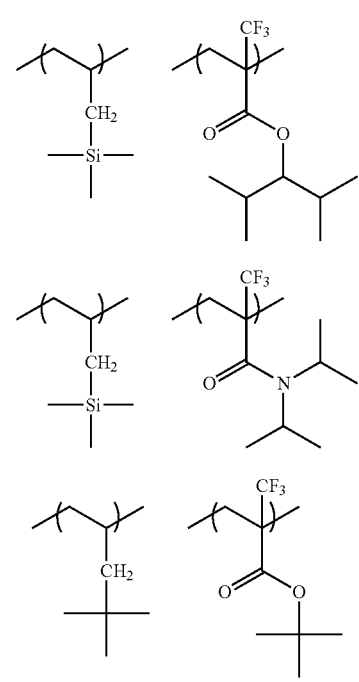
(HR-34)
(HR-35)
(HR-36)
(HR-37)
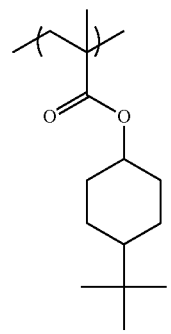
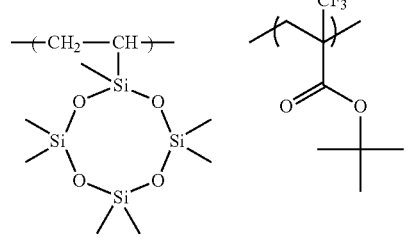
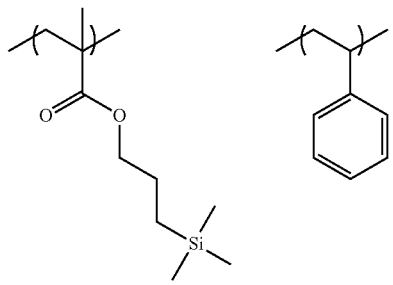
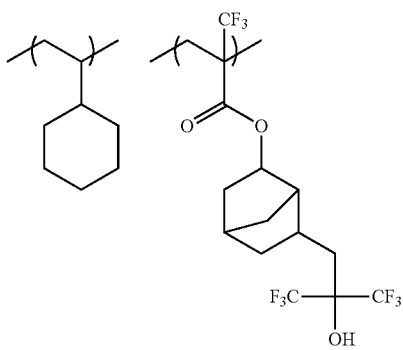
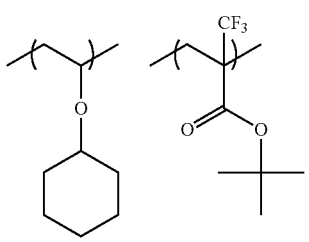

(HR-38)
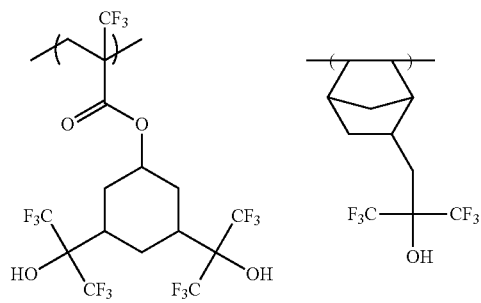
(HR-39)
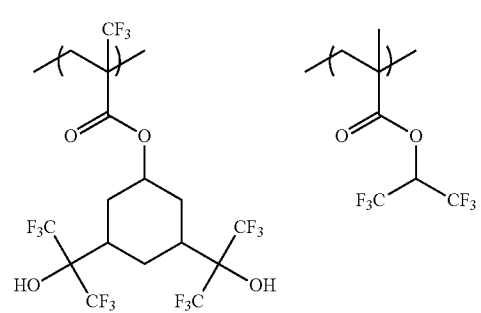
(HR-40)
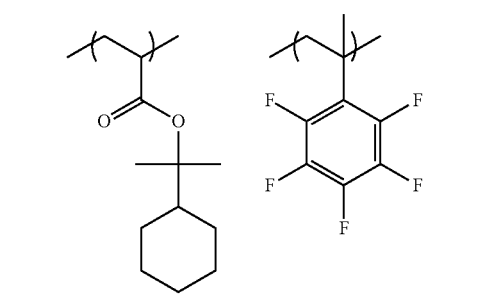
(HR-41)
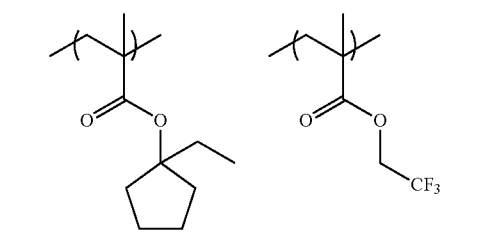
(HR-42)
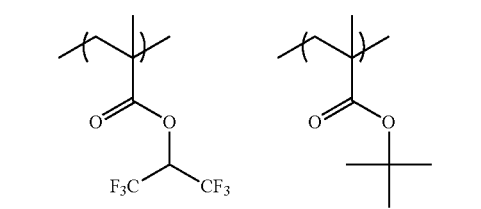
(HR-43)
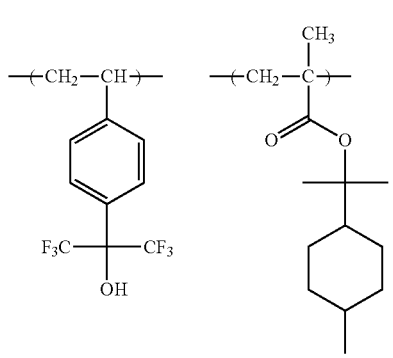
(HR-44)
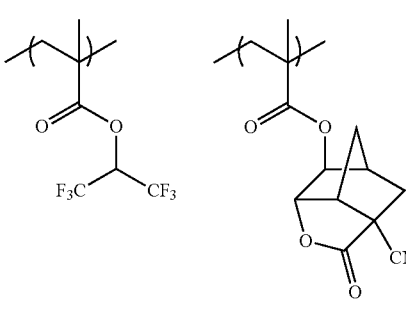
(HR-45)
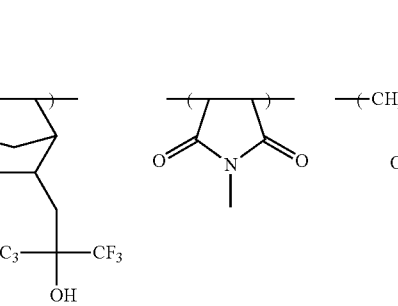
(HR-46)
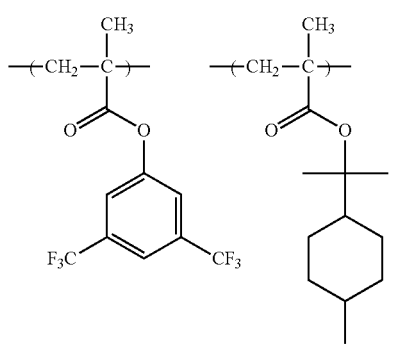
(HR-47)
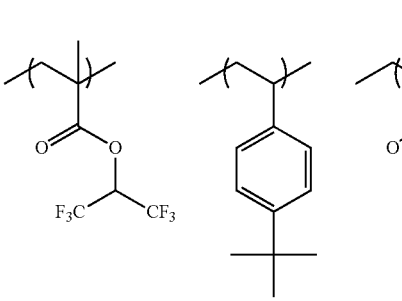

(HR-48)
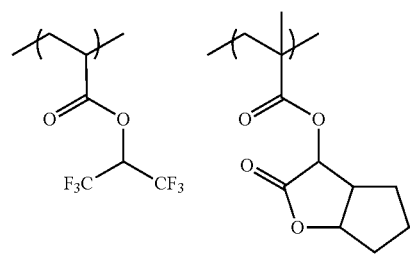
(HR-49)
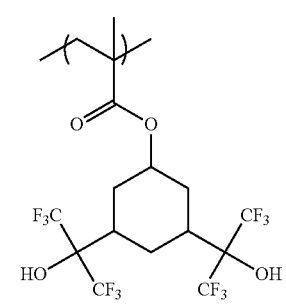
(HR-50)
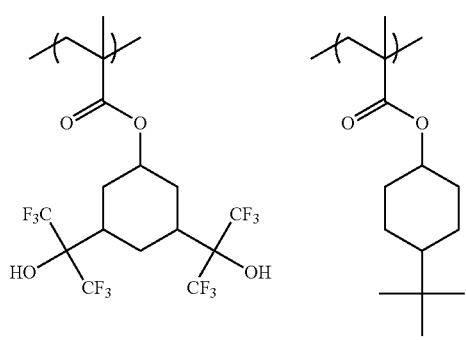
(HR-51)
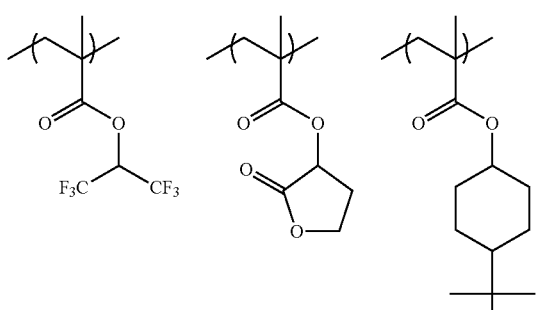
(HR-52)
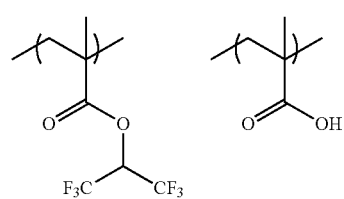
(HR-53)
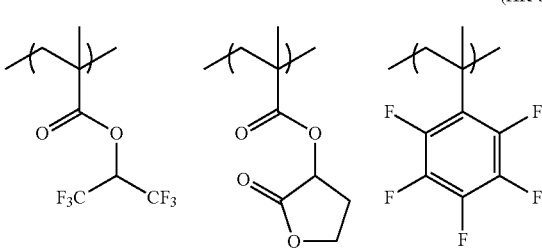
(HR-54)
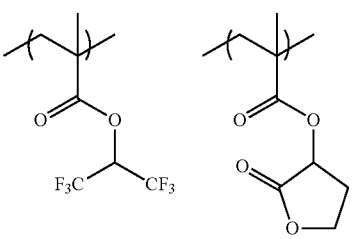
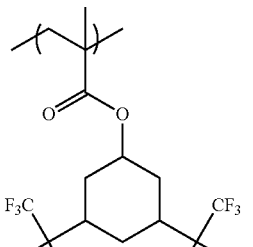
(HR-55)
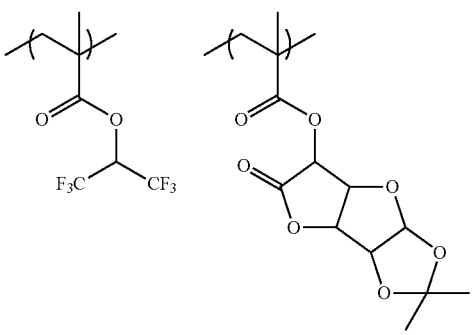
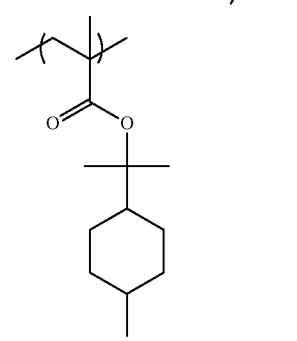
(HR-56)
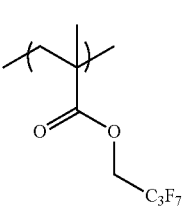

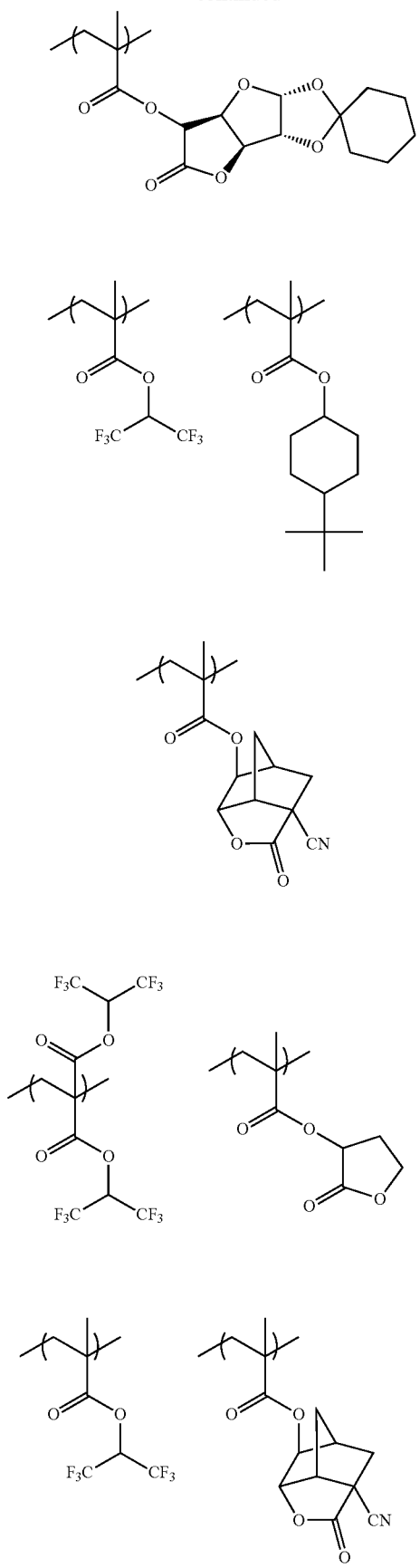
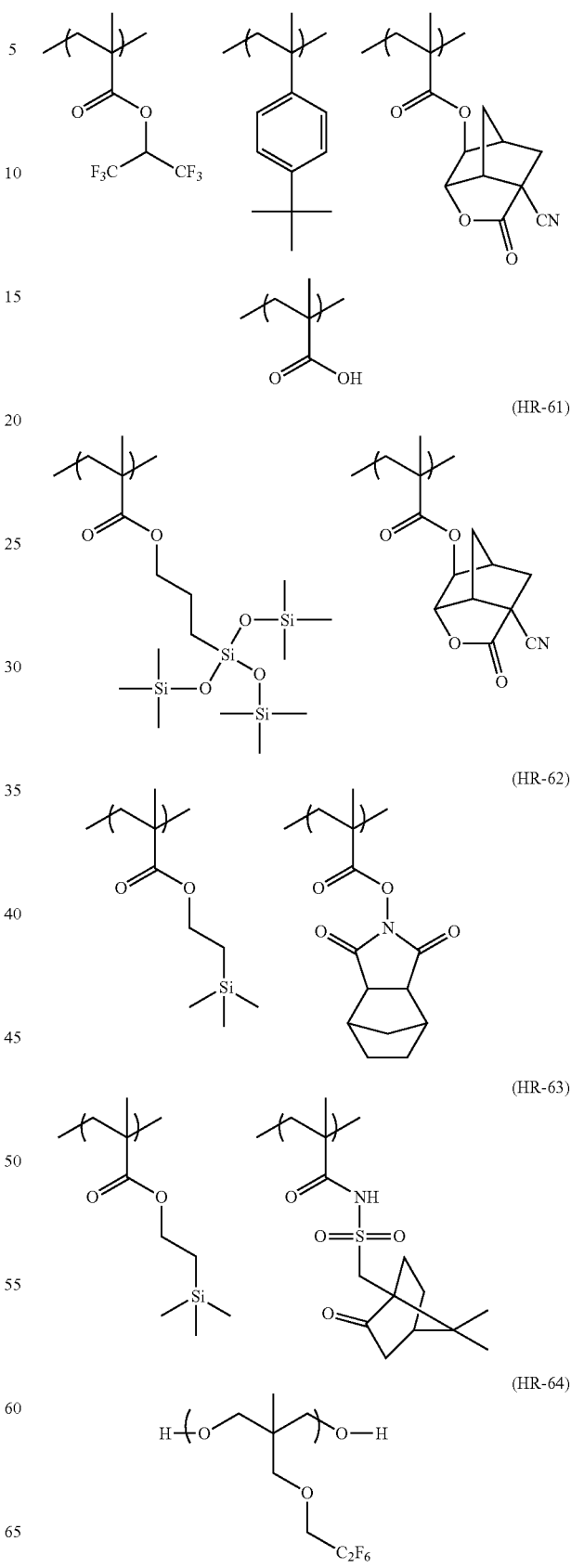

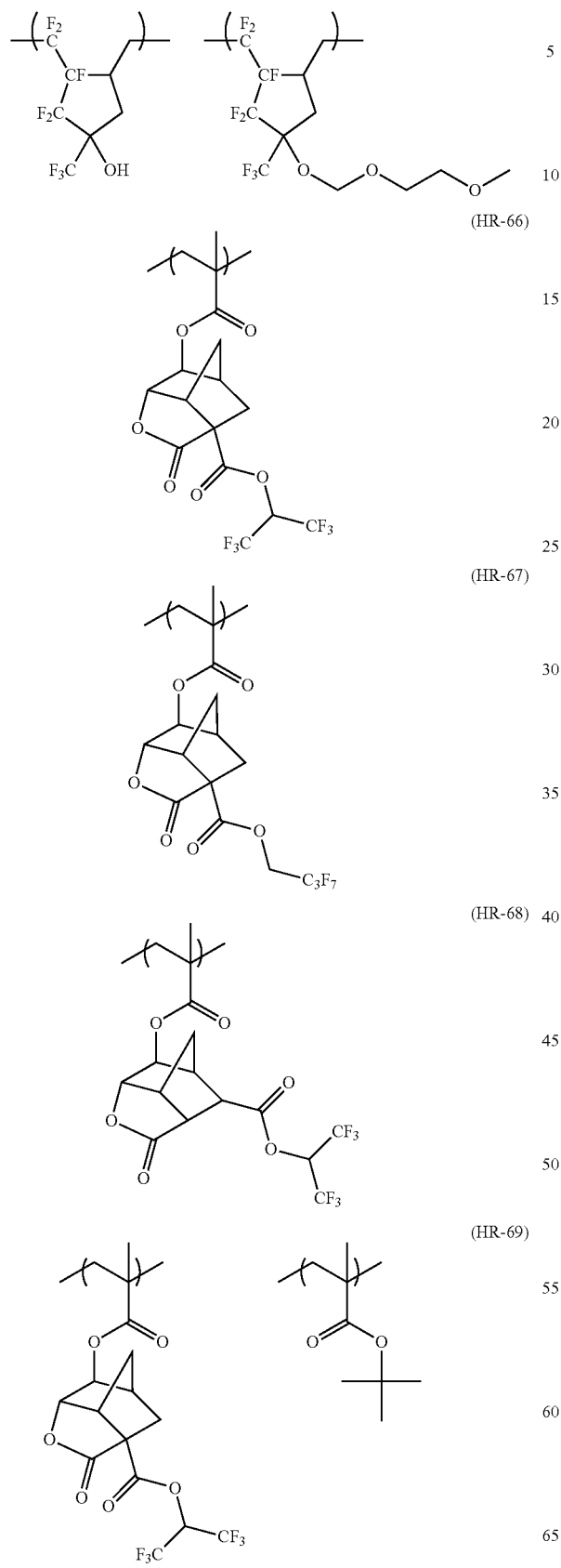
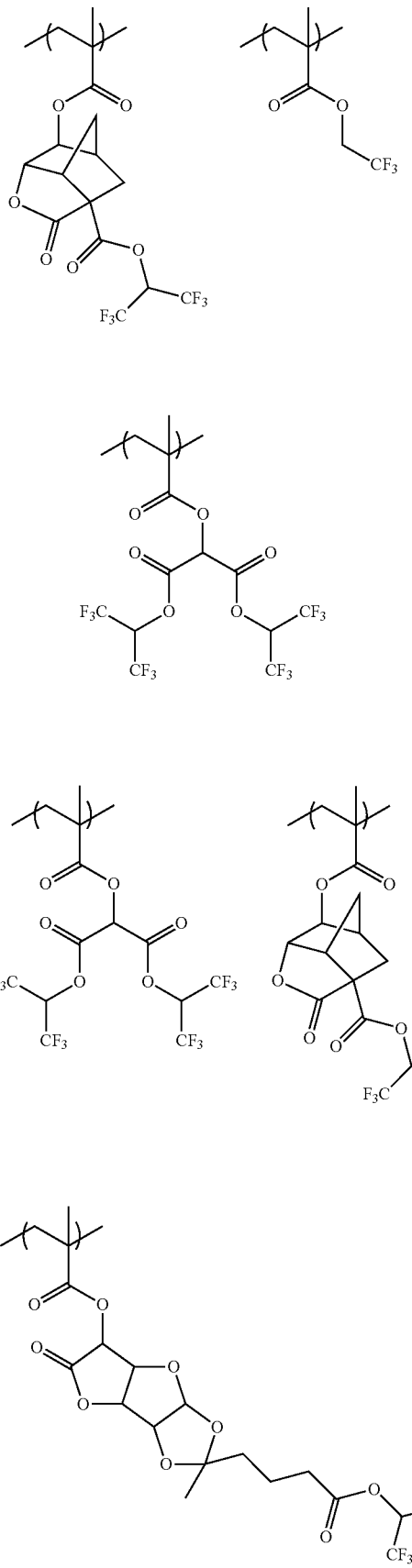

-continued
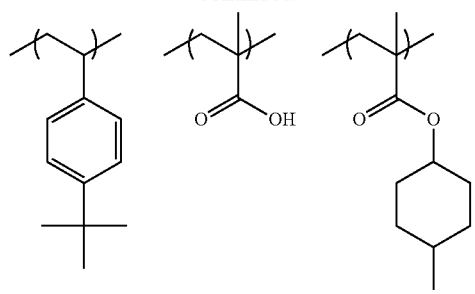
(HR-74)
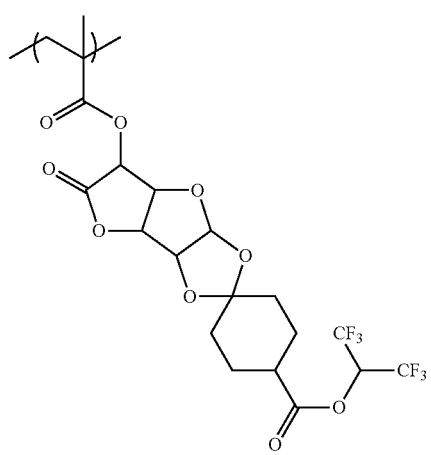
(HR-75)
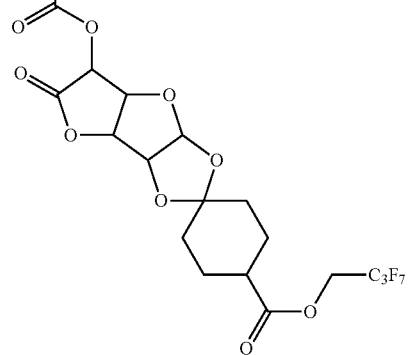
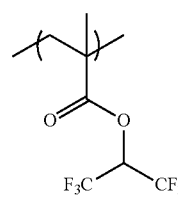
-continued
(HR-76)
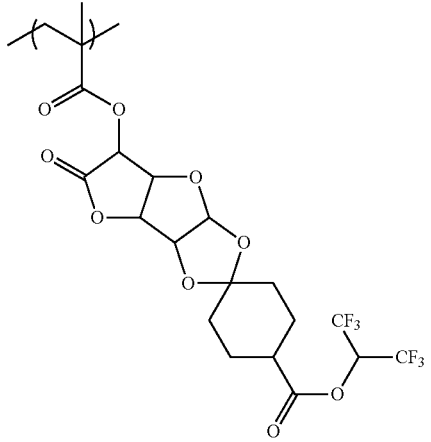
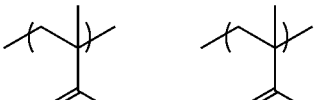
(HR-77)
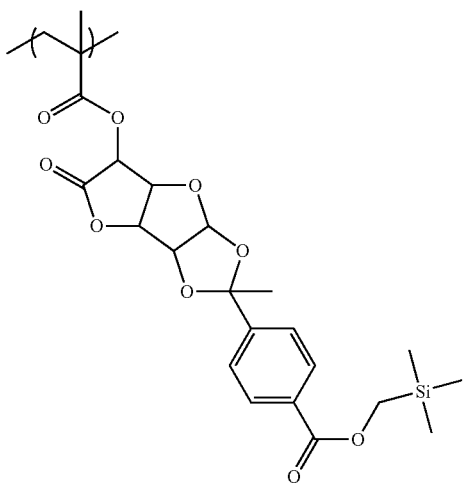

297
-continued
(HR-78)
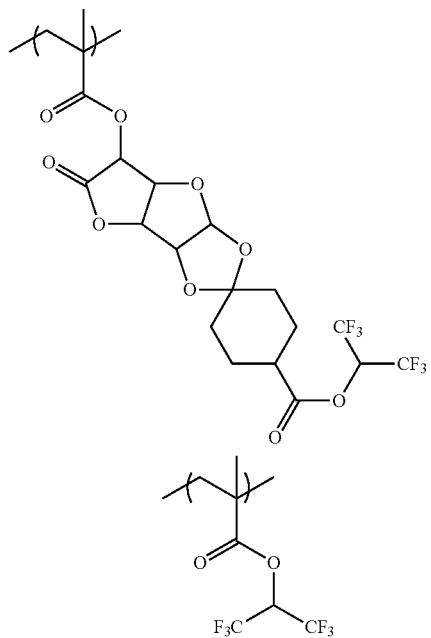
(HR-79)
(HR-80)
298
-continued
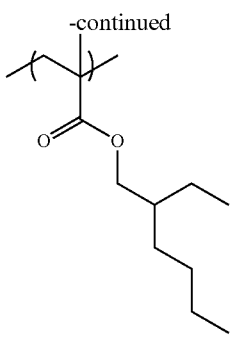
(HR-81)
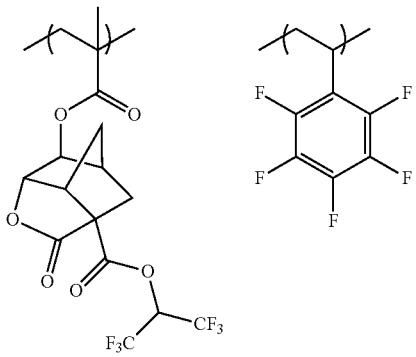
(HR-82)
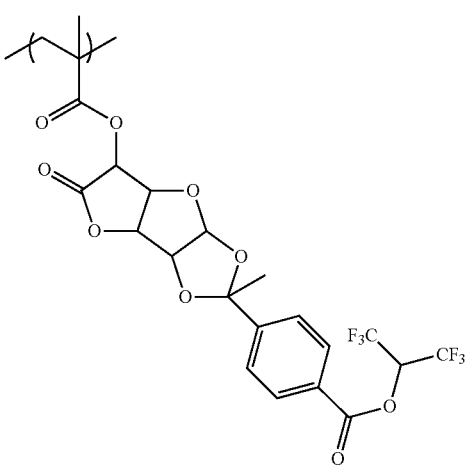

299
-continued
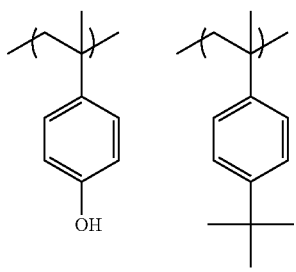
(HR-83)
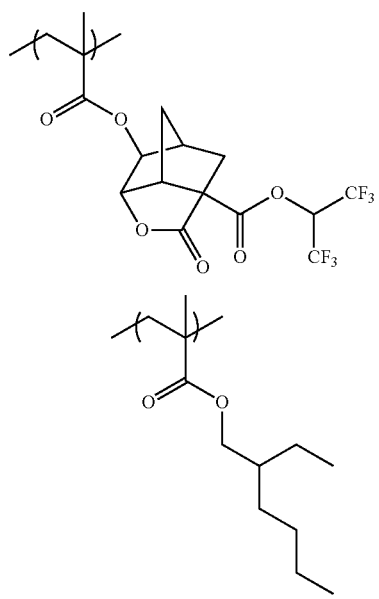
(HR-84)
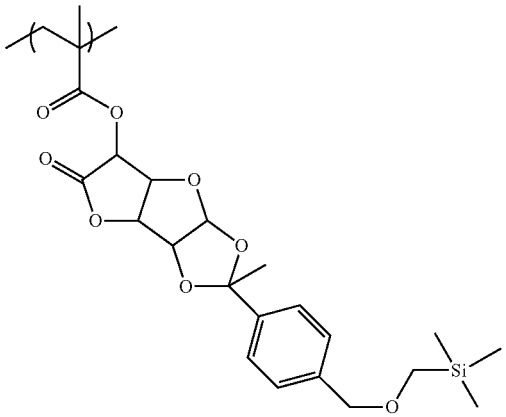
(HR-85)
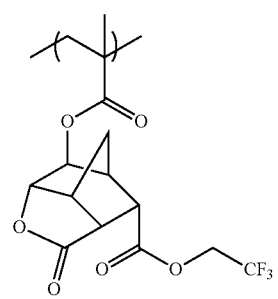
300
-continued
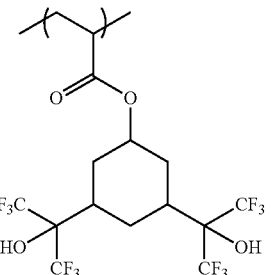
(HR-86)
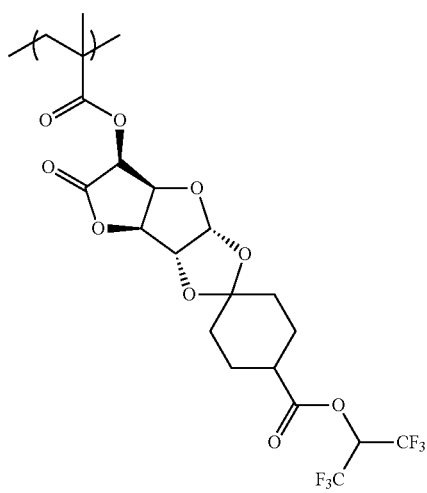
(HR-87)
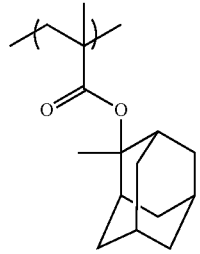
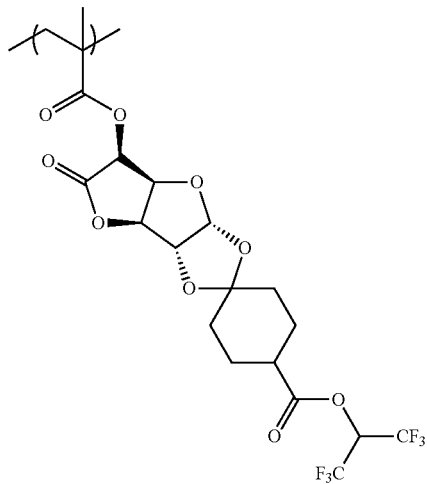

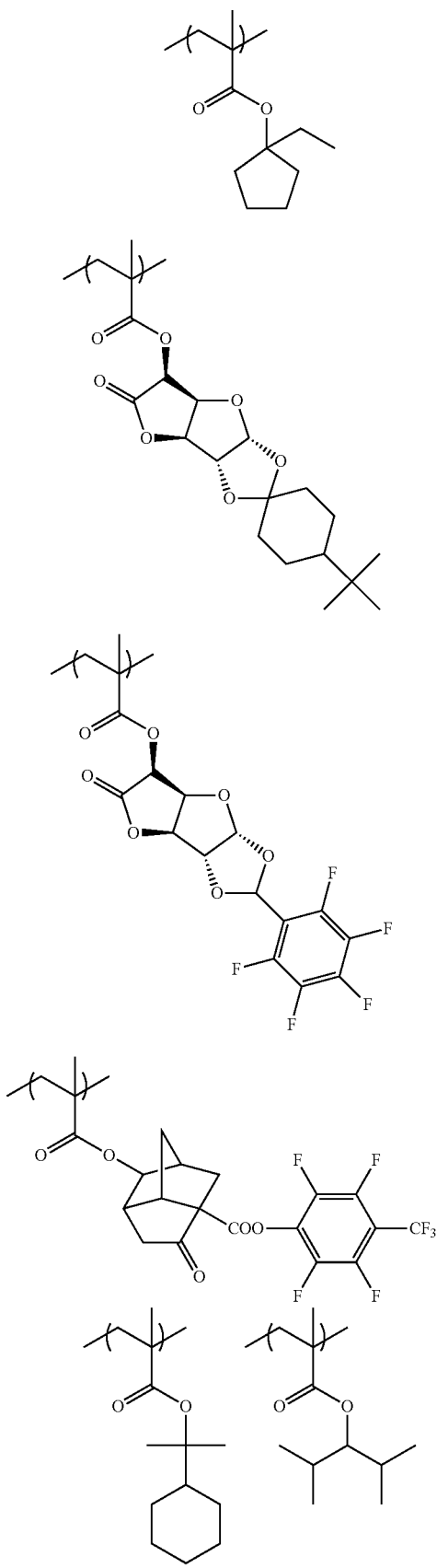
(HR-88)
(HR-89)
(HR-90)
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |

TABLE 1-continued
| Resin | Composition | Mw | Mw/Mn |
|---|---|---|---|
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |
(Hydrocarbon Series)
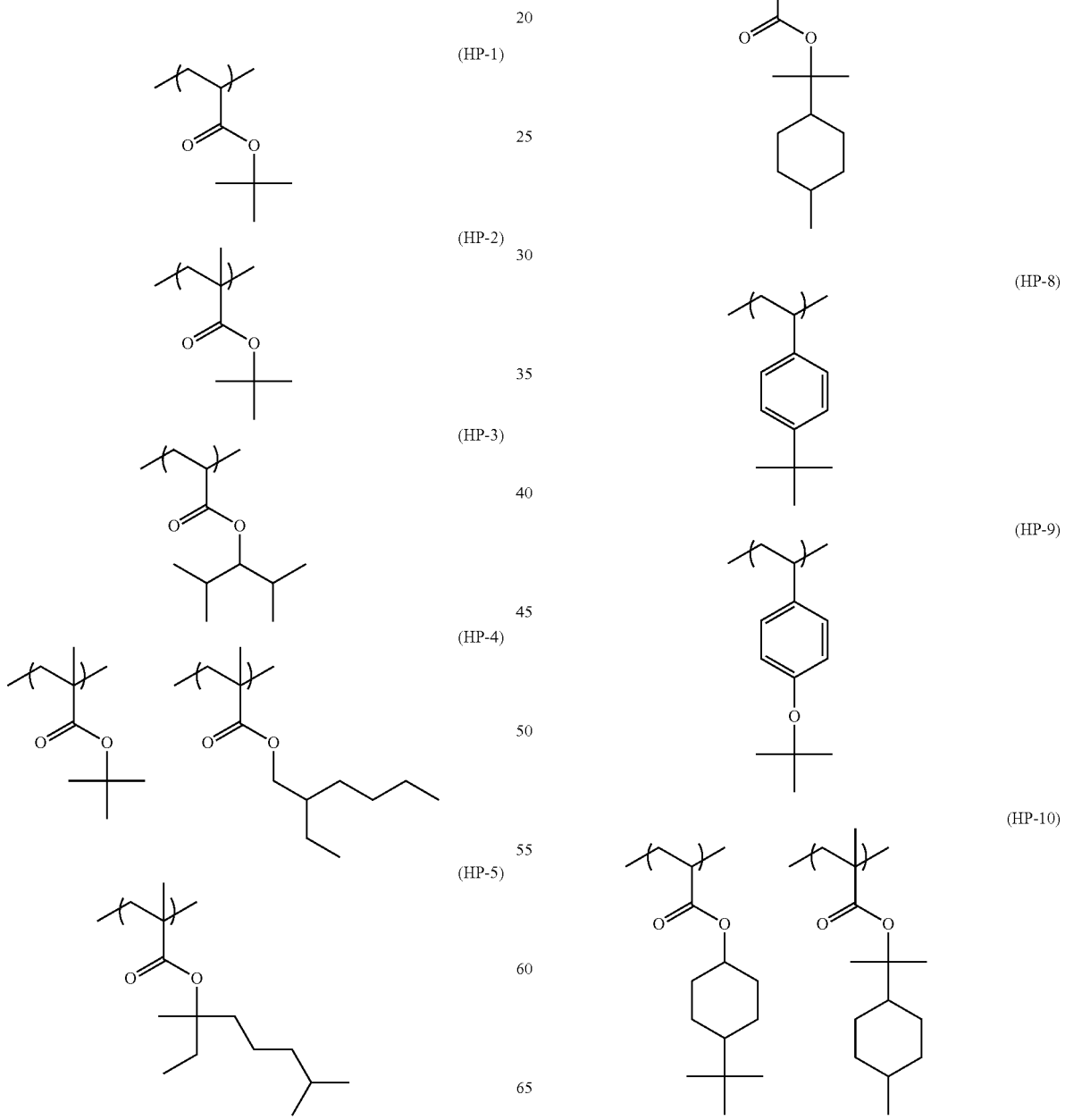

(HP-11) 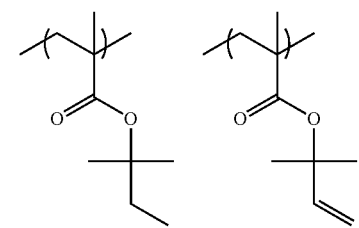
(HP-12) 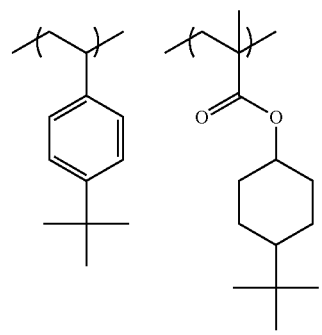
(HP-13) 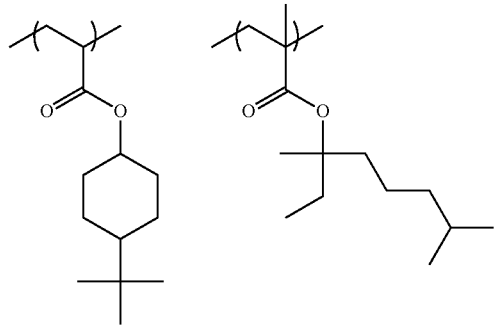
(HP-14) 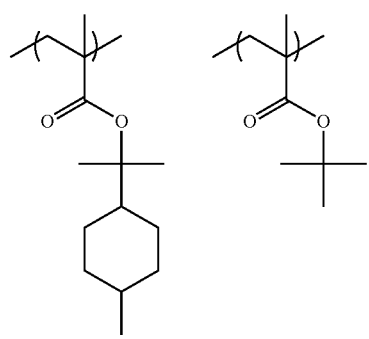
(HP-15) 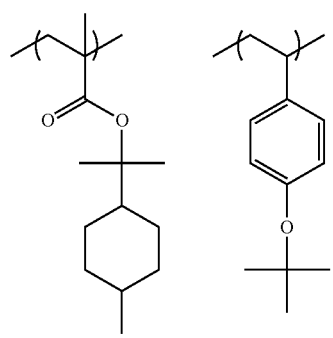
(HP-16) 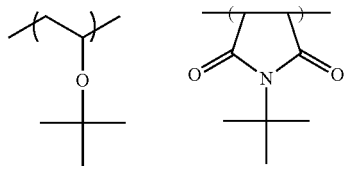
(HP-17) 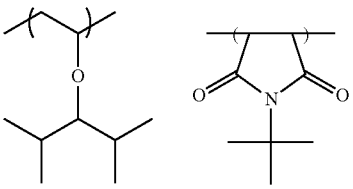
(HP-18)
(HP-19)
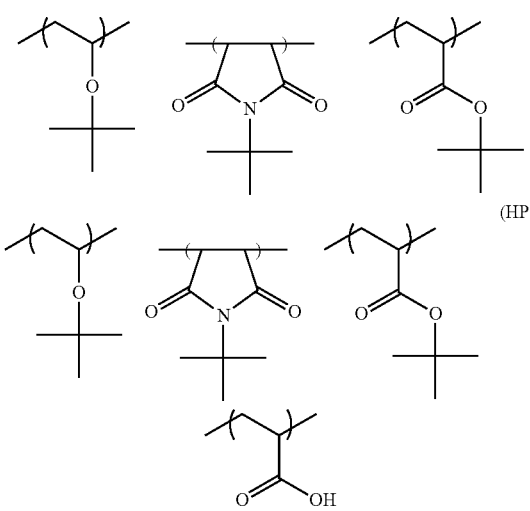
(HP-20)
(HP-21)
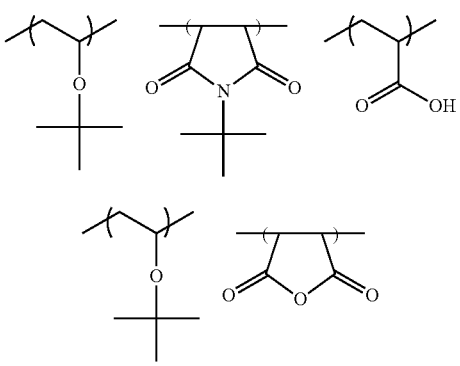
(HP-22)
(HP-23)
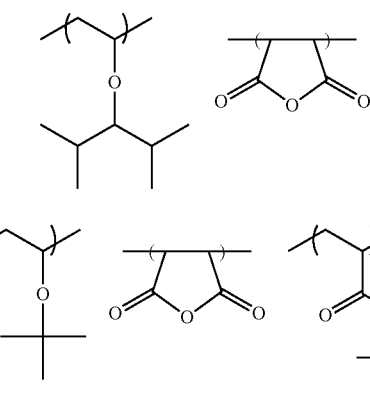

(HP-24)
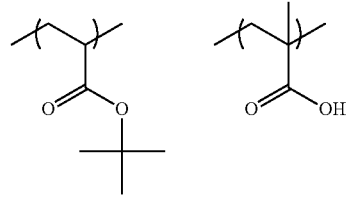
(HP-25)
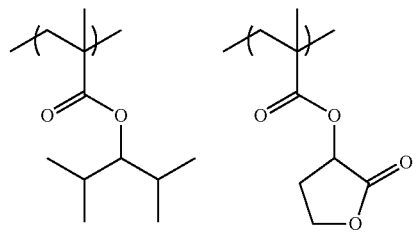
(HP-26)
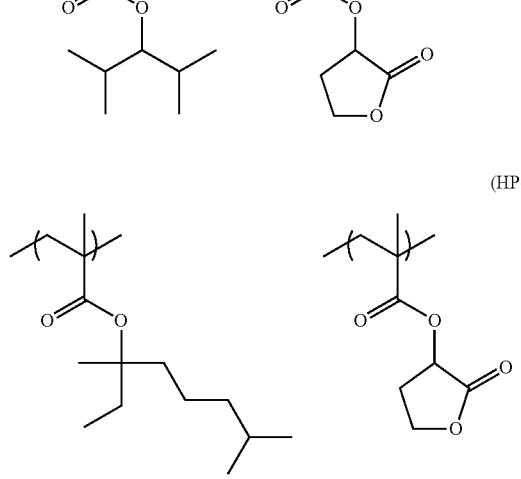
(HP-27)
(HP-28)
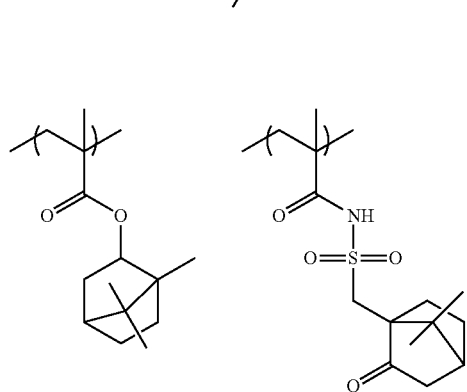
(HP-29)
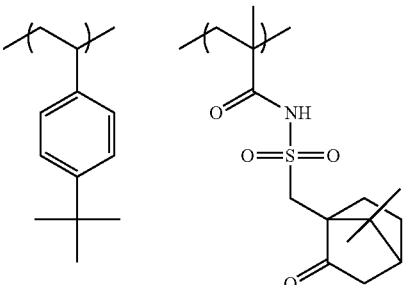
(HP-30)
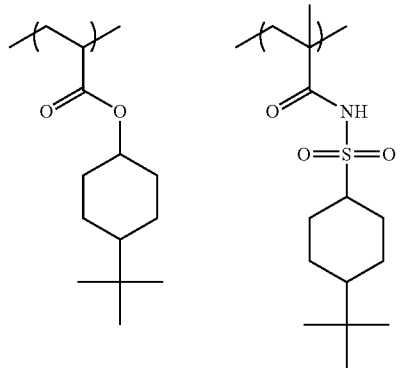
(HP-31)
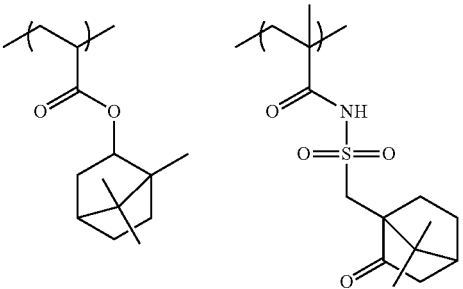
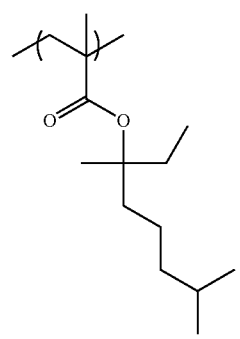
(HP-32)
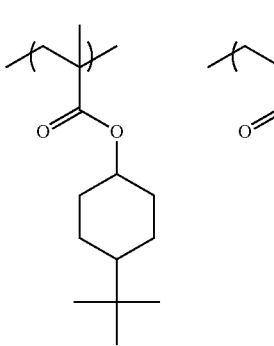

-continued

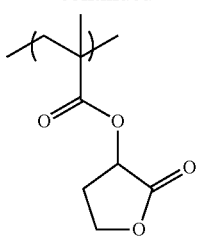

TABLE 2

| Resin | Composition | Mw | Mw/Mn |
| --- | --- | --- | --- |
| HP-1 | 100 | 12000 | 2.0 |
| HP-2 | 100 | 8000 | 2.0 |
| HP-3 | 100 | 10000 | 1.9 |
| HP-4 | 60/40 | 10000 | 2.3 |
| HP-5 | 100 | 18000 | 2.0 |
| HP-6 | 100 | 10000 | 1.8 |
| HP-7 | 100 | 7200 | 1.8 |
| HP-8 | 100 | 4800 | 1.6 |
| HP-9 | 100 | 8000 | 1.2 |
| HP-10 | 50/50 | 7800 | 2.5 |
| HP-11 | 80/20 | 7000 | 2.2 |
| HP-12 | 20/80 | 5000 | 2.3 |
| HP-13 | 50/50 | 8200 | 2.2 |
| HP-14 | 70/30 | 8000 | 2.2 |
| HP-15 | 80/20 | 10000 | 2.1 |
| HP-16 | 50/50 | 5600 | 1.3 |
| HP-17 | 50/50 | 4800 | 1.4 |
| HP-18 | 40/40/20 | 5600 | 1.5 |
| HP-19 | 30/30/30/10 | 7200 | 1.6 |
| HP-20 | 45/45/10 | 6100 | 1.4 |
| HP-21 | 50/50 | 6000 | 1.3 |
| HP-22 | 50/50 | 6200 | 1.3 |
| HP-23 | 40/40/20 | 7000 | 1.5 |
| HP-24 | 95/5 | 15000 | 1.8 |
| HP-25 | 90/10 | 9000 | 1.9 |
| HP-26 | 90/10 | 15000 | 2.0 |
| HP-27 | 90/10 | 10000 | 2.2 |
| HP-28 | 40/40/20 | 12000 | 2.0 |
| HP-29 | 90/10 | 8000 | 2.1 |
| HP-30 | 80/20 | 8200 | 2.1 |
| HP-31 | 40/10/50 | 8000 | 2.3 |
| HP-32 | 45/50/5 | 9000 | 2.5 |

Moreover, the compound (U) may be a low-molecular compound with a triphenylene skeleton, for example, one as shown below. This compound can be synthesized in accordance with the method described in *Ekisho Binran* (Liquid Crystal Handbook).

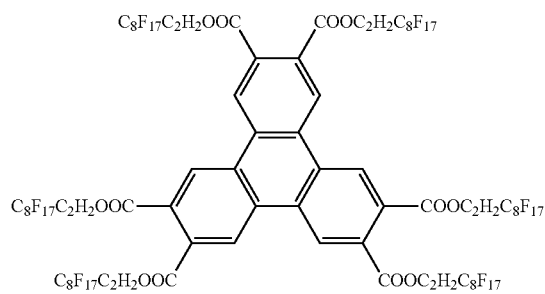

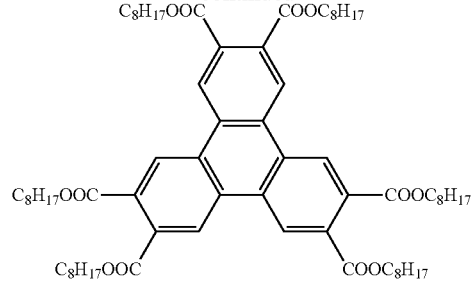

A single type of compound (U) may be used alone, or two or more types thereof are used in a mixture.

The content of compound (U) based on the total solids of the composition of the present invention is preferably in the range of 0.01 to 30 mass %, more preferably 0.1 to 20 mass % and most preferably 1 to 15 mass %.

The actinic-ray- or radiation-sensitive resin composition of the present invention may be further loaded, according to necessity, with a resin that when acted on by an acid, is decomposed to thereby increase its rate of dissolution in an alkali aqueous solution, a compound that when exposed to actinic rays or radiation, generates an acid (low-molecular photoacid generator (conventional type)), a basic compound, a low-molecular compound with a group that when acted on by an acid, is cleaved, a surfactant, a substance that when acted on by an acid, is decomposed to thereby produce an acid stronger than carboxylic acids, etc.

[3] Resin that when Acted on by an Acid, is Decomposed to Thereby Increase its Rate of Dissolution in an Alkali Aqueous Solution The actinic-ray- or radiation-sensitive resin composition of the present invention may contain, besides the resin (P), a resin that when acted on by an acid, is decomposed to thereby increase its rate of dissolution in an alkali aqueous solution.

The resin that when acted on by an acid, is decomposed to thereby increase its rate of dissolution in an alkali aqueous solution (hereinafter also referred to as an "acid-decomposable resin") is a resin provided at its principal chain or side chain or both thereof with a group that is decomposed by the action of an acid to thereby generate an alkali-soluble group (acid-decomposable group). The resin provided at its side chain with an acid-decomposable group is especially preferred.

The acid-decomposable resin can be obtained by either reacting a precursor of acid-decomposable group with an alkali-soluble resin, or copolymerizing an alkali-soluble resin monomer having an acid-decomposable group bonded thereto with any of various monomers, as disclosed in, for example, European Patent No. 254853 and JP-A's H2-25850, H3-223860 and H4-251259.

It is preferred for the acid-decomposable group to be, for example, a group as obtained by, in a resin having an alkali-soluble group such as —COOH or —OH, substituting the hydrogen atom of the alkali soluble group with a group that is cleaved by the action of an acid.

Preferred particular examples of the acid-decomposable groups are the same as set forth above with respect to the resins (P) of the present invention (for example, acid-decomposable groups mentioned above with respect to the repeating unit (B) of the resin (P)).

The resins having alkali-soluble groups are not particularly limited. As such, for example, there can be mentioned poly(o-hydroxystyrene), poly(m-hydroxystyrene), poly(p-hydroxystyrene), copolymers of these, a hydrogenated poly(hydroxystyrene), poly(hydroxystyrene) polymers containing substituents with the structures shown below, a resin containing a phenolic hydroxyl, a styrene-hydroxystyrene copolymer, an α-methylstyrene-hydroxystyrene copolymer, an alkali-soluble resin containing a hydroxystyrene structural unit such as a hydrogenated novolak resin, and an alkali-soluble resin comprising a repeating unit containing a carboxyl group, such as (meth)acrylic acid or norbornene carboxylic acid.

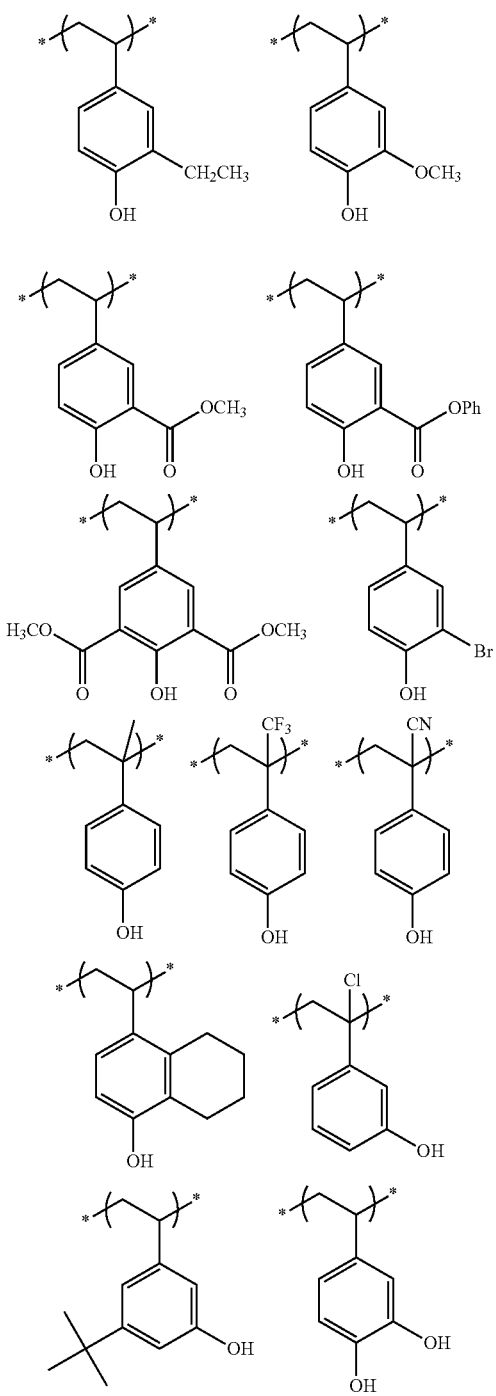

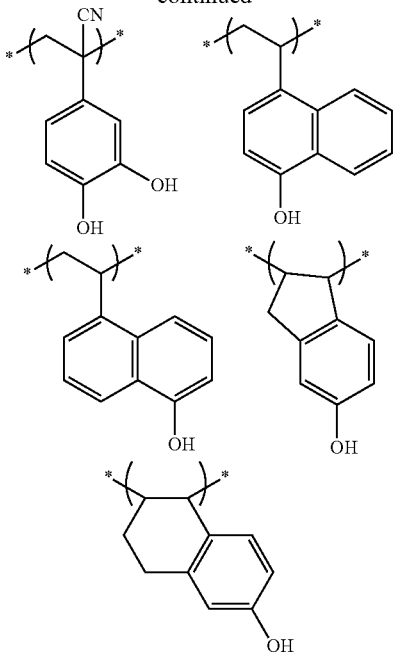

The alkali dissolution rate of these alkali-soluble resins as measured in a 2.38 mass % tetramethylammonium hydroxide (TMAH) solution (23° C.) is preferably 17 nm/sec or greater. The alkali dissolution rate is most preferably 33 nm/sec or greater.

The content of acid-decomposable group can be expressed as the quotient of the formula X/(X+Y) in which X is the number of repeating units containing groups decomposable by an acid in the resin and Y is the number of repeating units containing alkali-soluble groups not protected by any acid-cleavable group in the resin. The content is preferably in the range of 0.01 to 0.7, more preferably 0.05 to 0.50 and further more preferably 0.05 to 0.40.

The preferred ranges of the molecular weights and dispersities of these acid-decomposable resins are the same as those of the resin (P). Two or more types of acid-decomposable resins may be used in combination.

It is optional for the actinic-ray- or radiation-sensitive resin composition of the present invention to contain an acid-decomposable resin except the resin (P). When an acid-decomposable resin is contained, the content of acid-decomposable resin except the resin (P) in the composition is preferably in the range of 0.1 to 70 mass %, more preferably 0.1 to 50 mass % and further more preferably 0.1 to 30 mass % based on the total solids of the composition.

[4] Compound that when Exposed to Actinic Rays or Radiation, Generates an Acid (Low-Molecular Photoacid Generator)

The actinic-ray- or radiation-sensitive resin composition of the present invention essentially contains the resin with a photoacid generating structure (P). Besides the resin (P), a low-molecular compound that when exposed to actinic rays or radiation, generates an acid (hereinafter also referred to as an "acid generator" or "photoacid generator") may be contained in the composition.

The molecular weight of this low-molecular acid generator is preferably 3000 or less, more preferably 2000 or less. The lower limit value of molecular weight of the low-molecular acid generator is generally 2000.

As such an acid generator, use can be made of a member appropriately selected from among a photoinitiator for photocationic polymerization, a photoinitiator for photoradical polymerization, a photo-achromatic agent and photo-discoloring agent for dyes, any of generally known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate. As particular examples of these, there can be mentioned, for example, those set forth in Sections [0164] to [0248] of US Patent Application Publication No. 2008/0241737 A1.

When an acid generator, besides the resin with a photoacid generating structure (P), is used in the actinic-ray- or radiation-sensitive resin composition of the present invention, a single type of acid generator can be used alone, or two or more types of acid generators can be used in combination. The content of acid generator(s) in the composition, based on the total solids of the composition of the present invention, is preferably in the range of 0 to 20 mass %, more preferably 0 to 10 mass % and further more preferably 0 to 7 mass %. Although these acid generators are not essential components in the present invention, they are generally used in an amount of 0.01 mass % or more in order to attain the effect of the addition thereof.

[5] Basic Compound

The actinic-ray- or radiation-sensitive resin composition of the present invention preferably contains a basic compound.

The basic compound is preferably a nitrogenous organic basic compound. Useful basic compounds are not particularly limited. However, for example, the compounds of categories (1) to (4) below are preferably used.

(1) Compounds of General Formula (BS-1) Below

(BS-1)

In general formula (BS-1), each of Rs independently represents any of a hydrogen atom, an alkyl group (linear or branched), a monovalent aliphatic hydrocarbon ring group (monocyclic or polycyclic), an aryl group and an aralkyl group, provided that in no event all the three Rs are hydrogen atoms.

The number of carbon atoms of the alkyl group represented by R is not particularly limited. However, it is generally in the range of 1 to 20, preferably 1 to 12.

The number of carbon atoms of the monovalent aliphatic hydrocarbon ring group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, an aryl group, such as a phenyl group, a naphthyl group and the like, can be mentioned.

The number of carbon atoms of the aralkyl group represented by R is not particularly limited. However, it is generally in the range of 7 to 20, preferably 7 to 11. In particular, an aralkyl group, such as a benzyl group and the like, can be mentioned.

In the alkyl group, monovalent aliphatic hydrocarbon ring group, aryl group and aralkyl group represented by R, a hydrogen atom thereof may be replaced by a substituent. As the substituent, there can be mentioned, for example, an alkyl group, a monovalent aliphatic hydrocarbon ring group, an aryl group, an aralkyl group, a hydroxyl group, a carboxyl group, an alkoxy group, an aryloxy group, an alkylcarbonyloxy group, an alkyloxycarbonyl group or the like.

In the compounds of general formula (BS-1), it is preferred that only one of the three Rs be a hydrogen atom, and also that none of the Rs be a hydrogen atom.

Specific examples of the compounds of General Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline and the like.

Any of the compounds of General Formula (BS-1) in which at least one of the Rs is a hydroxylated alkyl group can be mentioned as a preferred form of compound. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —CH$_2$CH$_2$O—. As particular examples thereof, there can be mentioned tris(methoxyethoxyethyl)amine, compounds shown in column 3 line 60 et seq. of U.S. Pat. No. 6,040,112 and the like.

(2) Compounds with Nitrogenous Heterocyclic Structure

The heterocyclic structure optionally may have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]-undec-7-ene and the like.

(3) Amine Compounds with Phenoxy Group

The amine compounds with a phenoxy group are those having a phenoxy group at the end of the alkyl group of each amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —CH$_2$CH$_2$O— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown in section [0066] of US 2007/0224539 A1 and the like.

(4) Ammonium Salts

Ammonium salts can also be appropriately used. Hydroxides and carboxylates are preferred. Preferred particular examples thereof are tetraalkylammonium hydroxides, such as tetrabutylammonium hydroxide.

(5) Compound Whose Basicity is Increased by the Action of an Acid

A compound whose basicity is increased by the action of an acid can be used as one type of basic compound. As examples thereof, there can be mentioned the compounds with the structure of general formula (A) below. Although these compounds per se exhibit low basicity because of the presence of an electron withdrawing ester bond adjacent to the N atom, it is presumed that a substantial basicity is exhibited because when an acid acts on the compounds, first the moiety of —C(Rb)(Rb)(Rb) is decomposed and subsequently the ester bond moiety is decarbonated with the result that the moiety of the electron withdrawing ester bond is removed.

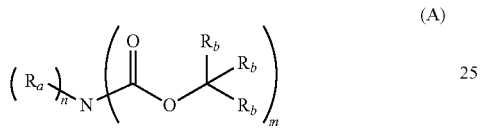

(A)

In general formula (A), Ra represents a hydrogen atom, an alkyl group, a monovalent aliphatic hydrocarbon ring group, an aryl group or an aralkyl group. When n=2, two Ra's may be identical to or different from each other, and two Ra's may be bonded to each other to thereby form a bivalent heterocyclic hydrocarbon group (preferably up to 20 carbon atoms) or a derivative thereof.

Rb, or each of Rb's independently, represents a hydrogen atom, an alkyl group, a monovalent aliphatic hydrocarbon ring group, an aryl group or an aralkyl group, provided that in the moiety —C(Rb)(Rb)(Rb), the three Rb's are in no event simultaneously hydrogen atoms.

At least two Rb's may be bonded to each other to thereby form an alicyclic hydrocarbon group, an aromatic hydrocarbon group, a heterocyclic hydrocarbon group or a derivative thereof.

In the formula, n is an integer of 0 to 2, and m is an integer of 1 to 3, provided that n+m=3.

In general formula (A), each of the alkyl groups, monovalent aliphatic hydrocarbon ring groups, aryl groups and aralkyl groups represented by Ra and Rb may be substituted with a functional group, such as a hydroxyl group, a cyano group, an amino group, a pyrrolidino group, a piperidino group, a morpholino group or an oxo group, as well as an alkoxy group or a halogen atom.

Specific examples of compounds whose basicity is increased by the action of an acid especially preferred in the present invention are shown below, which in no way limit the scope of the present invention.

(D-1)

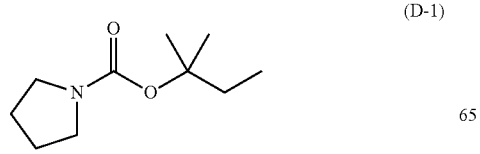

-continued (D-2)

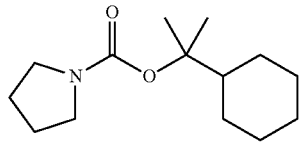

(D-3)

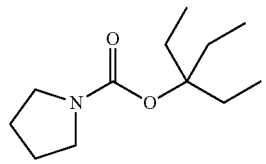

(D-4)

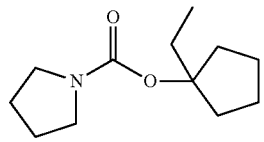

(D-5)

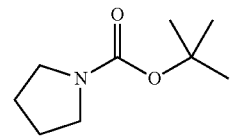

(D-6)

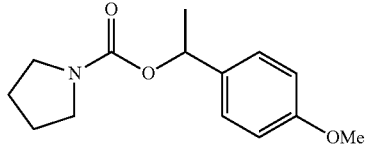

(D-7)

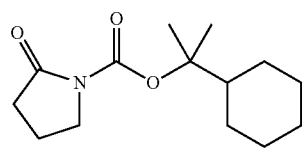

(D-8)

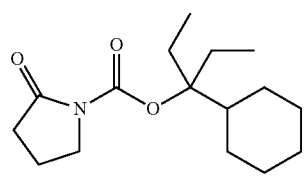

(D-9)

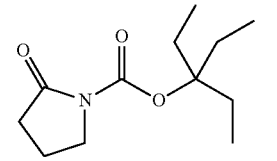

(D-10)

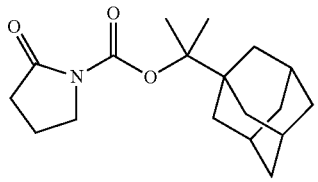

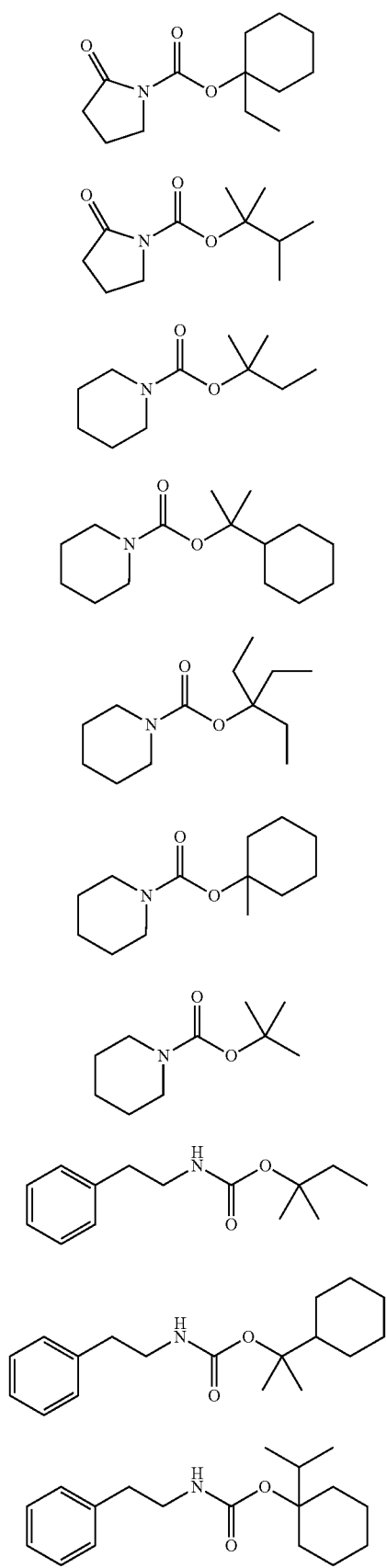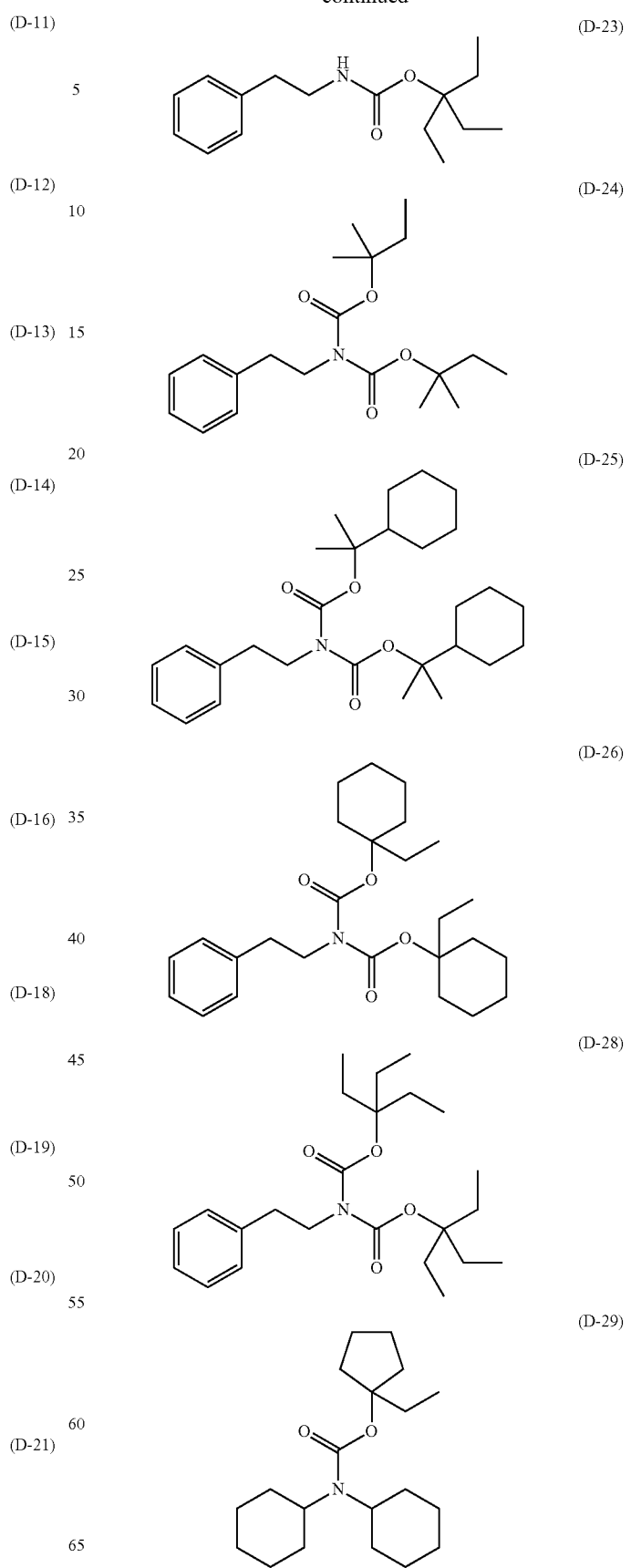

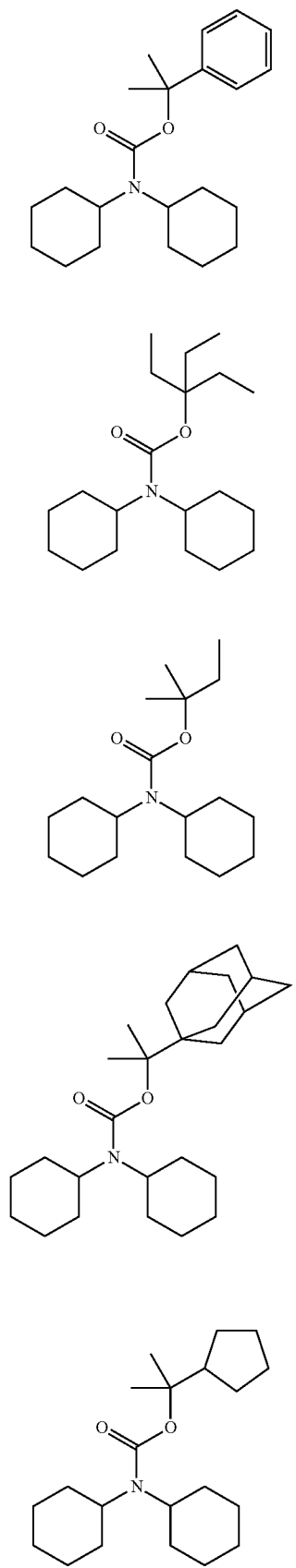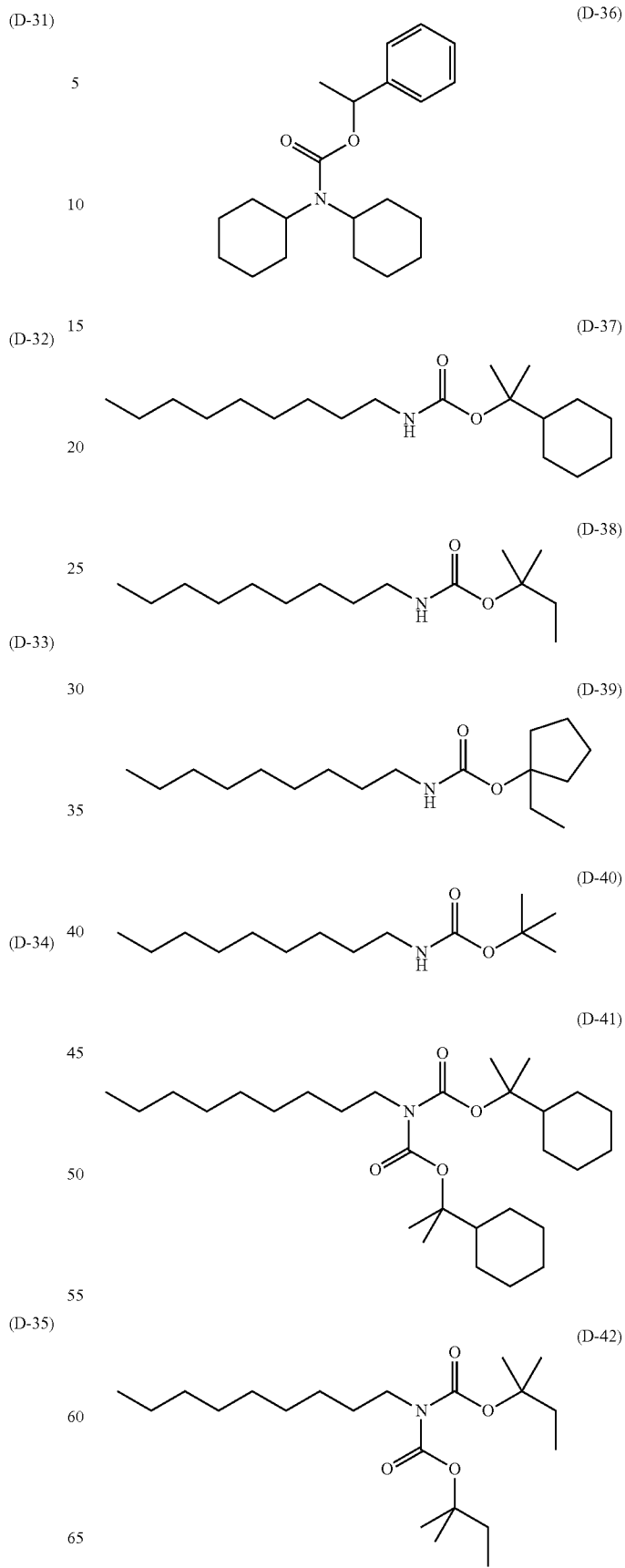

(D-43)
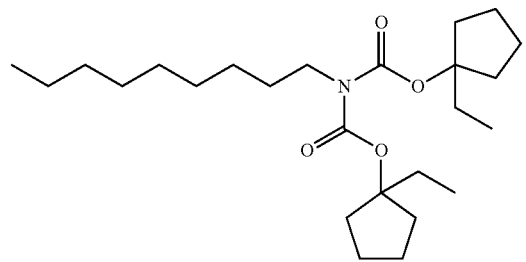

(D-44)
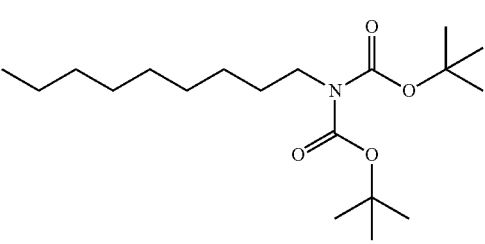

(D-45)
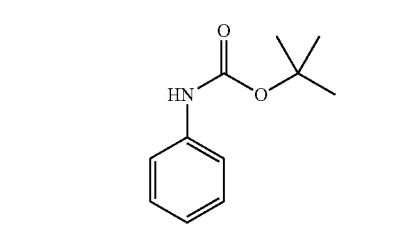

(D-46)
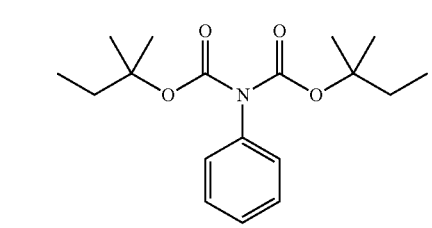

(D-47)
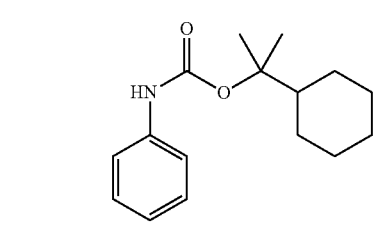

(D-48)
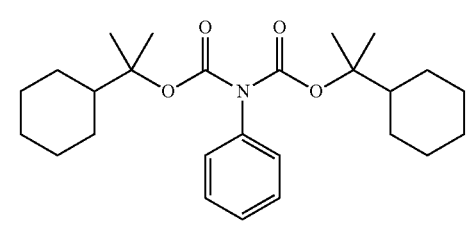

(D-50)
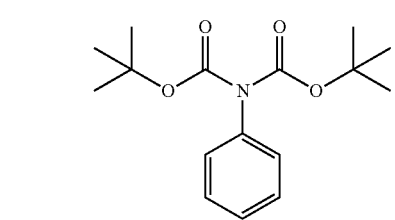

(D-51)
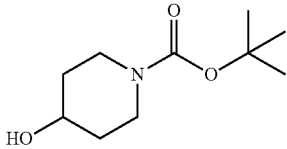

(D-52)
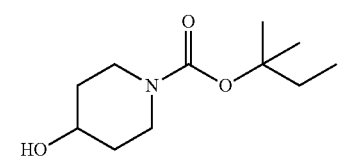

(D-53)
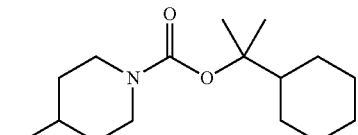

(D-54)
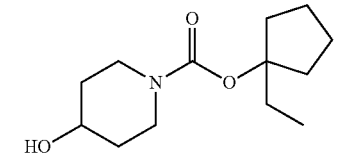

(D-55)
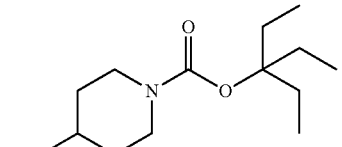

The compounds of general formula (A) can be easily synthesized from commercially available amines by the methods described in, for example, Protective Groups in Organic Synthesis, the fourth edition. The commonest method for obtaining the compounds comprises causing a bicarbonic ester or a haloformic ester to act on commercially available amines. In the formulae, X represents a halogen atom. Ra and Rb are as defined above in connection with general formula (A).

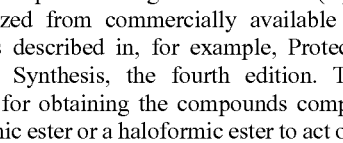
or
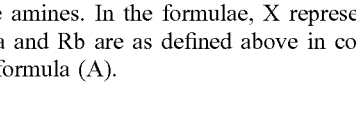

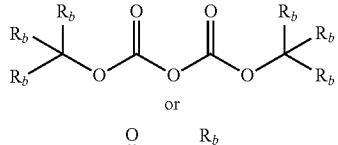
→

-continued

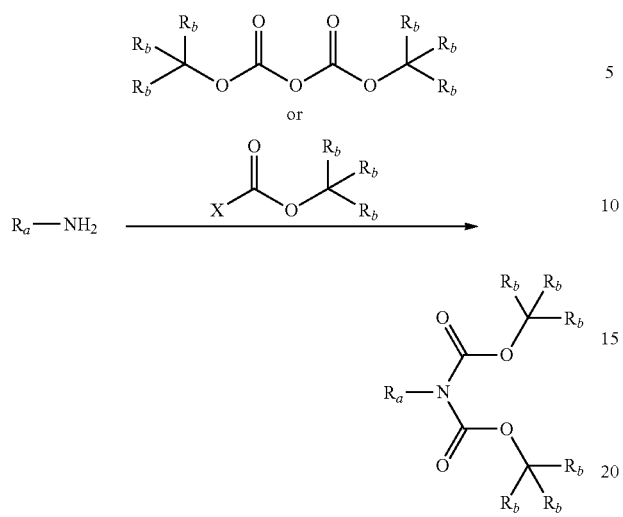

As other compounds usable in the composition of the present invention, there can be mentioned the compounds synthesized in Examples of JP-A-2002-363146, the compounds described in Paragraph 0108 of JP-A-2007-298569, and the like.

With respect to each of the above basic compounds, the pKa value of its conjugate acid is preferably 9 or less, more preferably in the range of 2 to 8 and further more preferably 2 to 6. If so, the effect of the compound (U) in the reduction of development defects can be enhanced. In particular, this effect is greater when the compound (U) contains a group that is decomposed by the action of an alkali developer to thereby produce an acid group.

With respect to the above compound whose basicity is increased by the action of an acid (5), the pKa value thereof is one corresponding to the structure after the decomposition by the action of an acid.

Herein, the pKa refers to the pKa in an aqueous solution, for example, any of those listed in *kagaku Binran* (Chemical Handbook) (II) (Revised 4th Edition, 1993, edited by The Chemical Society of Japan, published by Maruzen Co., Ltd.). The lower this value, the greater the acid strength. For example, the acid dissociation constant pKa in an aqueous solution can be actually measured through the determination of the acid dissociation constant at 25° C. using an infinitely diluted aqueous solution. Alternatively, the values based on a data base of publicly known literature values and Hammett's substituent constants can be determined by calculation by means of the following software package 1. All the pKa values appearing in this description are those determined by calculation by means of this software package.

Software package 1: Advanced Chemistry Development (ACD/Labs) Software V8.14 for Solaris (1994-2007 ACD/Labs).

These basic compounds are used individually or in combination.

The amount of basic compound added is generally in the range of 0.001 to 10 mass %, preferably 0.01 to 5 mass %, based on the total solid of the composition.

The molar ratio of acid generator to basic compound is preferably in the range of 2.5 to 300. Namely, a molar ratio of 2.5 or higher is preferred from the viewpoint of sensitivity and resolution. A molar ratio of 300 or below is preferred from the viewpoint of suppressing any resolution decrease due to pattern thickening over time from exposure to baking treatment. The molar ratio is more preferably in the range of 5.0 to 200, further more preferably 7.0 to 150. In this molar ratio, the acid generator refers to the total amount of repeating unit (a) contained in the resin (P) and above-mentioned acid generator other than the same.

[6] Low-Molecular Compound Containing a Group that when Acted on by an Acid or Alkali, is Decomposed The composition of the present invention can be loaded with a low-molecular compound containing a group that when acted on by an acid or alkali, is decomposed (provided that the above-mentioned compound whose basicity is increased by the action of an acid is excluded). It is preferred for the molecular weight of this low-molecular compound to be 3000 or less. The group that when acted on by an acid or alkali, is decomposed is not particularly limited. This group is preferably an acetal group, a carbonate group, a carbamate group, a tertiary ester group, a tertiary hydroxyl group, a hemiaminal ether group or a lactone structure, most preferably a carbamate group or a hemiaminal ether group.

When exposure is performed by means of electron beams or EUV light, the compound is preferably one with a structure resulting from substitution of a phenolic hydroxyl group of phenol compound with an acid-decomposable group. The phenol compound preferably contains 1 to 9, more preferably 2 to 6, phenol skeletons.

Specific examples of such low-molecular compounds are shown below, which in no way limit the scope of the present invention.

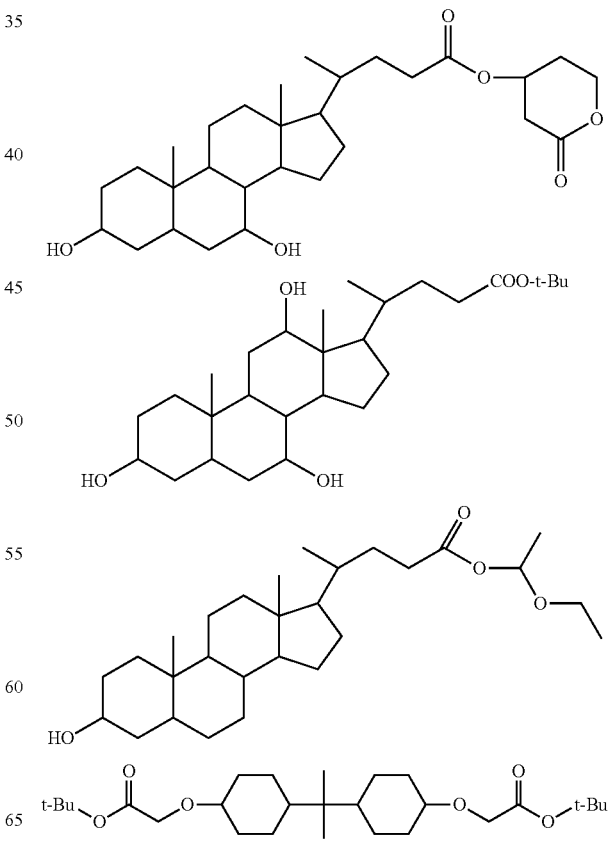

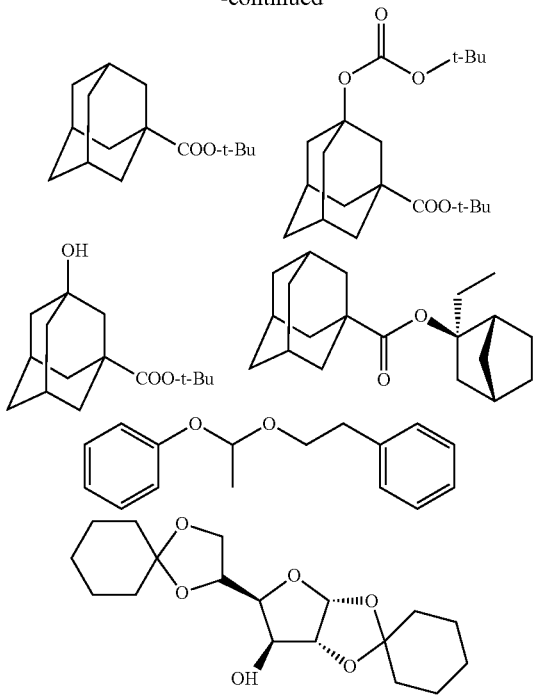

The above low-molecular compound containing a group that when acted on by an acid or alkali, is decomposed may be any of commercially available products or any of those synthesized by heretofore known methods.

[7] Surfactant

The composition of the present invention may further contain a surfactant. When a surfactant is contained, it is preferably a fluorinated and/or siliconized surfactant.

As such a surfactant, there can be mentioned, for example, Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., or polysiloxane polymer KP-341 produced by Shin-Etsu Chemical Co., Ltd.

Surfactants other than these fluorinated and/or siliconized surfactants can also be used. In particular, the other surfactants include polyoxyethylene alkyl ethers, polyoxyethylene alkyl aryl ethers and the like.

Moreover, heretofore known surfactants can also be appropriately used. As useful surfactants, there can be mentioned, for example, those described in section [0273] et seq of US Patent Application Publication No. 2008/0248425 A1.

A single type of surfactant may be used alone, or two or more types thereof may be used in combination.

The amount of surfactant added is preferably in the range of 0 to 2 mass %, more preferably 0.0001 to 2 mass % and most preferably 0.0005 to 1 mass %, based on the total solids of the actinic-ray- or radiation-sensitive resin composition (total amount excluding the solvents).

[8] Solvent

The solvent that can be employed in the preparation of the composition is not particularly limited as long as it can dissolve the individual components of the composition. For example, use can be made of an alkylene glycol monoalkyl ether carboxylate, an alkylene glycol monoalkyl ether, an alkyl lactate, a cyclolactone, a chain or cyclic ketone, an alkylene carbonate, an alkyl carboxylate, an alkyl alkoxyacetate, an alkyl pyruvate or the like. As other useful solvents, there can be mentioned, for example, those described in section [0244] et seq. of US Patent Application Publication No. 2008/0248425 A1 and the like.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred chain or cyclic ketones, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl carboxylates, there can be mentioned, for example, butyl acetate.

As preferred alkyl alkoxyacetates, there can be mentioned, for example, acetic acid 2-methoxyethyl ester, acetic acid 2-ethoxyethyl ester, acetic acid 2-(2-ethoxyethoxy) ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

Preferably employable solvents include 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, acetic acid 2-ethoxyethyl ester, acetic acid 2-(2-ethoxyethoxy)ethyl ester and propylene carbonate. Most preferred solvents are propylene glycol monomethyl ether acetate and propylene glycol monomethyl ether.

Any of these solvents may be used alone, and also two or more of these solvents may be used in combination. When two or more of these solvents are mixed together, it is preferred to mix a hydroxylated solvent with a non-hydroxylated solvent. The mass ratio of hydroxylated solvent to non-hydroxylated solvent is in the range of 1/99 to 99/1, preferably 10/90 to 90/10 and more preferably 20/80 to 60/40.

The hydroxylated solvent is preferably an alkylene glycol monoalkyl ether. The non-hydroxylated solvent is preferably an alkylene glycol monoalkyl ether carboxylate.

The content of solvent in the composition of the present invention can be appropriately regulated in accordance with the desired thickness of the film, etc. The solvent is used so that the total solid content of the composition falls within the range of generally 0.5 to 30 mass %, preferably 1.0 to 20 mass % and more preferably 1.5 to 10 mass %.

[9] Substance that when Acted on by Acid, is Decomposed to Thereby Produce an Acid Stronger than Carboxylic Acids>

The composition of the present invention may be loaded with a substance that when acted on by an acid, is decomposed to thereby produce an acid stronger than carboxylic acids (hereinafter also referred to as an "acid amplifier").

It is preferred for the acid produced by the acid amplifier to exhibit a high acid strength. In particular, the dissociation constant (pKa) of the acid is preferably 3 or below, more preferably 2 or below. It is preferred for the acid produced by the acid amplifier to be a sulfonic acid.

The acid amplifiers described in International Publication Nos. 95/29968 and 98/24000, JP-A's H8-305262, H9-34106 and H8-248561, Jpn. PCT National Publication No. H8-503082, U.S. Pat. No. 5,445,917, Jpn. PCT National Publication No. H8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943 and JP-A's H10-1508, H10-282642, H9-512498, 2000-62337, 2005-17730 and 2008-209889, etc. can be used individually or in combination as the acid amplifier according to the present invention.

In particular, the compounds of general formulae (1) to (6) below are preferred.

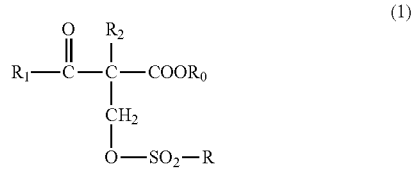 (1)

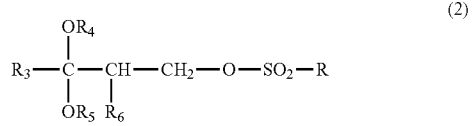 (2)

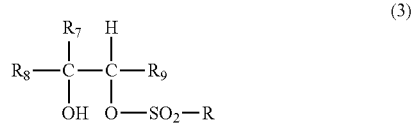 (3)

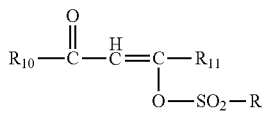 (4)

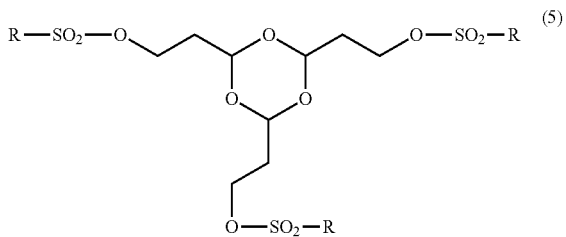 (5)

$R-SO_2-O-R_{12}$ (6)

In general formulae (1) to (6),

R represents an alkyl group, a monovalent aliphatic hydrocarbon ring group, an aryl group or an aralkyl group.

$R_0$ represents a group that is cleaved under the action of an acid.

$R_1$ represents an alkyl group, a monovalent aliphatic hydrocarbon ring group, an aryl group, an aralkyl group, an alkoxy group or an aryloxy group.

$R_2$ represents an alkyl group or an aralkyl group.

$R_3$ represents an alkyl group, a monovalent aliphatic hydrocarbon ring group, an aryl group or an aralkyl group.

Each of $R_4$ and $R_5$ independently represents an alkyl group, provided that $R_4$ and $R_5$ may be bonded to each other to thereby form a ring.

$R_6$ represents a hydrogen atom or an alkyl group.

$R_7$ represents a hydrogen atom, an alkyl group, a monovalent aliphatic hydrocarbon ring group, an aryl group or an aralkyl group.

$R_8$ represents an alkyl group, a monovalent aliphatic hydrocarbon ring group, an aryl group or an aralkyl group.

$R_9$ represents a hydrogen atom, an alkyl group, a monovalent aliphatic hydrocarbon ring group, an aryl group or an aralkyl group.

$R_9$ and $R_7$ may be bonded to each other to thereby form a ring.

$R_{10}$ represents an alkyl group, a monovalent aliphatic hydrocarbon ring group, an alkoxy group, an aryl group, an aralkyl group, an aryloxy group or an alkenyloxy group.

$R_{11}$ represents an alkyl group, a monovalent aliphatic hydrocarbon ring group, an alkoxy group, an aryl group, an aralkyl group, an aryloxy group or an alkenyl group.

$R_{10}$ and $R_{11}$ may be bonded to each other to thereby form a ring.

$R_{12}$ represents an alkyl group, a monovalent aliphatic hydrocarbon ring group, an aryl group, an alkenyl group, an alkynyl group or a cycloimido group.

In general formulae (1) to (6), the alkyl group can be one having 1 to 8 carbon atoms; the monovalent aliphatic hydrocarbon ring group can be a monocyclic or polycyclic one having 4 to 10 carbon atoms; the aryl group can be one having 6 to 14 carbon atoms; the aralkyl group can be one having 7 to 20 carbon atoms; the alkoxy group can be one having 1 to 8 carbon atoms; the alkenyl group can be one having 2 to 6 carbon atoms; the aryloxy group can be one having 6 to 14 carbon atoms; and the alkenyloxy group can be one having 2 to 8 carbon atoms.

As the ring formed by the mutual bonding of $R_4$ and $R_5$, there can be mentioned a 1,3-dioxorane ring, a 1,3-dioxane ring or the like.

As the ring formed by the mutual bonding of $R_7$ and $R_9$, there can be mentioned a cyclopentyl ring, a cyclohexyl ring or the like.

As the ring formed by the mutual bonding of $R_{10}$ and $R_{11}$, there can be mentioned a 3-oxocyclohexenyl ring, a 3-oxoindenyl ring or the like, in which an oxygen atom may be contained in the ring.

As the group cleaved by the action of an acid, contained in $R_0$, there can be mentioned, for example, a tertiary alkyl group, such as a t-butyl group or a t-amyl group; an isobornyl group; a 1-alkoxyethyl group, such as a 1-ethoxyethyl group, a 1-butoxyethyl group, a 1-isobutoxyethyl group or a 1-cyclohexyloxyethyl group; an alkoxymethyl group, such as a 1-methoxymethyl group or a 1-ethoxymethyl group; a tetrahydropyranyl group; a tetrahydrofuranyl group; a trialkylsilyl group; a 3-oxocyclohexyl group; or the like.

Preferred examples of the groups represented by R, $R_0$ and $R_1$ to $R_{11}$ are as follows.

R: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluoyl group, a mesityl group, a fluorophenyl group, a naphthyl group, a cyclohexyl group or a camphor group.

$R_0$: a t-butyl group, a methoxymethyl group, an ethoxyethyl group, a 1-ethoxyethyl group or a tetrahydropyranyl group.

$R_1$: a methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group or a naphthoxy group.

$R_2$: a methyl group, an ethyl group, a propyl group, a butyl group or a benzyl group.

$R_3$: a methyl group, an ethyl group, a propyl group, a cyclopropyl group, a cyclopentyl group, a cyclohexyl group, a phenyl group, a naphthyl group, a benzyl group, a phenethyl group or a naphthylmethyl group.

$R_4$, $R_5$: a methyl group, an ethyl group, a propyl group, or any capable of forming an ethylene group or propylene group through the mutual bonding thereof.

$R_6$: a hydrogen atom, a methyl group or an ethyl group.

$R_7$, $R_9$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group or any capable of forming a cyclopentyl ring or cyclohexyl ring through the mutual bonding thereof.

$R_8$: a methyl group, an ethyl group, an isopropyl group, a t-butyl group, a neopentyl group, a cyclohexyl group, a phenyl group or a benzyl group.

$R_{10}$: a methyl group, an ethyl group, a propyl group, an isopropyl group, a butyl group, an isobutyl group, a cyclopropyl group, a cyclopentyl group, a cyclohexyl group, a methoxy group, and ethoxy group, a phenyl group, a naphthyl group, a benzyl group, a phenoxy group, a naphthoxy group, a vinyloxy group, a methylvinyloxy group or any capable of forming a 3-oxocyclohexenyl ring or 3-oxoindenyl ring in which an oxygen atom may be contained through the mutual bonding thereof.

$R_{11}$: a methyl group, an ethyl group, a propyl group, an isopropyl group, a butyl group, an isobutyl group, a cyclopropyl group, a cyclopentyl group, a cyclohexyl group, a methoxy group, and ethoxy group, a phenyl group, a naphthyl group, a benzyl group, a phenoxy group, a naphthoxy group, a vinyl group, an allyl group or any capably of forming a 3-oxocyclohexenyl ring or 3-oxoindenyl ring in which an oxygen atom may be contained through the mutual bonding thereof.

In general formula (6), when $R_{12}$ is an alkyl group, the alkyl group is preferably a linear one have 1 to 12 carbon atoms or a branched one having 3 to 12 carbon atoms.

When $R_{12}$ is a monovalent aliphatic hydrocarbon ring group, the monovalent aliphatic hydrocarbon ring group is preferably a monocyclic or polycyclic one having 5 to 10 carbon atoms.

When $R_{12}$ is an aryl group, as the aryl group, there can be mentioned a condensed ring formed by 1 to 3 benzene rings or a condensed ring formed by a benzene ring and a 5-membered unsaturated ring. Specific examples thereof include a phenyl group, a naphthyl group, an anthryl group, a phenanthryl group, an indenyl group, an acenaphthenyl group, a fluorenyl group and the like. Among these, a phenyl group and a naphthyl group are preferred. The aryl groups include not only the above carbon-ring aryl groups but also heterocyclic aryl groups. As the heterocyclic aryl groups, there can be mentioned those each containing 3 to 20 carbon atoms and 1 to 5 heteroatoms, such as a pyridyl group and a furyl group as well as, resulting from condensation with a benzene ring, a quinolyl group, benzofuryl group, thioxanthone group and carbazole group.

When $R_{12}$ is an alkenyl group, a substituted alkenyl group [—C($R_{14}$)=C($R_{15}$)($R_{16}$)], an alkynyl group or a substituted alkynyl group [—C≡C($R_{17}$)], monovalent nonmetallic atomic groups can be used as $R_{14}$ to $R_{17}$. As preferred examples of the substituents represented by $R_{14}$ to $R_{17}$, there can be mentioned a hydrogen atom, a halogen atom, an alkyl group, a substituted alkyl group, an aryl group and a substituted aryl group. As specific examples thereof, there can be mentioned those set forth above by way of example. As more preferred substituents represented by $R_{14}$ to $R_{17}$, there can be mentioned a hydrogen atom, a halogen atom and a linear, branched or cyclic alkyl group having 1 to 10 carbon atoms.

When $R_{12}$ is a cycloimido group, as the cycloimido, there can be mentioned one having 4 to 20 carbon atoms, such as succinimido, phthalimido, cyclohexanedicarboxyimido or norbornenedicarboxyimido.

As specific examples of the compounds of general formulae (1) to (6), there can be mentioned the compounds (1-1) to (1-11), (2-1) to (2-6), (3-1) to (3-6), (4-1) to (4-7), (5-1) to (5-4) and (6-1) to (6-20) set forth as examples in section [0215] et seq. of JP-A-2008-209889.

[10] Other Component

The composition of the present invention can be appropriately loaded with, in addition to the above components, an onium salt of carboxylic acid and any of the dyes, plasticizers, photosensitizers, light absorbers, etc. described in, for example, Proceeding of SPIE, 2724, 355 (1996).

[11] Method of Forming Pattern

The present invention further relates to a resist film formed from the above composition of the present invention.

The method of forming a pattern according to the present invention comprises the operations of exposing the above resist film to light and developing the exposed film. In the use of the composition of the present invention, for example, the above components are dissolved in a solvent, filtered and applied onto a support.

The filter medium is preferably one made of a polytetrafluoroethylene, polyethylene or nylon having a pore size of 0.1 µm or less, more preferably 0.05 µm or less and further more preferably 0.03 µm or less.

The thickness of the film is not particularly limited. The thickness is preferably in the range of 0.01 to 0.2 µm, more preferably 0.02 to 0.1 µm.

The method of application onto a substrate is preferably a spin coating method, in which the rotating speed is preferably in the range of 1000 to 3000 rpm.

The composition is applied onto a substrate, such as one for use in the production of integrated circuit elements, photomasks, imprint molds, etc. (e.g., silicon/silicon dioxide coating), by appropriate application means, such as a spinner. Thereafter, the applied composition is dried, thereby forming a resist film.

This film is exposed through a given mask to actinic rays or radiation, preferably baked (heated), developed and rinsed. Thus, a favorable pattern can be obtained. When the film is exposed to electron beams, lithography through no mask (direct lithography) is generally carried out.

An imprint mold structure may be fabricated using the composition of the present invention. With respect to the particulars thereof, reference can be made to, for example, "Fundamentals of nanoimprint and its technology development/application deployment—technology of nanoimprint substrate and its latest technology deployment" edited by Yoshihiko Hirai, published by Frontier Publishing (issued in June, 2006), Japanese Patent No. 4109085 and JP-A-2008-162101.

The actinic rays or radiation is not particularly limited. For example, a KrF excimer laser, an ArF excimer laser, electron beams, X-rays, soft X-rays and the like can be preferably used. Electron beams, X-rays and soft X-rays are more preferred. Electron beams, X-rays and EUV light are most preferred.

In the development step, an alkali developer is generally used. Generally, a quaternary ammonium salt, typically tetramethylammonium hydroxide, is used in the alkali developer for the development step. The alkali developer is not limited to this, and use can be made of an aqueous solution of an alkali selected from among an inorganic alkali (for example, sodium hydroxide, potassium hydroxide, sodium carbonate, sodium silicate, sodium metasilicate or the like), a primary to tertiary amine (for example, ethylamine, n-propylamine, diethylamine, di-n-butylamine, triethylamine, methyldiethylamine or the like), an alcoholamine (for example, dimethylethanolamine, triethanolamine or the like), a cycloamine (for example, pyrrole, piperidine or the like) and the like.

Further, appropriate amounts of an alcohol and a surfactant may be added to the alkali developer.

The alkali concentration of the alkali developer is generally in the range of 0.1 to 20 mass %.

The pH value of the alkali developer is generally in the range of 10.0 to 15.0.

Pure water is preferably used as a rinse liquid, and before the use, an appropriate amount of surfactant can be added thereto.

Prior to the formation of the resist film, the substrate may be coated with an antireflection film. As the antireflection film, use can be made of not only an inorganic film of titanium, titanium dioxide, titanium nitride, chromium oxide, carbon, amorphous silicon or the like but also an organic film composed of a light absorber and a polymer material. Also, as the organic antireflection film, use can be made of any of commercially available organic antireflection films, such as the DUV30 Series and DUV40 Series produced by Brewer Science Inc. and the AR-2, AR-3 and AR-5 produced by Shipley Co., Ltd.

The present invention will be described in greater detail below by way of its examples. However, the gist of the present invention is in no way limited to these examples.

<Resin (P)>

With respect to each of the resins (P) employed in Examples, the structure, component ratio (molar ratio), weight average molecular weight (Mw) and dispersity (Mw/Mn) are indicated below.

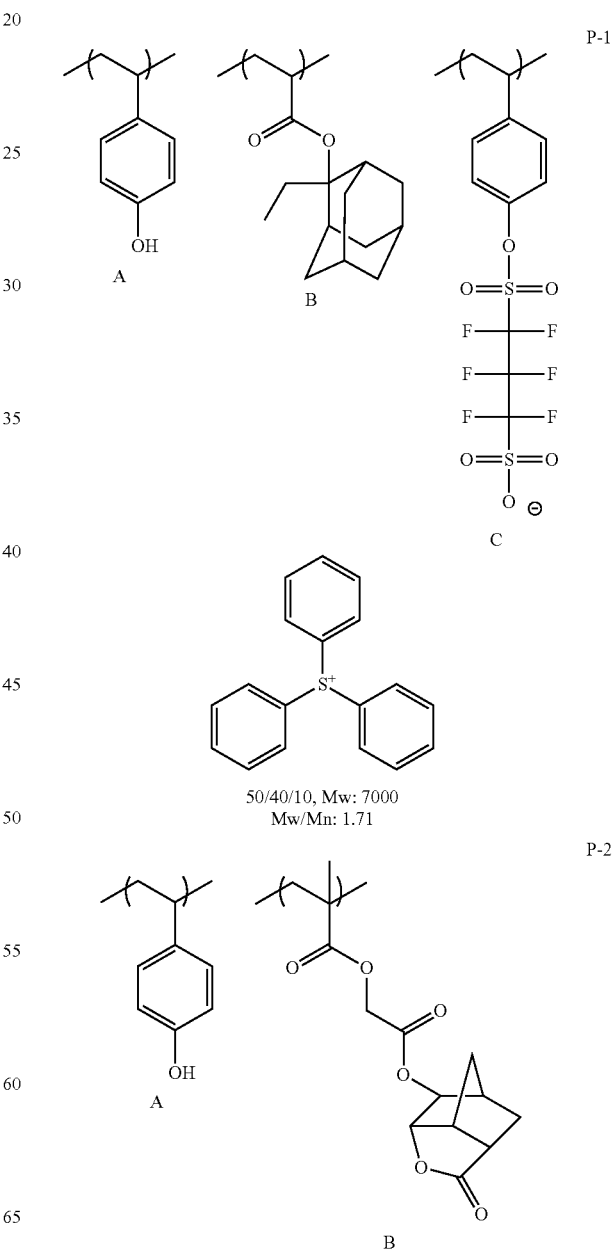

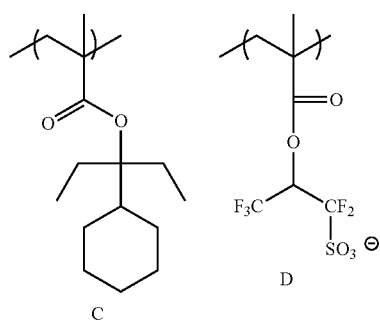
C                D
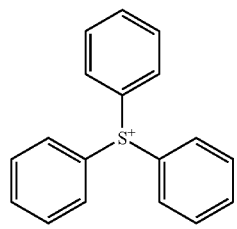
25/25/35/15, Mw: 10500
Mw/Mn: 1.65
P-3
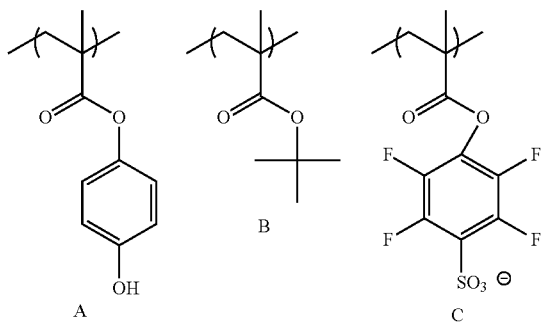
A    B    C
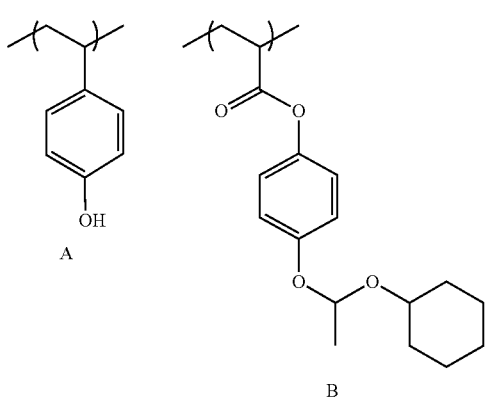
38/55/7, Mw: 5500
Mw/Mn: 1.69
P-4
A    B
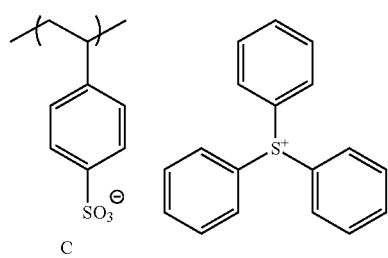
C
60/30/10, Mw: 4800
Mw/Mn: 1.75
P-5
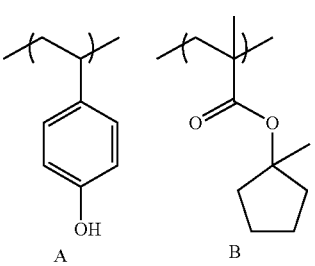
A    B
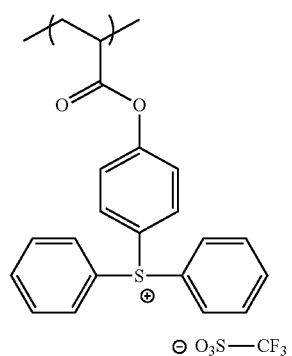
C
50/42/8, Mw: 9300
Mw/Mn: 1.82
P-6
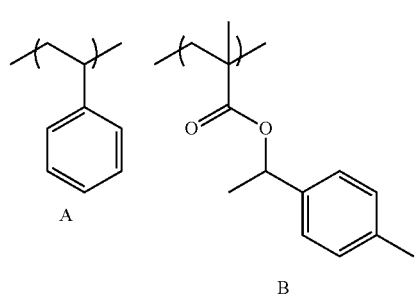
A    B

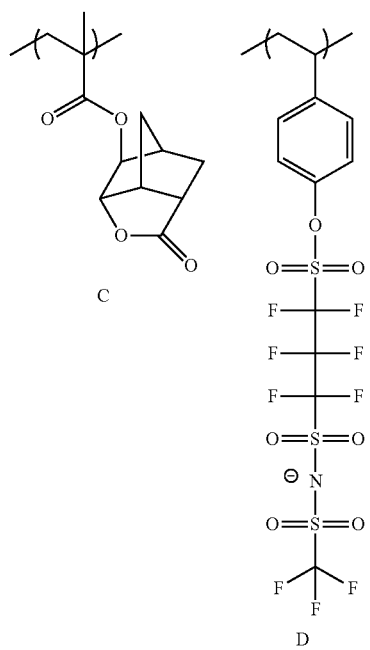
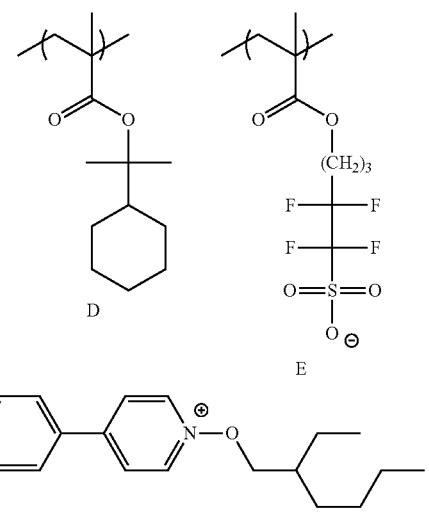
5/30/35/25/5, Mw: 8800
Mw/Mn: 1.84
<Compound (U)>
With respect to each of the compounds (U) employed in Examples, the structure, component ratio (molar ratio) and weight average molecular weight (Mw) are indicated below.
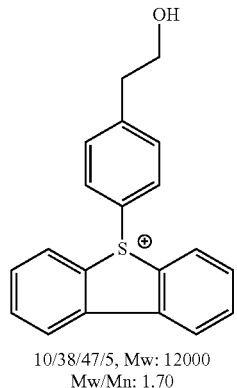
10/38/47/5, Mw: 12000
Mw/Mn: 1.70
U-1
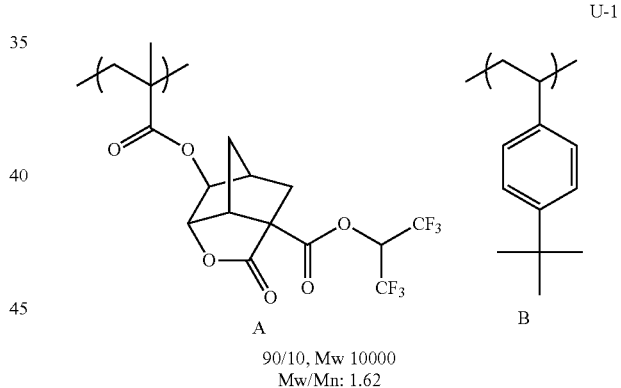
90/10, Mw 10000
Mw/Mn: 1.62
P-7
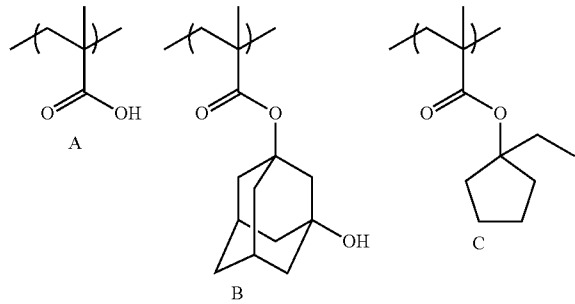
U-2
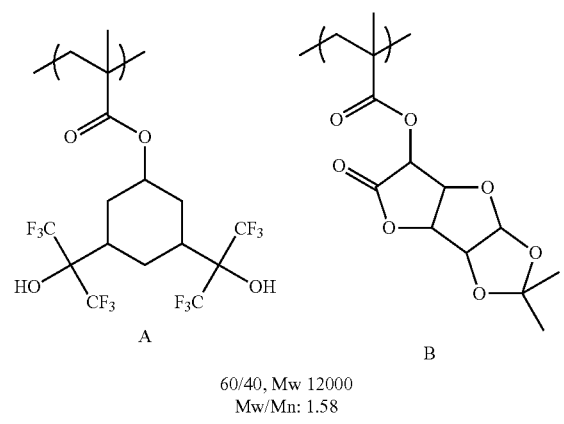
60/40, Mw 12000
Mw/Mn: 1.58

-continued
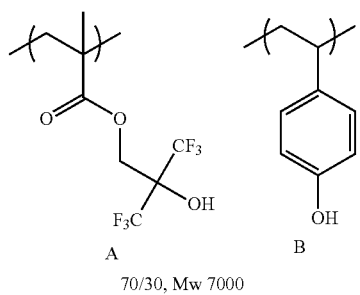
U-3
70/30, Mw 7000
Mw/Mn: 1.82
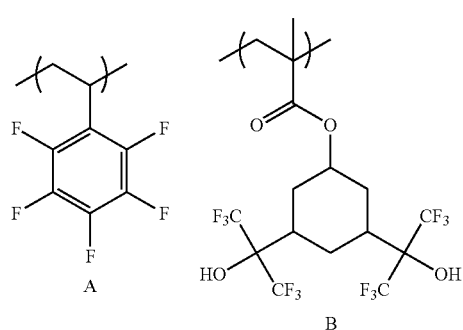
U-4
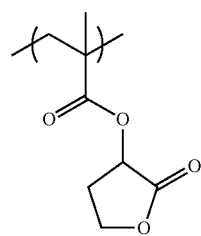
20/40/40, Mw 7000
Mw/Mn: 1.67
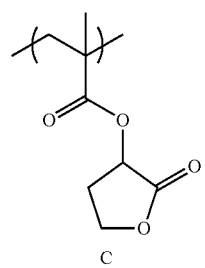
20/40/40, Mw 7000
Mw/Mn: 1.67
-continued
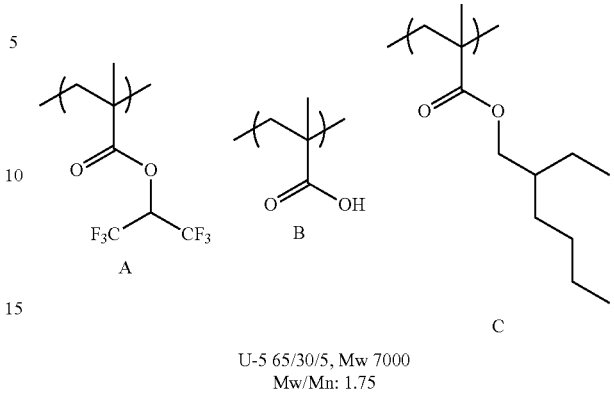
U-5
U-5 65/30/5, Mw 7000
Mw/Mn: 1.75
<Basic Compound>
With respect to each of the basic compounds employed in Examples, the structure and the pKa value of the conjugate acid thereof are indicated below. The pKa value is one calculated by the above-mentioned method.
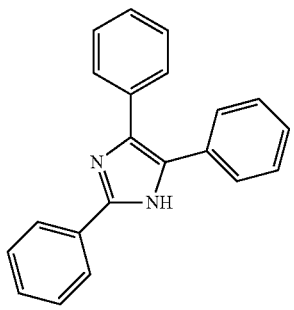
Q-1
pKa: 4.5
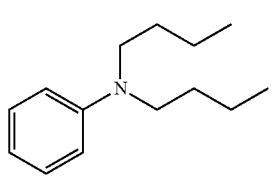
Q-2
pKa: 6.3
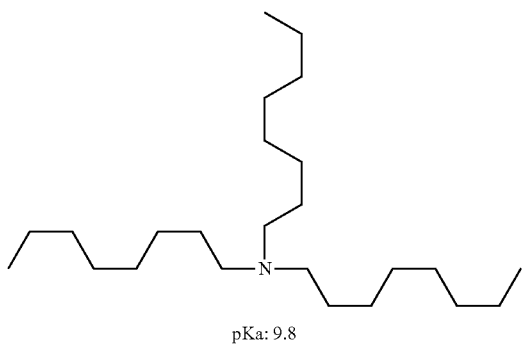
Q-3
pKa: 9.8

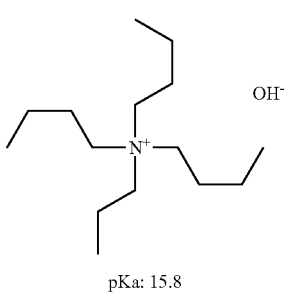

Q-4 pKa: 15.8

<Preparation of Resist>

The individual components of Table 3 below were dissolved in the solvents of the table, thereby obtaining solutions each of 2 mass % solid content. The solutions were passed through a polyethylene filter with a pore size of 0.03 μm, thereby obtaining actinic-ray- or radiation-sensitive resin compositions.

In Table 3, the abbreviations "PGMEA," "PGME" and "EL" mean propylene glycol monomethyl ether acetate, propylene glycol monomethyl ether and ethyl lactate, respectively.

Sensitivity $E_0$ at which the thickness of the resist film became zero was measured. It was ascertained that when the compositions of Examples were used, the sensitivity $E_0$ was 20 mJ or less.

[Defect]

At the above effective sensitivity $E_0$, a mask size 0.15 μm pattern exposure was carried out at 78 points within a wafer surface. On the thus obtained patterned wafer, the number of development defects was measured by the use of KLA-2360 manufactured by KLA-Tencor Corporation. In the measurement, the inspected area was a total of 205 $cm^2$, the pixel size 0.25 μm and the threshold 30, and visible light was used as the inspection light. Evaluation was made by the number of defects (count/$cm^2$), namely, the quotient of the obtained count divided by the inspected area.

[Measurement of Static Contact Angle of Resist Film]

A resist film was formed in the same manner as in the preparation of pattern and evaluation 1. One drop of pure water was placed on the resist film after development, and 5 seconds later, the static contact angle of the resist film was automatically measured according to the θ/2 method by means of an automated contact angle meter (model CA-V manufactured by Kyowa Interface Science Co., Ltd.).

TABLE 3

| | Resin | Conc. [mass %] | Unevenly distributed compd | Conc. [mass %] | Basic compd | Conc. [mass %] | Organic solvent | mass ratio |
|---|---|---|---|---|---|---|---|---|
| Ex. 1 | P-1 | 93.0 | U-1 | 5.0 | Q-1 | 2.0 | PGMEA/PGME | 40/60 |
| Ex. 2 | P-1 | 95.0 | U-1 | 3.0 | Q-2 | 2.0 | PGMEA/PGME | 40/60 |
| Ex. 3 | P-2 | 92.8 | U-1 | 5.0 | Q-1 | 2.2 | PGMEA/PGME | 30/70 |
| Ex. 4 | P-3 | 93.4 | U-1 | 5.0 | Q-2 | 1.6 | PGMEA/EL | 70/30 |
| Ex. 5 | P-4 | 93.2 | U-1 | 5.0 | Q-1 | 1.8 | PGMEA/PGME | 40/60 |
| Ex. 6 | P-5 | 93.0 | U-1 | 5.0 | Q-1 | 2.0 | PGMEA/PGME | 40/60 |
| Ex. 7 | P-3 | 93.4 | U-2 | 5.0 | Q-2 | 1.6 | PGMEA/PGME | 40/60 |
| Ex. 8 | P-3 | 93.4 | U-3 | 5.0 | Q-2 | 1.6 | PGMEA/EL | 70/30 |
| Ex. 9 | P-2 | 93.0 | U-1 | 5.0 | Q-3 | 2.0 | PGMEA/PGME | 30/70 |
| Ex. 10 | P-2 | 93.0 | U-1 | 5.0 | Q-4 | 2.0 | PGMEA/PGME | 30/70 |
| Ex. 11 | P-6 | 93.0 | U-1 | 5.0 | Q-1 | 2.0 | PGMEA/PGME | 40/60 |
| Ex. 12 | P-7 | 93.4 | U-1 | 5.0 | Q-1 | 1.6 | PGMEA/PGME/Cyclohexanone | 50/40/10 |
| Ex. 13 | P-1 | 93.0 | U-4 | 5.0 | Q-1 | 2.0 | PGMEA/PGME | 40/60 |
| Ex. 14 | P-1 | 93.0 | U-5 | 5.0 | Q-1 | 2.0 | PGMEA/PGME | 40/60 |
| Ex. 15 | P-1 | 93.0 | U-1/U-3 | 3.0/2.0 | Q-1 | 2.0 | PGMEA/PGME | 40/60 |
| Ex. 16 | P-1 | 93.0 | U-2/U-4 | 3.0/2.0 | Q-1 | 2.0 | PGMEA/PGME | 40/60 |
| Comp. 1 | P-2 | 98.0 | — | 0.0 | Q-1 | 2.0 | PGMEA/PGME | 40/60 |
| Comp. 2 | P-4 | 98.2 | — | 0.0 | Q-1 | 1.8 | PGMEA/PGME | 40/60 |

[Preparation of Pattern and Evaluation 1 (KrF)]

Each of the above prepared positive resist solutions was uniformly applied onto a substrate wafer coated with a 60 nm antireflection film (DUV42 produced by Brewer Science Inc.) by the use of a spin coater Mark 8, manufactured by Tokyo Electron Limited, and dried by baking at 130° C. for 60 seconds, thereby forming a positive resist film of 60 nm average thickness. Using a KrF excimer laser scanner (PAS5500/850C wavelength 248 nm, manufactured by ASML), the resist film was subjected to a checkered-flag exposure comprising alternate exposure for open-frame exposed portions and unexposed portions each with an area of 15 mm square on the entire surface of the wafer (exposure conditions: NA=0.80 σ=0.89, 20 mJ). The exposed resist film was baked at 110° C. for 60 seconds, immersed in a 2.38 mass % aqueous tetramethylammonium hydroxide (TMAH) solution for 60 seconds, rinsed with water for 30 seconds and dried. The thus obtained patterns were evaluated by the following methods.

<Preparation of Pattern and Evaluation 2 (EB)>

Each of the prepared positive resist solutions was uniformly applied onto a silicon substrate having undergone hexamethyldisilazane treatment by means of a spin coater, and dried by baking on a hot plate at 120° C. for 90 seconds. Thus, resist films each having a thickness of 100 nm were formed.

Each of the formed resist films was irradiated with electron beams by means of an electron beam irradiating apparatus (HL750 manufactured by Hitachi, Ltd., acceleration voltage 50 KeV). The irradiated film was immediately baked on a hot plate at 110° C. for 90 seconds. The baked film was developed with a 2.38 mass % aqueous tetramethylammonium hydroxide solution at 23° C. for 60 seconds, rinsed with pure water for 30 seconds and dried. Thus, line and space patterns were formed. The obtained patterns were evaluated by the following methods.

[Sensitivity]

The configuration of a cross section of each of the obtained patterns was observed by means of a scanning electron microscope (model S-9220, manufactured by Hitachi, Ltd.). The sensitivity was defined as the minimum exposure energy at which a 100 nm line (line:space=1:1) could be resolved.

[Resolving Power]

The resolving power was defined as a limiting resolving power (resolving power at which lines and spaces could be separated and resolved from each other) under the amount of exposure exhibiting the above sensitivity.

[Line Edge Roughness (LER)]

A 100 nm line pattern formed under the amount of exposure exhibiting the above sensitivity was observed by means of a scanning electron microscope (model S-9220, manufactured by Hitachi, Ltd.). The distance between actual edge and a reference line on which edges were to be present was measured on arbitrary 30 points within 50 μm in the longitudinal direction of the pattern. The standard deviation of measured distances was determined, and 3σ was computed therefrom.

The thus obtained results are given in Table 4 below.

TABLE 4

| | Defect number of unexposed portions [count/cm$^2$] | Contact angle after development [degree] | EB Sensitivity [μC/cm$^2$] | Resolving power [nm] | LER [nm] | KrF sensitivity [mJ/cm$^2$] |
|---|---|---|---|---|---|---|
| Ex. 1 | 0.05 | 49.2 | 48.1 | 40 | 4.8 | 5.5 |
| Ex. 2 | 0.26 | 51.6 | 46.3 | 40 | 4.4 | 5.3 |
| Ex. 3 | 0.11 | 50.3 | 48.9 | 40 | 4.1 | 5.5 |
| Ex. 4 | 0.03 | 52.1 | 45.1 | 45 | 5.0 | 5.0 |
| Ex. 5 | 1.71 | 54.4 | 48.2 | 45 | 4.7 | 4.8 |
| Ex. 6 | 0.39 | 51.1 | 50.6 | 55 | 5.6 | 5.6 |
| Ex. 7 | 8.68 | 53.4 | 44.6 | 50 | 4.8 | 4.9 |
| Ex. 8 | 16.88 | 54.7 | 45.7 | 45 | 5.1 | 5.1 |
| Ex. 9 | 15.21 | 53.9 | 47.6 | 45 | 4.7 | 5.3 |
| Ex. 10 | 20.30 | 54.0 | 48.5 | 50 | 4.2 | 5.6 |
| Ex. 11 | 0.42 | 48.5 | 49.2 | 40 | 3.9 | 5.6 |
| Ex. 12 | 0.19 | 53.0 | 51.2 | 45 | 4.6 | 5.7 |
| Ex. 13 | 3.26 | 48.9 | 48.3 | 40 | 5.3 | 5.8 |
| Ex. 14 | 35.90 | 55.0 | 48.0 | 45 | 4.4 | 6.0 |
| Ex. 15 | 2.99 | 52.0 | 48.2 | 45 | 4.7 | 5.5 |
| Ex. 16 | 6.57 | 51.6 | 48.5 | 45 | 5.0 | 5.5 |
| Comp. 1 | 166.01 | 61.3 | 47.7 | 40 | 4.5 | 5.2 |
| Comp. 2 | 326.88 | 65.7 | 47.9 | 45 | 4.7 | 5.0 |

As apparent from Table 4, the contact angle after development was strikingly low when the compositions of Examples were used as compared with that when the compositions of Comparative Examples were used. Further, when the compositions of Examples were used, high sensitivity, high resolution, good roughness characteristics and reduction of development defects could be simultaneously satisfied.

What is claimed is:

1. An actinic-ray- or radiation-sensitive resin composition comprising:
   a resin (P) containing a repeating unit (A) that when exposed to actinic rays or radiation, is decomposed to thereby generate an acid and a repeating unit (B) with a structure that when acted on by an acid, is decomposed to thereby increase its solubility in an alkali developer, and
   a compound (U) structured so that when the composition is formed into a film, the compound is unevenly distributed in a vertical direction of the film;

wherein the resin (P) further comprises a repeating unit (C) containing an alkali-soluble group represented by the general formula (C-I):

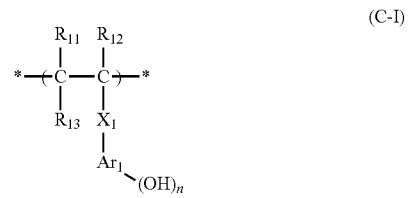

wherein,
each of $R_{11}$, $R_{12}$ and $R_{13}$ independently represents a hydrogen atom, an alkyl group, a cycloalkyl group, a halogen atom, a cyano group or an alkoxycarbonyl group, provided that $R_{13}$ may be bonded to $Ar_1$ to thereby form a ring, wherein $R_{13}$ is an alkylene group,
$X_1$ represents a single bond or a bivalent connecting group,
$Ar_1$ represents a bivalent aromatic ring group, provided that when a ring is formed by bonding to $R_{13}$, $Ar_1$ represents a trivalent aromatic ring group, and
n is an integer of 1 to 4, and wherein the repeating unit (A) is represented by any of the following general formulae (I):

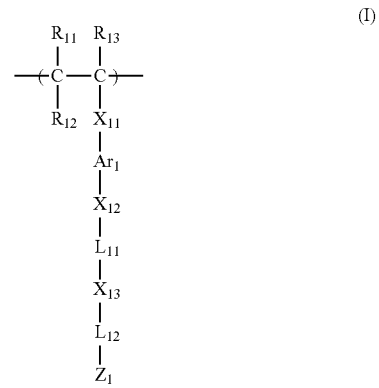

wherein in general formula (I),
each of $R_{11}$, $R_{12}$ and $R_{13}$ independently represents a hydrogen atom, an alkyl group, a monovalent aliphatic hydrocarbon ring group, a halogen atom, a cyano group or an alkoxycarbonyl group;

$X_{11}$ represents a single bond, —O—, —S—, —CO—, —SO$_2$—, —NR— (R represents a hydrogen atom or an alkyl group), a bivalent nitrogenous nonaromatic heterocyclic group or a group composed of a combination of these;

each of, $X_{12}$ and $X_{13}$ independently represents a single bond, —O—, —S—, —SO$_2$—, —NR— (R represents a hydrogen atom or an alkyl group), a bivalent nitrogenous nonaromatic heterocyclic group or a group composed of a combination of these;

$L_{11}$ represents an alkylene group, a bivalent aliphatic hydrocarbon ring group, a bivalent aromatic ring group or a group composed of a combination of two or more of these, wherein in the group composed of a combination, the two or more groups combined together may be identical to or different from each other and may be linked to each other through a connecting group selected from —O—, —S—, —SO$_2$—, and —NR— (R represents a hydrogen atom or an alkyl group), a bivalent nitrogenous nonaromatic heterocyclic group or a group composed of a combination of these;

$L_{12}$ represents an alkylene group, an alkenylene group, a bivalent aliphatic hydrocarbon ring group, a bivalent aromatic ring group or a group composed of a combination of two or more of these, wherein the hydrogen atoms of each of these groups are partially or entirely substituted with a substituent selected from among a fluorine atom, a fluoroalkyl group, a nitro group and a cyano group wherein in the group composed of a combination, the groups combined together may be identical to or different from each other and may be linked to each other through a connecting group selected from —O—, —S—, —SO$_2$, and —NR— (R represents a hydrogen atom or an alkyl group), a bivalent nitrogenous nonaromatic heterocyclic group or a group composed of a combination of these;

$Ar_1$ represents a bivalent aromatic ring group or a group composed of a combination of a bivalent aromatic ring group and an alkylene group;

$Z_1$ represents any of structural moieties represented by general formulae (ZI) to (ZIII) below,

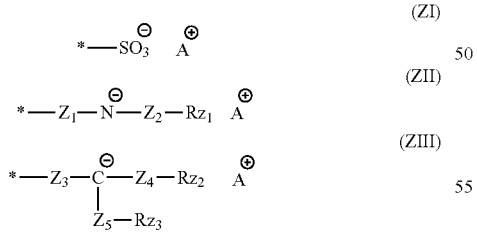

wherein, each of $Z_1$, $Z_2$, $Z_3$, $Z_4$ and $Z_5$ independently represents —CO— or —SO$_2$—, each of $Rz_1$, $Rz_2$ and $Rz_3$ independently represents an alkyl group, a monovalent aliphatic hydrocarbon ring group, an aryl group or an aralkyl group, and $A^+$ represents any of cations of general formulae (CT1) and (CT2) below, cations

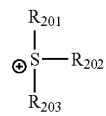
(CT1)

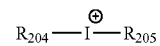
(CT2)

wherein, in general formula (CT1), each of $R_{201}$, $R_{202}$ and $R_{203}$ independently represents an organic group, and two of $R_{201}$, $R_{202}$ and $R_{203}$ are not bonded to each other to form a ring; and in general formula (CT2), each of $R_{204}$ and $R_{205}$ independently represents an aryl group, an alkyl group or a cycloalkyl group.

2. The composition according to claim 1, wherein the compound (U) contains either an acid group or a group that when acted on by an alkali developer, is decomposed to thereby produce an acid group.

3. The composition according to claim 1, wherein the repeating unit (A) has a structure that when exposed to actinic rays or radiation, produces an acid group in a side chain of the resin (P).

4. The composition according to claim 1, wherein the compound (U) contains at least either a fluorine atom or a silicon atom.

5. The composition according to claim 1, wherein the compound (U) is a resin.

6. The composition according to claim 1, wherein the compound (U) contains a polarity conversion group.

7. The composition according to claim 6, wherein the compound (U) has at least either the partial structure of general formula (KA-1) below or the partial structure of general formula (KB-1) below:

(KA-1)

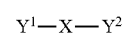
(KB-1)

in which

X represents the polarity conversion group, and each of $Y^1$ and $Y^2$ independently represents an electron withdrawing group.

8. The composition according to claim 7, wherein the above X represents a carboxylic ester, an acid anhydride, an acid imide, a carboxylic thioester, a carbonic ester, a sulfuric ester or a sulfonic ester.

9. The composition according to claim 1, wherein the compound (U) has at least one partial structure selected from the group consisting of those of general formulae (KA-1-1) to (KA-1-17) below:

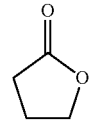
KA-1-1

KA-1-2
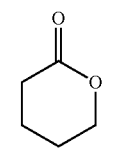
KA-1-3
KA-1-4
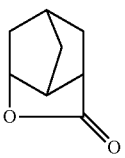
KA-1-5
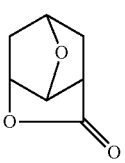
KA-1-6
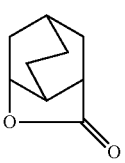
KA-1-7
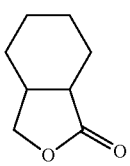
KA-1-8
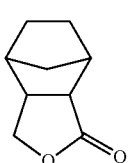
KA-1-9
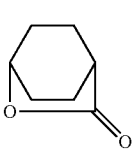
KA-1-10
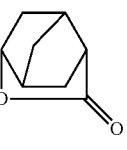
KA-1-11
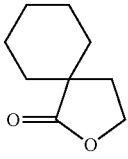
KA-1-12
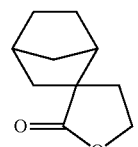
KA-1-13
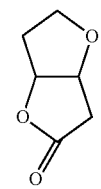
KA-1-14
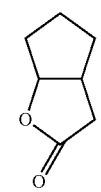
KA-1-15
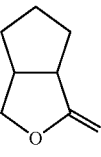
KA-1-16
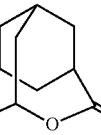
KA-1-17
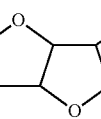
10. The composition according to claim 1, wherein the compound (U) has at least one partial structure selected from the group consisting of those of general formulae (F2), (F3), (F4), (CS-1), (CS-2) and (CS-3) below:
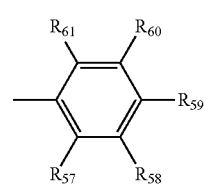
(F2)
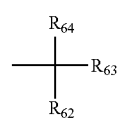
(F3)

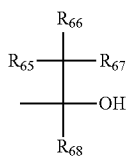

(F4)

in general formulae (F2) to (F4), each of $R_{57}$ to $R_{68}$ independently represents a hydrogen atom, a fluorine atom or an alkyl group, provided that in each of $R_{57}$-$R_{61}$, $R_{62}$-$R_{64}$ and $R_{65}$-$R_{68}$, at least one thereof is a fluorine atom or an alkyl group substituted with at least one fluorine atom, and

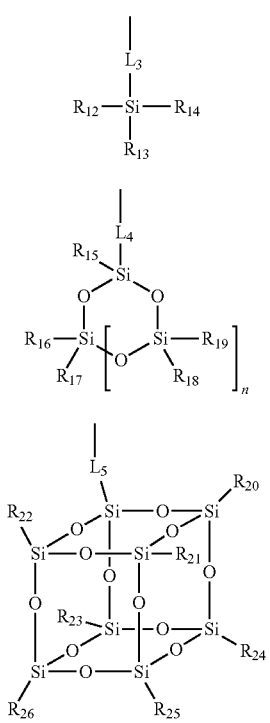

in general formulae (CS-1) to (CS-3), each of $R_{12}$ to $R_{26}$ independently represents an alkyl group or a cycloalkyl group, each of $L_3$ to $L_5$ independently represents a single bond or a bivalent connecting group, and n is an integer of 1 to 5.

11. The composition according to claim 1, wherein the repeating unit (B) is any of the repeating units of general formula (ES) below:

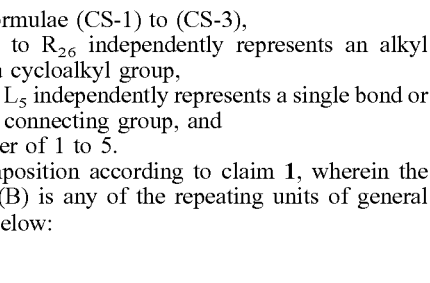

in which $Xa_1$ represents a hydrogen atom, a methyl group, a trifluoromethyl group or a hydroxymethyl group, T represents a single bond or a bivalent connecting group, and each of $Rx_1$ to $Rx_3$ independently represents an alkyl group or a cycloalkyl group, provided that at least two of $Rx_1$ to $Rx_3$ may be bonded to each other to thereby form a ring.

12. The composition according to claim 1, which further comprises a basic compound whose conjugate acid exhibits a pKa value of 9 or below.

13. A resist film formed from the composition according to claim 1.

14. A method of forming a pattern, comprising:
forming the composition according to claim 1 into a film,
exposing the film to light, and
developing the exposed film.

15. The method according to claim 14, wherein the exposure is performed using electron beams, X-rays or soft X-rays.

16. The composition according to claim 1, wherein $X_{11}$ in the general formula (I) is a single bond.

17. The composition according to claim 1, wherein the resin (P) contains any of the repeating units of general formula (VI) as the repeating unit (B):

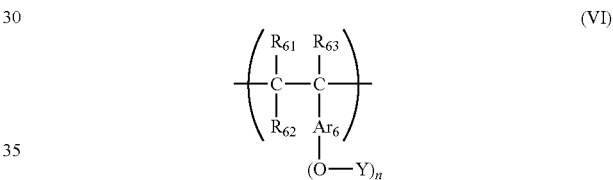

wherein, each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring, wherein $R_{62}$ represents an alkylene group, $Ar_6$ represents a bivalent aromatic ring group, provided that when a ring is formed by bonding to $R_{62}$, $Ar_6$ represents a trivalent aromatic ring group, Y represents a hydrogen atom or a group that when acted on by an acid, is cleaved, provided that when there are a plurality of Y's, they may be identical to or different from each other, and provided that at least one thereof is a group that when acted on by an acid, is cleaved, and n is an integer of 1 to 4.

18. The composition according to claim 17, wherein in the general formula (VI), the group Y that is cleaved by the action of an acid has any of the structures of the general formula (VI-A) below, and the group of the formula -M-Q has 1 to 30 carbon atoms

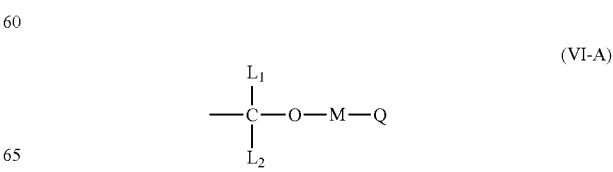

wherein,
each of $L_1$ and $L_2$ independently represents a hydrogen atom, an alkyl group, a monovalent aliphatic hydrocarbon ring group, a monovalent aromatic ring group or a group consisting of an alkylene group combined with a monovalent aromatic ring group, M represents a single bond or a bivalent connecting group, and Q represents an alkyl group, a monovalent aliphatic hydrocarbon ring group optionally containing a heteroatom, a monovalent aromatic ring group optionally containing a heteroatom, an amino group, an ammonium group, a mercapto group, a cyano group or an aldehyde group, provided that at least two of Q, M and $L_1$ may be bonded to each other to thereby form a ring.

19. The composition according to claim 1, wherein the content of the repeating unit containing an alkali-soluble group expressed by the general formula (C-I), based on all the repeating units of the resin (P), is in the range of 7 to 70 mol %.

20. The composition according to claim 1, the compound (U) contains the partial structure represented by the following general formula (KY-4):

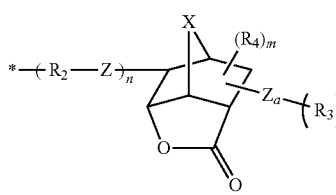

(KY-4)

wherein,
$R_2$ represents a chain or cyclic alkylene group, provided that when there are a plurality of $R_2$s, they may be identical to or different from each other, $R_3$ represents a linear, branched or cyclic hydrocarbon group whose hydrogen atoms on constituent carbons are partially or entirely substituted with fluorine atoms, $R_4$ represents a halogen atom, a cyano group, a hydroxyl group, an amido group, an alkyl group, a cycloalkyl group, an alkoxy group, a phenyl group, an acyl group, an alkoxycarbonyl group or any of the groups of the formula R—C(=O)— or R—C(=O)O— in which R is an alkyl group or a cycloalkyl group, wherein when there are a plurality of $R_4$s, they may be identical to or different from each other and two or more $R_4$s may be bonded to each other to thereby form a ring;

X represents an alkylene group, an oxygen atom or a sulfur atom;

each of Z and Za represents a single bond, an ether bond, an ester bond, an amido bond, a urethane bond or a urea bond, when there are a plurality thereof, they may be identical to or different from each other;

* represents a bonding hand to the principal chain or a side chain of the resin;

o is the number of substituents, being an integer of 1 to 7;

m is the number of substituents, being an integer of 0 to 7; and n is the number of repetitions, being an integer of 0 to 5.

21. The composition according to claim 1, wherein the content of the compound (U) based on the total solids of the composition is in the range of 1 to 15 mass %.

22. The composition according to claim 1, wherein $L_{12}$ in the general formula (I) is a bivalent aromatic ring group.

23. The composition according to claim 1, wherein the compound (U) is a resin which contains any of the repeating units containing a fluorine atom represented by the following general formula (C-Ia) to (C-Id):

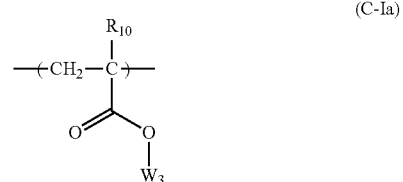

(C-Ia)

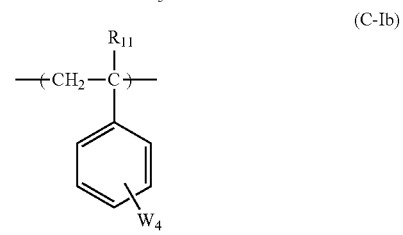

(C-Ib)

(C-Ic)

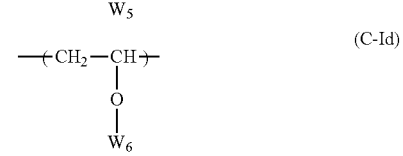

(C-Id)

in which
each of $R_{10}$ and $R_{11}$ independently represents a hydrogen atom, a fluorine atom or an alkyl group;

each of $W_3$ to $W_6$ independently represents an organic group containing at least one fluorine atom.

* * * * *